(12) United States Patent
Yamaguchi et al.

(10) Patent No.: US 8,338,247 B2
(45) Date of Patent: Dec. 25, 2012

(54) SEMICONDUCTOR DEVICE AND METHOD OF MANUFACTURING SAME

(75) Inventors: Tadashi Yamaguchi, Tokyo (JP); Toshiaki Tsutsumi, Tokyo (JP); Satoshi Ogino, Tokyo (JP); Kazumasa Yonekura, Tokyo (JP); Kenji Kawai, Tokyo (JP); Yoshihiro Miyagawa, Tokyo (JP); Tomonori Okudaira, Tokyo (JP); Keiichiro Kashihara, Tokyo (JP); Kotaro Kihara, Itami (JP)

(73) Assignee: Renesas Electronics Corporation, Kanagawa (JP)

( * ) Notice: Subject to any disclaimer, the term of this patent is extended or adjusted under 35 U.S.C. 154(b) by 224 days.

(21) Appl. No.: 12/720,174

(22) Filed: Mar. 9, 2010

(65) Prior Publication Data

US 2010/0230761 A1 Sep. 16, 2010

(30) Foreign Application Priority Data

Mar. 10, 2009 (JP) ................................. 2009-055905

(51) Int. Cl.
*H01L 27/092* (2006.01)
*H01L 21/8238* (2006.01)

(52) U.S. Cl. ................. 438/233; 257/369; 257/E21.636; 257/E27.062

(58) Field of Classification Search ........................ None
See application file for complete search history.

(56) References Cited

U.S. PATENT DOCUMENTS 7,105,394 B2 *   9/2006   Hachimine et al. ............ 438/197
7,115,954 B2 *  10/2006   Shimizu et al. ................ 257/369
2007/0057347 A1  3/2007   Ikeda
2007/0080392 A1  4/2007   Tomiye
2007/0093047 A1  4/2007   Okuno et al.
2007/0202695 A1  8/2007   Kawamura et al.
2008/0093676 A1  4/2008   Shingu et al.
2008/0274611 A1 * 11/2008  Cabral et al. .................. 438/653
2009/0011566 A1 *  1/2009  Okada et al. ................... 438/308

FOREIGN PATENT DOCUMENTS

JP         2006-173432         6/2006

(Continued)

OTHER PUBLICATIONS

F. Corni, B. Grignaffini Gregorio, G. Ottaviani, G. Queirolo, J.P. Follegot, Dilute NiPt alloy interactions with Si, Applied Surface Science, vol. 73, Nov. 2, 1993, pp. 197-202.*

(Continued)

*Primary Examiner* — Victor A Mandala
*Assistant Examiner* — Joseph Schoenholtz
(74) *Attorney, Agent, or Firm* — McDermott Will & Emery LLP

(57) ABSTRACT

To improve the performance of semiconductor devices. Over an $n^+$-type semiconductor region for source/drain of an n-channel type MISFET and a first gate electrode, and over a $p^+$-type semiconductor region for source/drain of a p-channel type MISFET and a second gate electrode, which are formed over a semiconductor substrate, a metal silicide layer including nickel platinum silicide is formed by a salicide process. After that, a tensile stress film is formed over the whole face of the semiconductor substrate, and then the tensile stress film over the p-channel type MISFET is removed by dry-etching, and, after a compression stress film is formed over the whole face of the semiconductor substrate, the compression stress film over the n-channel type MISFET is removed by dry-etching. The Pt concentration in the metal silicide layer is highest at the surface, and becomes lower as the depth from the surface increases.

7 Claims, 67 Drawing Sheets

FOREIGN PATENT DOCUMENTS

| | | |
|---|---|---|
| JP | 2007-103456 | 4/2007 |
| JP | 2007-103897 | 4/2007 |
| JP | 2007-142347 | 6/2007 |
| JP | 2007-234667 | 9/2007 |
| JP | 2007-234760 | 9/2007 |
| JP | 2008-060101 | 3/2008 |
| JP | 2008078559 A * | 4/2008 |
| WO | WO 02/43151 A1 | 5/2002 |

OTHER PUBLICATIONS

Ohuchi, K., et. al, "Extendibility of NiPt Silicide Contacts for CMOS Technology Demonstrated to the 22-nm Node," Electron Devices Meeting, 2007. IEDM 2007. IEEE International , vol., No., pp. 1029-1031, Dec. 10-12, 2007.*

Zhen Zhang, et. al."Sharp Reduction of Contact Resistivities by Effective Schottky Barrier Lowering With Silicides as Diffusion Sources", Electron Device Letters, IEEE, On pp. 731-733, vol. 31 Issue: 7, Jul. 2010.*

Marukame, T, et. al. "Impact of platinum incorporation on thermal stability and interface resistance in NiSi/Si junctions based on first-principles calculation," Electron Devices Meeting, 2008. IEDM 2008. IEEE International , vol., No., pp. 1-4, Dec. 15-17, 2008.*

D. Mangelinck, K. Hoummada, O. Cojocaru-Mirédin, E. Cadel, C. Perrin-Pellegrino, D. Blavette, Atom probe tomography of Ni silicides: First stages of reaction and redistribution of Pt, Microelectronic Engineering, vol. 85, Issue 10, Oct. 2008, pp. 1995-1999.*

Demeulemeester, J., D. Smeets, C. Van Bockstael, C. Detavernier, C. M. Comrie, N. P. Barradas, A. Vieira, and A. Vantomme. "Pt Redistribution during Ni(Pt) Silicide Formation." Applied Physics Letters 93.26 (2008): 261912.*

Kittl, J. A. "Ni- and Co-based Silicides for Advanced CMOS Applications." Microelectronic Engineering 70 (2003): 158-65.*

Machine translation of JP 2008078559 A.*

* cited by examiner

FIG. 70
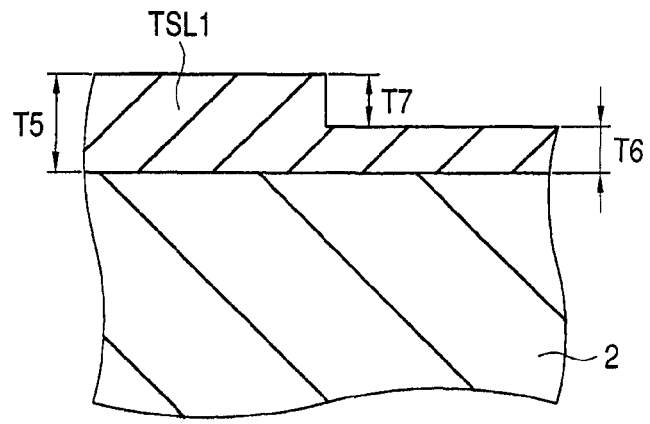
FIG. 71
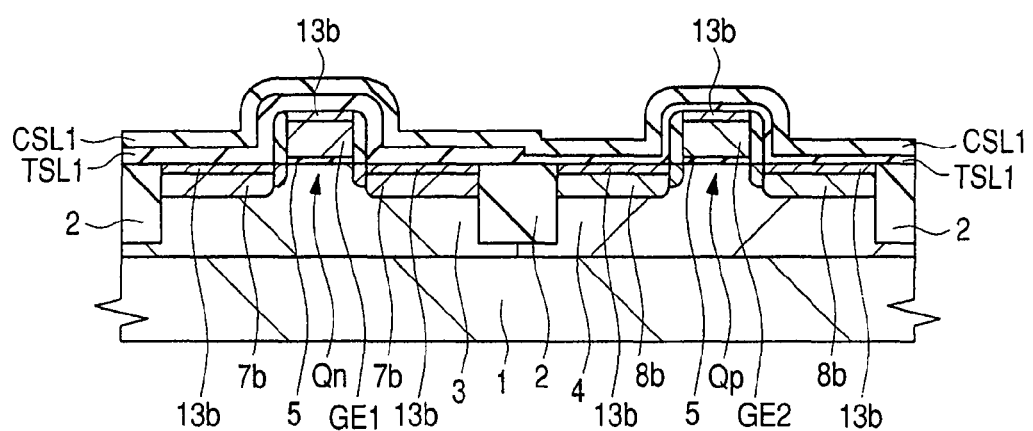

SEMICONDUCTOR DEVICE AND METHOD OF MANUFACTURING SAME

CROSS-REFERENCE TO RELATED APPLICATION

The disclosure of Japanese Patent Application No. 2009-55905 filed on Mar. 10, 2009 including the specification, drawings and abstract is incorporated herein by reference in its entirety.

BACKGROUND OF THE INVENTION

The present invention relates to a semiconductor device and a method of manufacturing the same, and, particularly, to a technology that is effective when applied to a semiconductor device that has a CMISFET and uses two stress films having different stress directions, and to the manufacture of the same.

Presently, it is widely performed at miniaturize transistors and improve the performance thereof. However, the improvement of the performance of transistor only by the miniaturization leads to such problem as the rise in the cost from the standpoint of the ratio relative to the performance.

Accordingly, a method has appeared which improves the performance of transistors by not only the miniaturization but also the use of a stress film represented by a nitride film.

As one of methods aiming at improving the performance of transistors using a stress film, there is a technique of so-called DSL (Dual Stress Liner), in which a compression stress film is formed over a p-channel type MISFET and a tensile stress film is formed over an n-channel type MISFET to apply stress to channels of both MISFETs and to improve the performance, as described in, for example, Patent Document 1 (International Patent Publication No. WO2002/043151).

Further, a salicide technology is studied, in which a metal silicide layer such as a nickel silicide layer or a cobalt silicide layer with low resistance is formed at the surface of an electroconductive film constituting a gate and of a semiconductor region constituting a source/drain by self alignment to lower the resistance of a gate or source/drain, and thereby a high-speed operation of a transistor can be achieved.

Patent Documents 2 to 7 (Japanese Unexamined Patent Application Publication Nos. 2008-60101, 2007-142347, 2007-103456, 2007-103897, 2007-234667 and 2007-234760) disclose a technique of forming a nickel platinum silicide layer at the surface of a source/drain region.

Patent Document 8 (Japanese Unexamined Patent Application Publication No. 2006-173432) discloses a technique, in which a silicon oxide film to be an etching stopper film is formed over the silicon nitride film having a tensile stress in a DSL technology.

SUMMARY OF THE INVENTION

As the result of the study of the present inventor, the followings were found.

FIGS. 109 to 114 are cross-sectional views of the essential part in a manufacturing process of a semiconductor device that was studied by the inventor.

Firstly, as shown in FIG. 109, an element isolation region 102 made of an insulator is formed at a semiconductor substrate 101, a p-type well 103 is formed at an nMIS region 101A being a region for forming an n-channel type MISFET of the semiconductor substrate 101, and an n-type well 104 is formed at a pMIS region 101B being a region for forming a p-channel type MISFET of the semiconductor substrate 101.

After that, over the p-type well 103, a gate electrode GE101 is formed via a gate insulating film 105, and, over the n-type well 104, a gate electrode GE102 is formed via the gate insulating film 105. Further, an $n^+$-type semiconductor region 107 for the source/drain of the n-channel type MISFET, and a $p^+$-type semiconductor region 108 for the source/drain of the p-channel type MISFET are formed, and at the surface of the $n^+$-type semiconductor region 107, $p^+$-type semiconductor region 108 and the gate electrodes GE101 and GE102, a metal silicide layer 113 is formed by a salicide process.

Next, a tensile stress film or a compression stress film is formed over the whole main face of the semiconductor substrate 101. FIG. 110 shows an instance where a tensile stress film TSL101 is formed.

Next, as shown in FIG. 111, using a photoresist film RP101 that covers the nMIS region 101A and exposes the pMIS region 101B, the tensile stress film TSL101 of the pMIS region 101B is removed by dry etching. When a compression stress film is formed in place of the tensile stress film TSL101 in FIG. 110, in FIG. 111, the compression stress film is removed in the nMIS region 101A by dry etching.

Next, as shown in FIG. 112, a compression stress film CSL101 is formed over the whole main face of the semiconductor substrate 101. When a compression stress film is formed in FIG. 110, in FIG. 112, a tensile stress film is formed in place of the compression stress film CSL101.

Next, as shown in FIG. 113, using a photoresist film RP102 that covers the pMIS region 101B and exposes the nMIS region 101A, the compression stress film CSL101 of the nMIS region 101A is removed by dry etching. When a tensile stress film is formed in FIG. 112, in FIG. 113, the tensile stress film is removed in the pMIS region 101B by dry etching.

Next, as shown in FIG. 114, an interlayer insulating film 121 is formed over the whole main face of the semiconductor substrate 101, and, at the interlayer insulating film 121, a contact hole 122 reaching the metal silicide layer 113 is formed, and the inside of the contact hole is embedded with a plug 123.

As described above, the tensile stress film TSL101 is formed at the nMIS region 101A, and the compression stress film CSL101 is formed at the pMIS region 101B. The application of the tensile stress by the tensile stress film TSL101 at the channel region of the n-channel type MISFET formed at the nMIS region 101A can improve the mobility in the channel region, and the application of the compression stress of the compression stress film CSL101 to the channel region of the p-channel type MISFET formed at the pMIS region 101B can improve the mobility in the channel region. This can improve ON current of both n-channel type MISFET and p-channel type MISFET.

However, the inventor studied and found a following problem to be solved.

That is, it was found that, upon dry-etching the stress film (the tensile stress film TSL101 in the case of FIG. 111) in the process of FIG. 111, the metal silicide layer 113 may be over-etched to generate the decrease in the thickness or etching damage of the metal silicide layer 113, to raise the resistance of the metal silicide layer 113. Since the metal silicide layer 113 is provided for lowering the resistance, a lower resistance of the metal silicide layer 113 is desirable, and the increase in the resistance of the metal silicide layer 113 may lower the performance of the semiconductor device. The problem of the rise in the resistance of the metal silicide layer 113 caused by the over etching of the metal silicide layer 113 may occur in both cases where the stress film to be etched in the process in FIG. 111 is the tensile stress film or the compression stress film.

A target of the present invention is to provide a technology capable of improving the performance of semiconductor devices.

The above and other targets and novel features of the invention will become clear from the description of the specification and accompanying drawings.

Brief explanation of the outline of representative inventions among ones disclosed in the present application is as follows.

The semiconductor device and the method of manufacturing the same according to a representative embodiment are those formed by using a nickel platinum silicide layer having such Pt concentration that becomes greater as the depth becomes shallower as the metal silicide layer on the source region and drain region, and, upon forming a DSL (Dual Stress Liner), the tensile stress film is formed first, and the tensile stress film on the p-channel type MISFET is removed, and, after that, the compression stress film is formed.

The semiconductor device and the method of manufacturing the same according to another representative embodiment are those in which, after the formation of a metal silicide layer over the source region and drain region, the surface of the metal silicide layer is oxidized before the formation of the DSL.

The semiconductor device and the method of manufacturing the same according to another representative embodiment are those in which, after the formation of the metal silicide layer over the source region and drain region, upon the formation of the DSL, a silicon oxide film is formed under the stress film that is firstly formed, and the stress film formed later is formed directly on the metal silicide layer.

The semiconductor device and the method of manufacturing the same according to another representative embodiment are those in which a common stress film made of silicon carbide is formed under two kinds of stress films constituting the DSL.

The semiconductor device and the method of manufacturing the same according to another representative embodiment are those in which after the formation of a metal silicide layer is formed on the source region and drain region, and, upon the formation of the DSL, when a stress film formed firstly is removed from over a MISFET that does not need the stress of the stress film, only the upper layer portion of the stress film is removed so as not to expose the metal silicide layer.

The semiconductor device and the method of manufacturing the same according to another representative embodiment are those in which, upon forming the DSL, a stress film, insulating film and another stress film are formed in this order, and the other stress film is removed from over a MISFET that does not need the stress of the other stress film, wherein the other stress film and the insulating film are removed, but the stress film is left.

The effect obtained by a representative invention among those disclosed in the application can briefly be described as follows.

According to the representative embodiment, the performance of a semiconductor device can be improved.

BRIEF DESCRIPTION OF THE DRAWINGS

FIG. 70 is a cross-sectional view of another essential part in a manufacturing process of the same semiconductor device as in FIG. 67;

FIG. 71 is a cross-sectional view of the essential part in the manufacturing process of the semiconductor device subsequent to FIG. 67;

DETAILED DESCRIPTION OF THE PREFERRED EMBODIMENTS

Figure 1:
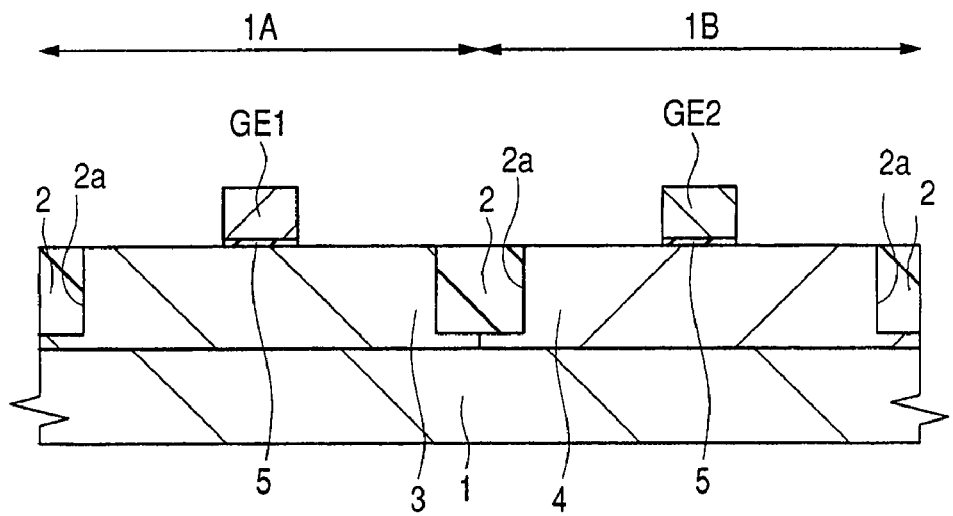
FIG. 1 is a cross-sectional view of an essential part in a manufacturing process of a semiconductor device being an Embodiment 1 of the invention.

The following embodiments will be explained, divided into plural sections or embodiments, if necessary for convenience. Except for the case where it shows clearly in particular, they are not mutually unrelated and one has relationships such as a modification, details, and supplementary explanation of some or entire of another. In the following embodiments, when referring to the number of elements, etc. (including the number, a numeric value, an amount, a range, etc.), they may be not restricted to the specific number but may be greater or smaller than the specific number, except for the case where they are clearly specified in particular and where they are clearly restricted to a specific number theoretically. Furthermore, in the following embodiments, it is needless to say that an element (including an element step etc.) is not necessarily indispensable, except for the case where it is clearly specified in particular and where it is considered to be clearly indispensable from a theoretical point of view, etc. Similarly, in the following embodiments, when shape, position relationship, etc. of an element etc. is referred to, what resembles or is similar to the shape substantially shall be included, except for the case where it is clearly specified in particular and where it is considered to be clearly not right from a theoretical point of view. This statement also applies to the numeric value and range described above.

Hereinafter, the embodiment of the invention will be described in detail on the basis of the drawings. Meanwhile, in the whole drawings for explaining the embodiment, the same symbol is given to members having the same function, and the repeating description thereof is omitted. Further, in the embodiment below, the explanation for the same or similar portions is not repeated as a general rule, except for the case where the explanation is particularly needed.

In drawings used in the embodiment, hatching is occasionally omitted even for a cross-sectional view, in order to give clear viewability for the drawing. Further, hatching is occasionally applied even to a plan view, in order to give clear viewability for the drawing.

Embodiment 1

Figure 2:
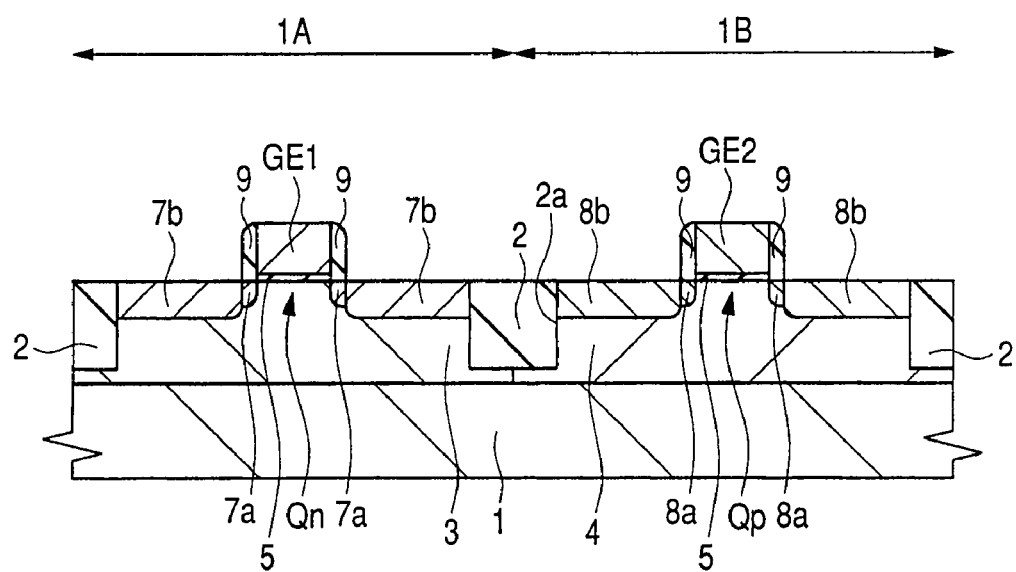
FIG. 2 is a cross-sectional view of the essential part in the manufacturing process of the semiconductor device subsequent to FIG. 1.

A manufacturing process of a semiconductor device of the embodiment will be described referring to drawings. FIGS. 1 and 2 are cross-sectional views of the essential part in a manufacturing process of the semiconductor device, here, the semiconductor device having a CMISFET (Complementary Metal Insulator Semiconductor Field Effect Transistor) being one embodiment of the invention.

Firstly, as shown in FIG. 1, a semiconductor substrate (a semiconductor wafer) 1 made of a p-type single crystalline silicon having a specific resistance of, for example, around 1 to 10 Ωcm, or the like, is prepared. The semiconductor substrate 1 at which a semiconductor device of the embodiment is formed has an nMIS formation region 1A being a region in which an n-channel type MISFET (Metal Insulator Semiconductor Field Effect Transistor) is to be formed, and a pMIS formation region 1B being a region in which a p-channel type MISFET is to be formed. Then, at the main face of the semiconductor substrate 1, an element isolation region 2 is formed. The element isolation region 2 is made of an insulator such as silicon oxide, and is formed by, for example, an STI (Shallow Trench Isolation) method, a LOCOS (Local Oxidization of Silicon) method, or the like. For example, the element isolation region 2 can be formed by an insulating film embedded into a groove (an element isolation groove) 2a formed at the semiconductor substrate 1.

Next, at a region for forming an n-channel type MISFET (an nMIS formation region 1A) of the semiconductor substrate 1, a p-type well 3 is formed, and, at a region for forming a p-channel type MISFET (a pMIS formation region 1B), an n-type well 4 is formed. The p-type well 3 is formed by ion-implanting a p-type impurity such as boron (B), and the n-type well 4 is formed by ion-implanting an n-type impurity such as phosphorous (P) or arsenic (As). Further, it is also possible to perform ion implantation for adjusting the threshold value of a MISFET to be formed later (so-called channel dope ion implantation), according to need, at the upper layer portion of the semiconductor substrate 1 before or after the formation of the p-type well 3 and the n-type well 4.

Next, after the clean up (washing) of the surface of the semiconductor substrate 1 by wet etching using, for example, an aqueous hydrofluoric acid (HF) solution, or the like, over the surface of the semiconductor substrate 1 (that is, the surface of the p-type well 3 and n-type well 4), a gate insulating film 5 is formed. The gate insulating film 5 is made of, for example, a thin silicon oxide film, or the like, and can be formed by, for example, a thermal oxidation method, or the like.

Next, over the gate insulating film 5 of the nMIS formation region 1A and the pMIS formation region 1B, gate electrodes GE1 and GE2 are formed respectively. For forming the gate electrodes GE1 and GE2, for example, it is sufficient to form an electroconductive film such as a polycrystalline silicon film (a doped polysilicon film) over the main face of the semiconductor substrate 1 (that is, over the gate insulating film 5) and, after that, to pattern the electroconductive film using a photolithographic technique and a dry etching technique. As the result, the gate electrode GE1 made of the patterned electroconductive film is formed over the surface of the p-type well 3 of the nMIS formation region 1A via the gate insulating film 5, and the gate electrode GE2 made of the patterned electroconductive film is formed over the surface of the n-type well 4 of the pMIS formation region 1B via the gate insulating film 5.

Next, as shown in FIG. 2, by ion-implanting an n-type impurity made of a 15th group (V group) element such as phosphorous (P) or arsenic (As) into regions on both sides of the gate electrode GE1 of the p-type well 3 in the nMIS formation region 1A, an n⁻-type semiconductor region (an impurity diffusion layer) 7a is formed. Upon the ion implantation for forming the n⁻-type semiconductor region 7a, the pMIS formation region 1B is covered with a photoresist film (not shown) as an ion implantation prevention mask, and the ion is implanted to the semiconductor substrate 1 (the p-type well 3) of the nMIS formation region 1A using the gate electrode GE1 as a mask. Further, by ion-implanting a p-type impurity made of a 13th group (III group) element such as boron (B) into regions on both sides of the gate electrode GE2 of the n-type well 4 in the pMIS formation region 1B, a p$^-$-type semiconductor region (an impurity diffusion layer) 8a is formed. Upon the ion implantation for forming the p$^-$-type semiconductor region 8a, the nMIS formation region 1A is covered with another photoresist film (not shown) as an ion implantation prevention mask, and the ion is implanted into the semiconductor substrate 1 (the n-type well 4) of the pMIS formation region 1B using the gate electrode GE2 as a mask. The n$^-$-type semiconductor region 7a may be formed ahead, or the p$^-$-type semiconductor region 8a may be formed ahead.

Next, on the side wall of gate electrodes GE1 and GE2, a sidewall (a side wall spacer, side wall insulating film) 9 made of an insulator is formed. For example, after the formation of a silicon oxide film and a silicon nitride film in this order from the bottom over the semiconductor substrate 1 so as to cover the gate electrodes GE1 and GE2, the laminated film of the silicon oxide film and silicon nitride film is subjected to an anisotropic etching (etch back), to enable the side wall 9, which remains on the side wall of the gate electrodes GE1 and GE2 and is made of the silicon oxide film and silicon nitride film, to be formed. Meanwhile, for simplifying the drawing, in FIG. 2, the silicon oxide film and silicon nitride film constituting the side wall 9 are shown in an integrated shape.

Next, by ion-implanting an n-type impurity made of a 15th group (V group) element such as phosphorous (P) or arsenic (As) into the gate electrode GE1 and regions on both sides of sidewall 9 of the p-type well 3 in the nMIS formation region 1A, the n$^+$-type semiconductor region 7b (source, drain) is formed. Upon the ion implantation for forming the n$^+$-type semiconductor region 7b, the pMIS formation region 1B is covered with a photoresist film (not shown) as an ion implantation prevention mask, and the ion is implanted to the semiconductor substrate 1 (the p-type well 3) of the nMIS formation region 1A using the gate electrode GE1 and sidewall 9 on the side wall thereof as a mask. For the purpose, the n$^-$-type semiconductor region 7a is formed in a shape matched to the gate electrode GE1, and the n$^+$-type semiconductor region 7b is formed in a shape matched to the sidewall 9. Further, by ion-implanting a p-type impurity made of a 13th group (III group) element such as boron (B) into the gate electrode GE2 and regions on both sides of the sidewall 9 of the n-type well 4 in the pMIS formation region 1B, the p$^+$-type semiconductor region 8b (source, drain) is formed. Upon the ion implantation for forming the p$^+$-type semiconductor region 8b, the nMIS formation region 1A is covered with another photoresist film (not shown) as an ion implantation prevention mask, and the ion is implanted into the semiconductor substrate 1 (the n-type well 4) of the pMIS formation region 1B using the gate electrode GE2 and the sidewall 9 on the side wall thereof as a mask. For the purpose, the p$^-$-type semiconductor region 8a is formed in a shape matched to the gate electrode GE2, and the p$^+$-type semiconductor region 8b is formed in a shape matched to the sidewall 9. The n$^+$-type semiconductor region 7b may be formed ahead, or the p$^+$-type semiconductor region 8b may be formed ahead.

After the ion implantation, an annealing treatment (activation anneal, a heat treatment) to activate the introduced impurity is performed. This treatment can activate impurities introduced into the n$^-$-type semiconductor region 7a, the p$^-$-type semiconductor region 8a, the n$^+$-type semiconductor region 7b and the p$^+$-type semiconductor region 8b.

As described above, a structure as shown in FIG. 2 is obtained, an n-channel type MISFET (Metal Insulator Semiconductor Field Effect Transistor) Qn is formed at the nMIS formation region 1A as a field effect transistor, and a p-channel type MISFET Qp is formed at the pMIS formation region 1B as a field effect transistor.

The n$^+$-type semiconductor region 7b has a higher impurity concentration and a deeper junction depth than the n$^-$-type semiconductor region 7a, and the p$^+$-type semiconductor region 8b has a higher impurity concentration and a deeper junction depth than the p$^-$-type semiconductor region 8a. As the result, an n-type semiconductor region (an impurity diffusion layer) that functions as a source or drain of the n-channel type MISFET Qn is formed by the n$^+$-type semiconductor region 7b and the n$^-$-type semiconductor region 7a, and a p-type semiconductor region (an impurity diffusion layer) that functions as a source or drain of the p-channel type MISFET Qp is formed by the p$^+$-type semiconductor region 8b and the p$^-$-type semiconductor region 8a. Accordingly, the source/drain region of the n-channel type MISFET Qn and p-channel type MISFET Qp has an LDD (Lightly doped Drain) structure. The n$^+$-type semiconductor region 7b may be considered as a semiconductor region for the source or drain of the n-channel type MISFET Qn, and the p$^+$-type semiconductor region 8b may be considered as a semiconductor region for the source or drain of the p-channel type MISFET Qp.

Figure 3:
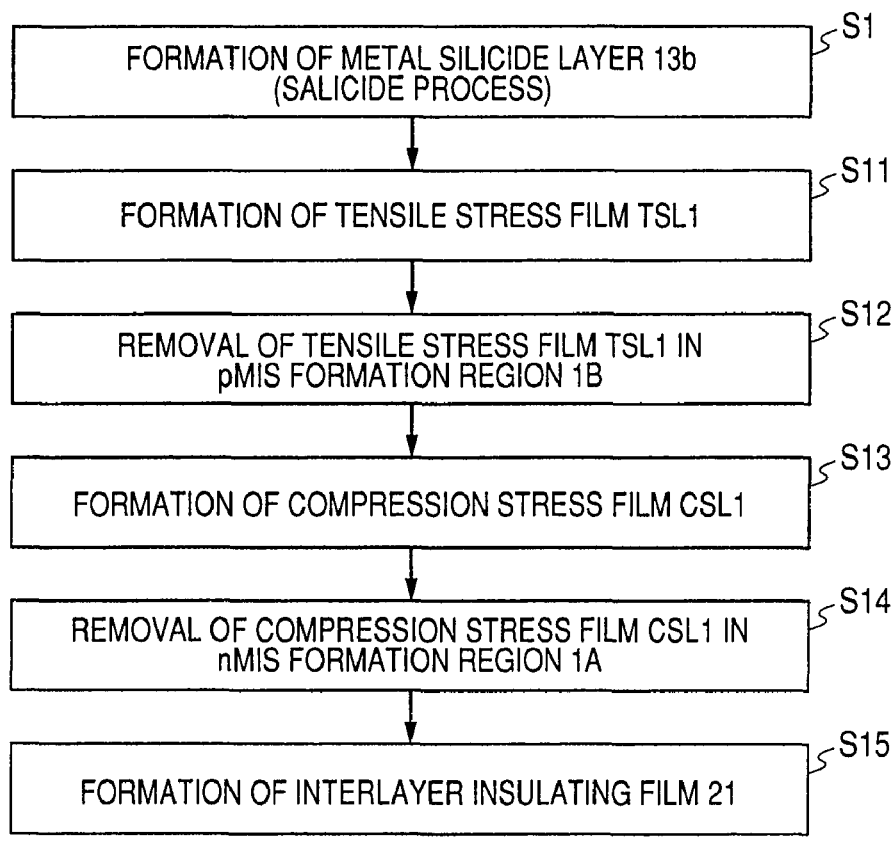
FIG. 3 is a manufacturing process flow chart showing a part of the manufacturing process of the semiconductor device being Embodiment 1 of the invention.
Figure 4:
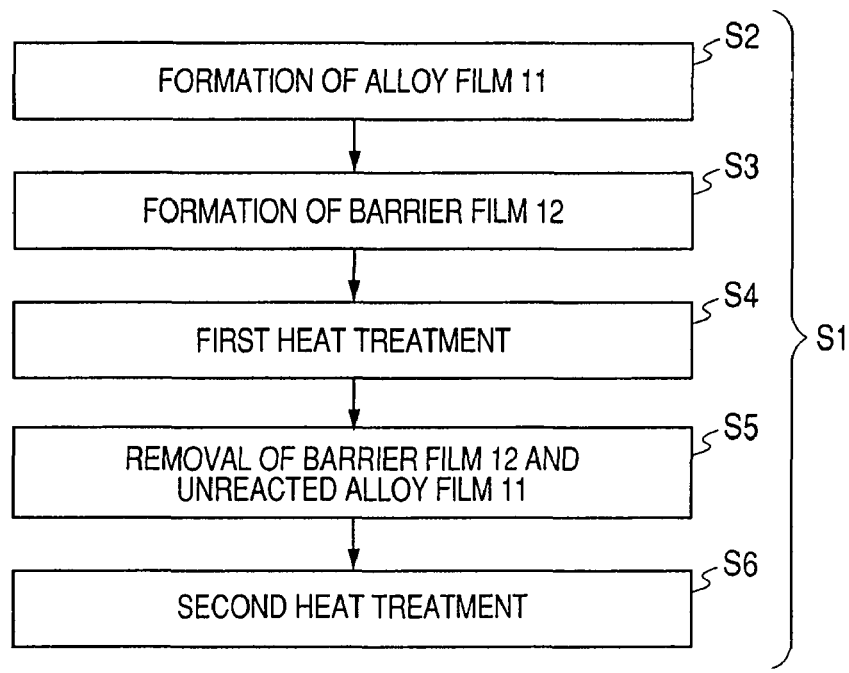
FIG. 4 is a manufacturing process flow chart specifically showing a formation process of a metal silicide layer.

FIG. 3 is a manufacturing process flow chart showing a part of the manufacturing process of a semiconductor device of the embodiment. FIG. 4 is a manufacturing process flow chart more specifically showing the process of forming the metal silicide layer of Step S1 in FIG. 3. FIGS. 5 to 9, and 11 to 17 are cross-sectional views of the essential part in a manufacturing process of a semiconductor device subsequent to FIG. 2. Meanwhile, in FIG. 3, a manufacturing process flow from after the process that gives the structure in FIG. 2 up to the process that gives the structure in FIG. 14 is shown. FIG. 10 is a plan view of the essential part in a manufacturing process of a semiconductor device, which corresponds to the same process stage as that in FIG. 9. The cross-sections shown in FIGS. 1, 2, 5 to 9, and 11 to approximately correspond to the cross-sectional position shown by an A-A line in FIG. 10. Meanwhile, although FIG. 10 is a plan view, hatching is given to a region that is covered with a photoresist film RP1, which is described later, (that is, a region where the tensile stress film TSL1 remains), and a planar layout of the gate electrode GE1 and the n$^+$-type semiconductor region 7b (the metal silicide layer 13b formed at the upper layer of the n$^+$-type semiconductor region 7b) covered with a laminated film of the photoresist film RP1 and tensile stress film TSL1 is shown by a dotted line.

After obtaining the structure in FIG. 2 as described above, the surface of the semiconductor substrate 1 is cleaned up using RCA washing or the like. Further, after the RCA washing, a natural oxide film of the surface of the semiconductor substrate 1 is removed using hydrofluoric acid or the like.

Next, by a salicide (Self Aligned Silicide) technique, a metal silicide layer with low resistance (corresponding to a metal silicide layer 13b described later) is formed at the surface of the gate electrode GE1 and the source/drain region (the n$^+$-type semiconductor region 7b) of the nMIS formation region 1A, and at the surface of the gate electrode GE2 and the source/drain region (the p$^+$-type semiconductor region 8b) of the pMIS formation region 1B (Step S1 in FIG. 3).

Hereinafter, the process of forming the metal silicide layer at the Step S1 will be described.

Figure 5:
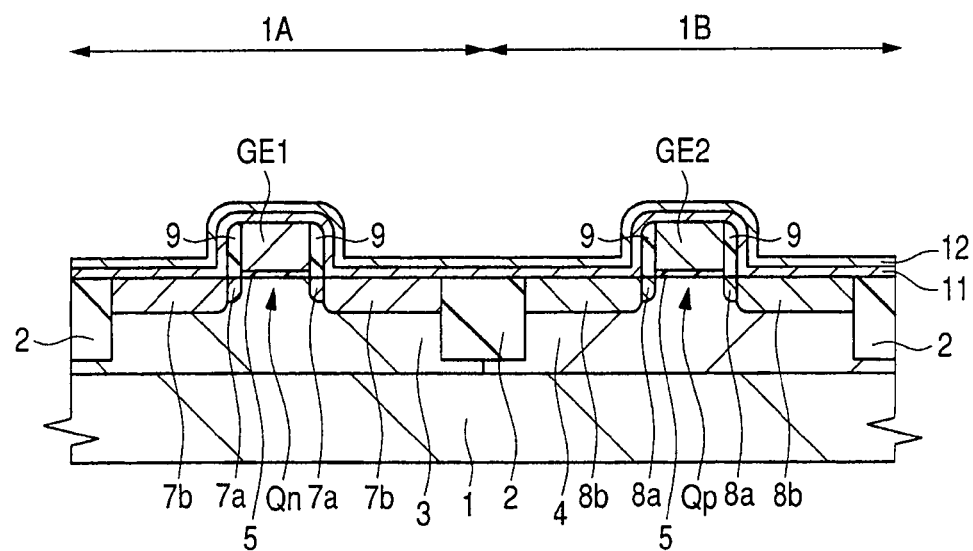
FIG. 5 is a cross-sectional view of the essential part in the manufacturing process of the semiconductor device subsequent to FIG. 2.

After exposing the surface of gate electrodes GE1 and GE2, the n$^+$-type semiconductor region 7b and p$^+$-type semiconductor region 8b by removing the natural oxide film, as shown in FIG. 5, an alloy film (a metal film) 11 is formed (deposited) over the main face (the whole face) of the semiconductor substrate 1 including the gate electrodes GE1 and GE2, the n$^+$-type semiconductor region 7b and p$^+$-type semiconductor region 8b using, for example, a sputtering method (Step S2 in FIG. 4). That is, in Step S2, the alloy film 11 is formed over the semiconductor substrate 1 including the n$^+$-type semiconductor region 7b and p$^+$-type semiconductor region 8b, so as to cover the gate electrodes GE1 and GE2.

In the embodiment, the alloy film 11 is an alloy film (a metal film) containing platinum (Pt), and more specifically an alloy film containing nickel (Ni) and platinum (Pt). More preferably, the alloy film 11 in the embodiment is a Ni—Pt alloy film being an alloy film of Ni (nickel) and Pt (platinum), wherein, when defining the ratio of Ni and Pt (an atomic ratio) in the alloy film 11 as 1-x:x, the alloy film 11 may also be expressed as a $Ni_{1-x}M_x$ alloy film.

Pt concentration in the alloy film 11 formed in Step S2 is preferably within a range of 3-7 atom %, and the thickness of the formed alloy film 11 is preferably within a range of 7 to 20 nm. The percentage (the ratio) of Ni in a $Ni_{1-x}Pt_x$ alloy film is $(1-x) \times 100\%$, and the percentage (the ratio) of Pt in the $Ni_{1-x}Pt_x$ alloy film is $x \times 100\%$. Therefore, when expressing the alloy film 11 as the $Ni_{1-x}Pt_x$ alloy film, x in $Ni_{1-x}Pt_x$ is preferably within a range of $0.03 \leq x \leq 0.07$. Meanwhile, in the application, a percentage (ratio, concentration) of an element shown in % means atom.

Next, over the alloy film 11, a barrier film 12 is formed (deposited) (Step S3 in FIG. 4). The barrier film 12 may be formed by a sputtering method or the like, which is made of, for example, a titanium nitride (TiN) film. The barrier film 12 has such function as preventing oxidation of the alloy film 11, and is a film that hardly reacts with the alloy film 11 even upon a first heat treatment described later.

Next, the semiconductor substrate 1 is subjected to a first heat treatment (an annealing treatment) (Step S4 in FIG. 4). The first heat treatment allows the polycrystalline silicon film constituting gate electrodes GE1 and GE2 and the alloy film 11, and the single crystalline silicon constituting the n$^+$-type semiconductor region 7b and p$^+$-type semiconductor region 8b and the alloy film 11 to react selectively to form a metal silicide layer 13a being a metal/semiconductor reacted layer. On this occasion, since the metal silicide layer 13a is formed as the result of the reaction between respective upper portions (upper layers) of the gate electrodes GE1 and GE2 and the n$^+$-type semiconductor region 7b and p$^+$-type semiconductor region 8b, and the alloy film 11, the metal silicide layer 13a is formed, therefore, at respective surfaces (upper portions) of the gate electrodes GE1 and GE2, and the n$^+$-type semiconductor region 7b and p$^+$-type semiconductor region 8b. Meanwhile, in the first heat treatment, Ni and Pt in the alloy film 11 diffuse into the n$^+$-type semiconductor region 7b, p$^+$-type semiconductor region 8b and gate electrodes GE1 and GE2 to form the metal silicide layer 13a.

The first heat treatment may be performed using, for example, an RTA (Rapid Thermal Anneal) method such as a lamp anneal. The first heat treatment is preferably performed at a temperature of 290° C. or less for 30 seconds or less, in the embodiment. The first heat treatment is preferably performed in a nitrogen (N$_2$) gas atmosphere, but may also be performed in an inert gas (for example, argon (Ar) gas, neon (Ne) gas or helium (He) gas) atmosphere, or in a mixed gas atmosphere of an inert gas and nitrogen gas.

As described above, in the first heat treatment, (Si constituting) the gate electrodes GE1 and GE2 and the n$^+$-type semiconductor region 7b and p$^+$-type semiconductor region 8b, and alloy film 11 are selectively reacted to form the metal silicide layer 13a made of silicide of Ni and Pt (nickel platinum silicide, platinum-added nickel silicide), wherein, at the stage of performing the first heat treatment, the metal silicide layer 13a has a $(Ni_{1-y}Pt_y)_2Si$ phase (here, 0<y<1). That is, the first heat treatment is performed at heat treatment temperatures that give the metal silicide layer 13a of a $(Ni_{1-y}Pt_y)_2Si$ phase but do not give that of a $Ni_{1-y}Pt_ySi$ phase.

Meanwhile, in the embodiment, as described later, it is important to suppress the heat treatment temperature and heat treatment time of the first heat treatment at Step S4 to values not more than the aforementioned values, so that the first heat treatment at Step S4 does not become excessive. However, from the standpoint of reacting the alloy film 11 with gate electrodes GE1 and GE2, and the n$^+$-type semiconductor region 7b and p$^+$-type semiconductor region 8b, in the first heat treatment at Step S4, preferably the heat treatment temperature is 200° C. or more and the heat treatment time is 5 seconds or more.

Figure 6:
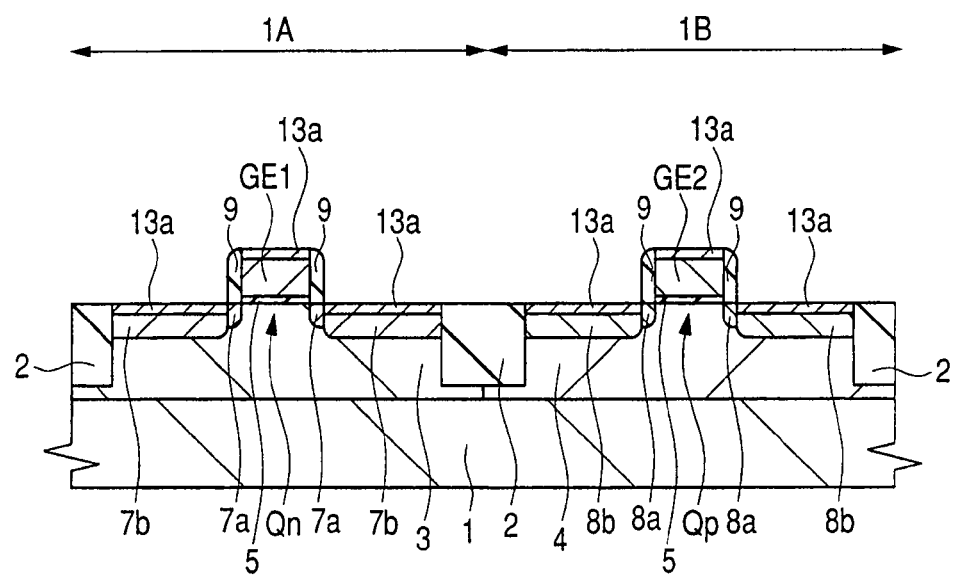
FIG. 6 is a cross-sectional view of the essential part in the manufacturing process of the semiconductor device subsequent to FIG. 5.

Next, by performing a wet washing treatment using, for example, a sulfuric acid hydrogen peroxide mixture or the like, the barrier film 12 and the unreacted alloy film 11 (that is, the alloy film 11 that did not react with the gate electrode GE1 or GE2, n$^+$-type semiconductor region 7b or p$^+$-type semiconductor region 8b in the first heat treatment process) are removed (Step S5 in FIG. 4). On this occasion, the unreacted alloy film 11 is removed, but the metal silicide layer 13a is left on the surface of gate electrodes GE1 and GE2, and the n$^+$-type semiconductor region 7b and p$^+$-type semiconductor region 8b. FIG. 6 shows a stage at which the barrier film 12 and unreacted alloy film 11 have been removed by the wet washing treatment at Step S5.

Figure 7:
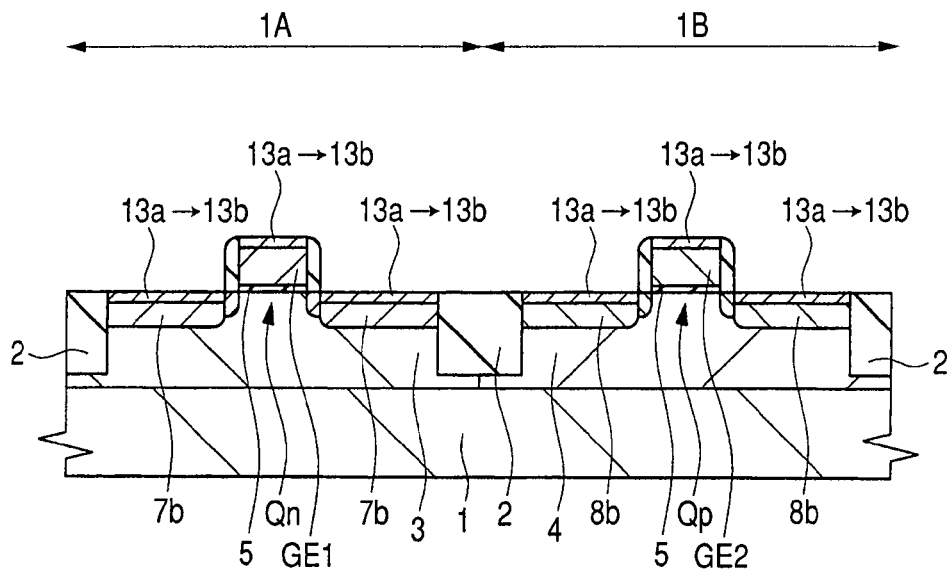
FIG. 7 is a cross-sectional view of the essential part in the manufacturing process of the semiconductor device subsequent to FIG. 6.

Next, the semiconductor substrate 1 is subjected to a second heat treatment (an annealing treatment) (Step S6 in FIG. 4). By performing the second heat treatment at Step S6, as shown in FIG. 7, the metal silicide layer 13a of the $(Ni_{1-y}Pt_y)_2Si$ phase formed by the first heat treatment at Step S4 changes into the metal silicide layer 13b of the $Ni_{1-y}Pt_ySi$ phase, to form the stable metal silicide layer 13b that has a composition ratio between metal elements (the sum of Ni and Pt) and Si of 1:1, which is nearer to the stoichiometric ratio.

That is, by allowing the metal silicide layer 13a of the $(Ni_{1-y}Pt_y)_2Si$ phase to react further with the Si of gate electrodes GE1 and GE2, and the n$^+$-type semiconductor region 7b and p$^+$-type semiconductor region 8b by the second heat treatment at Step S6, the metal silicide layer 13b made of the $Ni_{1-y}Pt_ySi$ phase that is more stable and has a lower resistivity than that made of the $(Ni_{1-y}Pt_y)_2Si$ phase is formed on the surface (an upper layer portion) of gate electrodes GE1 and GE2, and the n$^+$-type semiconductor region 7b and p$^+$-type semiconductor region 8b. Accordingly, both metal silicide layer 13a and metal silicide layer 13b are made of silicide of Ni and Pt (nickel platinum silicide, platinum-added nickel silicide), wherein the metal silicide layer 13a has the $(Ni_{1-y}Pt_y)_2Si$ phase, and the metal silicide layer 13b has the $Ni_{1-y}Pt_ySi$ phase.

Since it is necessary to perform the second heat treatment at Step S6 at temperatures that can change the metal silicide layer 13a of the $(Ni_{1-y}Pt_y)_2Si$ phase into the metal silicide layer 13b of the $Ni_{1-y}Pt_ySi$ phase, the heat treatment temperature in the second heat treatment needs to be higher than at least the heat treatment temperature in the first heat treatment. Further, in order not to allow the metal silicide layer 13b to have the $Ni_{1-y}Pt_ySi_2$ phase with a higher resistivity than the $Ni_{1-y}Pt_ySi$ phase, the second heat treatment at Step S6 is preferably performed at heat treatment temperatures that enable the metal silicide layer 13b to have the $Ni_{1-y}Pt_ySi$ phase but not to have the $Ni_{1-y}Pt_ySi_2$ phase.

Meanwhile, the $Ni_{1-y}Pt_ySi$ phase has a lower resistivity than the $(Ni_{1-y}Pt_y)_2Si$ phase and $Ni_{1-y}Pt_ySi_2$ phase. Also in processes after the second heat treatment at Step S6 (up to the end of manufacturing a semiconductor device), the phase of the metal silicide layer 13b is maintained to $Ni_{1-y}Pt_ySi$ with low resistivity without change, and, in manufactured semiconductor devices (for example, even in a state where the semiconductor substrate 1 is divided into isolated pieces to form semiconductor chips), the phase of the metal silicide layer 13b is $Ni_{1-y}Pt_ySi$ with low resistivity.

The second heat treatment at Step S6 may be performed using, for example, an RTA method such as lamp anneal. The second heat treatment at Step S6 is performed, in the embodiment, at a temperature of preferably 525° C. or less, more preferably 500° C. or less for, preferably, 30 seconds or less. The second heat treatment at Step S6 is performed in preferably a nitrogen ($N_2$) gas atmosphere, but may be performed in an inert gas (for example, argon (Ar) gas, neon (Ne) gas or helium (He) gas) atmosphere or a mixed gas atmosphere of an inert gas and nitrogen gas.

As described above, the metal silicide layer 13b of the $Ni_{1-y}Pt_ySi$ phase is formed at the surface (an upper portion) of the GE1 and source/drain region (the $n^+$-type semiconductor region 7b) of the n-channel type MISFET Qn, and at the surface (an upper portion) of the gate electrode GE2 and source/drain region (the $p^+$-type semiconductor region 8b) of the p-channel type MISFET Qp.

Meanwhile, in the embodiment, as described later, it is important to suppress the heat treatment temperature and heat treatment time of the second heat treatment at Step S6 to values not more than the aforementioned values, so that the second heat treatment at Step S6 does not become excessive. However, from the standpoint of forming the metal silicide layer 13b of the $Ni_{1-y}Pt_ySi$ phase to lower the resistivity of the metal silicide layer 13b, in the second heat treatment at Step S6, preferably the heat treatment temperature is 400° C. or more and the heat treatment time is 5 seconds or more.

After the formation of the metal silicide layer 13b at Step S1 as described above, as shown in FIG. 8, the tensile stress film TSL1 is formed over the whole main face of the semiconductor substrate 1, that is, the main face of the semiconductor substrate 1 including the nMIS formation region 1A and pMIS formation region 1B (Step S11 in FIG. 3). At Step S11 in FIG. 3, the tensile stress film TSL1 is formed over the semiconductor substrate 1 including the metal silicide layer 13b so as to cover the gate electrodes GE1 and GE2 and the sidewall 9. The tensile stress film TSL1 may be formed using a plasma CVD method or the like. The most suitable material for the tensile stress film TSL1 is silicon nitride (SiN) and the most suitable thickness of the tensile stress film TSL1 ranges from 20 nm to 50 nm, but silicon carbide (SiC), silicon carbonitride (SiCN) or silicon carboxide (SiCO) may also be used as the material for the tensile stress film TSL1.

When forming the tensile stress film TSL1 made of silicon nitride, a silicon nitride film is formed using silane ($SiH_4$), dinitrogen monoxide ($N_2O$) and ammonia ($NH_3$) by plasma CVD at a temperature of around 250° C. to 400° C., and, after that, the product is subjected to a heat treatment of around 400° C. to 550° C. while being irradiated with ultraviolet rays to form the tensile stress film TSL1 made of a silicon nitride film.

Meanwhile, in Embodiment 1 and Embodiments 2 to 12 below, respective films (such as the tensile stress film TSL1, or a compression stress film CSL1, interlayer insulating film 21, insulating film 31, 41, 51, 61 or 62 to be described later) to be formed over the main face of the semiconductor substrate 1 after the metal silicide layer 13b is formed are formed so as to cover the n-channel type MISFET Qn formed at the nMIS formation region 1A and the p-channel type MISFET Qp formed at the pMIS formation region 1B. That is, the film (such as the tensile stress film TSL1, or a compression stress film CSL1, interlayer insulating film 21, insulating film 31, 41, 51, 61 or 62 to be described later) is formed so as to cover the gate electrodes GE1 and GE2, the $n^+$-type semiconductor region 7b and $p^+$-type semiconductor region 8b.

Figure 9:
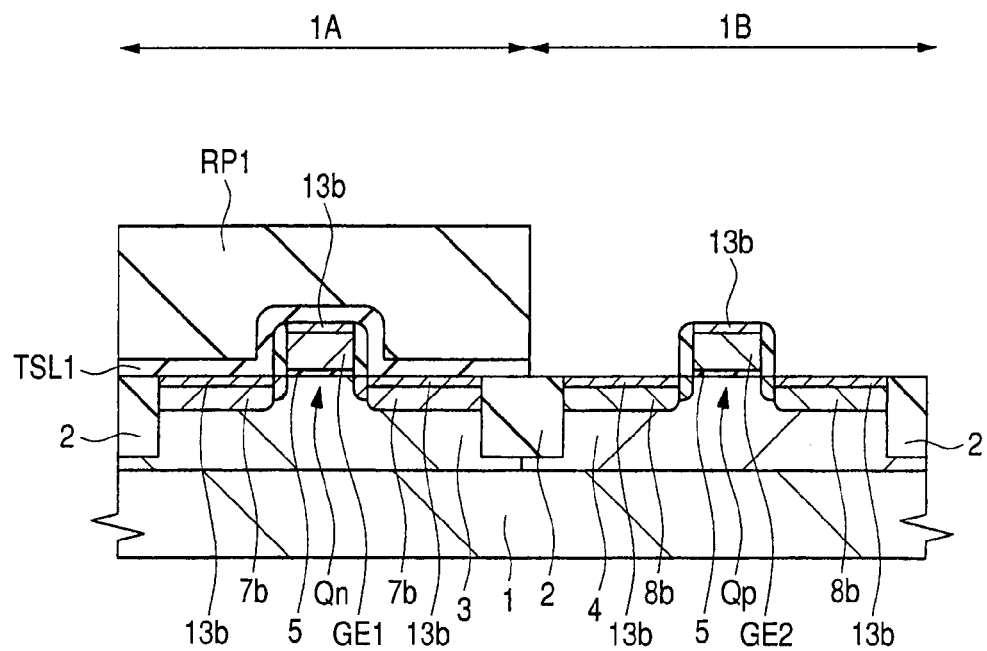
FIG. 9 is a cross-sectional view of the essential part in the manufacturing process of the semiconductor device subsequent to FIG. 8.
Figure 10:
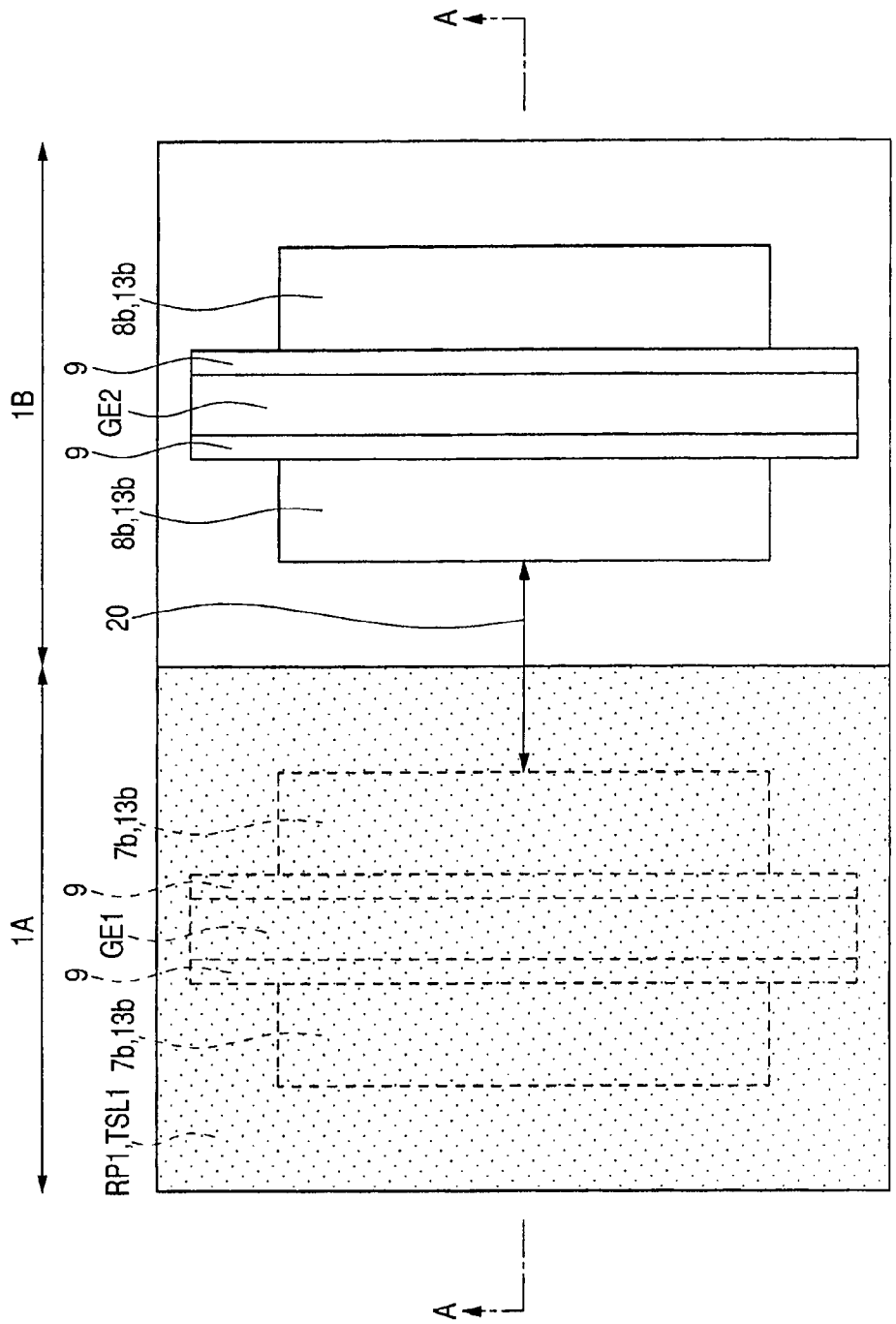
FIG. 10 is a plan view of the essential part in the manufacturing process of the semiconductor device subsequent to FIG. 8.

Next, as shown in FIGS. 9 and 10, a photoresist film (a photoresist pattern, resist film, mask layer) RP1 that covers the nMIS formation region 1A and exposes the pMIS formation region 1B is formed over the tensile stress film TSL1 using a photolithographic method, and, after that, the tensile stress film TSL1 in the pMIS formation region 1B is dry-etched and removed, using the photoresist film RP1 as an etching mask (Step S12 in FIG. 3). In dry etching process at Step S12 in FIG. 3, since the photoresist film RP1 functions as an etching mask, the tensile stress film TSL1 in the nMIS formation region 1A is not etched but is left. After that, the photoresist film RP1 is removed by ashing or the like.

Under a boundary line (a border) between a dry etching target region (a region where the tensile stress film TSL1 is etched and removed) and a dry etching non-target region (a region where the tensile stress film TSL1 is not etched but is left) upon dry-etching the tensile stress film TSL1 at Step S12 in FIG. 3, the element isolation region 2 preferably lies in order to protect the metal silicide layer 13b. Specifically, in the region schematically shown by numeral 20 in FIG. 10 being a plan view, the boundary line between the target region and the non-target region for dry etching lies preferably. Meanwhile, the dry etching target region also corresponds to a region that is exposed from a photoresist film for an etching mask (here, the photoresist film RP1), and the dry etching non-target region also corresponds to a region that is covered with a photoresist film for the etching mask (here, the photoresist film RP1).

Figure 11:
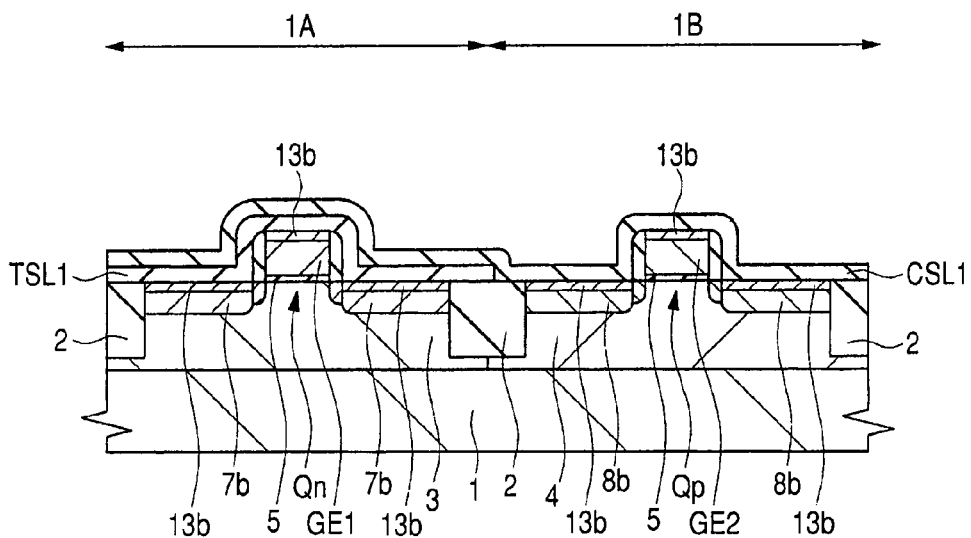
FIG. 11 is a cross-sectional view of the essential part in the manufacturing process of the semiconductor device subsequent to FIG. 9.

Next, as shown in FIG. 11, the compression stress film CSL1 is formed over the whole main face of the semiconductor substrate 1, that is, over the main face of the semiconductor substrate 1 including the nMIS formation region 1A and pMIS formation region 1B (Step S13 in FIG. 3). At Step S13 in FIG. 3, the compression stress film CSL1 is formed, in the pMIS formation region 1B, over the semiconductor substrate 1 including the metal silicide layer 13b so as to cover the gate electrode GE2 and sidewall 9 on the side wall thereof, and is formed, in the nMIS formation region 1A, over the tensile stress film TSL1 because the tensile stress film TSL1 exists.

The compression stress film CSL1 may be formed using a plasma CVD method. The most suitable material for the compression stress film CSL1 is silicon nitride (SiN) and the most suitable thickness of the compression stress film CSL1 ranges from 20 nm to 50 nm, but silicon carbide (SiC), silicon carbonitride (SiCN) or silicon carboxide (SiCo) may also be used as the material for the compression stress film CSL1.

When forming the compression stress film CSL1 made of silicon nitride, by forming a silicon nitride film by plasma CVD using silane ($SiH_4$), dinitrogen monoxide ($N_2O$) and ammonia (NH$_3$) at a temperature of around 350° C. to 500° C., the compression stress film CSL1 made of a silicon nitride film may be formed.

Meanwhile, in the embodiment and Embodiments 2 to 12 below, the tensile stress film means a film (an insulating film) that gives tensile stress to a semiconductor substrate at which the tensile stress film is formed, and in a region where the tensile stress film is formed over the semiconductor substrate, the tensile stress film operates (gives, generates) tensile stress on the semiconductor substrate. When the tensile stress film operates tensile stress on the semiconductor substrate (a channel region therein) at which the n-channel type MISFET has been formed, the mobility of electrons increases and the like to enable the ON current flowing the channel of the n-channel type MISFET to increase. The tensile stress film is occasionally referred to as a stress film of tension. On the other hand, the compression stress film means a film (an insulating film) that gives compression stress to a semiconductor substrate at which the compression stress film is formed, and in a region where the compression stress film is formed over the semiconductor substrate, the compression stress film operates (gives, generates) compression stress on the semiconductor substrate. When the compression stress film operates compression stress on the semiconductor substrate (a channel region therein) at which the p-channel type MISFET has been formed, the mobility of holes increases and the like to enable the ON current flowing the channel of the p-channel type MISFET to increase. The compression stress film is occasionally referred to as a stress film of compression.

Figure 12:
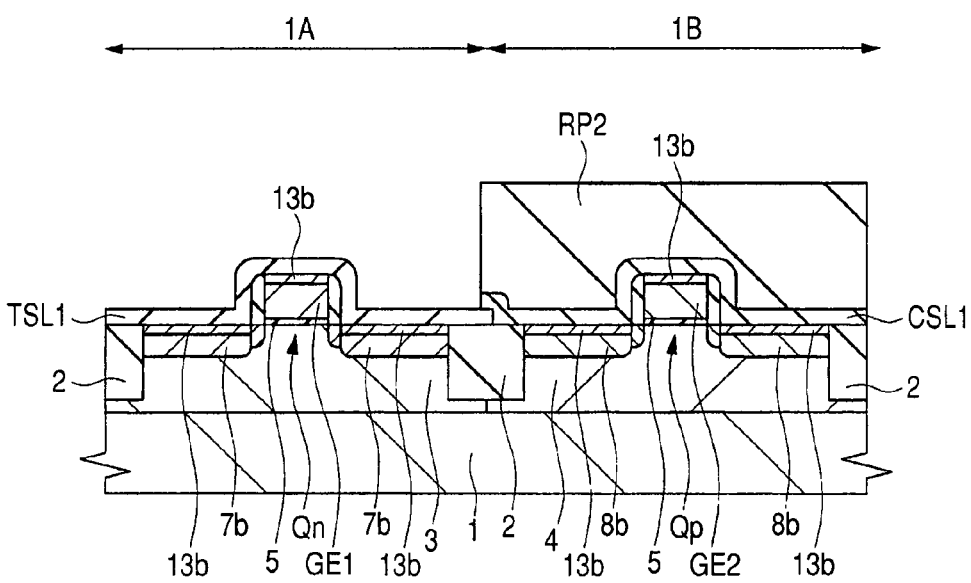
FIG. 12 is a cross-sectional view of the essential part in the manufacturing process of the semiconductor device subsequent to FIG. 11.

Next, as shown in FIG. 12, after the formation of a photoresist film (a photoresist pattern, resist film, mask layer) RP2 that covers the pMIS formation region 1B and exposes the nMIS formation region 1A using a photolithographic method, the compression stress film CSL1 in the nMIS formation region 1A is dry-etched and removed, using the photoresist film RP2 as an etching mask (Step S14 in FIG. 3). In the dry etching process at Step S14 in FIG. 3, it is so designed that the tensile stress film TSL1 of the nMIS formation region 1A is not removed but is left by controlling the over etching amount. Since the photoresist film RP2 functions as an etching mask, the compression stress film CSL1 in the pMIS formation region 1B is not etched but is left.

Upon dry-etching the compression stress film CSL1 at Step S14 in FIG. 3, it is preferable to design to form such a portion that a part of the compression stress film CSL1 covers the tensile stress film TSL1 in order to prevent damage given to the element isolation region 2 by the dry etching, as shown in FIG. 12. That is, at the end of the dry etching of the compression stress film CSL1 at Step S14, the compression stress film CSL1 is set to overlap (cover) a part (an end portion neighborhood region) of the tensile stress film TSL1 over the element isolation region 2 between the nMIS formation region 1A and the pMIS formation region 1B.

Since the compression stress on the n-channel type MISFET Qn by the compression stress film CSL1 is unnecessary, the dry etching process of the compression stress film CSL1 at Step S14 in FIG. 3 is preferably performed, but, as another embodiment, a dry etching process (including a process of forming the photoresist film RP2) of the compression stress film CSL1 at Step S14 in FIG. 3 may be omitted. When the dry etching process of the compression stress film CSL1 at Step S14 in FIG. 3 is omitted, upon opening a contact hole 22, which is described later, since the tensile stress film TSL1 of the nMIS formation region 1A is covered with the compression stress film CSL1, the compression stress film CSL1 over the tensile stress film TSL1 must be etched prior to etching the film TSL1 by a dry etching method at the bottom portion of the contact hole 22 of the nMIS formation region 1A.

Meanwhile, in Embodiment 1 and Embodiments 2 to 12 below, when respective films (such as the tensile stress film TSL1, the compression stress film CSL1, the insulating films 31, 41, 51, 61 and 62 described later) formed over the main face of the semiconductor substrate 1 after the formation of the metal silicide layer 13b are removed in the nMIS formation region 1A, as the result, a part of the film that covers the gate electrode GE1 and n$^+$-type semiconductor region 7b will be removed. Also, when respective films (such as the tensile stress film TSL1, the compression stress film CSL1, the insulating films 31, 41, 51, 61 and 62 described later) formed over the main face of the semiconductor substrate 1 after the formation of the metal silicide layer 13b are removed in the pMIS formation region 1B, as the result, a part of the film that covers the gate electrode GE2 and p$^+$-type semiconductor region 8b will be removed. On the other hand, when respective films (such as the tensile stress film TSL1, the compression stress film CSL1, the insulating films 31, 41, 51, 61 and 62 described later) formed over the main face of the semiconductor substrate 1 after the formation of the metal silicide layer 13b are left in the nMIS formation region 1A, as the result, a part of the film that covers the gate electrode GE1 and n$^+$-type semiconductor region 7b will be left. And, when respective films (such as the tensile stress film TSL1, the compression stress film CSL1, the insulating films 31, 41, 51, 61 and described later) formed over the main face of the semiconductor substrate 1 after the formation of the metal silicide layer 13b are left in the pMIS formation region 1B, a part of the film that covers the gate electrode GE2 and p$^+$-type semiconductor region 8b will be left.

Figure 13:
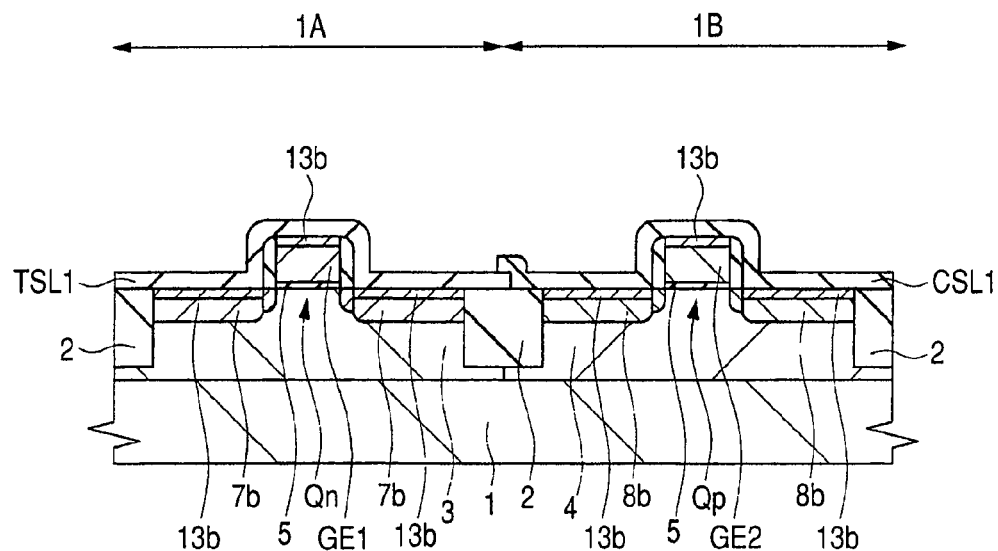
FIG. 13 is a cross-sectional view of the essential part in the manufacturing process of the semiconductor device subsequent to FIG. 12.
Figure 14:
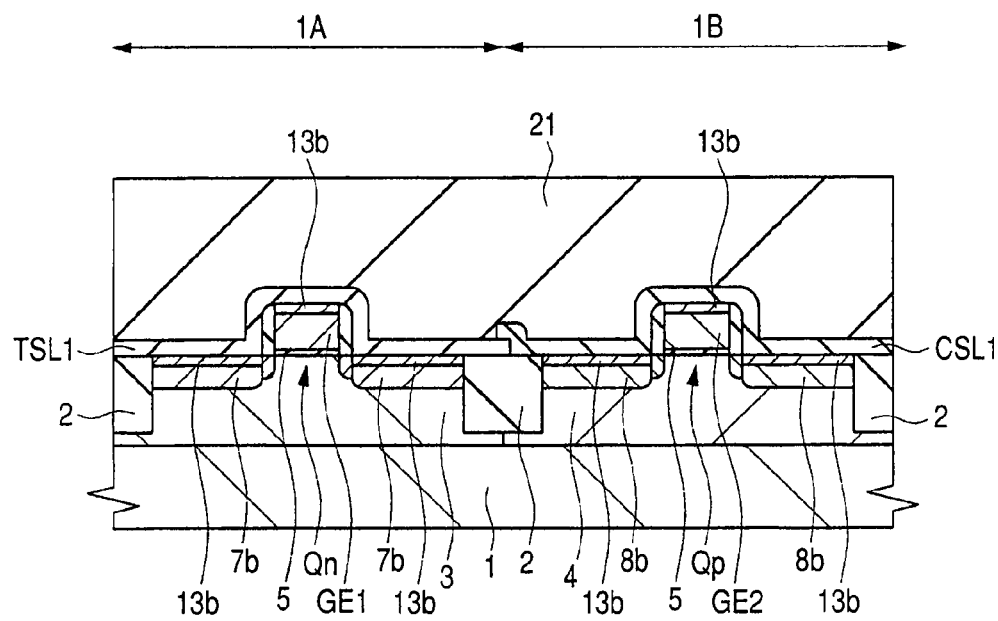
FIG. 14 is a cross-sectional view of the essential part in the manufacturing process of the semiconductor device subsequent to FIG. 13.

Next, as shown in FIG. 13, the photoresist film RP2 is removed by ashing or the like.

Next, as shown in FIG. 14, an interlayer insulating film 21 is formed over the whole main face of the semiconductor substrate 1, that is, over the main face of semiconductor substrate 1 including the nMIS formation region 1A and pMIS formation region 1B, (Step S15 in FIG. 3). The interlayer insulating film 21 is formed over the tensile stress film TSL1 and compression stress film CSL1, wherein the thickness of the interlayer insulating film 21 is greater than that of the tensile stress film TSL1 and compression stress film CSL1. As the material of the interlayer insulating film 21, for example, silicon oxide or the like may be employed. After the formation of the interlayer insulating film 21, the surface of the interlayer insulating film 21 is polished by a CMP method, or the like, and thereby the upper surface of the interlayer insulating film 21 is flattened.

Figure 15:
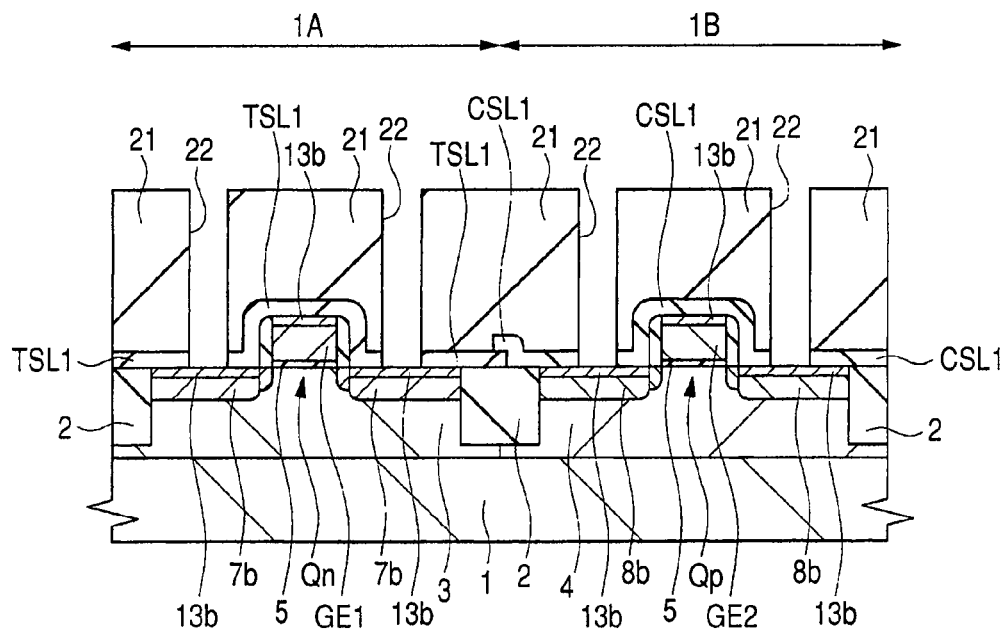
FIG. 15 is a cross-sectional view of the essential part in the manufacturing process of the semiconductor device subsequent to FIG. 14.

Next, as shown in FIG. 15, by dry-etching of the interlayer insulating film 21, compression stress film CSL1 and tensile stress film TSL1 using a photoresist pattern (not shown) formed over the interlayer insulating film 21 as an etching mask, contact holes (a through hole, hole) are formed at the interlayer insulating film 21, compression stress film CSL1 and tensile stress film TSL1. On this occasion, in the nMIS formation region 1A, at a laminated film made of the interlayer insulating film 21 and tensile stress film TSL1 under it, the contact hole 22 passing through the laminated film is formed, and, in the pMIS formation region 1B, at a laminated film made of the interlayer insulating film 21 and compression stress film CSL1 under it, the contact hole 22 passing through the laminated film is formed.

In order to form the contact hole 22, firstly, dry etching of the interlayer insulating film 21 is performed under conditions in which the interlayer insulating film 21 is etched more easily as compared with the compression stress film CSL1 and tensile stress film TSL1, and, by allowing the compression stress film CSL1 and tensile stress film TSL1 to function as the etching stopper film, the contact hole 22 is formed at the interlayer insulating film 21. After that, under conditions in which the compression stress film CSL1 and tensile stress film TSL1 are etched more easily as compared with the interlayer insulating film 21, the compression stress film CSL1 at the bottom portion of the contact hole 22 of the pMIS formation region 1B, and the tensile stress film TSL1 at the bottom portion of the contact hole 22 of the nMIS formation region 1A are dry-etched and removed, and thereby the contact hole 22 as a through hole is formed.

At the bottom portion of the contact hole 22 formed at the upper portion of the $n^+$-type semiconductor region 7b in the nMIS formation region 1A, the metal silicide layer 13b over the $n^+$-type semiconductor region 7b is exposed. Also, at the bottom portion of the contact hole 22 formed at the upper portion of the $p^+$-type semiconductor region 8b in the pMIS formation region 1B, the metal silicide layer 13b over the $p^+$-type semiconductor region 8b is exposed. This is the same also in Embodiments 2 to 12 below.

Figure 16:
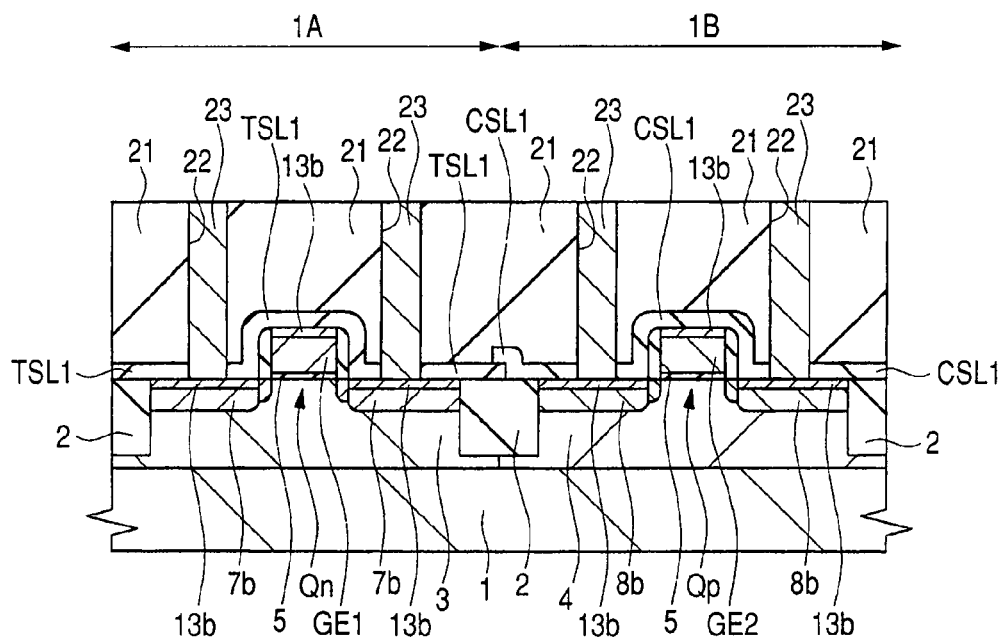
FIG. 16 is a cross-sectional view of the essential part in the manufacturing process of the semiconductor device subsequent to FIG. 15.

Next, as shown in FIG. 16, in the contact hole 22, an electroconductive plug (a conductor portion for connection) 23 made of tungsten (W) or the like is formed. In order to form the plug 23, for example, over the interlayer insulating film 21 including the inside of the contact hole 22 (on the bottom portion and side wall), a barrier conductor film (for example, a titanium film, titanium nitride film, or laminated film thereof) is formed. After that, over the barrier conductor film, a main conductor film made of a tungsten film or the like is formed so as to be buried into the contact hole 22, and, by removing an unnecessary main conductor film and barrier conductor film over the interlayer insulating film 21 by a CMP method, etch back method, or the like, the plug 23 can be formed. Meanwhile, for simplifying the drawing, in FIG. 16, the barrier conductor film and main conductor film (a tungsten film) constituting the plug 23 is shown in an integrated shape.

The plug 23 formed at the upper portion of the $n^+$-type semiconductor region 7b in the nMIS formation region 1A is in contact with and electrically connected to the metal silicide layer 13b on the surface of the $n^+$-type semiconductor region 7b at the bottom portion thereof. Also, the plug 23 formed at the upper portion of the $p^+$-type semiconductor region 8b in the pMIS formation region 1B is in contact with and electrically connected to the metal silicide layer 13b on the surface of the $p^+$-type semiconductor region 8b at the bottom portion thereof. This is the same also in Embodiments 2 to 12 below.

Figure 17:
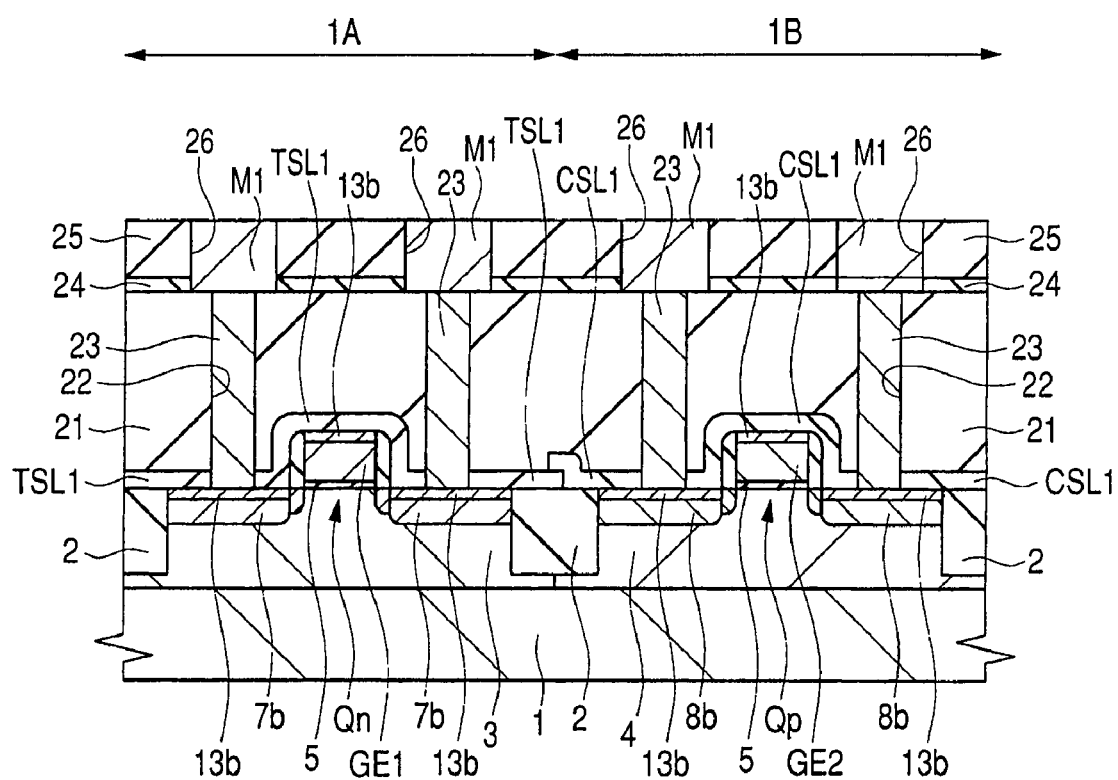
FIG. 17 is a cross-sectional view of the essential part in the manufacturing process of the semiconductor device subsequent to FIG. 16.

Next, as shown in FIG. 17, over the interlayer insulating film 21 into which the plug 23 is embedded, a stopper insulating film (an insulating film for an etching stopper) 24 and an insulating film (an interlayer insulating film) 25 for forming wiring are successively formed. The stopper insulating film 24 is a film that works as an etching stopper upon processing a groove to the insulating film 25, for which a material having an etching selectivity relative to the insulating film 25 is used. For example, it is possible to set a silicon nitride film as the stopper insulating film 24, and to set a silicon oxide film as the insulating film 25.

Next, by a single damascene method, wiring of a first layer is formed. Firstly, after the formation of a wiring groove 26 in a prescribed region of the insulating film 25 and stopper insulating film 24 by dry etching using a resist pattern (not shown) as a mask, the barrier conductor film (for example, a titanium nitride film, tantalum film, tantalum nitride film or the like) is formed over the main face of the semiconductor substrate 1 (that is, over the insulating film 25 including the bottom portion and side wall of the wiring groove 26). Subsequently, a seed layer of copper is formed over the barrier conductor film by a CVD method, sputtering method or the like, further, using an electrolytic plating method or the like, a copper plated film is formed over the seed layer, and the inside of the wiring groove 26 is embedded with the copper plated film. Then, the copper plated film, seed layer and barrier metal film in regions other than the wiring groove 26 are removed by a CMP method, and then wiring M1 of the first layer including copper as a main electroconductive material is formed. Note that, for simplifying the drawing, in FIG. 17, the copper plated film, seed layer and barrier conductor film constituting the wiring M1 is shown in an integrated shape.

The wiring M1 is electrically coupled to the $n^+$-type semiconductor region 7b and $p^+$-type semiconductor region 8b for the source or drain of the n-channel type MISFET Qn and p-channel type MISFET Qp and the like via the plug 23. After that, by a dual damascene method or the like, wirings for second and subsequent layers are formed, but, here, drawings and description thereof are omitted. Further, the wiring M1 is not limited to a damascene wiring, but may also be formed by patterning an electroconductive material film for wiring, for example, tungsten wiring, aluminum wiring or the like is also adoptable.

In the semiconductor device of the embodiment manufactured as described above, as shown in FIG. 17, over the semiconductor substrate 1, the tensile stress film TSL1 is formed so as to cover the n-channel type MISFET Qn, that is, the gate electrode GE1 and $n^+$-type semiconductor region 7b, and, the compression stress film CSL1 is formed so as to cover the p-channel type MISFET Qp, that is, the gate electrode GE2 and $p^+$-type semiconductor region 8b. Further, at least a part of the compression stress film CSL1 formed afterward overlaps the tensile stress film TSL1 formed ahead.

Figure 18:
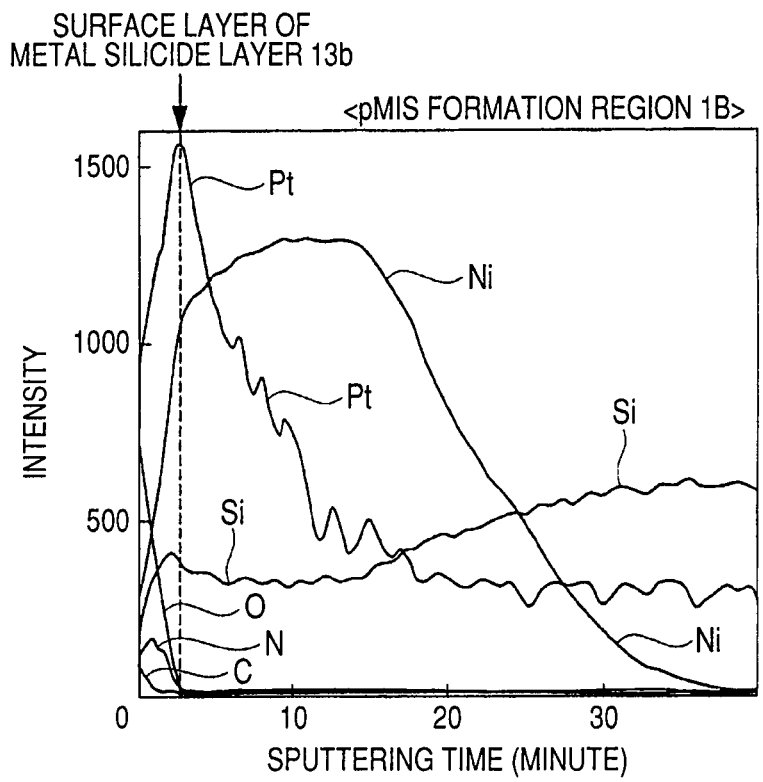
FIG. 18 is a graph showing a result of measurement with a SIMS for compositional distribution (compositional distribution in the depth direction) of a metal silicide layer of the pMIS formation region formed by the manufacturing process of Embodiment 1 of the invention.
Figure 19:
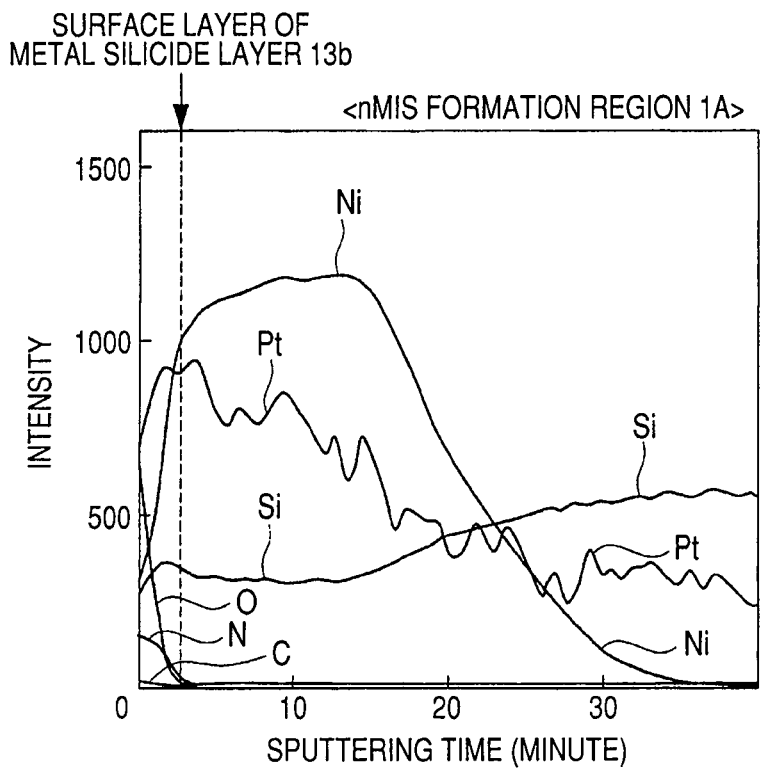
FIG. 19 is a graph showing a result of measurement with a SIMS for compositional distribution (compositional distribution in the depth direction) of a metal silicide layer of the nMIS formation region formed by the manufacturing process of Embodiment 1 of the invention.

FIG. 18 is a graph showing a result of measurement on compositional distribution (compositional distribution in the depth direction) of the metal silicide layer 13b of the pMIS formation region 1B formed by a manufacturing process of the embodiment by SIMS (Secondary Ion Mass Spectroscopy). FIG. 19 is a graph showing a result of measurement by SIMS on compositional distribution (compositional distribution in the depth direction) of the metal silicide layer 13b of the nMIS formation region 1A formed by the manufacturing process of the embodiment. The transverse axis of graphs in FIGS. 18 and 19 corresponds to a sputtering time, which shows, as is well known, depth direction (a position in the depth direction). The vertical axis of graphs in FIGS. 18 and 19 corresponds to intensity (detected intensity), which represents the concentration of respective elements. For example, in graphs in FIGS. 18 and 19, a position having a greater detected intensity of Pt (corresponds to the vertical axis of graphs in FIGS. 18 and 19) means the position with a higher Pt concentration. Meanwhile, graphs in FIGS. 18 and 19 show detected intensity of Pt (platinum), Ni (nickel), Si (silicon), O (oxygen), N (nitrogen) and C (carbon). In graphs in FIGS. 18 and 19, as is well known, the original surface of the metal silicide layer 13b is thought to be a position represented by a dotted line in the graph.

As is understood also from FIGS. 18 and 19, in both nMIS formation region 1A and pMIS formation region 1B, the distribution of the Pt concentration in the metal silicide layer 13b is not uniform in the depth direction, the Pt concentration is highest at the outermost surface of the metal silicide layer 13b, and the Pt concentration becomes lower as the depth from the outermost surface increases. The tendency is more significant for the metal silicide layer 13b of the pMIS formation region 1B as compared with the metal silicide layer 13b of the nMIS formation region 1A. That is, as compared with the Pt concentration distribution in the metal silicide layer 13b of the nMIS formation region 1A (corresponds to the Pt distribution in the graph in FIG. 19), the Pt concentration distribution in the metal silicide layer 13b of the pMIS formation region 1B (corresponds to the Pt distribution in the graph in FIG. 18) shows a Pt distribution more biased toward the outermost surface of the metal silicide layer 13b. Consequently, the Pt concentration of the surface of the metal silicide layer 13b of the pMIS formation region 1B (on the $p^+$-type semiconductor region 8b) is higher than that of the surface of the metal silicide layer 13b of the nMIS formation region 1A (on the $n^+$-type semiconductor region 7b).

Then, the peak value (the greatest value) in the Pt concentration distribution in the depth direction of the metal silicide layer 13b of the pMIS formation region 1B is 1.5 times or more the peak value (the greatest value) in the Pt concentration distribution in the depth direction of the metal silicide layer 13b of the nMIS formation region 1A. It is also possible to say that, as described above, since the Pt concentration is greatest (peak) at the outermost surface of the metal silicide layer 13b, the Pt concentration at the surface of the metal silicide layer 13b of the pMIS formation region 1B (on the $p^+$-type semiconductor region 8b) is 1.5 times or more the Pt concentration at the surface of the metal silicide layer 13b of the nMIS formation region 1A (on the $n^+$-type semiconductor region 7b). This means that the metal silicide layer 13b of the nMIS formation region 1A has the peak (the greatest) Pt concentration at the outermost surface thereof, the peak value (the greatest value) being denoted by $\alpha$ atom %, and the metal silicide layer 13b of the pMIS formation region 1B has the peak (the greatest) Pt concentration at the outermost surface thereof, the peak value (the greatest value) being denoted by $\beta$ atom %, and that the relation $\beta \geq \alpha \times 1.5$ is satisfied.

Figure 20:
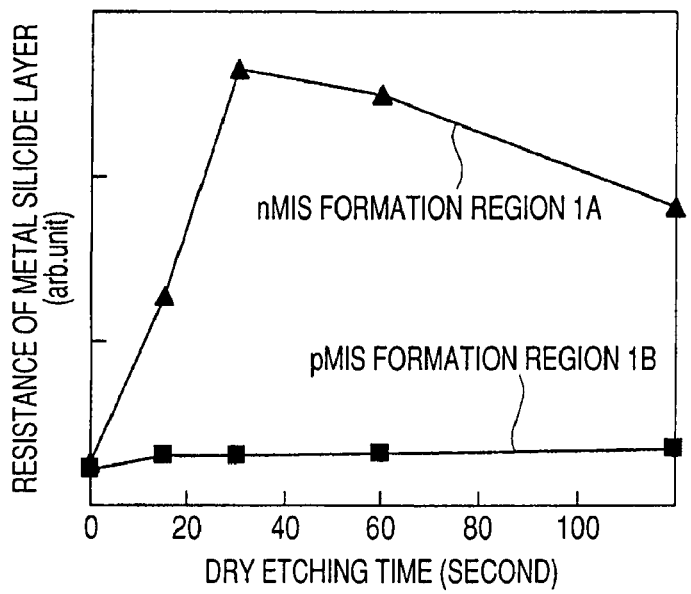
FIG. 20 is a graph showing the result checked on the relation between dry etching time and the resistance of a metal silicide layer when the tensile stress film is dry-etched in both nMIS formation region and pMIS formation region.

In FIG. 20, the graph shows the relation between dry etching time and resistance of the metal silicide layer 13b when the tensile stress film TSL1 is dry-etched in both nMIS formation region 1A and pMIS formation region 1B without forming the aforementioned photoresist film RP1 in dry etching process of the tensile stress film TSL1 at Step S12 differing from the embodiment. Accordingly, in the case shown by the graph in FIG. 20, when dry etching time (corresponds to the transverse axis of the graph in FIG. 20) is elongated, the tensile stress film TSL1 is removed in both nMIS formation region 1A and pMIS formation region 1B, and the metal silicide layer 13b is exposed and over-etched. Meanwhile, the transverse axis in FIG. 20 corresponds to dry etching time of the tensile stress film TSL1. Also, the vertical axis of the graph in FIG. 20 corresponds to the resistance of the metal silicide layer 13b after dry-etching the tensile stress film TSL1 for a prescribed time (corresponds to the transverse axis in FIG. 20).

As is understood also from the graph in FIG. 20, when dry etching time is elongated, in the nMIS formation region 1A, the metal silicide layer 13b is exposed and over-etched to raise the resistance of the metal silicide layer 13b. In contrast, in the pMIS formation region 1B, even when dry etching time is elongated, and the metal silicide layer 13b is exposed and over-etched, the resistance value of the metal silicide layer 13b is left to be low showing almost no change. The reason is considered as follows.

In the metal silicide layer 13b of the pMIS formation region 1B, the Pt concentration (corresponds to $\beta$ above) is high at the surface layer portion. It is considered that, since the surface layer portion having a high Pt concentration functions as a barrier against the over etching in dry etching, even when dry etching time is elongated and the metal silicide layer 13b of the pMIS formation region 1B is over-etched, the metal silicide layer 13b of the pMIS formation region 1B shows almost no change in the thickness and the resistance value of the metal silicide layer 13b shows almost no change. On the other hand, it is considered that, since the metal silicide layer 13b of the nMIS formation region 1A has a lower Pt concentration at the surface layer portion (corresponds to $\alpha$ above) as compared with the metal silicide layer 13b of the pMIS formation region 1B and a barrier function against the over etching is low in dry etching, when dry etching time is elongated and the metal silicide layer 13b is over-etched, the metal silicide layer 13b becomes thin to raise the resistance value of the metal silicide layer 13b.

That is, when the metal silicide layer 13b is formed over the $n^+$-type semiconductor region 7b of the nMIS formation region 1A and the $p^+$-type semiconductor region 8b of the pMIS formation region 1B by the same salicide process, the metal silicide layer 13b of the pMIS formation region 1B (on the $p^+$-type semiconductor region 8b) has a higher Pt concentration at the surface as compared with the metal silicide layer 13b of the nMIS formation region 1A (on the $n^+$-type semiconductor region 7b), and thereby resistance properties against the over etching becomes higher.

Accordingly, in the embodiment, while utilizing the fact that a higher Pt concentration leads to higher resistance properties against the over etching, the process is devised so that the metal silicide layer 13b of the pMIS formation region 1B, where the Pt concentration at the surface layer portion is easily heightened, is subjected to the over etching, but that the metal silicide layer 13b of the nMIS formation region 1A, where the Pt concentration at the surface layer portion is lower as compared with the metal silicide layer 13b of the pMIS formation region 1B, is not subjected to the over etching.

That is, in the embodiment, after the metal silicide layer 13b is formed at Step S1, the tensile stress film TSL1 is formed at Step S11 in FIG. 3, and then the tensile stress film TSL1 of the pMIS formation region 1B is removed by dry etching at Step S12 in FIG. 3. After that, the compression stress film CSL1 is formed at Step S13 in FIG. 3. Since the manufacture is performed according to this order of processes, after the formation of the tensile stress film TSL1 at Step S11 in FIG. 3, the metal silicide layer 13b of the pMIS formation region 1B having high resistance properties against the over etching is exposed in the dry etching process at Step S12 in FIG. 3 and may be over-etched, but, since it has high resistance properties against the over etching, the rise in the resistance of the metal silicide layer 13b hardly occurs. On the other hand, the metal silicide layer 13b of the nMIS formation region 1A having relatively lower resistance properties against the over etching than the metal silicide layer 13b of the pMIS formation region 1B is left, after the formation of the tensile stress film TSL1 at Step S11 in FIG. 3, to be covered with the tensile stress film TSL1 and not exposed, and not subjected to the over etching. Therefore, no rise in the resistance of the metal silicide layer 13b occurs. This can suppress or prevent the rise in the resistance of the metal silicide layer 13b caused by the over etching in both nMIS formation region 1A and pMIS formation region 1B. Accordingly, the performance and reliability of semiconductor devices can be improved.

In the embodiment, the metal silicide layer 13b contains Pt, and more preferably, as described above, the metal silicide layer 13b is constituted of nickel platinum silicide. Further, in order to raise resistance properties of the metal silicide layer 13b of the pMIS formation region 1B against the over etching, it is so designed that the Pt concentration at the surface of the metal silicide layer 13b of the pMIS formation region 1B (on the p+-type semiconductor region 8b) becomes higher than the Pt concentration inside the metal silicide layer 13b of the pMIS formation region 1B (on the p+-type semiconductor region 8b). More specifically, the metal silicide layer 13b is formed so as to have such Pt concentration distribution in the metal silicide layer 13b of the pMIS formation region 1B (on the p+-type semiconductor region 8b) that the Pt concentration is greatest at the surface of the metal silicide layer 13b and is lower at a deeper position (that is, as the depth from the surface of the metal silicide layer 13b increases). Here, the depth direction corresponds to the thickness direction of the semiconductor substrate 1, and to the direction perpendicular to the main face of the semiconductor substrate 1. In order to realize such Pt concentration distribution, the salicide process at Step S1 is devised as follows.

That is, in the embodiment, for the first heat treatment at Step S4, the heat treatment temperature is set to 290° C. or less and the heat treatment time is set to 30 seconds or less. When the first heat treatment at Step S1 is excessive, since Pt can sufficiently diffuse in the first heat treatment, the Pt concentration tends to distribute uniformly in the formed metal silicide layer 13a. In contrast, as in the embodiment, by suppressing the heat treatment temperature and heat treatment time in the first heat treatment at Step S4 as described above, it is possible to suppress the diffusion of Pt to make the Pt concentration distribution in the metal silicide layer 13a nonuniform, that is, to make the Pt concentration greatest at the surface of the metal silicide layer 13a, and the Pt concentration lower for a deeper position.

Further, in the embodiment, for the second heat treatment at Step S6, the heat treatment temperature is set to 525° C. or less, more preferably 500° C. or less, and the heat treatment time is set to 30 seconds or less. When the second heat treatment at Step S6 is excessive, even when the Pt concentration in the metal silicide layer 13a is distributed nonuniformly, since Pt can sufficiently diffuse in the second heat treatment, the Pt concentration tends to distribute uniformly in the formed metal silicide layer 13b. In contrast, as in the embodiment, by suppressing the heat treatment temperature and heat treatment time in the second heat treatment at Step S6 as described above, it is possible to form the metal silicide layer 13b, while maintaining the aforementioned nonuniformity of Pt concentration in the metal silicide layer 13a (the distribution in which the Pt concentration becomes greatest at the surface of the metal silicide layer 13a, and becomes lower at a deeper position). As the result, the Pt concentration in the metal silicide layer 13b distributes such that the Pt concentration becomes greatest at the surface of the metal silicide layer 13a and becomes lower at a deeper position.

Thus, in the embodiment, by devising the Pt concentration distribution in the metal silicide layer 13b of the pMIS formation region 1B and the order of processes for forming the tensile stress film TSL1 and compression stress film CSL1 as described above, it is possible to suppress or prevent the rise in the resistance of the metal silicide layer 13b for both nMIS formation region 1A and pMIS formation region 1B, and to improve the performance and reliability of semiconductor devices.

Further, in the embodiment, the case is described, where the metal silicide layer 13b is formed over a semiconductor region for source or drain (here, the n+-type semiconductor region 7b and p+-type semiconductor region 8b) and gate electrodes (GE1, GE2). As another embodiment, it is also possible not to form the metal silicide layer 13b over gate electrodes GE1 and GE2, but to form the metal silicide layer 13b over the semiconductor region for source or drain (here, the n+-type semiconductor region 7b and p+-type semiconductor region 8b). This is the same for Embodiments 2 to 12 below.

Embodiment 2

Figure 21:
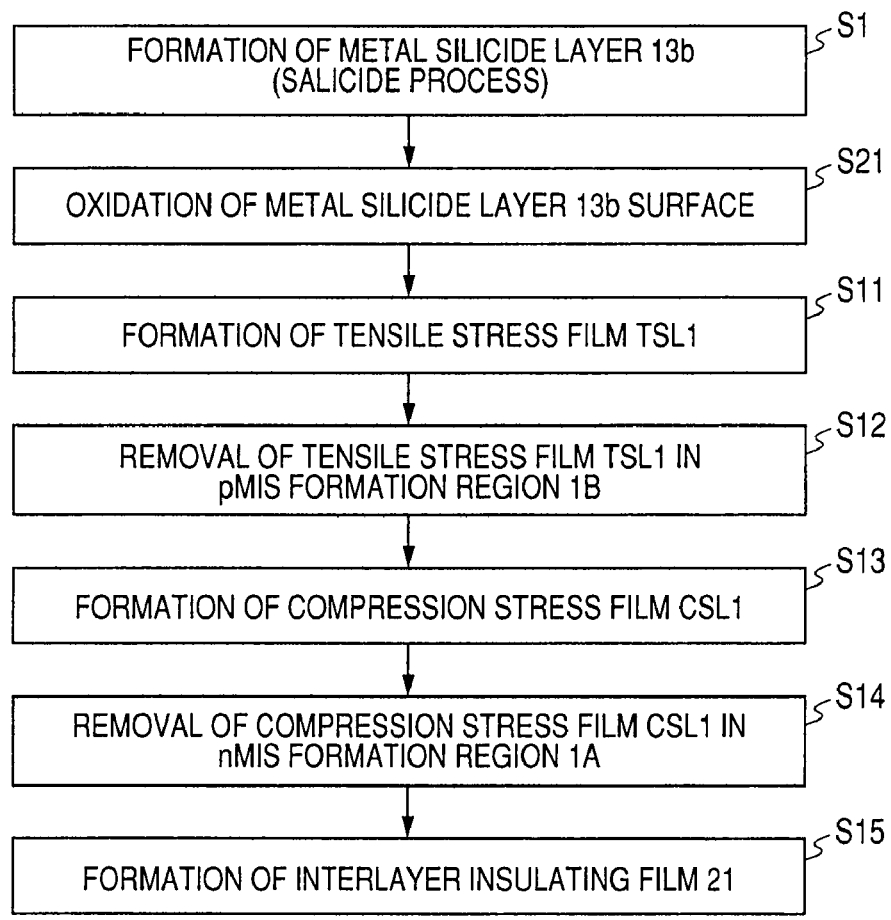
FIG. 21 is a manufacturing process flow chart showing a part of the manufacturing process of the semiconductor device being an Embodiment 2 of the invention.
Figure 22:
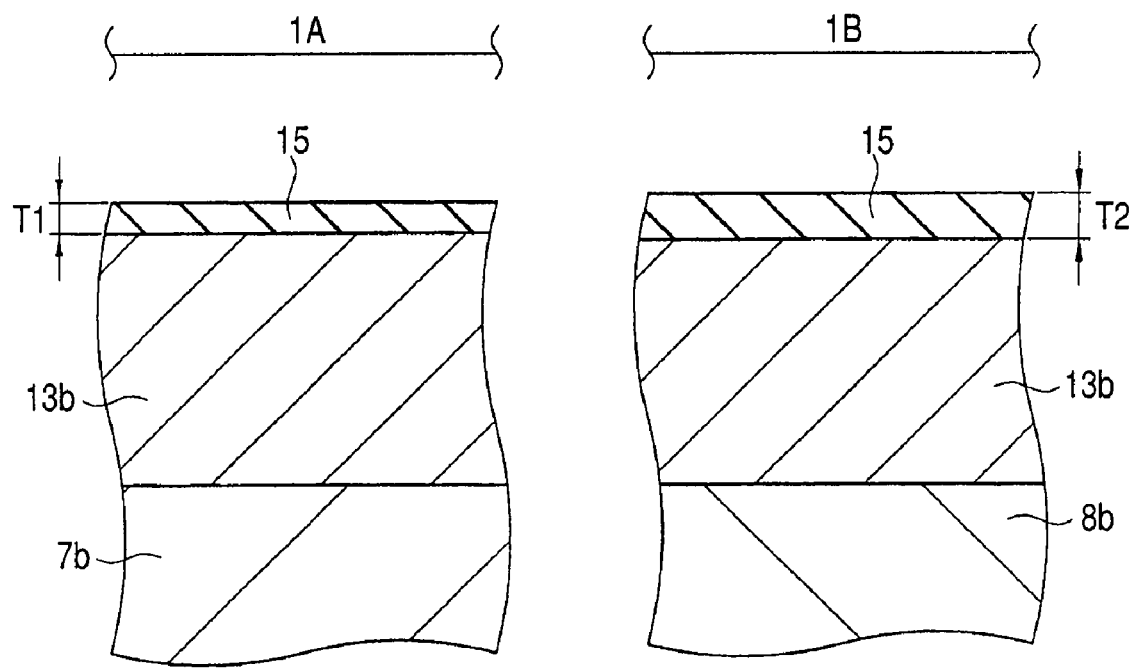
FIG. 22 is a cross-sectional view of the essential part in a manufacturing process of the semiconductor device being Embodiment 2 of the invention.

FIG. 21 is a manufacturing process flow chart showing a part of the manufacturing process of a semiconductor device of the present embodiment, which corresponds to FIG. 3 in Embodiment 1. FIG. 22 is a cross-sectional view of the essential part in a manufacturing process of a semiconductor device of the embodiment, which shows the neighborhood of the metal silicide layer 13b of the nMIS formation region 1A and pMIS formation region 1B.

The embodiment corresponds to a first modification of Embodiment 1. The manufacturing process of a semiconductor device of the embodiment is the same as that in Embodiment 1 up to the formation of the metal silicide layer 13b at Step S1, and the description thereof is omitted here.

In the embodiment, after the formation of the metal silicide layer 13b at Step Si above (that is, after the second heat treatment at Step S6 above), the surface of the metal silicide layer 13b is oxidized (Step S21 in FIG. 21). The oxidation process at Step S21 forms an oxide film (an oxidized film of metal silicide) 15 at the surface of the metal silicide layer 13b, as shown in FIG. 22. The oxide film 15 is an oxide film including elements constituting the metal silicide layer 13b (here, Ni, Pt and Si) and oxygen (O) as constitutional elements (that is, a compound film made of Ni, Pt, Si and O).

As a method of oxidizing the surface of the metal silicide layer 13b at Step S21, there is such method as treating it by oxygen plasma, treating it with hydrogen peroxide, or oxidizing it with an oxygen gas. In any of methods, the treatment is performed at the greatest temperature or less that is set at the formation of the metal silicide layer 13b, that is, at the aforementioned heat treatment temperature or less in the second heat treatment at Step S6.

As the thickness T1, T2 of the oxide film 15 formed at the surface of the metal silicide layer 13b by the oxidizing process at Step S21, around 1 nm to 5 nm is most suitable (that is, 1 nm≤T1≤5 nm, 1 nm≤T2≤5 nm). Further, the film thickness (thickness) T2 of the oxide film 15 formed at the surface of the metal silicide layer 13b (the metal silicide layer 13b on the p+-type semiconductor region 8b) in the pMIS formation region 1B is greater than the film thickness (thickness) T1 of the oxide film 15 formed at the surface of the metal silicide layer 13b (the metal silicide layer 13b on the n+-type semiconductor region 7b) in the nMIS formation region 1A (that is, T1<T2). The reason is so considered that the p-type substrate region (here, the p+-type semiconductor region 8b) and the n-type substrate region (here, the n+-type semiconductor region 7b) have surface states different from each other, and reactions at surfaces differ from each other.

Subsequent processes are the same as those in Embodiment 1, and the aforementioned process at Step S11 (the process of forming the tensile stress film TSL1) and subsequent processes are performed in the same way as those in Embodiment 1. That is, the embodiment corresponds to an embodiment in which a process for oxidizing the surface of the metal silicide layer 13b at Step S21 is added between the aforementioned salicide process at Step S1 and the aforementioned process for forming the tensile stress film TSL1 at Step S11.

The semiconductor device of the embodiment thus manufactured is different from the semiconductor device of Embodiment 1 in that the oxide film 15 is formed at the surface of the metal silicide layer 13b.

In the embodiment, following effects can be further obtained in addition to that obtained in Embodiment 1. That is, the oxide film 15 formed by oxidizing the surface of the metal silicide layer 13b at Step S21 in FIG. 21 can function as a barrier against the over etching (a protect film of the metal silicide layer 13b) upon removing the tensile stress film TSL1 of the pMIS formation region 1B at Step S12 in FIG. 21 by dry etching. This makes it possible to suppress or prevent more appropriately the rise in the resistance of the metal silicide layer 13b by the over etching. Accordingly, the performance and reliability of semiconductor devices can further be improved.

Further, as described above, the thickness T2 of the oxide film 15 formed at the surface of the metal silicide layer 13b in the pMIS formation region 1B is greater than the thickness T1 of the oxide film 15 formed at the surface of the metal silicide layer 13b in the nMIS formation region 1A (T1<T2). Consequently, upon removing the tensile stress film TSL1 of the pMIS formation region 1B by the dry etching at Step S12 in FIG. 21, since the oxide film 15 having a relatively greater thickness (the thickness T2) functions as a barrier against the over etching, the effect of suppressing the rise in the resistance of the metal silicide layer 13b caused by forming the oxide film 15 can sufficiently be obtained.

Embodiment 3

Figure 23:
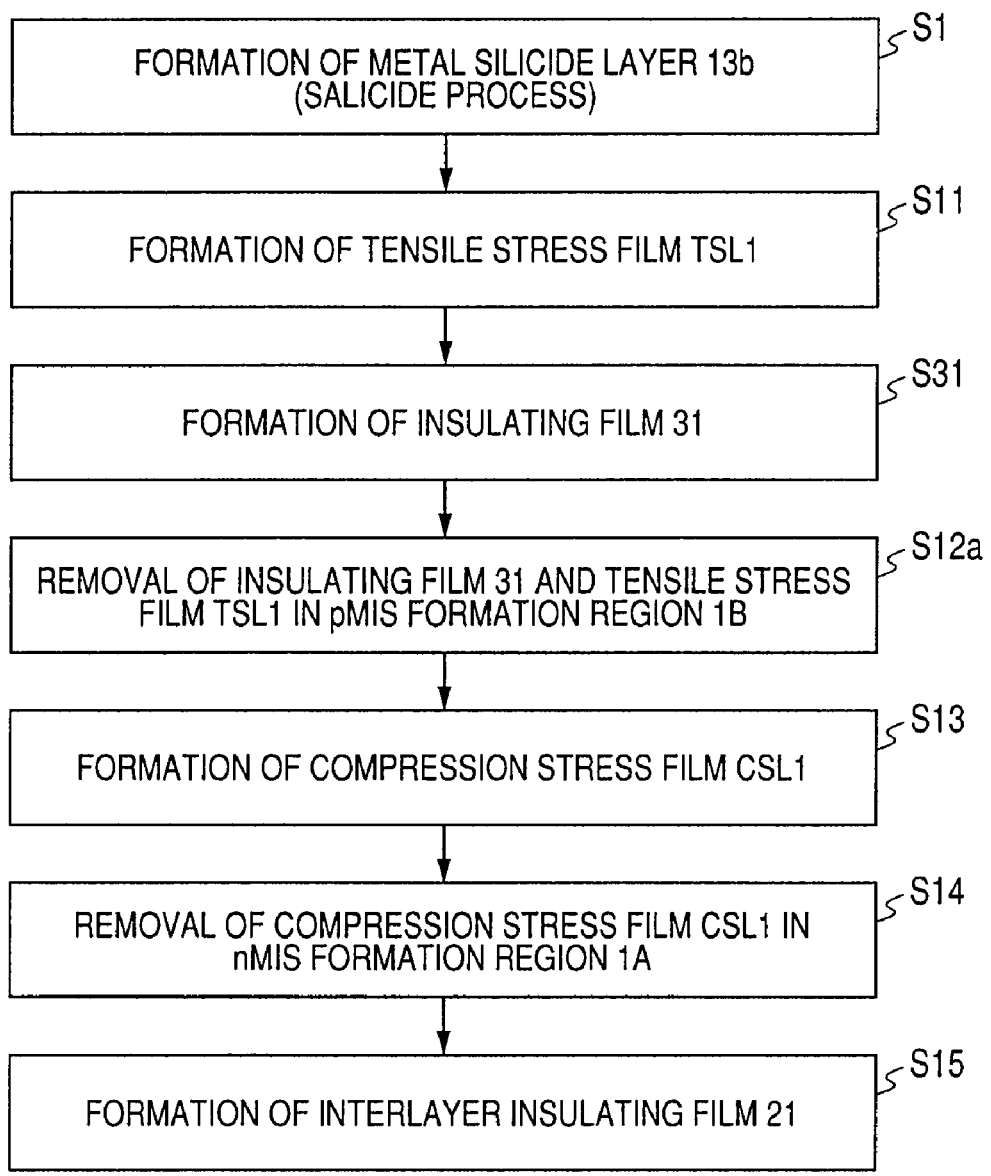
FIG. 23 is a manufacturing process flow chart showing a part of the manufacturing process of a semiconductor device being an Embodiment 3 of the invention.

FIG. 23 is a manufacturing process flow chart showing a part of the manufacturing process of a semiconductor device of the present embodiment, which corresponds to FIG. 3 in Embodiment 1. FIGS. 24 to 28 are cross-sectional views of the essential part in a manufacturing process of a semiconductor device of the embodiment.

The embodiment corresponds to a second modification of Embodiment 1. The manufacturing process of a semiconductor device in the embodiment is the same as that in Embodiment 1 up to the formation of the tensile stress film TSL1 at Step S11 (that is, up to the obtainment of the structure in FIG. 8), and the description thereof is omitted here. Further, also in the embodiment, an oxidizing process of the surface of the metal silicide layer 13b at Step S21 may be added between the salicide process at Step S1 and the process for forming the tensile stress film TSL1 at Step S11, as in Embodiment 2.

Figure 8:
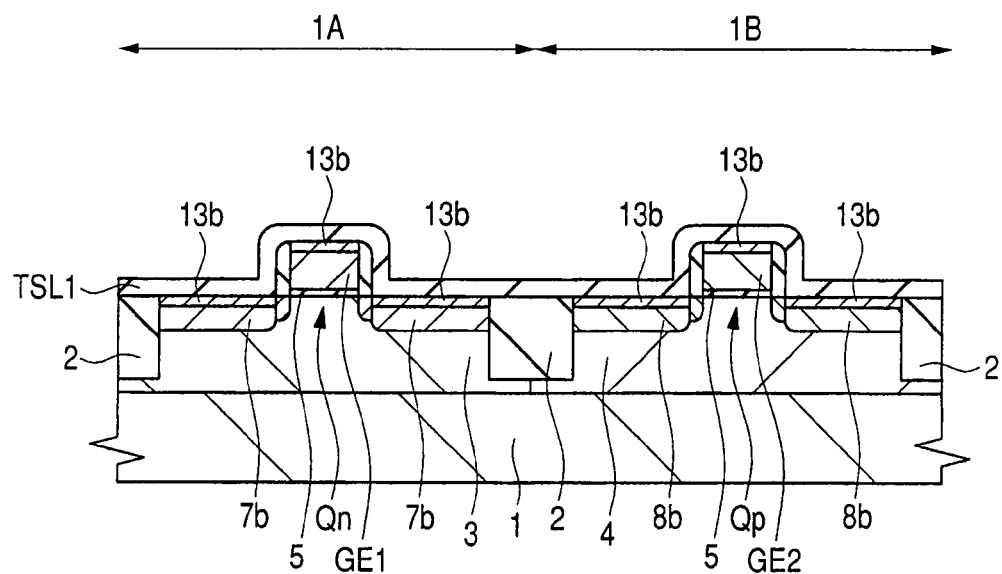
FIG. 8 is a cross-sectional view of the essential part in the manufacturing process of the semiconductor device subsequent to FIG. 7.
Figure 24:
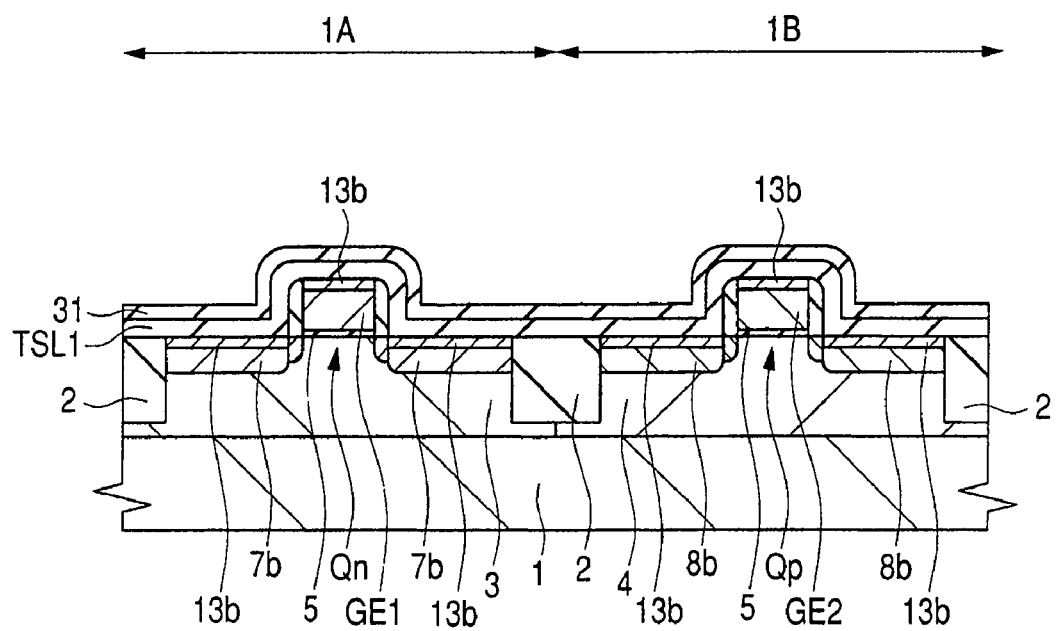
FIG. 24 is a cross-sectional view of the essential part in a manufacturing process of the semiconductor device being Embodiment 3 of the invention.

In the embodiment, after the formation of the tensile stress film TSL1 at Step S11 to give the structure in FIG. 8, as shown in FIG. 24, an insulating film 31 is formed over the whole main face of the semiconductor substrate 1 including the nMIS formation region 1A and pMIS formation region 1B, that is, over the tensile stress film TSL1 (Step S31 in FIG. 23). The most suitable insulating film 31 is a silicon oxide film represented by $SiO_2$, but is not limited to the film only when it exerts etching selectivity for the compression stress film CSL1 to be formed later. However, in order to give the etching selectivity between the compression stress film CSL1 and insulating film 31, the insulating film 31 needs to be formed from a material different from that of the compression stress film CSL1. For example, when a silicon nitride film is set as the compression stress film CSL1 to be formed later, a silicon oxide film is favorable as the insulating film 31, but, additionally, a silicon carbide film, a silicon carbonitride film or a silicon oxynitride film may be employed as the insulating film 31. The thickness of the insulating film 31 (formed film thickness) is preferably around 6 to 20 nm.

Figure 25:
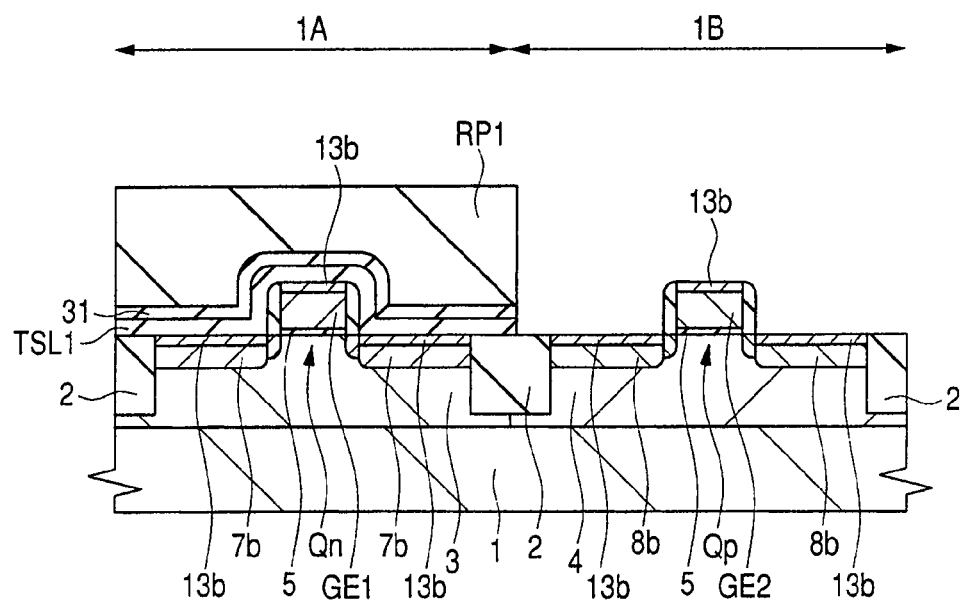
FIG. 25 is a cross-sectional view of the essential part in the manufacturing process of the semiconductor device subsequent to FIG. 24.

Next, as shown in FIG. 25, after the formation of the photoresist film RP1 that covers the nMIS formation region 1A and exposes the pMIS formation region 1B over the insulating film 31 using a photolithographic method, the insulating film 31 and tensile stress film TSL1 under it lying in the pMIS formation region 1B are dry-etched and removed using the photoresist film RP1 as an etching mask (Step S12a in FIG. 23). In the dry etching process at Step S12a in FIG. 23, since the photoresist film RP1 functions as the etching mask, the insulating film 31 and tensile stress film TSL1 under it of the nMIS formation region 1A are not etched but are left. After that, the photoresist film RP1 is removed by ashing or the like.

In the dry etching process at Step S12 in FIG. 3 in Embodiment 1, the tensile stress film TSL1 is dry-etched, but, in contrast, in the dry etching process at Step S12a in FIG. 23 in the embodiment, a laminated film of the insulating film 31 and tensile stress film TSL1 under it is dry-etched. For the other points, the dry etching process at Step S12a in FIG. 23 is the same as the dry etching process at Step S12 in FIG. 3.

Figure 26:
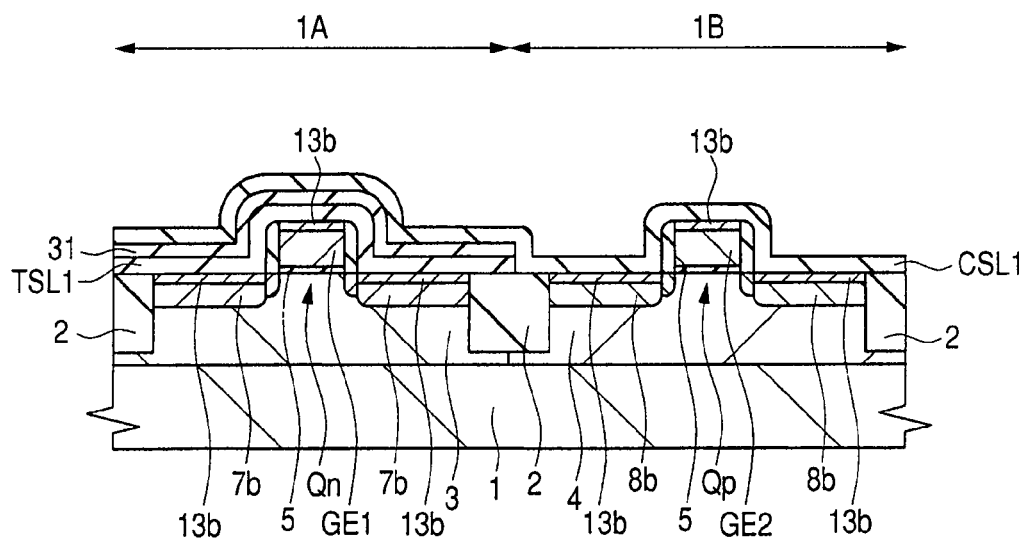
FIG. 26 is a cross-sectional view of the essential part in the manufacturing process of the semiconductor device subsequent to FIG. 25.

Next, in the same way as that in Embodiment 1, as shown in FIG. 26, the compression stress film CSL1 is formed over the whole main face of the semiconductor substrate 1, that is, over the main face of the semiconductor substrate 1 including the nMIS formation region 1A and pMIS formation region 1B (Step S13 in FIG. 23). At Step S13 in FIG. 23, the compression stress film CSL1 is formed, in the pMIS formation region 1B, over the semiconductor substrate 1 including the metal silicide layer 13b so as to cover the gate electrode GE2 and sidewall 9 on the side wall thereof, and, in the nMIS formation region 1A, the compression stress film CSL1 is formed over the insulating film 31 because the laminated film of the insulating film 31 and the tensile stress film TSL1 under it exists.

Figure 27:
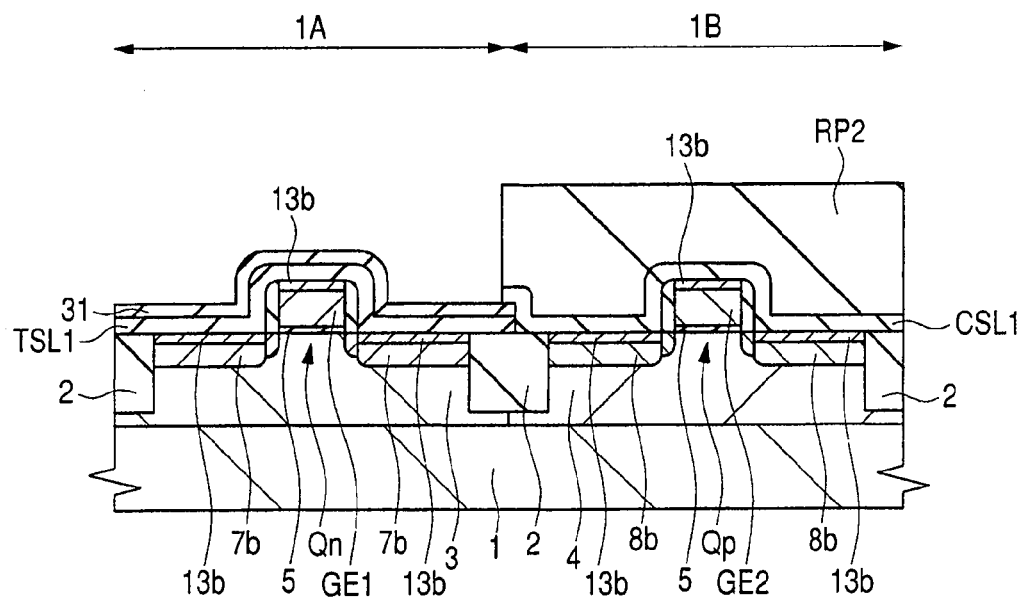
FIG. 27 is a cross-sectional view of the essential part in the manufacturing process of the semiconductor device subsequent to FIG. 26.

Next, as shown in FIG. 27, after the formation of the photoresist film RP2 that covers the pMIS formation region 1B and exposes the nMIS formation region 1A by a photolithographic method, the compression stress film CSL1 lying in the nMIS formation region 1A is dry-etched and removed using the photoresist film RP2 as an etching mask (Step S14 in FIG. 23).

The dry etching process (a process for removing the compression stress film CSL1) at Step S14 in FIG. 23 in the embodiment is substantially the same as that (a process for removing the compression stress film CSL1) at Step S14 in FIG. 3 in Embodiment 1, except for causing the insulating film 31 to function as an etching stopper.

That is, in the dry etching process at Step S14 in FIG. 23 in the embodiment, since the photoresist film RP2 functions as an etching mask, the compression stress film CSL1 of the pMIS formation region 1B is not etched but is left. Also, in the dry etching process at Step S14 in FIG. 23, the dry etching of the compression stress film CSL1 is performed under conditions in which the compression stress film CSL1 is etched more easily as compared with the insulating film 31, and the insulating film 31 is caused to function as the etching stopper film. Consequently, in the nMIS formation region 1A not covered with the photoresist film RP2, the insulating film 31 and tensile stress film TSL1 under it are left. Therefore, the metal silicide layer 13b is not exposed in both nMIS formation region 1A and pMIS formation region 1B. After the dry etching process at Step S14 in FIG. 23, the photoresist film RP2 is removed by ashing or the like.

Note that in the embodiment, since the insulating film 31 functions as the etching stopper (the etching protective film for the tensile stress film TSL1) in the dry etching process at Step S14 in FIG. 23, the etching of the tensile stress film TSL1 can be prevented, and the decrease in the thickness of the tensile stress film TSL1 can be prevented.

In the dry etching process at Step S14 in FIG. 23, possibly there is such case that a part of the insulating film 31 (an upper layer portion) is etched (removed) by over etching in the nMIS formation region 1A. However, it is preferable to design so that, at the stage after the end of the dry etching process at Step S14 in FIG. 23, at least a part of the insulating film 31 (a lower layer portion) remains in laminate over the tensile stress film TSL1 in the nMIS formation region 1A, and the tensile stress film TSL1 is not exposed. This makes it possible to prevent appropriately the etching of the tensile stress film TSL1 in the dry etching process at Step S14.

Figure 28:
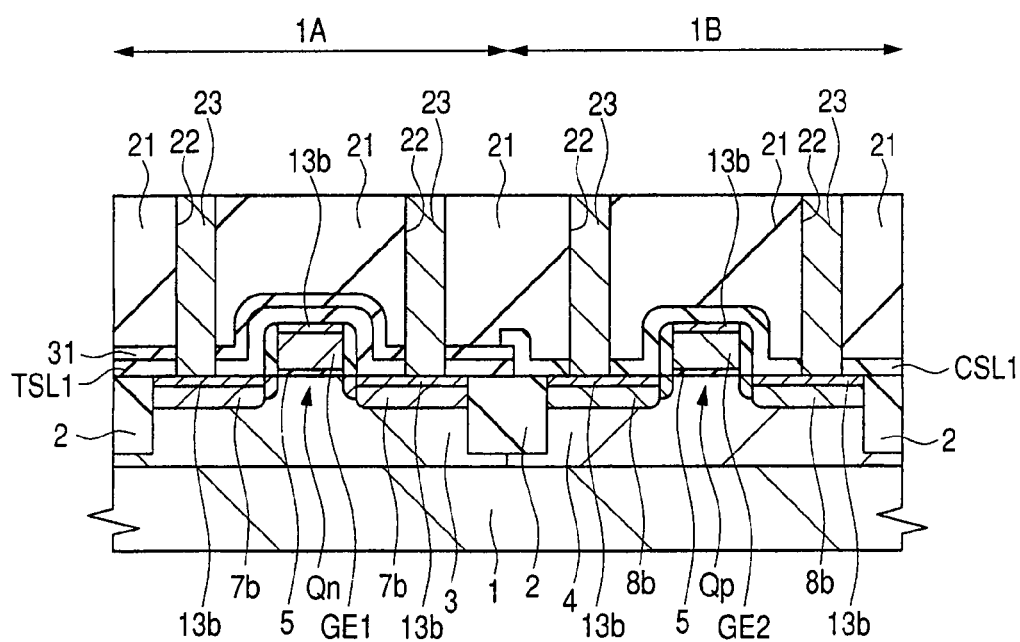
FIG. 28 is a cross-sectional view of the essential part in the manufacturing process of the semiconductor device subsequent to FIG. 27.

Subsequent processes are approximately the same as those in Embodiment 1. That is, as shown in FIG. 28, the interlayer insulating film 21 is formed over the whole main face of the semiconductor substrate 1, that is, over the main face of the semiconductor substrate 1 including the nMIS formation region 1A and pMIS formation region 1B (Step S15 in FIG. 23). The interlayer insulating film 21 is formed over the laminated film of the insulating film 31 and tensile stress film TSL1, and over the compression stress film CSL1, wherein the thickness of the interlayer insulating film 21 is greater than that of the tensile stress film TSL1, insulating film 31 and compression stress film CSL1. After the formation of the interlayer insulating film 21, the surface of the interlayer insulating film 21 is polished by a CMP method, or the like, and thereby the upper surface of the interlayer insulating film 21 is flattened.

Next, by the dry etching using a photoresist pattern (not shown) formed on the interlayer insulating film 21 as an etching mask, the contact hole 22 is formed. On this occasion, in the nMIS formation region 1A, at a laminated film made of the interlayer insulating film 21, insulating film 31 and tensile stress film TSL1, the contact hole 22 passing through the laminated film is formed, and, in the pMIS formation region 1B, at a laminated film made of the interlayer insulating film 21 and compression stress film CSL1, the contact hole 22 passing through the laminated film is formed.

The contact hole 22 can be formed as follows. Firstly, the interlayer insulating film 21 is subjected to the dry etching under conditions in which the interlayer insulating film 21 and insulating film 31 are etched more easily as compared with the compression stress film CSL1 and tensile stress film TSL1, and, by causing the compression stress film CSL1 and tensile stress film TSL1 to function as the etching stopper film, the contact holes 22 are formed at the interlayer insulating film 21 of the pMIS formation region 1B and at the interlayer insulating film 21 and insulating film 31 of the nMIS formation region 1A. After that, by dry-etching and removing of the compression stress film CSL1 at the bottom portion of the contact hole 22 of the pMIS formation region 1B and the tensile stress film TSL1 at the bottom portion of the contact hole 22 of the nMIS formation region 1A under conditions in which the compression stress film CSL1 and tensile stress film TSL1 are etched more easily as compared with the interlayer insulating film 21 and insulating film 31, the contact hole 22 as a through hole is formed.

Next, in the same way as that in Embodiment 1, the electroconductive plug 23 is formed in the contact hole 22.

After that, in the same way as that in Embodiment 1, after the formation of the stopper insulating film 24 and the insulating film 25, the wiring groove 26 is formed, and, in the wiring groove 26, the wiring M1 is formed. Here, a drawing and detailed description thereof are omitted.

When compared with the semiconductor device in Embodiment 1 (FIG. 17), the semiconductor device of the embodiment thus manufactured (FIG. 28) is different in that the insulating film 31 lies over the tensile stress film TSL1 (between the tensile stress film TSL1 and the interlayer insulating film 21) in the nMIS formation region 1A. The insulating film 31 has the same planar shape as that of the tensile stress film TSL1. Further, at least a part of the compression stress film CSL1 overlaps the laminated film of the insulating film 31 and tensile stress film TSL1.

In the embodiment, following effects can be further obtained in addition to that obtained in Embodiment 1. That is, in the embodiment, by causing the insulating film 31 formed at Step S31 in FIG. 23 to function as the etching stopper (the etching protective film for the tensile stress film TSL1) in the dry etching process at Step S14 in FIG. 23 (the process for removing the compression stress film CSL1), it is possible to prevent the etching of the tensile stress film TSL1, and to prevent decrease in the thickness of the tensile stress film TSL1. As the result, the thickness of the tensile stress film TSL1 in the manufactured semiconductor device is maintained as the deposited film thickness (the film thickness when the tensile stress film TSL1 is deposited at Step S11 in FIG. 23). Since the deposited film thickness upon deposition over the semiconductor wafer can be controlled with high accuracy, if the deposited film thickness can be maintained as the thickness of the tensile stress film TSL1, as in the embodiment, the thickness of the tensile stress film TSL1 in manufactured semiconductor devices can be set to an approximately designed value, which makes it possible to set the stress value acting on MISFETs approximately to the designed value itself. Further, in the embodiment, since the deposited film thickness can be maintained as the thickness of the tensile stress film TSL1, variation of the thickness of the tensile stress film TSL1 can be suppressed for each wafer, and the spread of MISFET properties among wafers can be suppressed.

Embodiment 4

Figure 29:
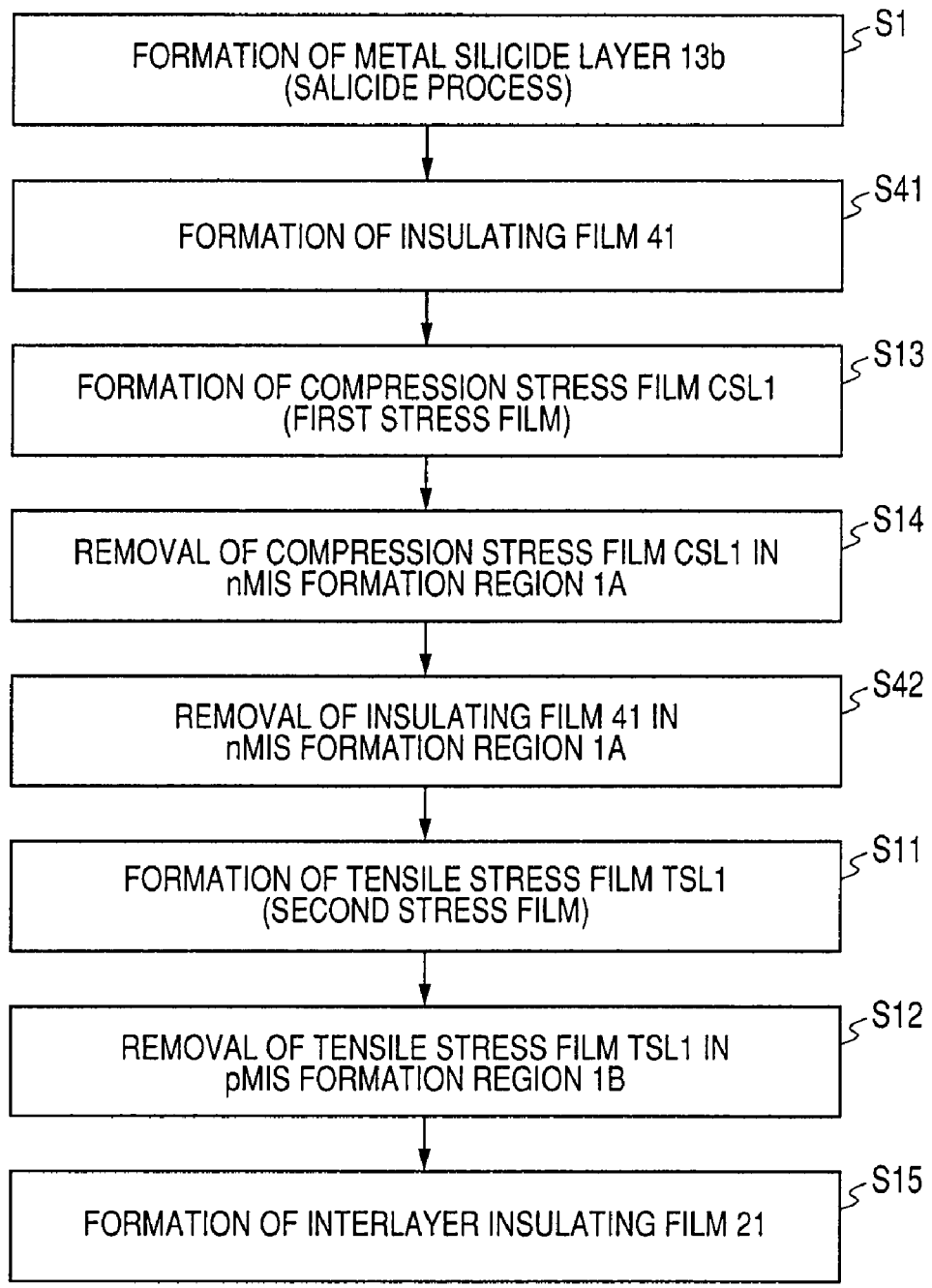
FIG. 29 is a manufacturing process flow chart showing a part of the manufacturing process of a semiconductor device being an Embodiment 4 of the invention.

FIG. 29 is a manufacturing process flow chart showing a part of the manufacturing process of a semiconductor device of the present embodiment, which corresponds to FIG. 3 in Embodiment 1. FIGS. 30 to 37 are cross-sectional views of the essential part in a manufacturing process of a semiconductor device of the embodiment.

The manufacturing process of a semiconductor device of the embodiment may be performed in approximately the same way as that in Embodiment 1 up to the formation of the metal silicide layer 13b (that is, up to the obtainment of the structure in FIG. 7), and, therefore, the description thereof is omitted here.

However, in Embodiment 4 and following Embodiments 5 to 12, the process for forming the metal silicide layer 13b at Step S1 is not limited to that at Step S1 explained in Embodiment 1. That is, the material, concentration distribution and formation method of the metal silicide layer 13b in Embodiment 4 and following Embodiments 5 to are not limited to the material, concentration distribution and formation method of the metal silicide layer 13b as described in Embodiment 1. For example, as metal elements for constituting the metal silicide layer 13b, in Embodiment 1, a combination of Ni (nickel) and Pt (platinum) is used, but, in Embodiment 4 and following Embodiments 5 to 12, other elements may be employed in addition to the combination of Ni (nickel) and Pt (platinum) (that is, the metal silicide layer 13b may not be of nickel platinum silicide). For example, one or more elements selected from the group made of Ni (nickel), Co (cobalt), Pt (platinum), Pd (palladium), Hf (hafnium), V (vanadium), Er (erbium), Ir (iridium) and Yb (ytterbium) may be employed as a metal element constituting the metal silicide layer 13b in Embodiment 4 and following Embodiments 5 to 12. In this instance, a metal film or an alloy film made of one or more elements selected from the group made of Ni (nickel), Co (cobalt), Pt (platinum), Pd (palladium), Hf (hafnium), V (vanadium), Er (erbium), Ir (iridium) and Yb (ytterbium) is satisfactorily employed in place of the alloy film 11.

Further, also in the embodiment, it is also possible to add the oxidizing process of the surface of the metal silicide layer 13b at Step S21 as is described in Embodiment 2, after forming the metal silicide layer 13b at Step S1 and before forming an insulating film 41 at Step S41 to be described later.

Figure 30:
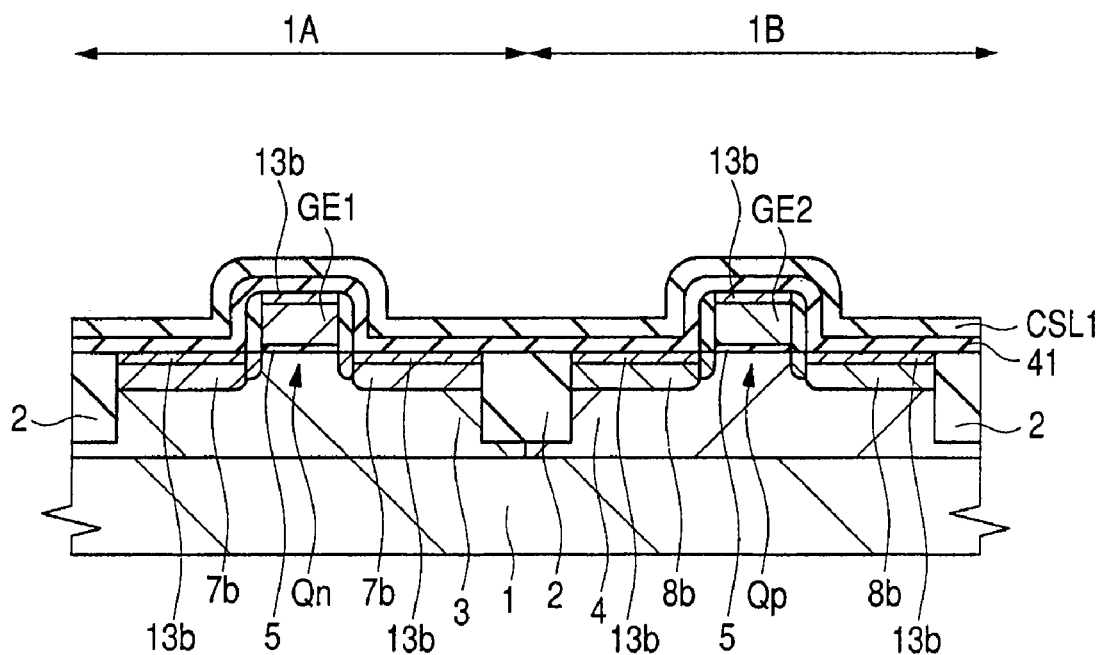
FIG. 30 is a cross-sectional view of the essential part in a manufacturing process of the semiconductor device being Embodiment 4 of the invention.

After the processes up to the formation process of the metal silicide layer 13b are performed to give the structure in FIG. 7, in the embodiment, the insulating film 41 is formed over the whole main face of the semiconductor substrate 1, that is, over the main face of the semiconductor substrate 1 including the nMIS formation region 1A and pMIS formation region 1B, as shown in FIG. 30 (Step S41 in FIG. 29). At Step S41 in FIG. 29, the insulating film 41 is formed so as to cover the gate electrodes GE1 and GE2, and sidewall 9, over the semiconductor substrate 1 including the metal silicide layer 13b.

Since the insulating film 41 to be formed at Step S41 in FIG. 29 needs to have etching selectivity for a first stress film to be formed at Step S13 described later, the insulating film 41 to be formed at Step S41 in FIG. 29 needs to be formed from a material different from that of the first stress film to be formed at Step S13 described later. However, the insulating film 41 is preferably made of a material that enables the process of removing the insulating film 41 at Step S42 described later to be performed while suppressing the decrease in the thickness of the metal silicide layer 13b. From this standpoint, silicon oxide represented by $SiO_2$ is most suitable for the material of the insulating film 41. As the thickness (formed film thickness) of the insulating film 41, around 3 to 10 nm is favorable. For example, the insulating film 41 made of silicon oxide may be formed by a thermal CVD method using TEOS (Tetraethoxysilane, also referred to as Tetra Ethyl Ortho Silicate) and $O_3$ gas.

Next, the first stress film is formed over the whole main face of the semiconductor substrate 1 including the nMIS formation region 1A and pMIS formation region 1B, that is, over the insulating film 41 (Step S13 in FIG. 29). Hereinafter, instances, in which the first stress film formed at Step S13 in FIG. 29 is the compression stress film CSL1, are illustrated and explained, but, the tensile stress film TSL1 instead of the compression stress film CSL1 may be set as the first stress film formed at Step S13 in FIG. 29. Since the material, thickness and formation method of the compression stress film CSL1 and tensile stress film TSL1 in the embodiment are the same as those in Embodiment 1, the description thereof is omitted here.

Figure 31:
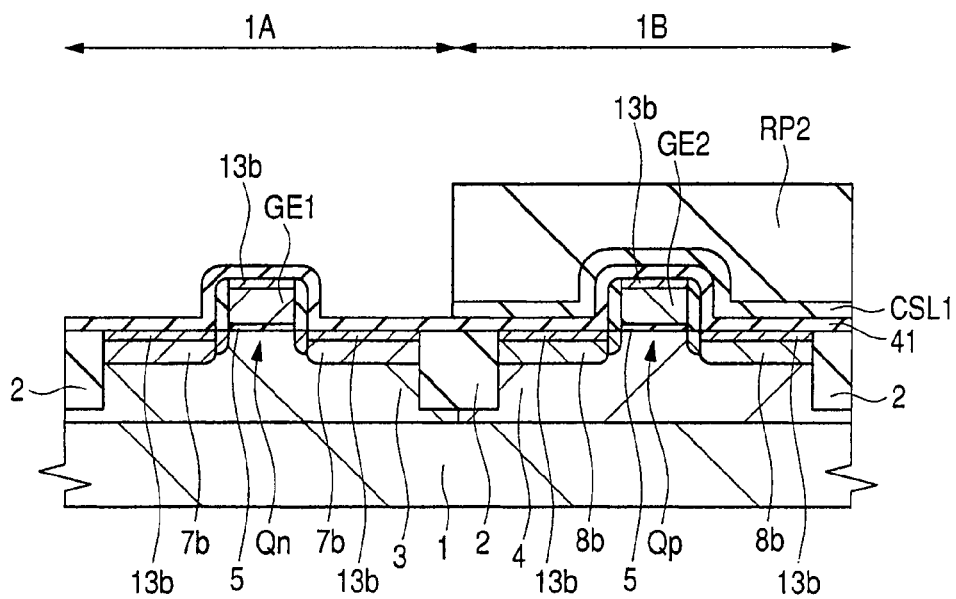
FIG. 31 is a cross-sectional view of the essential part in the manufacturing process of the semiconductor device subsequent to FIG. 30.

Next, as shown in FIG. 31, after the formation of a photoresist film RP2 that covers the pMIS formation region 1B and exposes the nMIS formation region 1A using a photolithographic method, the compression stress film CSL1 lying in the nMIS formation region 1A is dry-etched and removed using the photoresist film RP2 as the etching mask (Step S14 in FIG. 29). On this occasion, by dry-etching the compression stress film CSL1 under conditions in which the compression stress film CSL1 is etched more easily as compared with the insulating film 41 to cause the insulating film 41 to function as the etching stopper film, it is so designed that the insulating film 41 is left at the nMIS formation region 1A and the metal silicide layer 13b is not exposed. That is, the insulating film 41 is caused to function as the etching protective film (a barrier against etching) for the metal silicide layer 13b. Further, on this occasion, since the photoresist film RP2 functions as the etching mask, the compression stress film CSL1 and insulating film 41 under it of the pMIS formation region 1B are not etched but are left.

Under the boundary line (the border) between the dry etching target region (a region where the compression stress film CSL1 is exposed from the photoresist film RP2 and etched and removed) and the non-target region (a region where the compression stress film CSL1 is covered by the photoresist film RP2 and not etched but left) upon dry-etching the compression stress film CSL1 at Step S14 in FIG. 29, the element isolation region 2 preferably lies in order to protect the metal silicide layer 13b. Specifically, in the region schematically shown by numeral 20 in FIG. 10, the boundary line lies between the target region and non-target region for the dry etching.

Meanwhile, when setting the tensile stress film TSL1 instead of the compression stress film CSL1 as the first stress film to be formed at Step S13 in FIG. 29, the tensile stress film TSL1 lying in the pMIS formation region 1B is removed by the dry etching at Step S14 in FIG. 29, while utilizing the photoresist film RP1 that covers the nMIS formation region 1A and exposes the pMIS formation region 1B as the etching mask.

Figure 32:
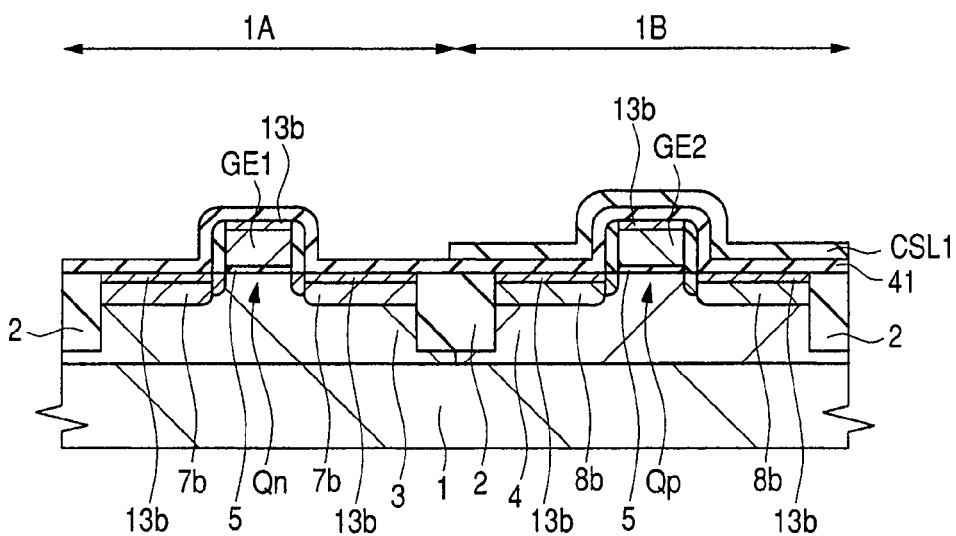
FIG. 32 is a cross-sectional view of the essential part in the manufacturing process of the semiconductor device subsequent to FIG. 31.

Next, as shown in FIG. 32, the photoresist film RP2 is removed by ashing or the like.

Figure 33:
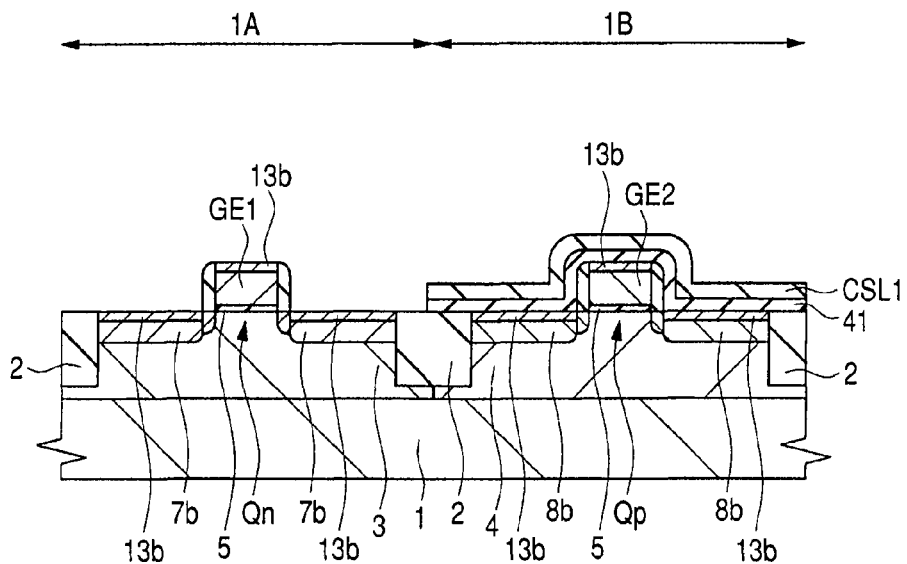
FIG. 33 is a cross-sectional view of the essential part in the manufacturing process of the semiconductor device subsequent to FIG. 32.

Next, as shown in FIG. 33, the insulating film 41 of the nMIS formation region 1A is selectively removed (Step S42 in FIG. 29). In the process for removing the insulating film 41 at Step S42 in FIG. 29, it is so designed that the insulating film 41 is removed in the nMIS formation region 1A to expose the metal silicide layer 13b, and that the compression stress film CSL1 is not removed but left in the pMIS formation region 1B. This can be realized, for example, by forming the insulating film 41 with silicon oxide, forming the compression stress film CSL1 with a material other than silicon oxide, and performing the process for removing the insulating film 41 at Step S42 as follows.

That is, firstly, by exposing the semiconductor substrate 1 to plasma of a mixed gas of $N_2$, $H_2$, $NF_3$ and the like, the plasma gives a chemical action on the insulating film 41 (a silicon oxide film) so that the $SiO_2$ constituting the insulating film 41 is reacted, and a decomposable (volatile) reaction component (a polymerized film) such as ammonium fluorosilicate $((NH_4)_2SiF_6)$ is generated. After that, by subjecting the semiconductor substrate 1 to a heat treatment (for example, a heat treatment at a temperature of around 200 to 300° C. in an inert gas atmosphere), the reaction component (the polymerized film) such as ammonium fluorosilicate $(NH_4)_2SiF_6)$ is volatilized (decomposed) and removed from the semiconductor substrate 1. This can selectively remove the silicon oxide film (the insulating film 41) alone. On this occasion, the compression stress film CSL1, which is not made of silicon oxide, is not removed but left. Further, on this occasion, since the metal silicide layer 13b is not etched (not removed), the reduction of the thickness of the metal silicide layer 13b can be prevented, and the rise in the resistance of the metal silicide layer 13b can be prevented. In the pMIS formation region 1B, the insulating film 41 is not decomposed but left, because it is covered with the compression stress film CSL1.

Thus, the embodiment utilizes the fact that, when a silicon nitride film is formed in contact with the metal silicide layer 13b, it is difficult to remove the silicon nitride film alone while preventing the etching of the metal silicide layer 13b, but that when a silicon oxide film is formed in contact with the metal silicide layer 13b, it is easy to remove the silicon oxide film alone while preventing the etching of the metal silicide layer 13b. Consequently, as the insulating film 41, a silicon oxide film is preferable.

Meanwhile, when the tensile stress film TSL1 instead of the compression stress film CSL1 is set as the first stress film formed at Step S13 in FIG. 29, at Step S42 in FIG. 29, the insulating film 41 of the pMIS formation region 1B is selectively removed to expose the metal silicide layer 13b in the pMIS formation region 1B, and the tensile stress film TSL1 (and the insulating film 41 under it) is left in the nMIS formation region 1A.

Figure 34:
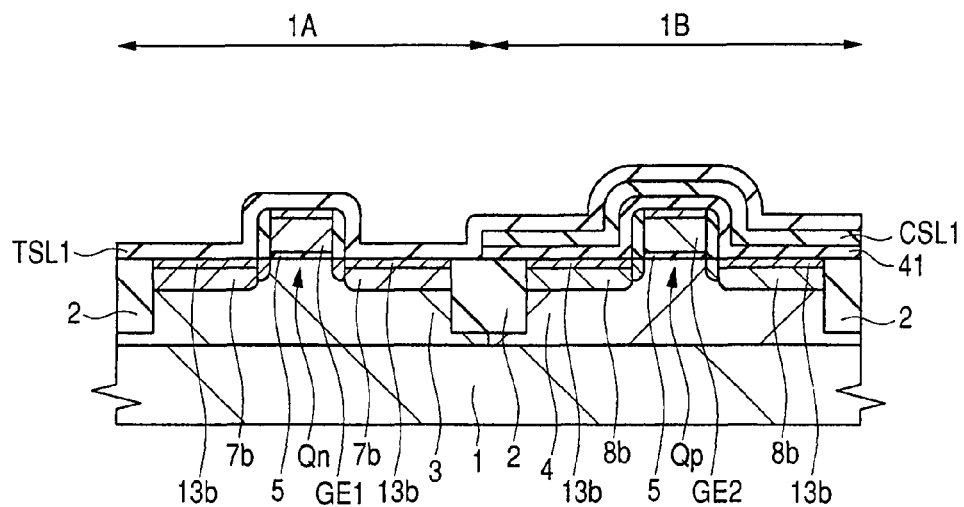
FIG. 34 is a cross-sectional view of the essential part in the manufacturing process of the semiconductor device subsequent to FIG. 33.

Next, as shown in FIG. 34, a second stress film is formed over the whole main face of the semiconductor substrate 1, that is, over the main face of the semiconductor substrate 1 including the nMIS formation region 1A and pMIS formation region 1B (Step S11 in FIG. 29). The second stress film formed at Step S11 in FIG. 29 is a film that gives stress in the opposite direction as compared with the first stress film formed at Step S13 in FIG. 29, and, when the compression stress film CSL1 is set as the first stress film to be formed at Step S13 in FIG. 29, the second stress film formed at Step S11 in FIG. 29 is the tensile stress film TSL1, as shown in FIG. 34. At Step S11, the tensile stress film TSL1 is formed, in the nMIS formation region 1A, over the semiconductor substrate 1 including the metal silicide layer 13b so as to cover the gate electrode GE1 and sidewall 9 on the side wall thereof, and, in the pMIS formation region 1B, the tensile stress film TSL1 is formed over the compression stress film CSL1 because the laminated film of the compression stress film CSL1 and insulating film 41 under it exists.

Meanwhile, when the tensile stress film TSL1 instead of the compression stress film CSL1 is set as the first stress film to be formed at Step S13 in FIG. 29, at Step S11 in FIG. 29, the compression stress film CSL1 instead of the tensile stress film TSL1 is formed as the second stress film.

Figure 35:
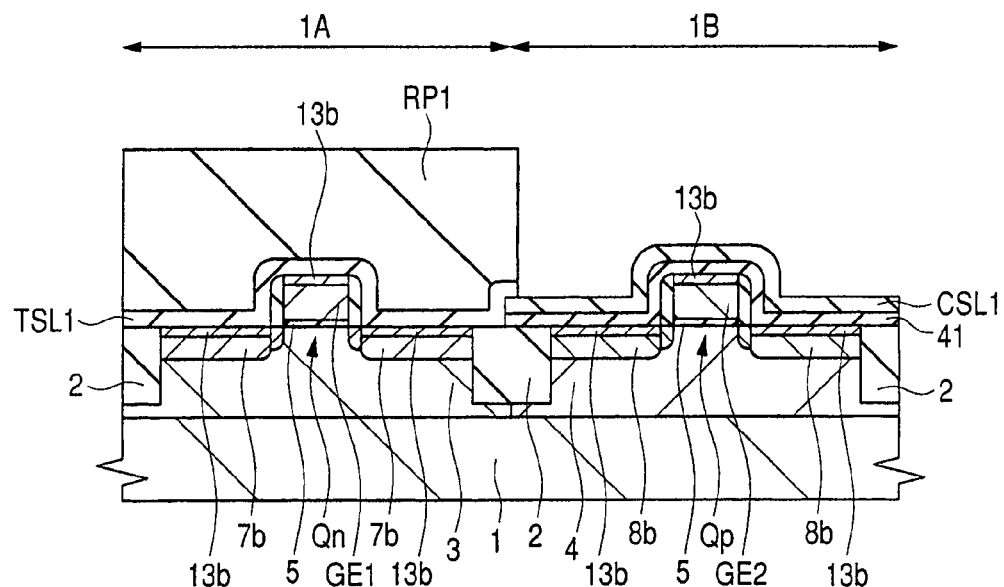
FIG. 35 is a cross-sectional view of the essential part in the manufacturing process of the semiconductor device subsequent to FIG. 34.

Next, as shown in FIG. 35, after the formation of the photoresist film RP1 that covers the nMIS formation region 1A and exposes the pMIS formation region 1B by a photolithographic method, using the photoresist film RP1 as the etching mask, the tensile stress film TSL1 lying in the pMIS formation region 1B is dry-etched and removed (Step S12 in FIG. 29). In the dry etching process at Step S12 in FIG. 29, the amount of over etching is controlled so as not to remove but to leave the compression stress film CSL1 (and the insulating film 41 under it) of the pMIS formation region 1B. Since the photoresist film RP1 functions as the etching mask, the tensile stress film TSL1 of the nMIS formation region 1A is not etched but left. After that, the photoresist film RP1 is removed by ashing or the like.

When dry-etching the tensile stress film TSL1 at Step S12 in FIG. 29, in order to prevent damages on the element isolation region 2 by the dry etching, as shown in FIG. 35, it is preferable to form a portion in which a part of the tensile stress film TSL1 covers the compression stress film CSL1. That is, the tensile stress film TSL1 is set to overlap (cover) apart (an end portion neighborhood region) of the compression stress film CSL1 above the element isolation region 2 between the nMIS formation region 1A and pMIS formation region 1B, at the end of the dry etching of the tensile stress film TSL1 at Step S12.

Meanwhile, when the tensile stress film TSL1 instead of the compression stress film CSL1 is set as the first stress film to be formed at Step S13 in FIG. 29 (that is, when the compression stress film CSL1 is set as the second stress film), at Step S12 in FIG. 29, the compression stress film CSL1 lying in the nMIS formation region 1A is removed by the dry etching, using the photoresist film RP2, which covers the pMIS formation region 1B and exposes the nMIS formation region 1A, as the etching mask. On this occasion, since the photoresist film RP2 functions as the etching mask, the compression stress film CSL1 of the pMIS formation region 1B is not etched but left, and, by controlling the amount of over etching, the tensile stress film TSL1 (and the insulating film 41 under it) of the nMIS formation region 1A is not removed but left.

Figure 36:
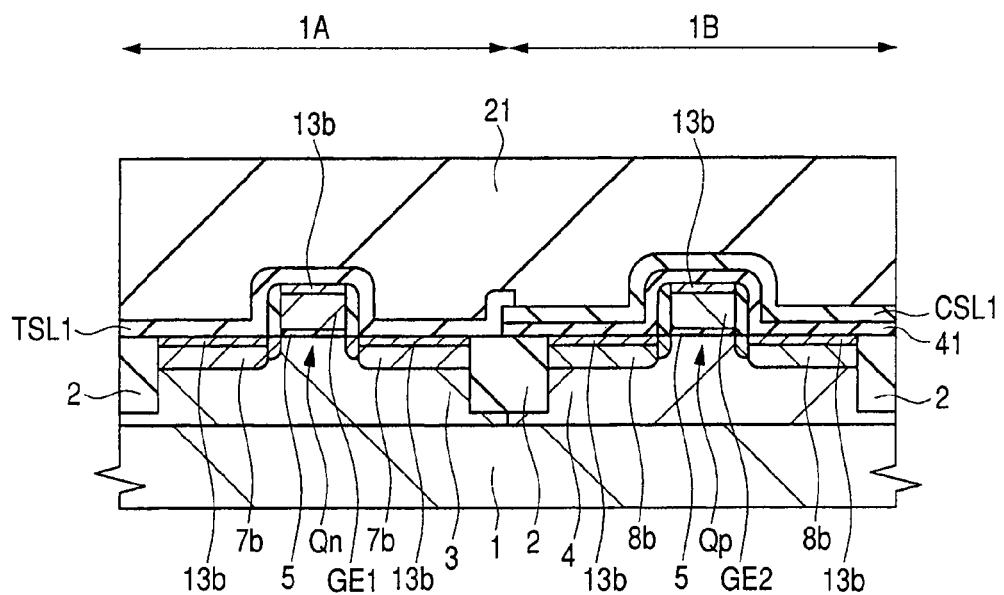
FIG. 36 is a cross-sectional view of the essential part in the manufacturing process of the semiconductor device subsequent to FIG. 35.

Subsequent processes are approximately the same as those in Embodiment 1. That is, as shown in FIG. 36, the interlayer insulating film 21 is formed over the whole main face of the semiconductor substrate 1, that is, over the main face of the semiconductor substrate 1 including the nMIS formation region 1A and pMIS formation region 1B (Step S15 in FIG. 29). The interlayer insulating film 21 is formed over the laminated film of the compression stress film CSL1 and insulating film 31, and over the tensile stress film TSL1, wherein the thickness of the interlayer insulating film 21 is greater than that of the tensile stress film TSL1, insulating film 41 and compression stress film CSL1. After the formation of the interlayer insulating film 21, the surface of the interlayer insulating film 21 is polished by a CMP method, or the like, and the upper surface of the interlayer insulating film 21 is flattened.

Figure 37:
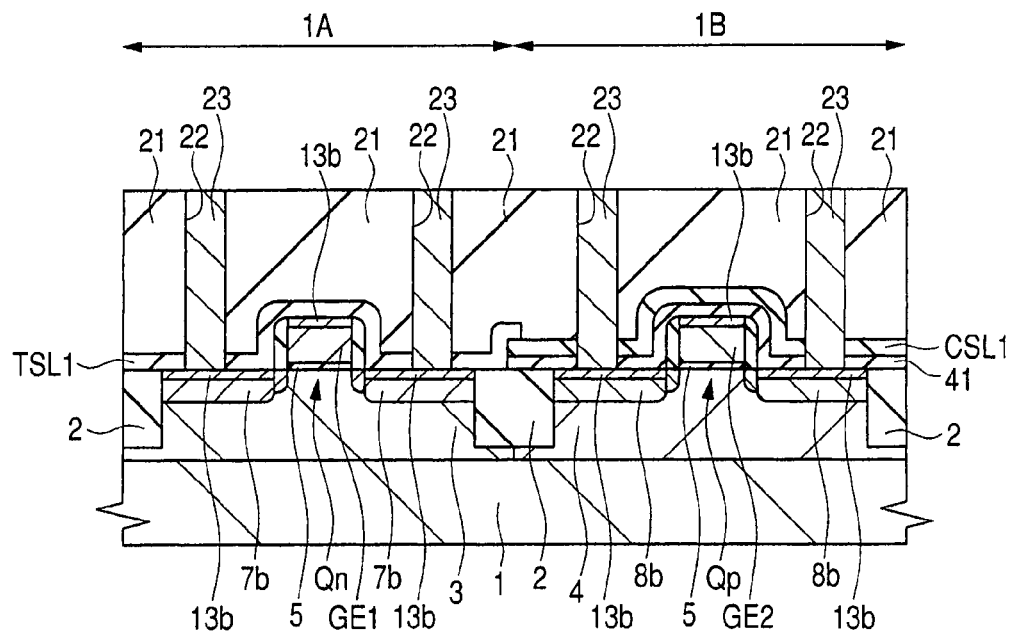
FIG. 37 is a cross-sectional view of the essential part in the manufacturing process of the semiconductor device subsequent to FIG. 36.

Next, as shown in FIG. 37, the contact hole 22 is formed by the dry etching using a photoresist pattern (not shown) formed on the interlayer insulating film 21 as the etching mask. On this occasion, in the nMIS formation region 1A, at a laminated film made of the interlayer insulating film 21 and tensile stress film TSL1, the contact hole 22 passing through the laminated film is formed, and, in the pMIS formation region 1B, at a laminated film made of the interlayer insulating film 21, compression stress film CSL1 and insulating film 41, the contact hole 22 passing through the laminated film is formed.

Meanwhile, when the tensile stress film TSL1 instead of the compression stress film CSL1 is set as the first stress film to be formed at Step S13 in FIG. 29, in the nMIS formation region 1A, at a laminated film made of the interlayer insulating film 21, tensile stress film TSL1 and insulating film 41, the contact hole 22 passing through the laminated film is formed. On this occasion, in the pMIS formation region 1B, at a laminated film made of the interlayer insulating film 21 and compression stress film CSL1, the contact hole 22 passing through the laminated film is formed.

Next, in the same way as that in Embodiment 1, the electroconductive plug 23 is formed inside the contact hole 22.

After that, in the same way as that in Embodiment 1, after the formation of the stopper insulating film 24 and the insulating film 25, the wiring groove 26 is formed, and the wiring M1 is formed inside the wiring groove 26. Here, the illustration and detailed description thereof are omitted.

In a semiconductor device of the embodiment thus manufactured, as shown in FIG. 37, the tensile stress film TSL1 is formed over the semiconductor substrate 1 so as to cover the n-channel type MISFET Qn, that is, to cover the gate electrode GE1 and $n^+$-type semiconductor region 7b. Also, a laminated film of the insulating film 41 and the compression stress film CSL1 above the film 41 is formed so as to cover the p-channel type MISFET Qp, that is, to cover the gate electrode GE2 and $p^+$-type semiconductor region 8b. Further, at least a part of the tensile stress film TSL1 overlaps the laminated film of the compression stress film CSL1 and insulating film 41.

As the stress film, a silicon nitride film, a silicon carbide film, a silicon carbonitride film or a silicon carboxide film is preferable. However, when the stress film constituted of such material is formed over the metal silicide layer 13b in contact with the metal silicide layer 13b, differing from the present embodiment, it is difficult to remove the stress film on the metal silicide layer 13b while preventing the etching (decrease in the thickness) of the metal silicide layer 13b.

Therefore, in the embodiment, after the formation of the insulating film 41 over the metal silicide layer 13b in contact with the metal silicide layer 13b at Step S41 in FIG. 29, the first stress film (the compression stress film CSL1 or tensile stress film TSL1) is formed over the insulating film 41 at Step S13 in FIG. 29. After that, after removing the first stress film of either the nMIS formation region 1A or the pMIS formation region 1B by the dry etching at Step S14 in FIG. 29, the insulating film 41 of either the nMIS formation region 1A or the pMIS formation region 1B above described is selectively removed at Step S42 in FIG. 29. Since the compression stress film CSL1 and tensile stress film TSL1 are used in addition to the insulating film 41, it is unnecessary to cause the insulating film 41 to function as a stress film. That is, the insulating film 41 is not a stress film. Consequently, in the embodiment, it is possible to form the insulating film 41 with a film of material (preferably a silicon oxide film) that enables the insulating film 41 on the metal silicide layer 13b to be etched selectively while preventing the etching (decrease in film thickness) of the metal silicide layer 13b. Consequently, in the embodiment, the etching (decrease in the film thickness, generation of etching damage) of the metal silicide layer 13b can be prevented to suppress or prevent the rise in the resistance of the metal silicide layer 13b. Accordingly, the performance and reliability of semiconductor devices can be improved.

Figure 38:
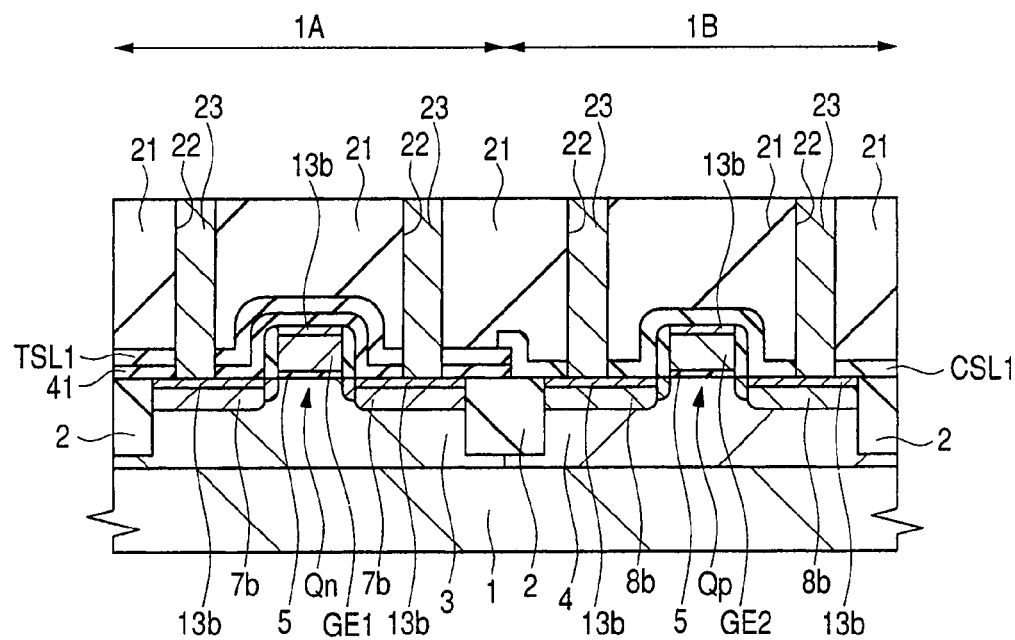
FIG. 38 is a cross-sectional view of the essential part in the manufacturing process of the semiconductor device being Embodiment 4 of the invention when a tensile stress film is set as the first stress film.

In the embodiment, the instance, in which the compression stress film CSL1 is set as the first stress film to be formed at Step S13 in FIG. 29, is mainly illustrated and described, and, the instance, in which the tensile stress film TSL1 is set as the first stress film to be formed at Step S13 in FIG. 29, is also written down and explained. When the tensile stress film TSL1 is set as the first stress film formed at Step S13 in FIG. 29, the shape becomes as that in FIG. 38. FIG. 38 is a cross-sectional view of the essential part in a manufacturing process of a semiconductor device of the embodiment when the tensile stress film TSL1 is set as the first stress film formed at Step S13 in FIG. 29, which corresponds to FIG. 37 (the same process stage as that in FIG. 37) above.

As the first stress film formed at Step S13 in FIG. 29, either of the compression stress film CSL1 and the tensile stress film TSL1 may be set, but the compression stress film CSL1 is more preferable (that is, the instance in FIG. 37 is more preferred to the instance in FIG. 38), the reason of which is as follows.

That is, in manufactured semiconductor devices, the second stress film formed at Step S11 in FIG. 29 is disposed nearer to the semiconductor substrate 1 than the first stress film formed at Step S13 in FIG. 29 because no insulating film 41 intervenes between the stress film and the semiconductor substrate 1. Generally, formation of a stress film having a greater absolute value of the stress is easier for a stress film that gives stress in the compression stress direction as compared with a stress film that gives stress in the tensile stress direction. Therefore, by setting the compression stress film CSL1, for which the formation of a film having a great absolute value of the stress is easy, as the first stress film that is disposed apart from the semiconductor substrate 1, and setting the tensile stress film TSL1, for which the formation of a film having a great absolute value of the stress is difficult, as the second stress film that is disposed close to the semiconductor substrate 1, the stress is allowed to act more effectively in both nMIS formation region 1A and pMIS formation region 1B. Further, it is advantageous also in that the shortage of the tensile stress in the nMIS formation region 1A is easily prevented.

Embodiment 5

Figure 39:
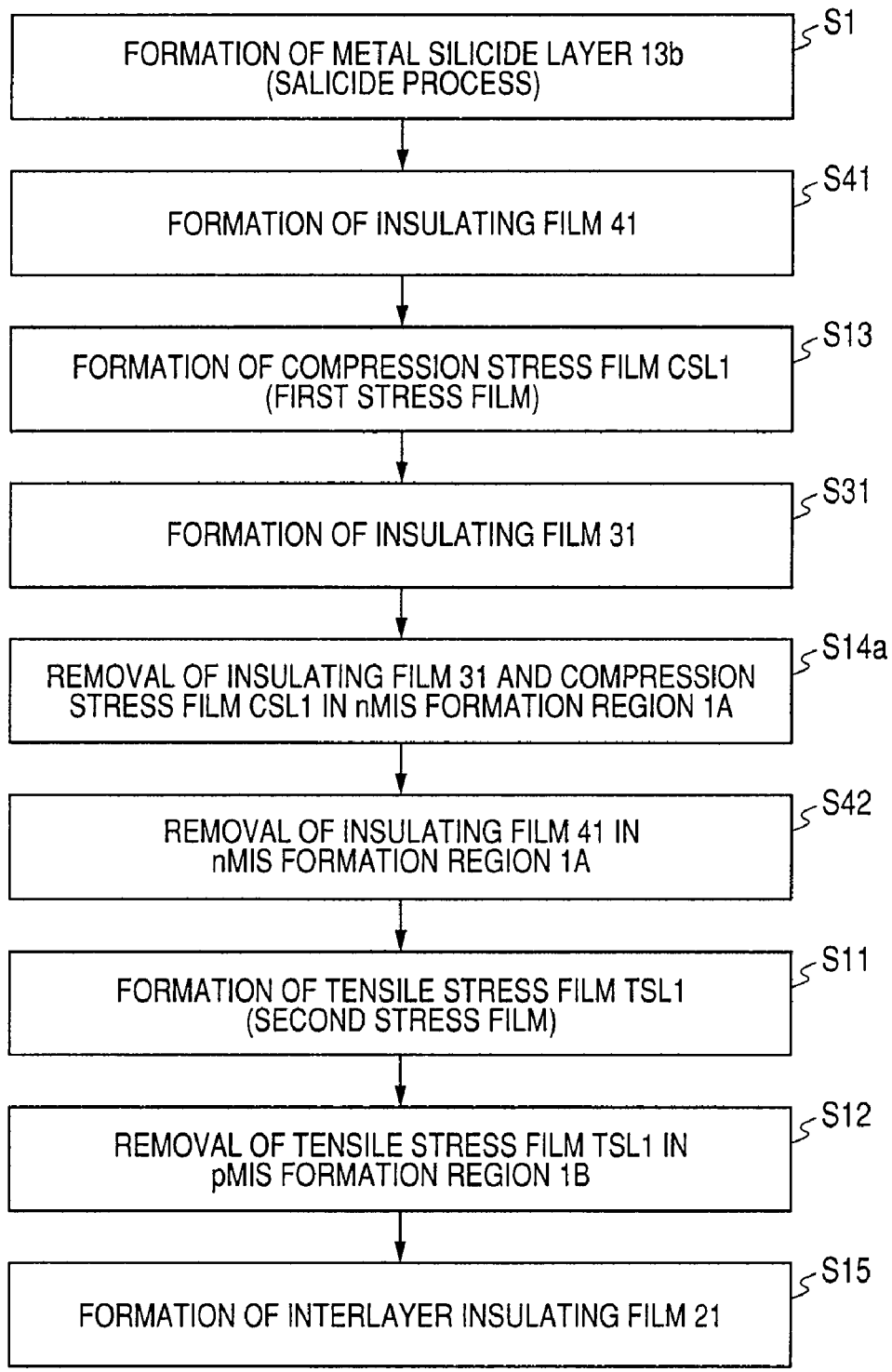
FIG. 39 is a manufacturing process flow chart showing a part of the manufacturing process of a semiconductor device being an Embodiment 5 of the invention.

FIG. 39 is a manufacturing process flow chart showing a part of the manufacturing process of a semiconductor device of the present embodiment, which corresponds to FIG. 29 in Embodiment 4. FIGS. 40 to 46 are cross-sectional views of the essential part in a manufacturing process of a semiconductor device of the embodiment.

The embodiment corresponds to the modification of Embodiment 4 (the modification of Embodiment 4, in which the insulating film 31 is provided over the first stress film of the above Embodiment 4). In the embodiment, since manufacturing processes of a semiconductor device are the same as those in Embodiment 4 up to the formation of the first stress film at Step S13 (that is, up to the obtainment of the structure in FIG. 30), the description thereof is omitted here, and subsequent processes will be described. Meanwhile, hereinafter, an instance, in which the first stress film to be formed at Step S13 in FIG. 39 is the compression stress film CSL1, is illustrated and described, but, the first stress film to be formed at Step S13 in FIG. 39 may also be set as the tensile stress film TSL1 instead of the compression stress film CSL1.

Figure 40:
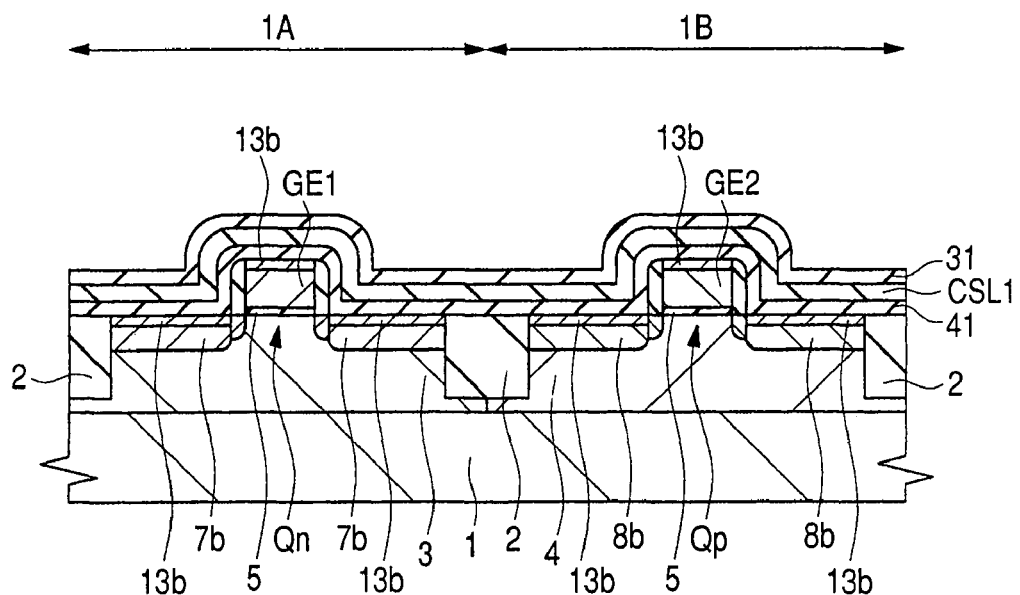
FIG. 40 is a cross-sectional view of the essential part in a manufacturing process of the semiconductor device being an Embodiment 5 of the invention.

Next, as shown in FIG. 40, the insulating film 31 is formed over the whole main face of the semiconductor substrate 1 including the nMIS formation region 1A and pMIS formation region 1B, that is, over the tensile stress film TSL1 (Step S31 in FIG. 39).

Although a film of silicon oxide represented by $SiO_2$ is most suitable for the insulating film 31, the film is not limited to it only when the film can give etching selectivity for the second stress film to be formed at Step S11, which will be described later. However, in order to obtain the etching selectivity for the second stress film to be formed at Step S11 described later, it is necessary to form the insulating film 31 with a material different from that of the second stress film to be formed at Step S11 described later. For example, when the second stress film to be formed at Step S11 described later is made of a silicon nitride film, as the insulating film 31, a silicon oxide film is favorable, but, in addition to it, a silicon carbide film, a silicon carbonitride film or a silicon oxynitride film may be employed as the insulating film 31. The insulating film 31 preferably has a thickness (formed film thickness) of around 6 to 20 nm.

Meanwhile, when the tensile stress film TSL1 instead of the compression stress film CSL1 is set as the first stress film to be formed at Step S13 in FIG. 39, the insulating film 31 is formed over the tensile stress film TSL1 at Step S31 in FIG. 39.

Figure 41:
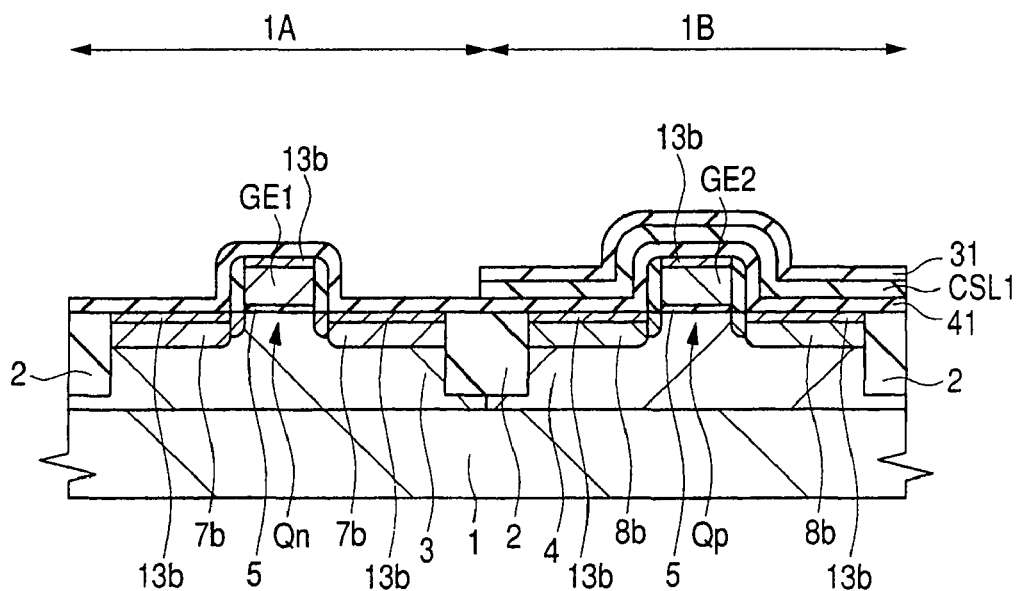
FIG. 41 is a cross-sectional view of the essential part in the manufacturing process of the semiconductor device subsequent to FIG. 40.

Next, as shown in FIG. 41, after the formation of the photoresist film RP2 (not shown in FIG. 41) that covers the pMIS formation region 1B and exposes the nMIS formation region 1A using a photolithographic method, the insulating film 31 and compression stress film CSL1 under it lying in the nMIS formation region 1A are dry-etched and removed using the photoresist film RP2 as the etching mask (Step S14a in FIG. 39).

In the dry etching process at Step S14a in FIG. 39, firstly, by dry-etching the insulating film 31 under conditions in which the insulating film 31 is etched more easily as compared with the compression stress film CSL1, the compression stress film CSL1 is caused to function as the etching stopper film, and, after that, by dry-etching the compression stress film CSL1 under conditions in which the compression stress film CSL1 is etched more easily as compared with the insulating film 41, the insulating film 41 is caused to function as the etching stopper film. As the result, the insulating film 41 is left in the nMIS formation region 1A so as not to expose the metal silicide layer 13b. In the dry etching process at Step S14a in FIG. 39, since the photoresist film RP2 (not shown in FIG. 41) functions as an etching mask, the laminated film of the insulating film 31, compression stress film CSL1 and insulating film 41 of the pMIS formation region 1B is not etched but left. After that, the photoresist film RP2 is removed by ashing or the like.

Under a boundary line (a border) between the dry etching target region (the region where the insulating film 31 and compression stress film CSL1 are etched and removed) and the non-target region (the region where the insulating film 31 and compression stress film CSL1 are not etched but are left) upon dry-etching the insulating film 31 and compression stress film CSL1 under it at Step S14a in FIG. 39, the element isolation region 2 preferably lies in order to protect the metal silicide layer 13b. Specifically, in the region schematically shown by numeral 20 in FIG. 10, the boundary line between the target region and non-target region of the dry etching lies preferably.

Meanwhile, when the tensile stress film TSL1 instead of the compression stress film CSL1 is set as the first stress film to be formed at Step S13 in FIG. 39, at Step S14a in FIG. 39, the insulating film 31 and tensile stress film TSL1 under it lying in the pMIS formation region 1B are removed by the dry etching, using the photoresist film RP1 that covers the nMIS formation region 1A and exposes the pMIS formation region 1B as the etching mask.

Figure 42:
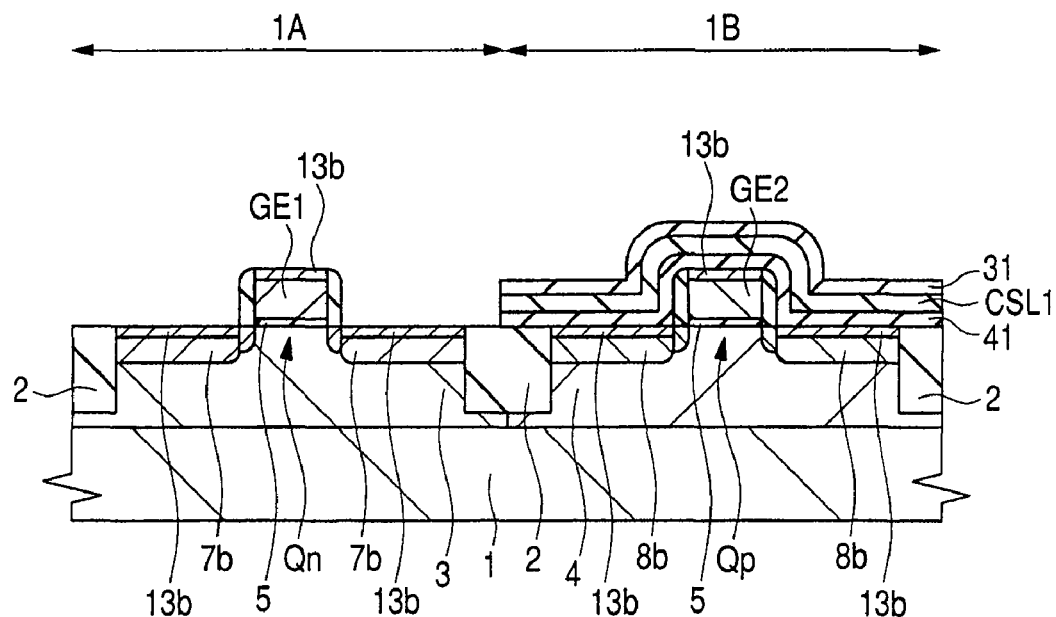
FIG. 42 is a cross-sectional view of the essential part in the manufacturing process of the semiconductor device subsequent to FIG. 41.

Next, as shown in FIG. 42, the insulating film 41 of the nMIS formation region 1A is selectively removed (Step S42 in FIG. 39). Since the process for removing the insulating film 41 of the nMIS formation region 1A at Step S42 in FIG. 39 is the same as the process for removing the insulating film 41 at Step S42 in FIG. 29 in Embodiment 4, the description thereof is omitted here. By the process for removing the insulating film 41 at Step S42 in FIG. 39, in the nMIS formation region 1A, the insulating film 41 is removed and the metal silicide layer 13b is exposed, and, in the pMIS formation region 1B, the laminated film of the insulating film 31, compression stress film CSL1 and insulating film 41 is not removed but left.

In the embodiment, it is necessary to form the insulating film 31 from a material different from that of the insulating film 41. It is possible to form insulating film 41 with a silicon oxide film, and to form the insulating film 31 with, for example, a silicon carbide film or silicon carbonitride film. This can prevent the removal of the insulating film 31 in the process for removing the insulating film 41 at Step S42 in FIG. 39.

Meanwhile, when the tensile stress film TSL1 instead of the compression stress film CSL1 is set as the first stress film to be formed at Step S38 in FIG. 39, at Step S42 in FIG. 39, the insulating film 41 of the pMIS formation region 1B is selectively etched and the metal silicide layer 13b is exposed in the pMIS formation region 1B, and, in the nMIS formation region 1A, the laminated film of the insulating film 31, tensile stress film TSL1 and insulating film 41 is left.

Figure 43:
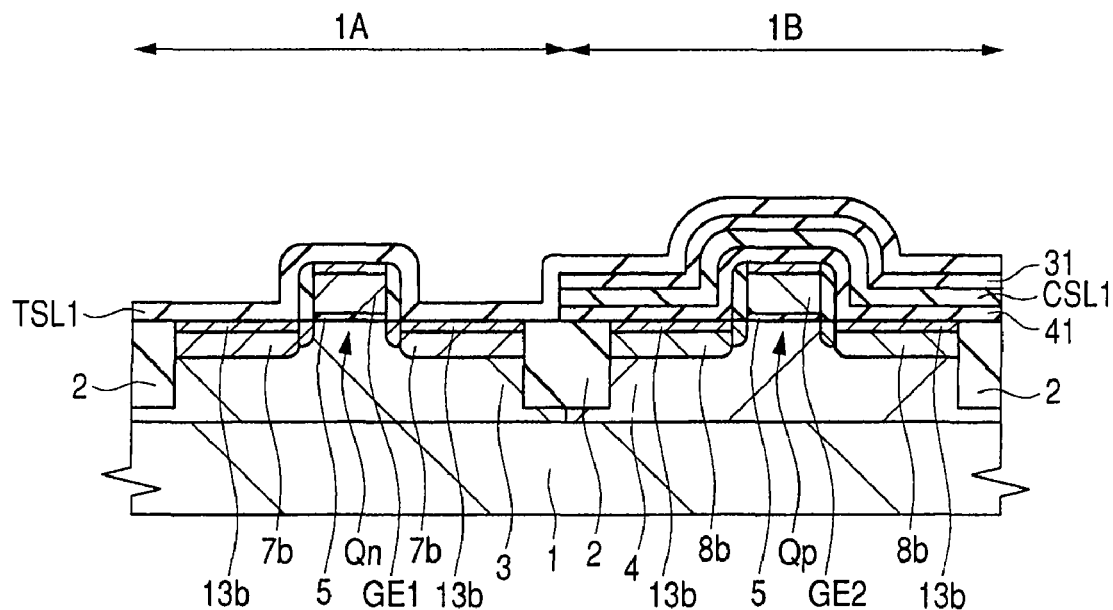
FIG. 43 is a cross-sectional view of the essential part in the manufacturing process of the semiconductor device subsequent to FIG. 42.

Next, as shown in FIG. 43, the second stress film is formed over the whole main face of the semiconductor substrate 1, that is, over the main face of the semiconductor substrate 1 including the nMIS formation region 1A and pMIS formation region 1B (Step S11 in FIG. 39). The second stress film formed at Step S11 in FIG. 39 is a film that gives stress in the opposite direction as compared with the first stress film formed at Step S13 in FIG. 39, and, when the compression stress film CSL1 is set as the first stress film to be formed at Step S13 in FIG. 39, the second stress film formed at Step S11 in FIG. 39 is set as the tensile stress film TSL1, as shown in FIG. 43. At Step S11, the tensile stress film TSL1 is formed, in the nMIS formation region 1A, over the semiconductor substrate 1 including the metal silicide layer 13b so as to cover the gate electrode GE1 and sidewall 9 on the side wall thereof, and, in the pMIS formation region 1B, the tensile stress film TSL1 is formed over the insulating film 31 because the laminated film of the insulating film 31, compression stress film CSL1 and insulating film 41 exists.

Meanwhile, when the tensile stress film TSL1 instead of the compression stress film CSL1 is set as the first stress film to be formed at Step S13 in FIG. 39, at Step S11 in FIG. 39, the compression stress film CSL1 instead of the tensile stress film TSL1 is formed as the second stress film.

Figure 44:
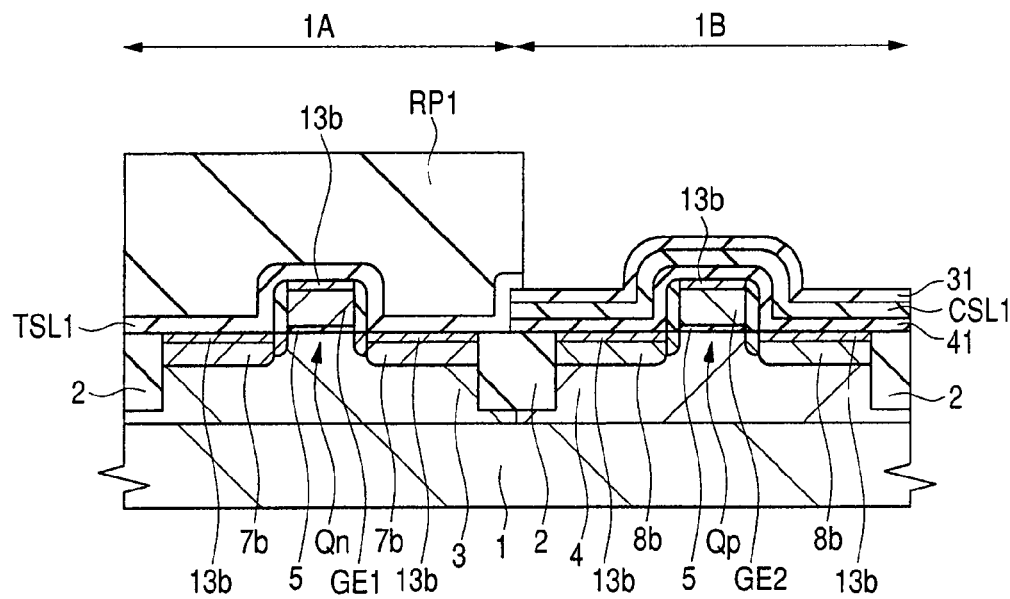
FIG. 44 is a cross-sectional view of the essential part in the manufacturing process of the semiconductor device subsequent to FIG. 43.

Next, as shown in FIG. 44, after the formation of the photoresist film RP1 that covers the nMIS formation region 1A and exposes the pMIS formation region 1B using a photolithographic method, the tensile stress film TSL1 lying in the pMIS formation region 1B is dry-etched and removed using the photoresist film RP1 as the etching mask (Step S12 in FIG. 39).

The dry etching process (the process for removing the tensile stress film TSL1) at Step S12 in FIG. 39 in the embodiment is similar to the dry etching process (the process for removing the tensile stress film TSL1) at Step S12 in FIG. 29 in Embodiment 4, except for causing the insulating film 31 to function as the etching stopper.

That is, in the dry etching process at Step S12 in FIG. 39 in the embodiment, since the photoresist film RP1 functions as the etching mask, the tensile stress film TSL1 of the nMIS formation region 1A is not etched but left. Further, in the dry etching process at Step S12 in FIG. 39, the tensile stress film TSL1 is dry-etched under conditions in which the tensile stress film TSL1 is etched more easily as compared with the insulating film 31, and the insulating film 31 is caused to function as the etching stopper film. Consequently, in the pMIS formation region 1B not covered with the photoresist film RP1, the insulating film 31, and the compression stress film CSL1 and insulating film 41 under it are left. Consequently, the metal silicide layer 13b is not exposed in both nMIS formation region 1A and pMIS formation region 1B. After the dry etching process at Step S12 in FIG. 39, the photoresist film RP1 is removed by ashing or the like.

In the embodiment, in the dry etching process at Step S12 in FIG. 39, since the insulating film 31 functions as the etching stopper (the etching protective film for the compression stress film CSL1), the etching of the compression stress film CSL1 (the first stress film formed at Step S13 in FIG. 39) can be prevented, and the decrease in the thickness of the compression stress film CSL1 can be prevented.

Meanwhile, in the dry etching process at Step S12 in FIG. 39, a part of the insulating film 31 (an upper layer portion) is possibly etched (removed) by over etching in the pMIS formation region 1B. However, it is preferable that, at the stage after the end of the dry etching process at Step S12 in FIG. 39, at least a part (a lower layer portion) of the insulating film 31 remains in laminate over the compression stress film CSL1 in the pMIS formation region 1B, and the compression stress film CSL1 is not exposed. This makes it possible to appropriately prevent the etching of the compression stress film CSL1 in the dry etching process at Step S12 in FIG. 39.

Further, upon dry-etching the tensile stress film TSL1 at Step S12 in FIG. 39, in order to prevent the damage on the element isolation region 2 caused by the dry etching, it is preferable, as shown in FIG. 44, to design so that a portion, where a part of the tensile stress film TSL1 covers the laminated film of the insulating film 31, compression stress film CSL1 and insulating film 41, is formed. That is, it is designed so that the tensile stress film TSL1 overlaps (covers) a part (an end portion neighborhood region) of the laminated film of the insulating film 31, compression stress film CSL1 and insulating film 41 over the element isolation region 2 between the nMIS formation region 1A and pMIS formation region 1B, at the end of the dry etching of the tensile stress film TSL1 at Step S12.

Meanwhile, when the tensile stress film TSL1 instead of the compression stress film CSL1 is set as the first stress film to be formed at Step S13 in FIG. 39 (that is, when the compression stress film CSL1 is set as the second stress film), at Step S12 in FIG. 39, the compression stress film CSL1 lying in the nMIS formation region 1A is removed by the dry etching using the photoresist film RP2 that covers the pMIS formation region 1B and exposes the nMIS formation region 1A as the etching mask. On this occasion, since the photoresist film RP2 functions as the etching mask, the compression stress film CSL1 in the pMIS formation region 1B is not etched but left, and, by causing the insulating film 31 to function as the etching stopper film, the insulating film 31, and the tensile stress film TSL1 and insulating film 41 under it are left in the nMIS formation region 1A.

Figure 45:
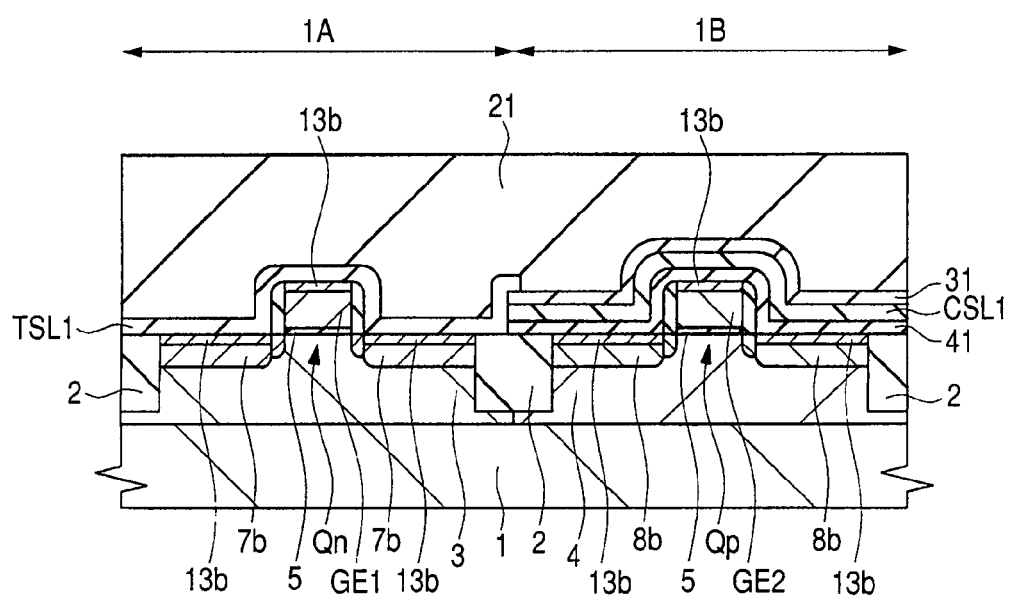
FIG. 45 is a cross-sectional view of the essential part in the manufacturing process of the semiconductor device subsequent to FIG. 44.

Subsequent processes are approximately the same as those in Embodiment 4. That is, as shown in FIG. 45, the interlayer insulating film 21 is formed over the whole main face of the semiconductor substrate 1, that is, over the main face of the semiconductor substrate 1 including the nMIS formation region 1A and pMIS formation region 1B (Step S15 in FIG. 39). The interlayer insulating film 21 is formed over the laminated film of the insulating film 41, compression stress film CSL1 and insulating film 31, and over the tensile stress film TSL1, and the thickness of the interlayer insulating film 21 is greater than the thickness of the tensile stress film TSL1, insulating film 41, compression stress film CSL1, and insulating film 31. After the formation of the interlayer insulating film 21, the surface of the interlayer insulating film 21 is polished by a CMP method, or the like, and the upper surface of the interlayer insulating film 21 is flattened.

Figure 46:
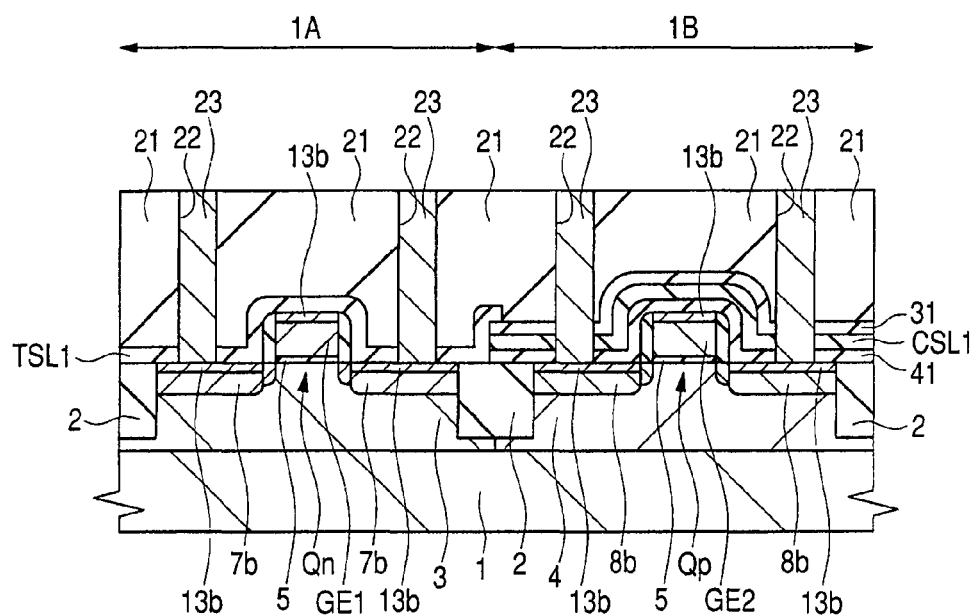
FIG. 46 is a cross-sectional view of the essential part in the manufacturing process of the semiconductor device subsequent to FIG. 45.

Next, as shown in FIG. 46, the contact hole 22 is formed by the dry etching using a photoresist pattern (not shown) formed over the interlayer insulating film 21 as an etching mask. On this occasion, in the nMIS formation region 1A, at a laminated film made of the interlayer insulating film 21 and the tensile stress film TSL1, the contact hole 22 passing through the laminated film is formed, and, in the pMIS formation region 1B, at a laminated film made of the interlayer insulating film 21, insulating film 31, compression stress film CSL1 and insulating film 41, the contact hole 22 passing through the laminated film is formed.

Meanwhile, when the tensile stress film TSL1 instead of the compression stress film CSL1 is set as the first stress film to be formed at Step S13 in FIG. 39, in the nMIS formation region 1A, at a laminated film made of the interlayer insulating film 21, insulating film 31, tensile stress film TSL1 and insulating film 41, the contact hole 22 passing through the laminated film is formed. On this occasion, in the pMIS formation region 1B, at a laminated film made of the interlayer insulating film 21 and compression stress film CSL1, the contact hole 22 passing through the laminated film is formed.

Next, in the same way as that in the embodiment 1, the electroconductive plug 23 is formed inside the contact hole 22.

After that, in the same way as that in the embodiment 1, the stopper insulating film 24 and the insulating film 25 are formed, and then the wiring groove 26 is formed, and the wiring M1 is formed inside the wiring groove 26. The illustration and detailed description thereof are omitted here.

Meanwhile, the first stress film to be formed at Step S13 in FIG. 39 may be set as either of the compression stress film CSL1 and the tensile stress film TSL1, but, the compression stress film CSL1 is more preferable, on the basis of the same reason as that in Embodiment 4.

A semiconductor device of the embodiment thus manufactured (FIG. 46) is different from the semiconductor device in Embodiment 4 (FIG. 37) in that the insulating film 31 lies over the compression stress film CSL1 (between the compression stress film CSL1 and the interlayer insulating film 21) in the pMIS formation region 1B. The insulating film 31, compression stress film CSL1 and insulating film 41 have the same planar shape. At least a part of the tensile stress film TSL1 overlaps the laminated film of the insulating film 31, compression stress film CSL1 and insulating film 41.

In the embodiment, following effects can be further obtained in addition to that obtained in Embodiment 4. That is, in the embodiment, by causing the insulating film 31 formed at Step S31 in FIG. 39 to function as the etching stopper (the etching protective film for the first stress film) in the dry etching process at Step S12 in FIG. 39 (the process for removing the second stress film), it is possible to prevent the etching of the first stress film, and to prevent decrease in the thickness of the first stress film. As the result, the deposited film thickness (the film thickness when deposited at Step S13 in FIG. 39) is maintained as the thickness of the first stress film (the first stress film formed at Step S13 in FIG. 39) in the manufactured semiconductor device. Since the deposited film thickness upon deposition over the semiconductor wafer can be controlled with high accuracy, if the deposited film thickness can be maintained as the thickness of the first stress film, as in the embodiment, the thickness of the first stress film in manufactured semiconductor devices can be set to an approximately designed value, which makes it possible to set the stress value acting on MISFETs approximately to the designed value itself. Further, in the embodiment, since the deposited film thickness can be maintained as the thickness of the first stress film, variation of the thickness of the first stress film can be suppressed for each wafer, and the spread of MISFET properties among wafers can be suppressed.

Figure 47:
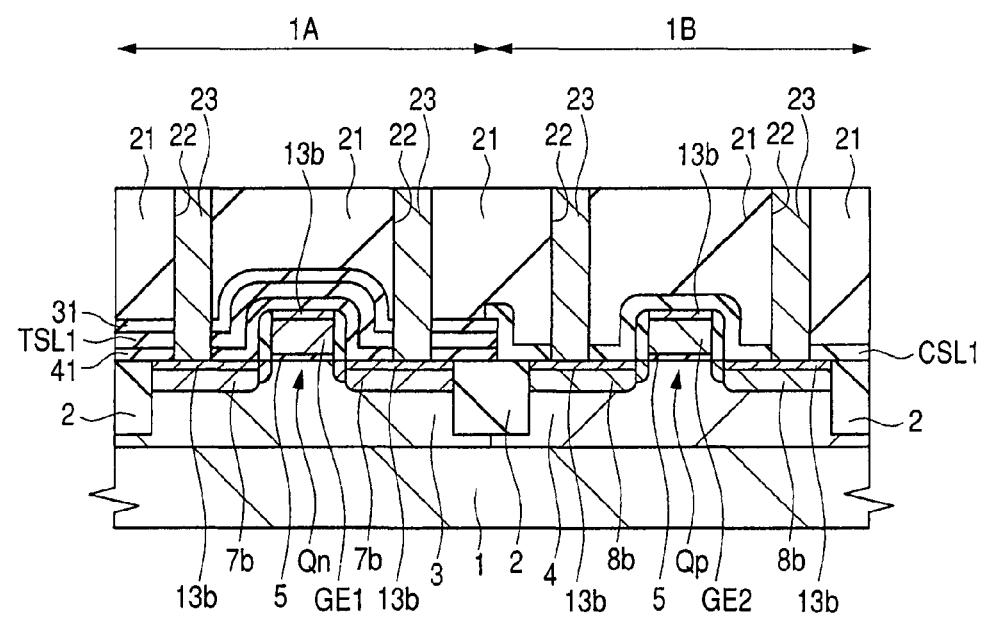
FIG. 47 is a cross-sectional view of the essential part in the manufacturing process of the semiconductor device of Embodiment 5 of the invention when a tensile stress film is set as the first stress film.

In the embodiment, the instance, in which the compression stress film CSL1 is set as the first stress film to be formed at Step S13 in FIG. 39, is mainly illustrated and described, and, the instance, in which the tensile stress film TSL1 is set as the first stress film to be formed at Step S13 in FIG. 39, is also written down and explained. When the tensile stress film TSL1 is set as the first stress film to be formed at Step S13 in FIG. 39, the shape becomes as that in FIG. 47. FIG. 47 is a cross-sectional view of the essential part in a manufacturing process of a semiconductor device of the embodiment when the tensile stress film TSL1 is set as the first stress film formed at Step S13 in FIG. 39, which corresponds to FIG. 46 (the same process stage as that in FIG. 46) above.

As the first stress film formed at Step S13 in FIG. 39, either of the compression stress film CSL1 and the tensile stress film TSL1 may be set, but the compression stress film CSL1 is more preferable (that is, the instance in FIG. 46 is more preferred to the instance in FIG. 47), on the basis of the same reason as that in Embodiment 4.

Embodiment 6

Figure 48:
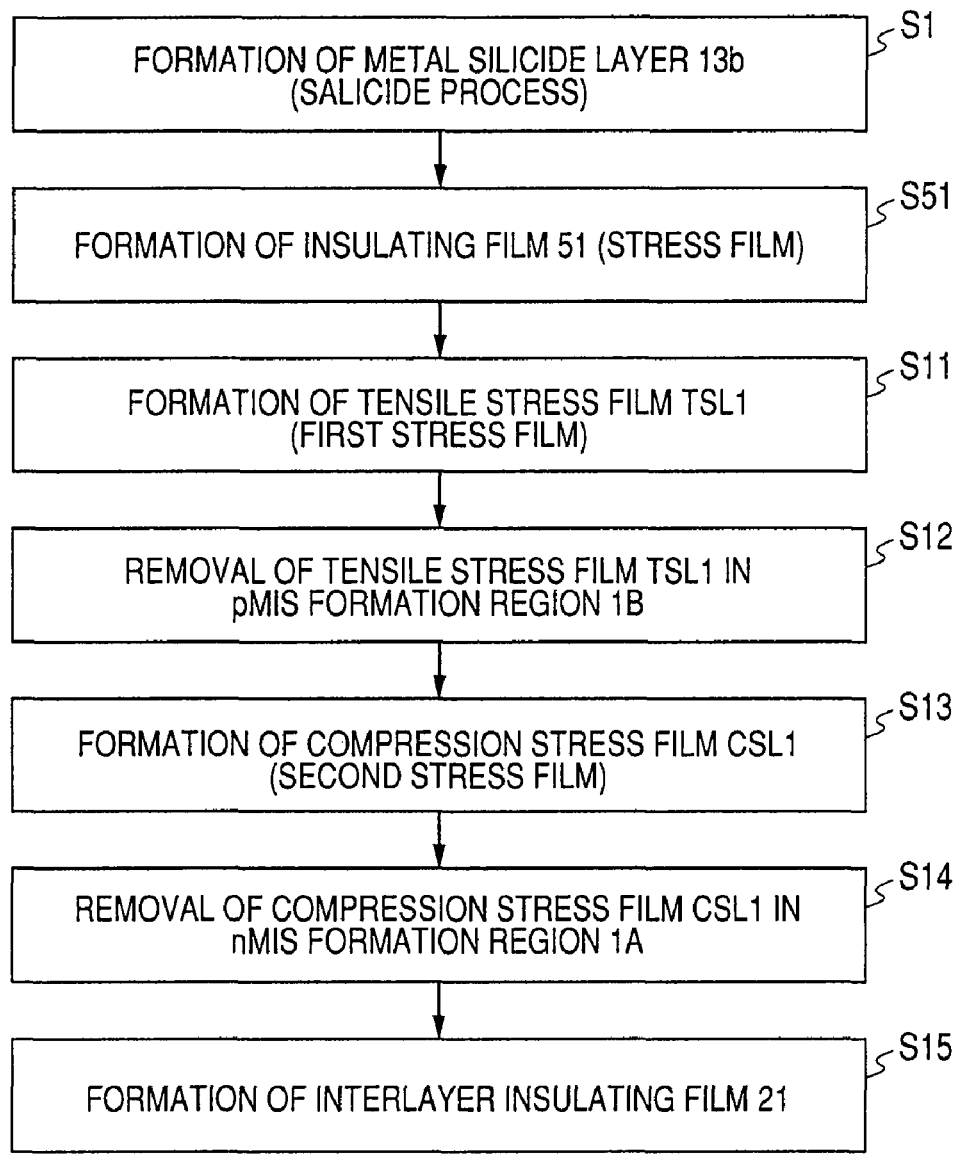
FIG. 48 is a manufacturing process flow chart showing a part of the manufacturing process of a semiconductor device being an Embodiment 6 of the invention.

FIG. 48 is a manufacturing process flow chart showing a part of the manufacturing process of a semiconductor device of the present embodiment, which corresponds to FIG. 3 in Embodiment 1. FIGS. 49 to 55 are cross-sectional views of the essential part in a manufacturing process of a semiconductor device of the embodiment.

Since manufacturing processes of a semiconductor device of the embodiment can be performed in the approximately same way as those in Embodiment 1 up to the formation of the metal silicide layer 13b (that is, up to the obtainment of the structure in FIG. 7), the description thereof is omitted here.

However, as described in Embodiment 4 above, also in the embodiment, the process for forming the metal silicide layer 13b at Step S1 is not limited to the Step S1 described in Embodiment 1. That is, also in the embodiment, as in Embodiments 4 and 5, the material, concentration distribution and formation method of the metal silicide layer 13b are not limited to the material, concentration distribution and formation method of the metal silicide layer 13b as described in Embodiment 1. For example, one or more elements selected from the group made of Ni (nickel), Co (cobalt), Pt (platinum), Pd (palladium), Hf (hafnium), V (vanadium), Er (erbium), Ir (iridium) and Yb (ytterbium) may be employed in the embodiment as a metal element constituting the metal silicide layer 13b.

Figure 49:
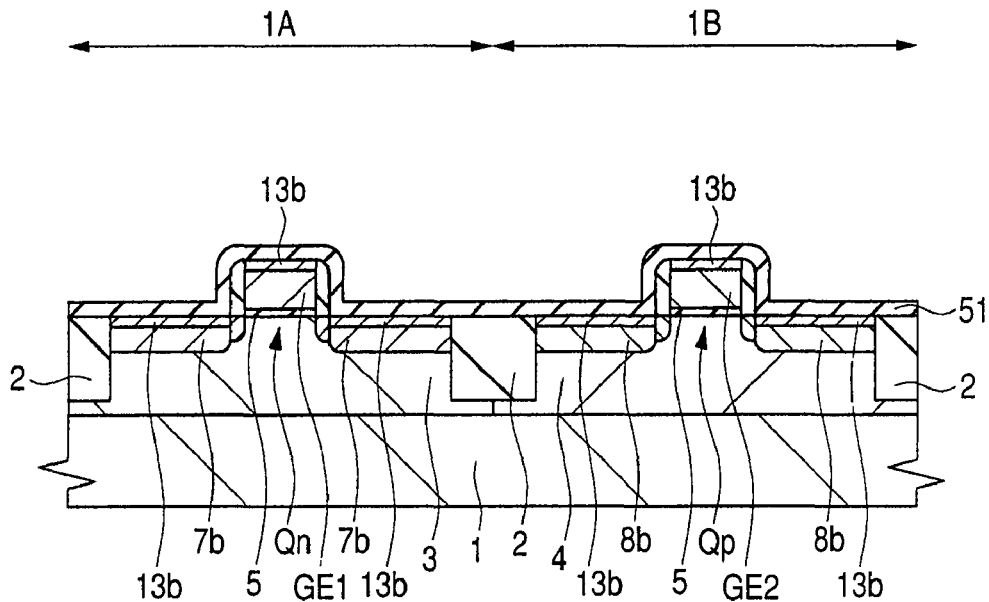
FIG. 49 is a cross-sectional view of the essential part in a manufacturing process of the semiconductor device being Embodiment 6 of the invention.

After the processes up to the formation of the metal silicide layer 13b are performed to obtain the structure in FIG. 7, in the embodiment, as shown in FIG. 49, an insulating film 51 is formed over the whole main face of the semiconductor substrate 1, that is, over the main face of the semiconductor substrate 1 including the nMIS formation region 1A and pMIS formation region 1B (Step S51 in FIG. 48). In Step S51 in FIG. 48, the insulating film 51 is formed over the semiconductor substrate 1 including the metal silicide layer 13b so as to cover the gate electrodes GE1 and GE2, and the sidewall 9.

The insulating film 51 is formed with a material different from that of the first stress film to be formed at Step S11 described later, and is preferably a carbonized film made of a silicon carbide (SiC), silicon carbonitride (SiCN) or silicon carboxide (SiCO), which may be formed by, for example, a CVD method. The insulating film 51 is formed as a stress film of either tension or compression. That is, the insulating film 51 is either a tensile stress film or a compression stress film.

A silicon carbide film formed by, for example, a CVD method is a compression stress film, but, by the irradiation of ultraviolet rays after the film deposition, it may be changed into a tensile stress film, which is utilized to form both the insulating film 51 as the compression stress film made of silicon carbide and the insulating film 51 as the tensile stress film made of silicon carbide. However, when comparing the tensile stress film TSL1 that is formed later with the compression stress film CSL1, since it is more difficult to give stress of a greater absolute value to the tensile stress film TSL1, the insulating film 51 is more preferably a tensile stress film (a stress film of tension) so that the insulating film 51 can reinforce the tensile stress of the tensile stress film TSL1.

Figure 50:
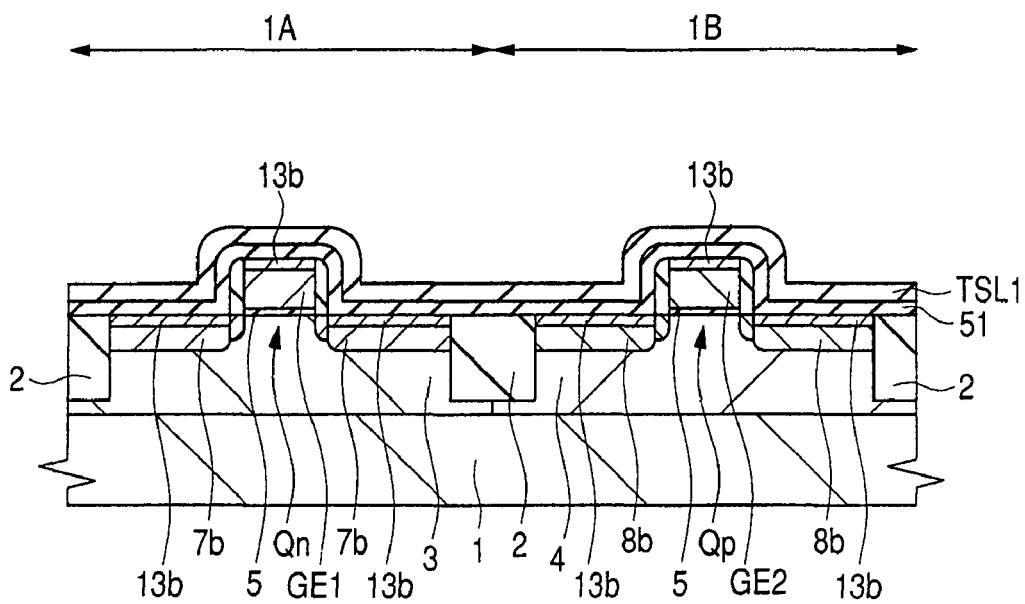
FIG. 50 is a cross-sectional view of the essential part in the manufacturing process of the semiconductor device subsequent to FIG. 49.

Next, as shown in FIG. 50, the first stress film is formed over the whole main face of the semiconductor substrate 1 including the nMIS formation region 1A and pMIS formation region 1B, that is, over the insulating film 51 (Step S11 in FIG. 48). Hereinafter, an instance, in which the first stress film formed at Step S11 in FIG. 48 is the tensile stress film TSL1, is illustrated and described, but, the compression stress film CSL1 instead of the tensile stress film TSL1 may also be set as the first stress film formed at Step S11 in FIG. 48. Since the material, thickness and formation method of the tensile stress film TSL1 and compression stress film in the embodiment are the same as those in Embodiment 1, the description thereof is omitted here.

Since the first stress film formed at Step S11 in FIG. 48 needs to give etching selectivity for the insulating film 51, the first stress film formed at the Step S11 in FIG. 48 and the insulating film 51 formed at Step S51 in FIG. 48 are constituted of materials different from each other. Preferably, the insulating film 51 formed at Step S51 in FIG. 48 is made of a carbonized film (a silicon carbide film, silicon carbonitride film or silicon carboxide film) and the first stress film formed at Step S11 in FIG. 48 is made of a silicon nitride film.

Figure 51:
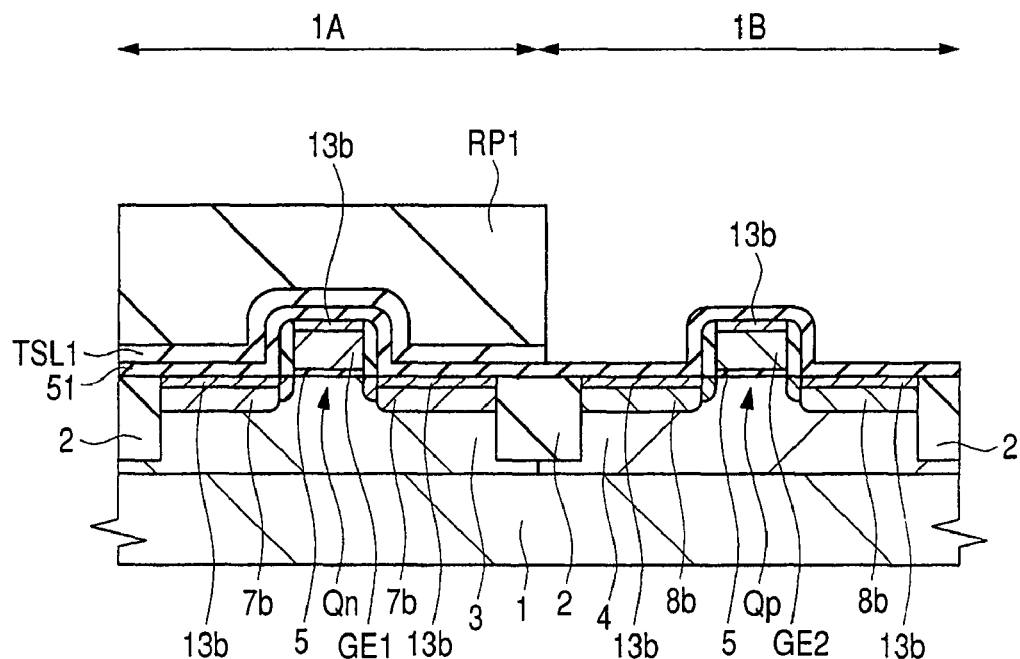
FIG. 51 is a cross-sectional view of the essential part in the manufacturing process of the semiconductor device subsequent to FIG. 50.

Next, as shown in FIG. 51, after the formation of the photoresist film RP1 that covers the nMIS formation region 1A and exposes the pMIS formation region 1B by a photolithographic method, the tensile stress film TSL1 lying in the pMIS formation region 1B is dry-etched and removed using the photoresist film RP1 as the etching mask (Step S12 in FIG. 48). On this occasion, by dry-etching the tensile stress film TSL1 under conditions in which the tensile stress film TSL1 is easily etched as compared with the insulating film 51, the insulating film 51 is caused to function as the etching stopper film. That is, the insulating film 51 is caused to function as the etching protective film (barrier of etching) for the metal silicide layer 13b. Further, on this occasion, since the photoresist film RP1 functions as the etching mask, the tensile stress film TSL1 and insulating film 51 under it of the nMIS formation region 1A are not etched but are left. After that, the photoresist film RP1 is removed by ashing or the like.

Under the boundary line (the border) between the dry etching target region (the region where the tensile stress film TSL1 is etched and removed) and the non-target region (the region where the tensile stress film TSL1 is not etched but left) upon dry-etching the tensile stress film TSL1 at Step S12 in FIG. 48, the element isolation region 2 preferably lies in order to protect the metal silicide layer 13b. Specifically, in the region schematically shown by numeral 20 in FIG. 10, the boundary line between the target region and non-target region of the dry etching lies preferably.

Meanwhile, when the compression stress film CSL1 instead of the tensile stress film TSL1 is set as the first stress film to be formed at Step S11 in FIG. 48, at Step S12 in FIG. 48, the first stress film (the compression stress film CSL1) lying in the nMIS formation region 1A is dry-etched and removed using the photoresist film RP2 that covers the pMIS formation region 1B and exposes the nMIS formation region 1A as the etching mask, to cause the insulating film 51 to function as the etching stopper film.

Further, upon dry-etching the first stress film formed at Step S11 in FIG. 48, at Step S12, even when the all or most part of the insulating film 51 in the etching target region (the region where the first stress film is to be etched and removed) is removed, as compared with a case where no insulating film 51 is provided, the decrease in film thickness and etching damage of the metal silicide layer 13b by over etching can be suppressed. However, upon dry-etching the first stress film, which was formed at Step S11 in FIG. 48, at Step S12, it is more preferable to leave at least a part (a lower layer portion) of the insulating film 51 in laminate so as not to expose the metal silicide layer 13b in the etching target region (the region where the first stress film is to be etched and removed). Consequently, the decrease in film thickness and etching damage of the metal silicide layer 13b by over etching can more appropriately be prevented.

Figure 52:
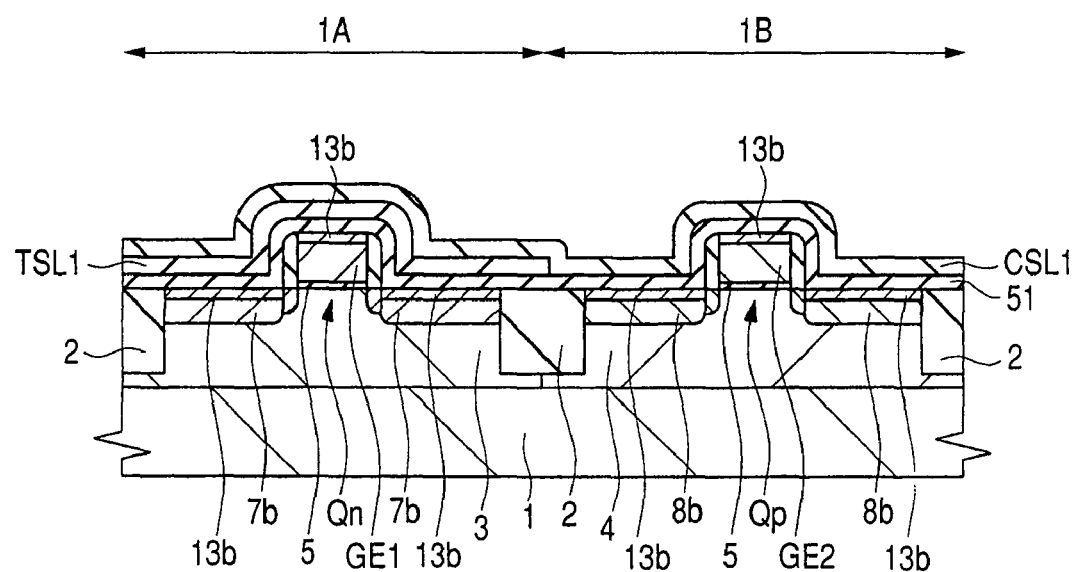
FIG. 52 is a cross-sectional view of the essential part in the manufacturing process of the semiconductor device subsequent to FIG. 51.

Next, as shown in FIG. 52, the second stress film is formed over the whole main face of the semiconductor substrate 1, that is, over the main face of the semiconductor substrate 1 including the nMIS formation region 1A and pMIS formation region 1B (Step S13 in FIG. 48). The second stress film formed at Step S13 in FIG. 48 is a film having stress in opposite direction as compared with the first stress film formed at Step S11 in FIG. 48. When the tensile stress film TSL1 is set as the first stress film to be formed at Step S11 in FIG. 48, the second stress film formed at Step S13 in FIG. 48 is the compression stress film CSL1, as shown in FIG. 52.

At Step S13 in FIG. 48, the compression stress film CSL1 is formed over the remaining insulating film 51 in the pMIS formation region 1B, and in the nMIS formation region 1A, the compression stress film CSL1 is formed over the tensile stress film TSL1 because the laminated film of the tensile stress film TSL1 and insulating film 51 under it exists.

Meanwhile, when the compression stress film CSL1 instead of the tensile stress film TSL1 is set as the first stress film to be formed at Step S11 in FIG. 48, the tensile stress film TSL1 instead of the compression stress film CSL1 is formed as the second stress film at Step S13 in FIG. 48.

Figure 53:
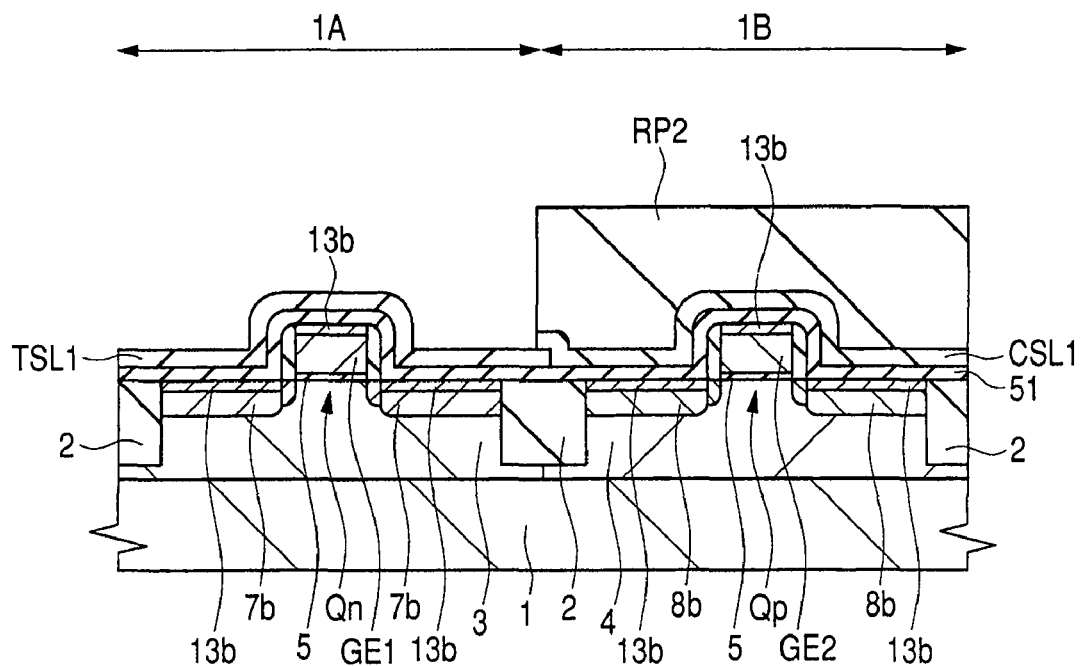
FIG. 53 is a cross-sectional view of the essential part in the manufacturing process of the semiconductor device subsequent to FIG. 52.

Next, as shown in FIG. 53, after the formation of the photoresist film RP2 that covers the pMIS formation region 1B and exposes the nMIS formation region 1A using a photolithographic method, the compression stress film CSL1 in the nMIS formation region 1A is dry-etched and removed using the photoresist film RP2 as the etching mask (Step S14 in FIG. 48). In the dry etching process at Step S14 in FIG. 48, it is so designed that the tensile stress film TSL1 (and the insulating film 51 under it) of the nMIS formation region 1A is not removed but is left by controlling the over etching amount. Further, since the photoresist film RP2 functions as the etching mask, the compression stress film CSL1 (and the insulating film 51 under it) in the pMIS formation region 1B is not etched but left. After that, the photoresist film RP2 is removed by ashing or the like.

Upon dry-etching the compression stress film CSL1 at Step S14, it is preferable to design so that a part of the compression stress film CSL1 may cover the tensile stress film TSL1, as shown in FIG. 53, in order to prevent damage given to the element isolation region 2 by the dry etching. That is, at the end of the dry etching of the compression stress film CSL1 at Step S14, the compression stress film CSL1 is set to overlap (cover) a part (an end portion neighborhood region) of the tensile stress film TSL1 over the element isolation region 2 between the nMIS formation region 1A and the pMIS formation region 1B.

Meanwhile, when the compression stress film CSL1 instead of the tensile stress film TSL1 is set as the first stress film to be formed at Step S11 in FIG. 48 (that is, the tensile stress film TSL1 is set as the second stress film), at Step S14 in FIG. 48, the tensile stress film TSL1 lying in the pMIS formation region 1B is dry-etched and removed using the photoresist film RP1 that covers the nMIS formation region 1A and exposes the pMIS formation region 1B as the etching mask. On this occasion, since the photoresist film RP1 functions as the etching mask, the tensile stress film TSL1 (and the insulating film 51 under it) in the nMIS formation region 1A is not etched but left, and, in the pMIS formation region 1B, the compression stress film CSL1 and the insulating film 51 under it are left.

Figure 54:
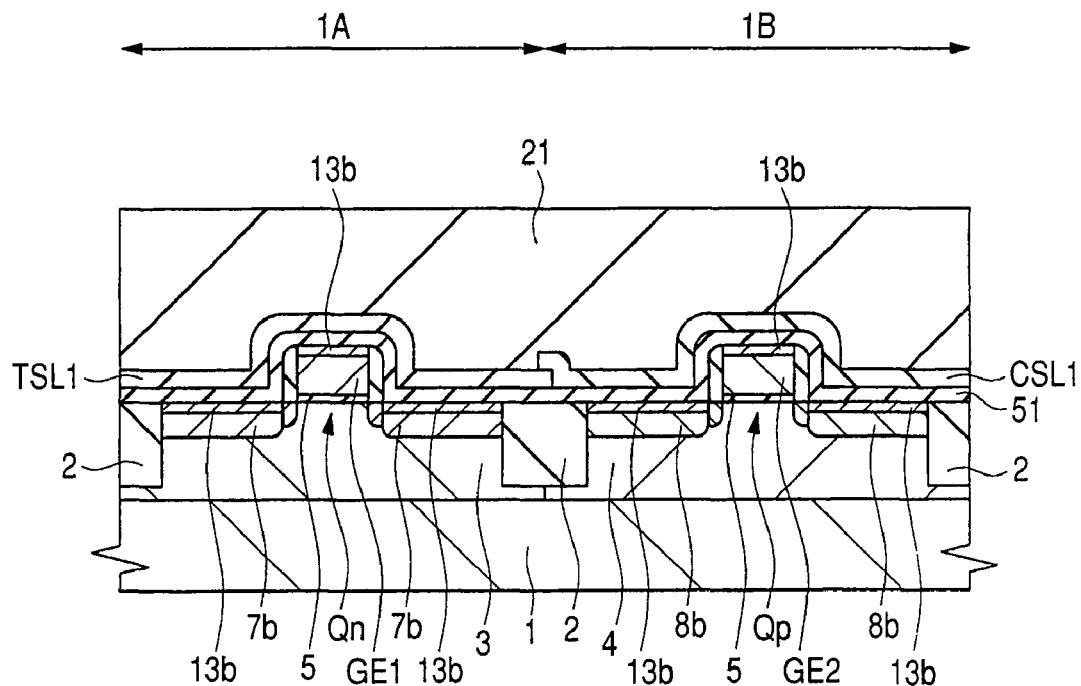
FIG. 54 is a cross-sectional view of the essential part in the manufacturing process of the semiconductor device subsequent to FIG. 53.

Subsequent processes are approximately the same as those in Embodiment 1. That is, as shown in FIG. 54, the interlayer insulating film 21 is formed over the whole main face of the semiconductor substrate 1, that is, over the main face of the semiconductor substrate 1 including the nMIS formation region 1A and pMIS formation region 1B (Step S15 in FIG. 48). The interlayer insulating film 21 is formed over the laminated film of the insulating film 51 and tensile stress film TSL1, and over the laminated film of the insulating film 51 and compression stress film CSL1, and the thickness of the interlayer insulating film 21 is greater than that of the tensile stress film TSL1, compression stress film CSL1, and insulating film 51. After the formation of the interlayer insulating film 21, the surface of the interlayer insulating film 21 is polished by a CMP method, or the like, and thereby the upper surface of the interlayer insulating film 21 is flattened.

Figure 55:
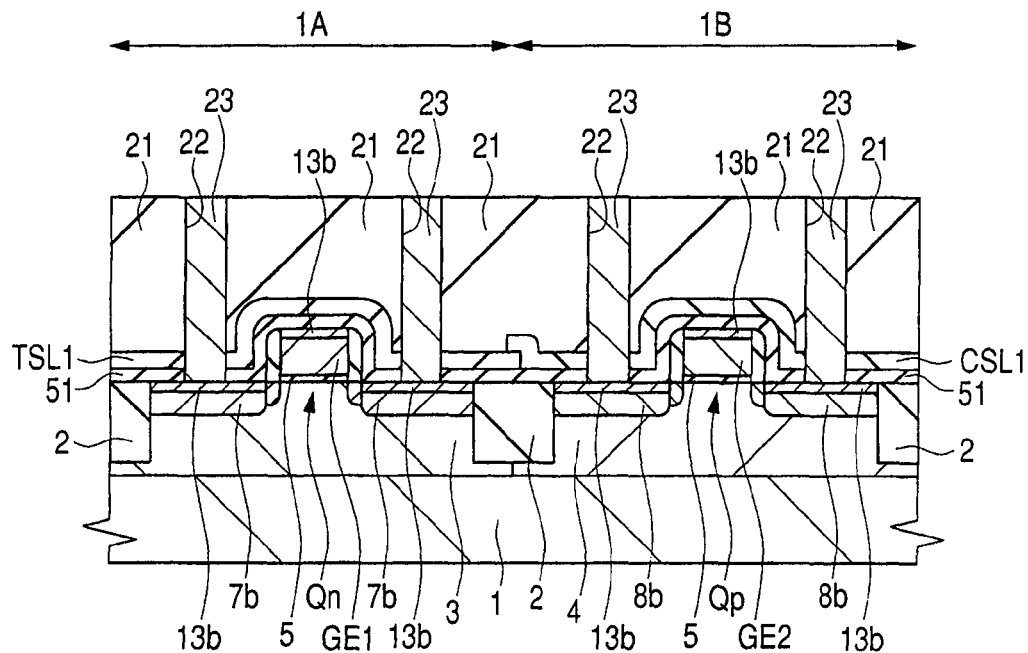
FIG. 55 is a cross-sectional view of the essential part in the manufacturing process of the semiconductor device subsequent to FIG. 54.

Next, as shown in FIG. 55, the contact hole 22 is formed by the dry etching using the photoresist pattern (not shown) formed on the interlayer insulating film 21 as the etching mask. On this occasion, in the nMIS formation region 1A, at a laminated film made of the interlayer insulating film 21, tensile stress film TSL1 and insulating film 51, the contact hole 22 passing through the laminated film is formed, and, in the pMIS formation region 1B, at a laminated film made of the interlayer insulating film 21, compression stress film CSL1 and insulating film 51, the contact hole 22 passing through the laminated film is formed.

Meanwhile, even when the compression stress film CSL1 instead of the tensile stress film TSL1 is set as the first stress film to be formed at Step S11 in FIG. 48, in the nMIS formation region 1A, at a laminated film made of the interlayer insulating film 21, tensile stress film TSL1 and insulating film 51, the contact hole 22 passing through the laminated film is formed. Further, on this occasion, in the pMIS formation region 1B, at a laminated film made of the interlayer insulating film 21, compression stress film CSL1 and insulating film 51, the contact hole 22 passing through the laminated film is formed.

Next, in the same way as that in Embodiment 1, the electroconductive plug 23 is formed inside the contact hole 22.

After that, in the same way as that in Embodiment 1, after the formation of the stopper insulating film 24 and the insulating film 25, the wiring groove 26 is formed, and the wiring M1 is formed inside the wiring groove 26. Here, the illustration and detailed description thereof are omitted.

In the semiconductor device of the embodiment thus manufactured, as shown in FIG. 55, the insulating film 51 is formed over the semiconductor substrate 1 so as to cover the n-channel type MISFET Qn and p-channel type MISFET Qp, that is, to cover gate electrodes GE1 and GE2, the n$^+$-type semiconductor region 7b and p$^+$-type semiconductor region 8b. Then, over the insulating film 51, the tensile stress film TSL1 is formed so as to cover the n-channel type MISFET Qn, that is, to cover the gate electrode GE1 and n$^+$-type semiconductor region 7b, and, the compression stress film CSL1 is formed so as to cover the p-channel type MISFET Qp, that is, to cover the gate electrode GE2 and p$^+$-type semiconductor region 8b. Further, at least a part of the compression stress film CSL1 overlaps the tensile stress film TSL1.

When the insulating film 51 is not formed, differing from the embodiment, the metal silicide layer 13b may be over-etched upon dry-etching the first stress film, which was formed at Step S11 in FIG. 48, at Step S12 in FIG. 48 to generate the decrease in the thickness or etching damage of the metal silicide layer 13b, and to raise the resistance of the metal silicide layer 13b.

In contrast, in the embodiment, the insulating film 51 is formed at Step S51 in FIG. 48, and the first stress film is formed over the insulating film 51 at Step S11 in FIG. 48, wherein the insulating film 51 is caused to function as the etching stopper upon dry-etching the first stress film at Step S12 in FIG. 48. Thereby, the occurrence of the decrease in thickness or etching damage of the metal silicide layer 13b caused by the over etching of the metal silicide layer 13b can be prevented, and the rise in the resistance of the metal silicide layer 13b can be prevented. Consequently, the performance and reliability of semiconductor devices can be improved.

Further, in the embodiment, by setting the insulating film 51, which is caused to function as the etching stopper, as a stress film of either tension or compression (more preferably, a tensile stress film), not only the stress of the tensile stress film TSL1 and the stress of the compression stress film CSL1, but also the stress of the insulating film 51 can be acted on the semiconductor substrate (the channel region of a MISFET). Consequently, it is possible to improve more appropriately the mobility of the channel of a MISFET, and to improve more the performance of a MISFET formed at the semiconductor substrate 1. Since the insulating film 51 is formed closer to the semiconductor substrate 1 than the tensile stress film TSL1 and compression stress film CSL1, the effect of improving the mobility of the channel region caused by setting the insulating film 51 as a stress film is very great.

Figure 56:
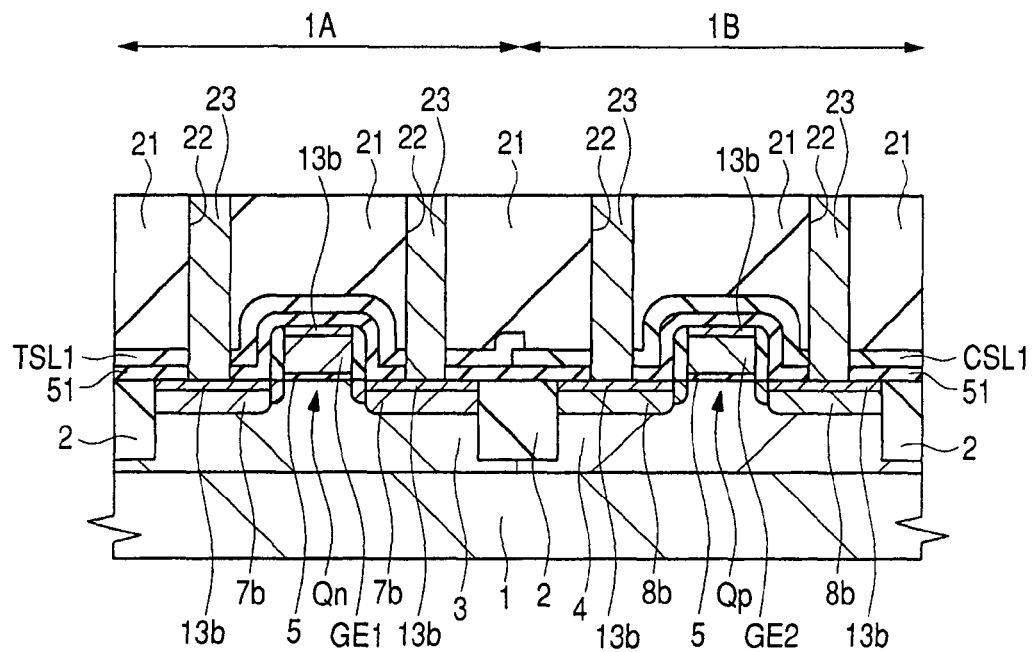
FIG. 56 is a cross-sectional view of the essential part in the manufacturing process of the semiconductor device being an Embodiment 6 of the invention when the compression stress film is set as the first stress film.

Further, in the embodiment, the instance, in which the tensile stress film TSL1 is set as the first stress film to be formed at Step S11 in FIG. 48, is mainly illustrated and described, and, the instance, in which the compression stress film CSL1 is set as the first stress film to be formed at Step S11 in FIG. 48, is also written down and explained. When the compression stress film CSL1 is set as the first stress film formed at Step S11 in FIG. 48, the shape becomes as that in FIG. 56. FIG. 56 is a cross-sectional view of the essential part in a manufacturing process of a semiconductor device of the embodiment when the compression stress film CSL1 is set as the first stress film formed at Step S11 in FIG. 48, which corresponds to FIG. 55 (the same process stage as that in FIG. 55) above.

Embodiment 7

Figure 57:
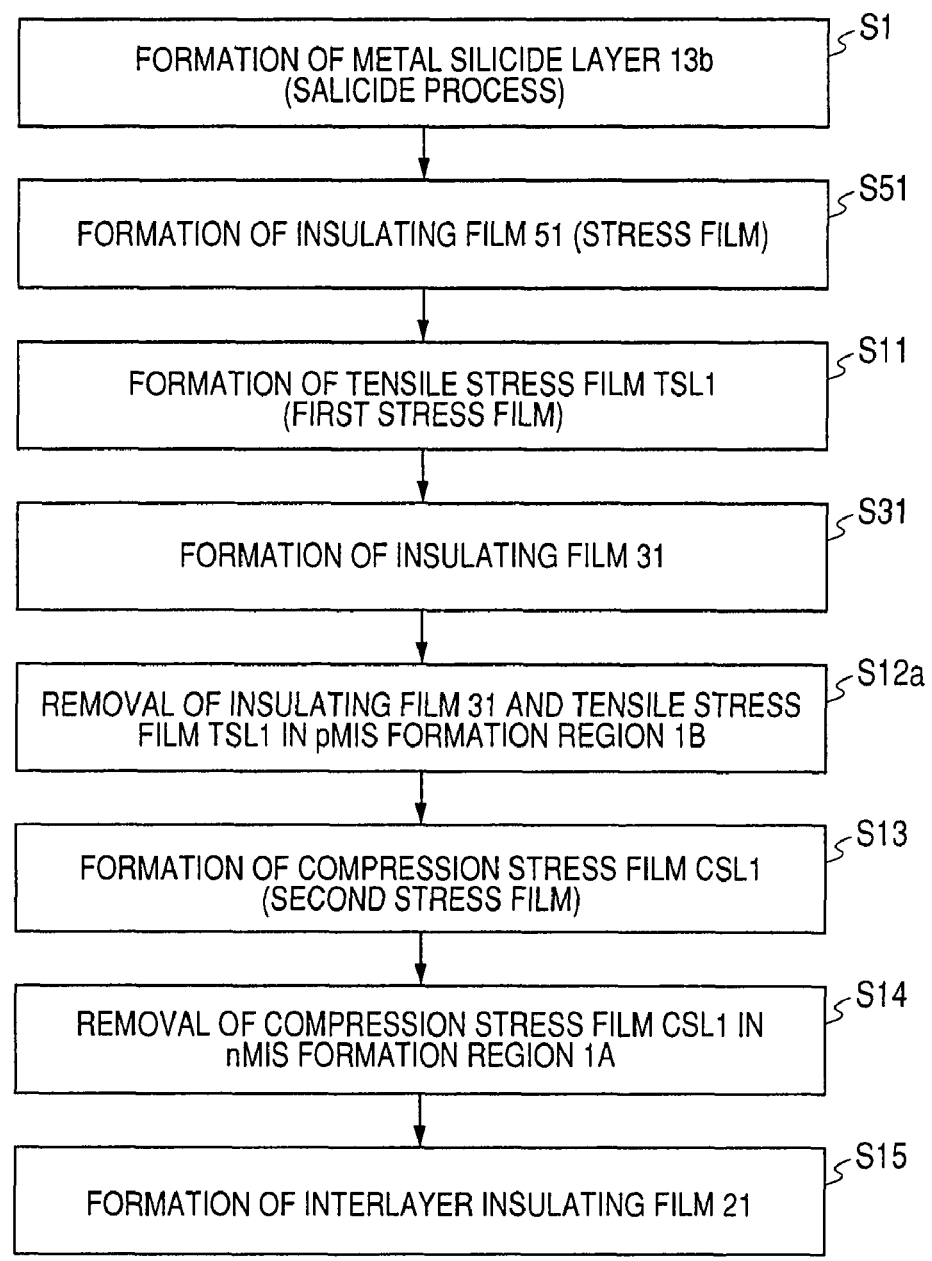
FIG. 57 is a manufacturing process flow chart showing a part of the manufacturing process of a semiconductor device being an Embodiment 7 of the invention.

FIG. 57 is a manufacturing process flow chart showing a part of the manufacturing process of a semiconductor device of the embodiment, which corresponds to FIG. 48 in Embodiment 6. FIGS. 58 to 63 are cross-sectional views of the essential part in a manufacturing process of a semiconductor device of the embodiment.

Embodiment 7 corresponds to a modification of Embodiment 6 (a modification of Embodiment 6, in which the insulating film 31 is provided on the first stress film). Since manufacturing processes of a semiconductor device of the embodiment are the same as those in Embodiment 6 up to the formation of the first stress film at Step S11 (that is, up to the obtainment of the structure in FIG. 50), the description thereof is omitted here and processes subsequent these will be described. Meanwhile, hereinafter, an instance, in which the tensile stress film TSL1 is set as the first stress film to be formed at Step S11 in FIG. 57, is illustrated and described, but, the compression stress film CSL1 instead of the tensile stress film TSL1 may also be set as the first stress film to be formed at Step S11 in FIG. 57.

Figure 58:
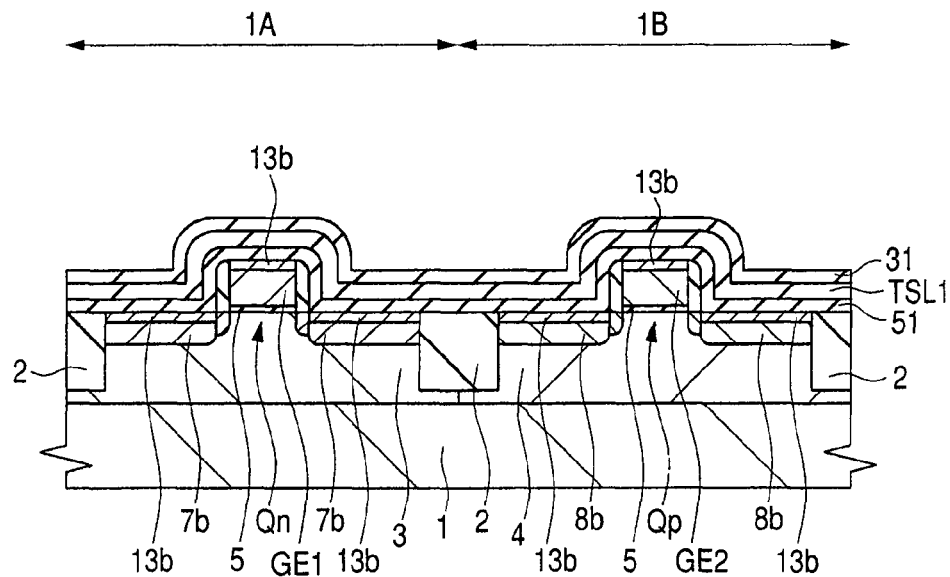
FIG. 58 is a cross-sectional view of the essential part in a manufacturing process of the semiconductor device being Embodiment 7 of the invention.

Next, as shown in FIG. 58, the insulating film 31 is formed over the whole main face of the semiconductor substrate 1 including the nMIS formation region 1A and pMIS formation region 1B, that is, over the tensile stress film TSL1 (Step S31 in FIG. 57).

Although a film of silicon oxide represented by $SiO_2$ is most suitable for the insulating film 31, the film is not limited to it only when the film can give etching selectivity for the second stress film to be formed at Step S13, which will be described later. For example, when the second stress film to be formed at Step S13 described later is a silicon nitride film, as the insulating film 31, not only a silicon oxide film, but a silicon carbide film (a SiC film), a silicon carbonitride film (a SiCN film) or a silicon oxynitride film (a SiON film) may also be employed. However, in order to give etching selectivity for the second stress film to be formed at Step S13 described later, the insulating film 31 needs to be formed from a material different from that of the second stress film to be formed at Step S13 described later. The insulating film 31 preferably has a thickness (formed film thickness) of around 6 to 20 nm.

Meanwhile, when the compression stress film CSL1 instead of the tensile stress film TSL1 is set as the first stress film formed at Step S11 in FIG. 57, at Step S31 in FIG. 57, the insulating film 31 is formed over the compression stress film CSL1.

Figure 59:
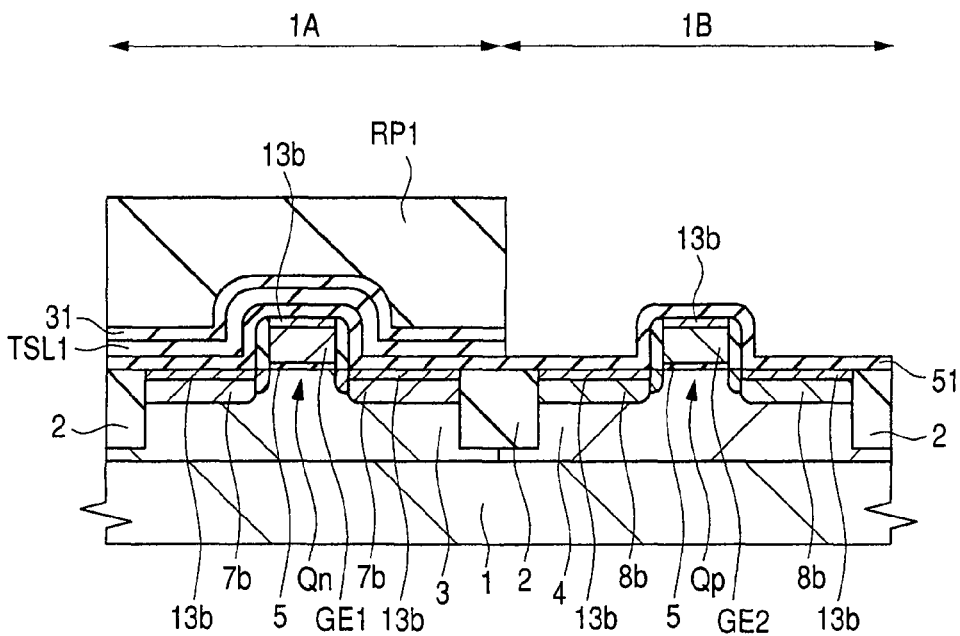
FIG. 59 is a cross-sectional view of the essential part in the manufacturing process of the semiconductor device subsequent to FIG. 58.

Next, as shown in FIG. 59, after the formation of the photoresist film RP1 that covers the nMIS formation region 1A and exposes the pMIS formation region 1B using a photolithographic method, the insulating film 31 and tensile stress film TSL1 under it lying in the pMIS formation region 1B are dry-etched and removed using the photoresist film RP1 as the etching mask (Step S12a in FIG. 57).

In the dry etching process at Step S12a in FIG. 57, firstly, by dry-etching the insulating film 31 under conditions in which the insulating film 31 is etched more easily as compared with the tensile stress film TSL1, the tensile stress film TSL1 is caused to function as the etching stopper film, and, after that, by dry-etching the tensile stress film TSL1 under conditions in which the tensile stress film TSL1 is etched more easily as compared with the insulating film 51 to cause the insulating film 51 to function as the etching stopper film. That is, the insulating film 51 is caused to function as the etching protective film (the barrier against the etching) for the metal silicide layer 13b. Further, on this occasion, since the photoresist film RP1 functions as the etching mask, the laminated film of the insulating film 31, tensile stress film TSL1 and insulating film 51 of the nMIS formation region 1A is not etched but left. After that, the photoresist film RP1 is removed by ashing or the like.

Under the boundary line (the border) between the dry etching target region (the region where the tensile stress film TSL1 is etched and removed) and the non-target region (the region where the tensile stress film TSL1 is not etched but left) upon dry-etching the insulating film 31 and tensile stress film TSL1 under it at Step S12a in FIG. 57, the element isolation region 2 preferably lies in order to protect the metal silicide layer 13b. Specifically, in the region schematically shown by numeral 20 in FIG. 10, the boundary line lies between the target region and non-target region for dry etching.

Meanwhile, when the compression stress film CSL1 is set as the first stress film to be formed at Step S11 in FIG. 57, at Step S12a in FIG. 57, the insulating film 31 and first stress film (the compression stress film CSL1) under it of the nMIS formation region 1A are dry-etched and removed using the photoresist film RP2 that covers the pMIS formation region 1B and exposes the nMIS formation region 1A as the etching mask to cause the insulating film 51 to function as the etching stopper film.

Further, when dry-etching the first stress film, which has been formed at Step S11 in FIG. 57, at Step S12a, even when the all or most of the insulating film 51 is removed in the etching target region (the region in which the first stress film is etched and removed), it is possible to suppress the decrease in film thickness and etching damage of the metal silicide layer 13b caused by over etching, as compared with an instance where no insulating film 51 is provided. However, upon dry-etching the first stress film, which has been formed at Step S11 in FIG. 57, at Step S12a, it is more preferable to leave at least a part (a lower layer portion) of the insulating film 51 in laminate so that the metal silicide layer 13b is not exposed, in the etching target region (the region in which the first stress film is etched and removed). This makes it possible to prevent more appropriately the decrease in film thickness and etching damage of the metal silicide layer 13*b* caused by over etching.

Figure 60:
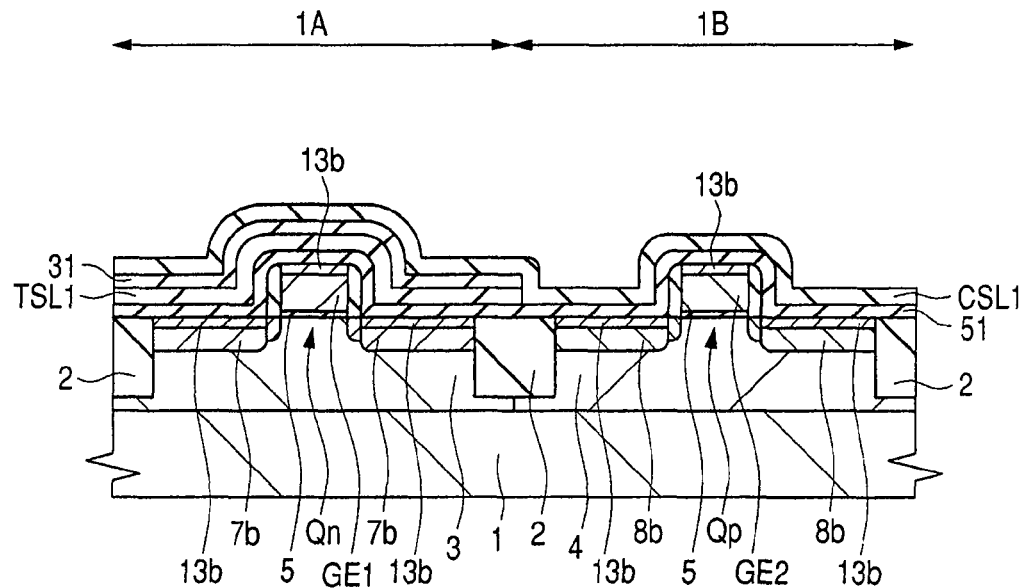
FIG. 60 is a cross-sectional view of the essential part in the manufacturing process of the semiconductor device subsequent to FIG. 59.

Next, as shown in FIG. 60, the second stress film is formed over the whole main face of the semiconductor substrate 1, that is, over the main face of the semiconductor substrate 1 including the nMIS formation region 1A and pMIS formation region 1B (Step S13 in FIG. 57). The second stress film formed at Step S13 in FIG. 57 is a film that gives stress in the opposite direction as compared with the first stress film formed at Step S11 in FIG. 57, and, when the tensile stress film TSL1 is set as the first stress film to be formed at Step S11 in FIG. 57, the second stress film formed at Step S13 in FIG. 57 is the compression stress film CSL1, as shown in FIG. 60.

At Step S13 in FIG. 57, the compression stress film CSL1 is formed, in the pMIS formation region 1B, over the remaining insulating film 51, and, in the nMIS formation region 1A, the compression stress film CSL1 is formed over the insulating film 31, because the laminated film of the insulating film 31, tensile stress film TSL1 and insulating film 51 exists.

Meanwhile, when the compression stress film CSL1 instead of the tensile stress film TSL1 is set as the first stress film to be formed at Step S11 in FIG. 57, the tensile stress film TSL1 instead of the compression stress film CSL1 is formed as the second stress film at Step S13 in FIG. 57.

Figure 61:
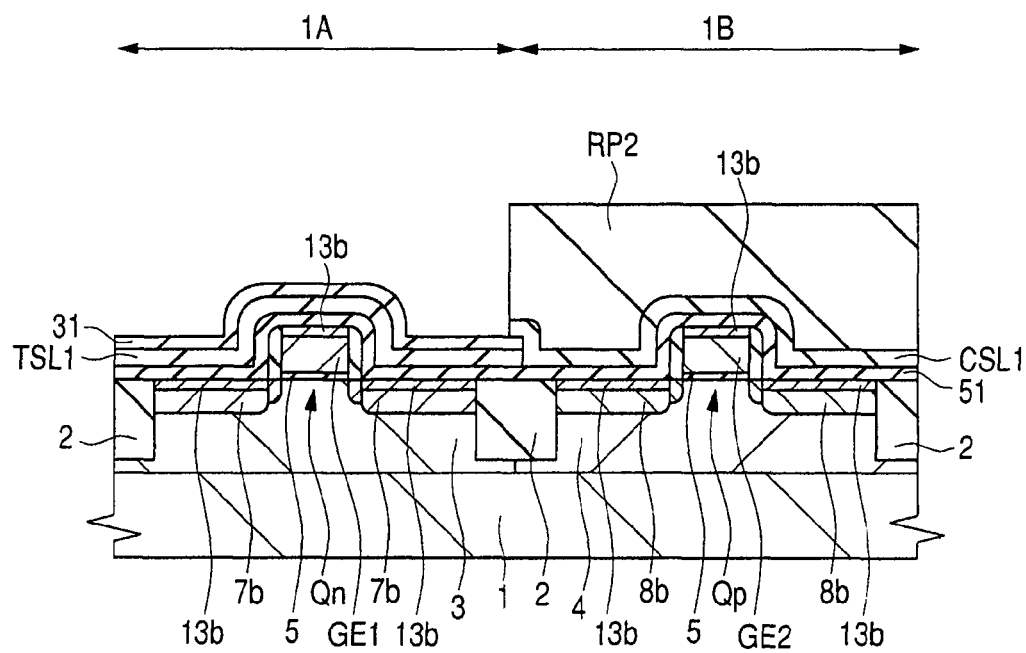
FIG. 61 is a cross-sectional view of the essential part in the manufacturing process of the semiconductor device subsequent to FIG. 60.

Next, as shown in FIG. 61, after the formation of the photoresist film RP2 that covers the pMIS formation region 1B and exposes the nMIS formation region 1A using a photolithographic method, the compression stress film CSL1 lying in the nMIS formation region 1A is dry-etched and removed using the photoresist film RP2 as the etching mask (Step S14 in FIG. 57)

The dry etching process (the process for removing the compression stress film CSL1) at Step S14 in FIG. 57 in the embodiment is similar to the dry etching process (the process for removing the compression stress film CSL1) at Step S14 in FIG. 48 in Embodiment 6, except for causing the insulating film 31 to function as the etching stopper.

That is, in the dry etching process at Step S14 in FIG. 57 in the embodiment, since the photoresist film RP2 functions as the etching mask, the compression stress film CSL1 and insulating film 51 under it of the pMIS formation region 1B are not etched but are left. Further, in the dry etching process at Step S14 in FIG. 57, by dry-etching the compression stress film CSL1 under conditions in which the compression stress film CSL1 is easily etched as compared with the insulating film 31, the insulating film 31 is caused to function as the etching stopper film. Consequently, in the nMIS formation region 1A not covered with the photoresist film RP2, the insulating film 31, and the tensile stress film TSL1 and insulating film 51 under it are left. Consequently, the metal silicide layer 13*b* is not exposed in both nMIS formation region 1A and pMIS formation region 1B. After the dry etching process at Step S14 in FIG. 57, the photoresist film RP2 is removed by ashing or the like.

In the embodiment, since the insulating film 31 functions as the etching stopper (an etching protective film for the tensile stress film TSL1) in the dry etching process at Step S14 in FIG. 57, the etching of the tensile stress film TSL1 (the first stress film formed at Step S11 in FIG. 57) can be prevented, and the decrease in the thickness of the tensile stress film TSL1 (the first stress film formed at Step S11 in FIG. 57) can be prevented.

Meanwhile, in the dry etching process at Step S14 in FIG. 57, possibly there is such case that a part of the insulating film 31 (an upper layer portion) is etched (removed) by over etching in the nMIS formation region 1A. However, it is preferable to design so that, at the end stage of the dry etching process at Step S14 in FIG. 57, at least a part of the insulating film 31 (a lower layer portion) remains in laminate on the tensile stress film TSL1 in the nMIS formation region 1A, not to expose the tensile stress film TSL1. This makes it possible to prevent appropriately the etching of the tensile stress film TSL1 in the dry etching process at Step S14 in FIG. 57.

When dry-etching the compression stress film CSL1 at Step S14 in FIG. 57, in order to prevent damages on the element isolation region 2 by the dry etching, the formation of a portion in which a part of the compression stress film CSL1 covers the laminated film of the insulating film 31 and tensile stress film TSL1, as shown in FIG. 61, is preferable. That is, the compression stress film CSL1 is set to overlap (cover) a part (an end portion neighborhood region) of the laminated film of the insulating film 31 and tensile stress film TSL1 above the element isolation region 2 between the nMIS formation region 1A and pMIS formation region 1B, at the end of the dry etching of the compression stress film CSL1 at Step S14.

Meanwhile, when the compression stress film CSL1 instead of the tensile stress film TSL1 is set as the first stress film to be formed at Step S11 in FIG. 57 (that is, the tensile stress film TSL1 is set as the second stress film), at Step S14 in FIG. 57, the tensile stress film TSL1 lying in the pMIS formation region 1B is dry-etched and removed, using the photoresist film RP1, which covers the nMIS formation region 1A and exposes the pMIS formation region 1B, as the etching mask. On this occasion, since the photoresist film RP1 functions as the etching mask, the tensile stress film TSL1 (and the insulating film 51 under it) in the nMIS formation region 1A is not etched but left, and, by causing the insulating film 31 to function as the etching stopper film, the insulating film 31, and the compression stress film CSL1 and insulating film 51 under it are left in the pMIS formation region 1B.

Figure 62:
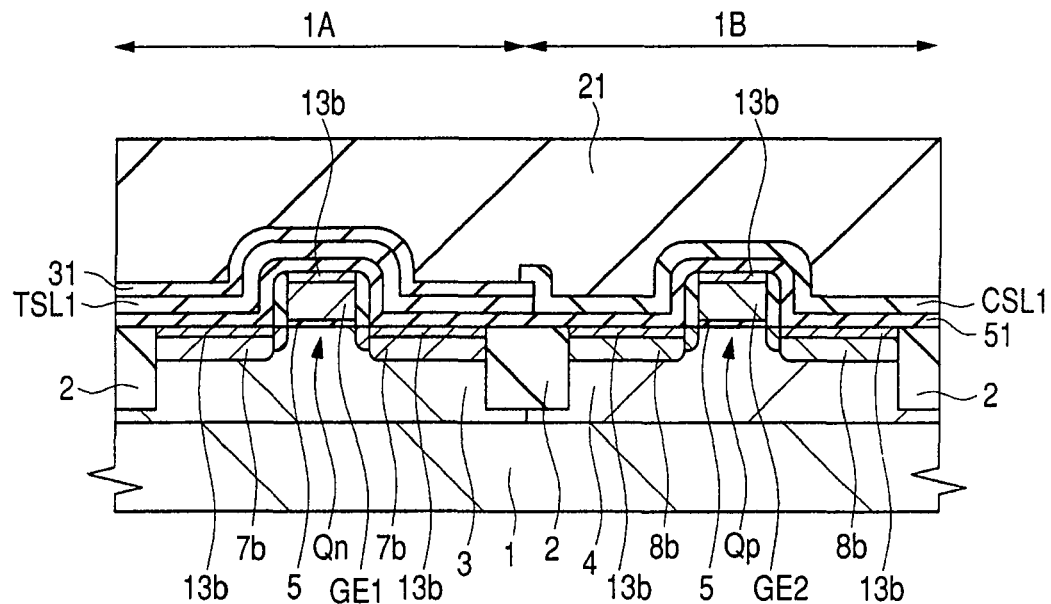
FIG. 62 is a cross-sectional view of the essential part in the manufacturing process of the semiconductor device subsequent to FIG. 61.

Subsequent processes are approximately the same as those in the embodiment 1. That is, as shown in FIG. 62, the interlayer insulating film 21 is formed over the whole main face of the semiconductor substrate 1, that is, over the main face of the semiconductor substrate 1 including the nMIS formation region 1A and pMIS formation region 1B (Step S15 in FIG. 57). The interlayer insulating film 21 is formed over the laminated film of the insulating film 51, tensile stress film TSL1 and insulating film 31, and over the laminated film of the insulating film 51 and compression stress film CSL1, and the thickness of the interlayer insulating film 21 is greater than that of the tensile stress film TSL1, compression stress film CSL1, insulating film 31 and insulating film 51. After the formation of the interlayer insulating film 21, the surface of the interlayer insulating film 21 is polished by a CMP method, or the like, and thereby the upper surface of the interlayer insulating film 21 is flattened.

Figure 63:
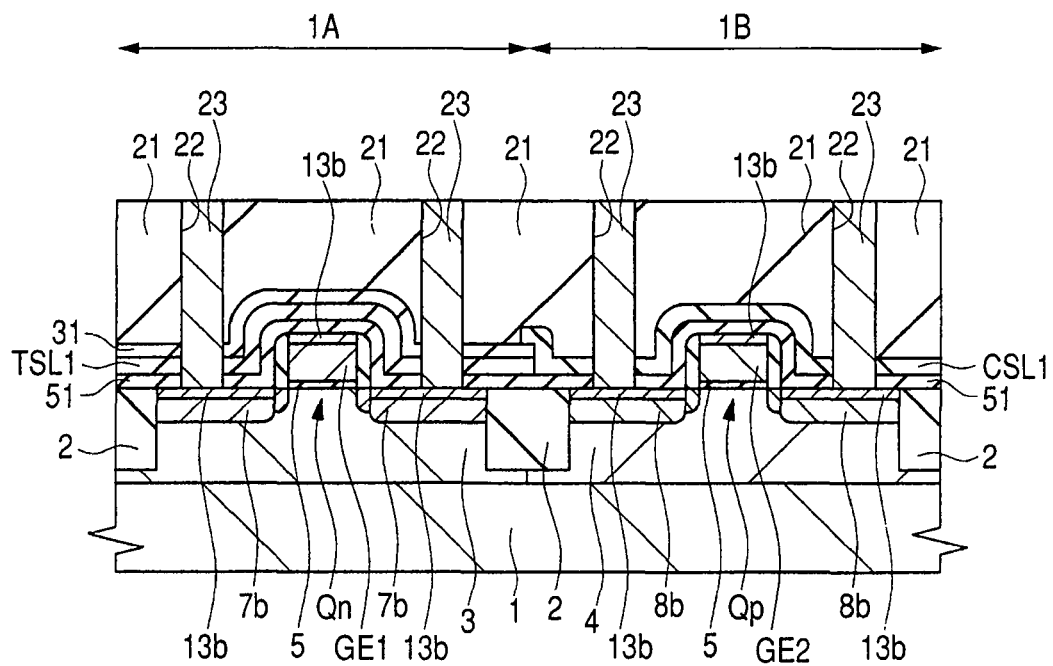
FIG. 63 is a cross-sectional view of the essential part in the manufacturing process of the semiconductor device subsequent to FIG. 62.

Next, as shown in FIG. 63, the contact hole 22 is formed by the dry etching using a photoresist pattern (not shown) formed on the interlayer insulating film 21 as the etching mask. On this occasion, in the nMIS formation region 1A, at a laminated film made of the interlayer insulating film 21, insulating film 31, tensile stress film TSL1 and insulating film 51, the contact hole 22 passing through the laminated film is formed, and, in the pMIS formation region 1B, at a laminated film made of the interlayer insulating film 21, compression stress film CSL1 and insulating film 51, the contact hole 22 passing through the laminated film is formed.

Meanwhile, when the compression stress film CSL1 instead of the tensile stress film TSL1 is set as the first stress film to be formed at Step S11 in FIG. 57, in the nMIS formation region 1A, at a laminated film made of the interlayer insulating film 21, tensile stress film TSL1 and insulating film 51, the contact hole 22 passing through the laminated film is formed. On this occasion, in the pMIS formation region 1B, at a laminated film made of the interlayer insulating film 21, insulating film 31, compression stress film CSL1 and insulating film 51, the contact hole 22 passing through the laminated film is formed.

Next, in the same way as that in Embodiment 1, the electroconductive plug 23 is formed in the contact hole 22.

After that, in the same way as that in Embodiment 1, the stopper insulating film 24 and the insulating film 25 are formed, and, after that, the wiring groove 26 is formed, and the wiring M1 is formed inside the wiring groove 26, but, here, the illustration and detailed description thereof are omitted.

When comparing the semiconductor device of the embodiment thus manufactured (FIG. 63) with the semiconductor device in Embodiment 6 (FIG. 55), the former is different from the latter in that the insulating film 31 lies over the tensile stress film TSL1 (between the tensile stress film TSL1 and the interlayer insulating film 21) in the nMIS formation region 1A. The insulating film 31 and the tensile stress film TSL1 have the same planar shape. Further, at least a part of the compression stress film CSL1 overlaps the laminated film of the insulating film 31 and tensile stress film TSL1.

In Embodiment 7, following effects can be further obtained in addition to that obtained in Embodiment 6. That is, in the embodiment, by causing the insulating film 31 formed at Step S31 in FIG. 57 to function as the etching stopper (the etching protective film for the first stress film) in the dry etching process (the process for removing the second stress film) at Step S14 in FIG. 57, it is possible to prevent the etching of the first stress film and to prevent the decrease in the thickness of the first stress film. As the result, the deposited film thickness (the film thickness when the first stress film is formed at Step S11 in FIG. 57) is maintained as the thickness of the first stress film in the manufactured semiconductor device. Since the deposited film thickness upon film deposition over the semiconductor wafer can be controlled with high accuracy, if the deposited film thickness can be maintained as the thickness of the first stress film, as in the embodiment, the thickness of the first stress film in manufactured semiconductor devices can be set to an approximately designed value, which makes it possible to set the stress value acting on MISFETs approximately to the designed value itself. Further, in the embodiment, since the deposited film thickness can be maintained as the thickness of the first stress film, variation of the thickness of the first stress film can be suppressed for each wafer, and the spread of MISFET properties among wafers can be suppressed.

Figure 64:
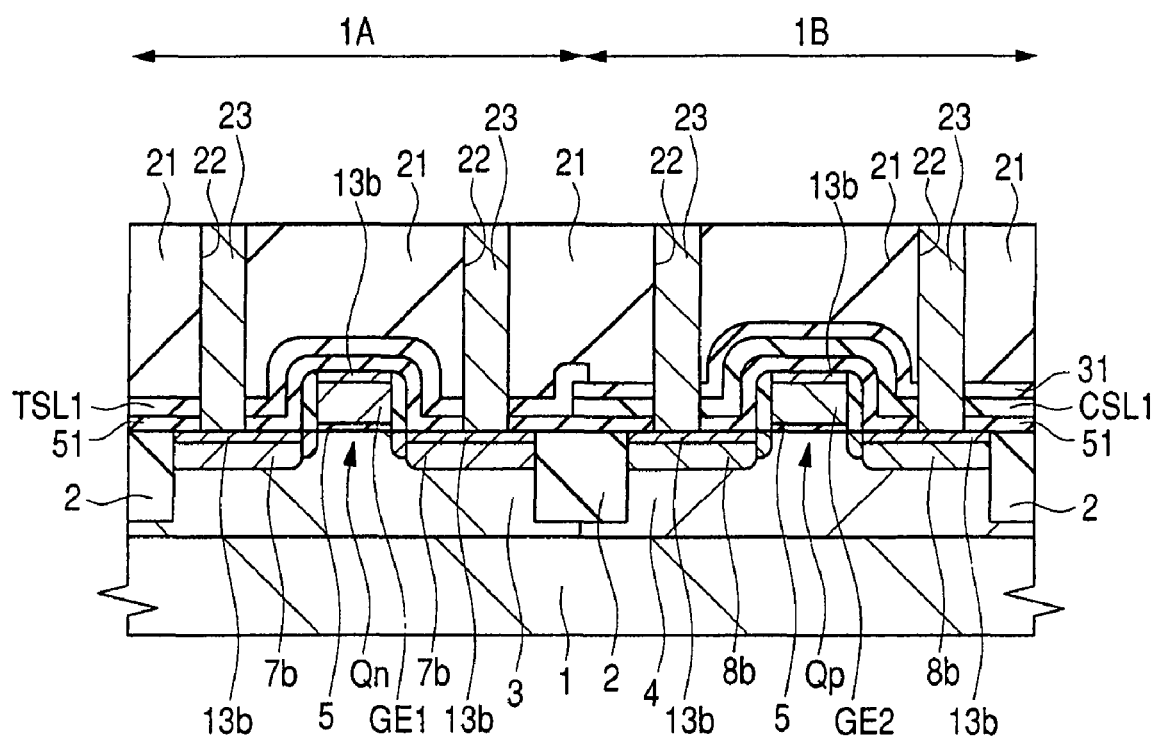
FIG. 64 is a cross-sectional view of the essential part in the manufacturing process of the semiconductor device being Embodiment 7 of the invention when the compression stress film is set as the first stress film.

In the embodiment, the instance, in which the tensile stress film TSL1 is set as the first stress film to be formed at Step S11 in FIG. 57, is mainly illustrated and described, and, the instance, in which the compression stress film CSL1 is set as the first stress film to be formed at Step S11 in FIG. 57, is also written down and explained. When the compression stress film CSL1 is set as the first stress film formed at Step S11 in FIG. 57, the shape becomes as that in FIG. 64. FIG. 64 is a cross-sectional view of the essential part in a manufacturing process of a semiconductor device of the embodiment when the compression stress film CSL1 is set as the first stress film formed at Step S11 in FIG. 57, which corresponds to FIG. 63 (the same process stage as that in FIG. 63) above.

Embodiment 8

Figure 65:
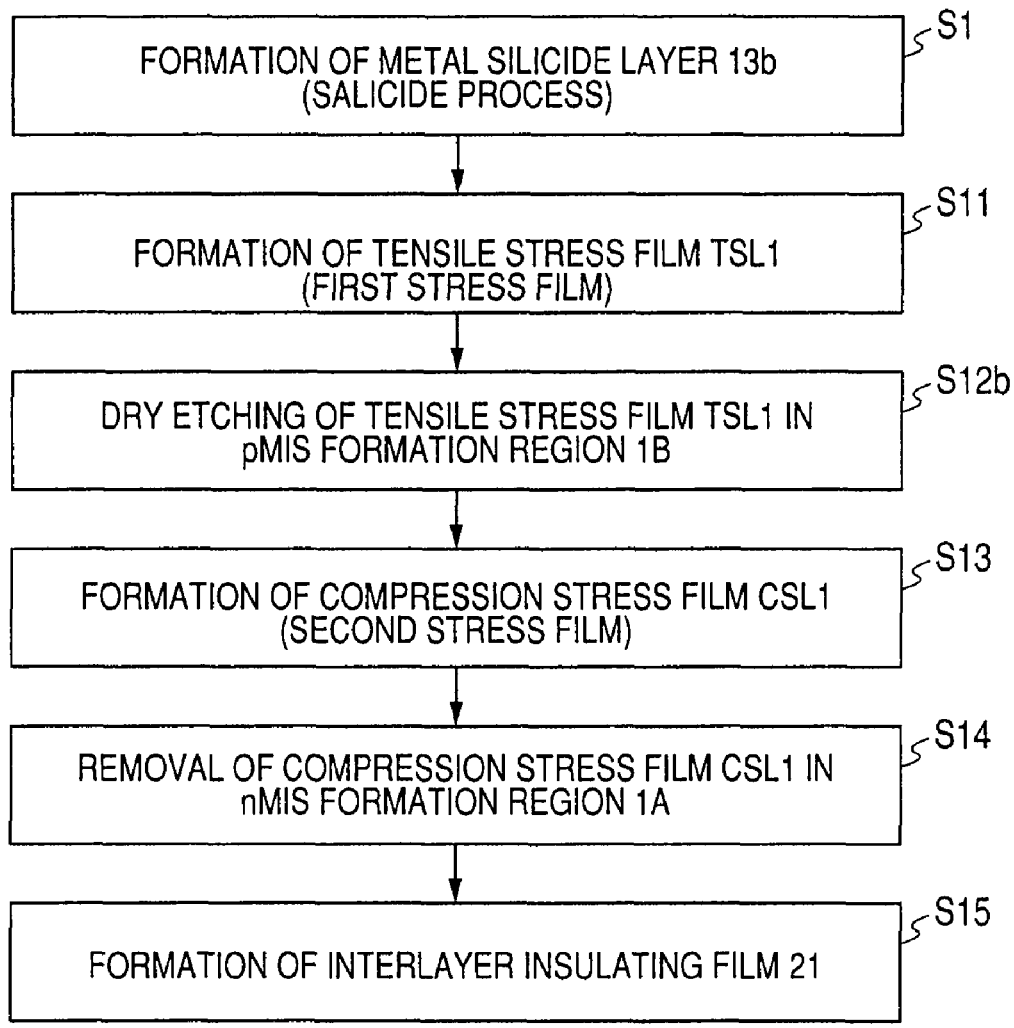
FIG. 65 is a manufacturing process flow chart showing a part of the manufacturing process of a semiconductor device being an Embodiment 8 of the invention.
Figure 66:
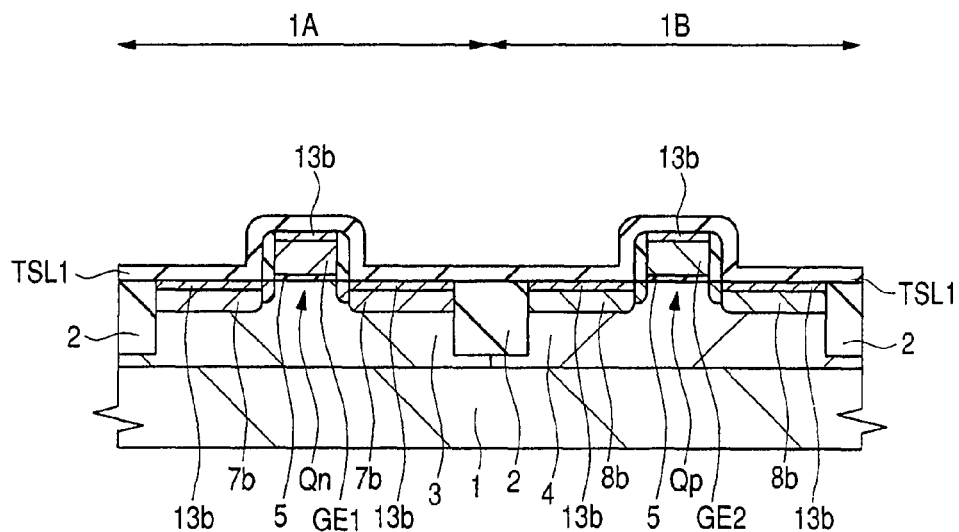
FIG. 66 is a cross-sectional view of the essential part in a manufacturing process of the semiconductor device being Embodiment 8 of the invention.
Figure 67:
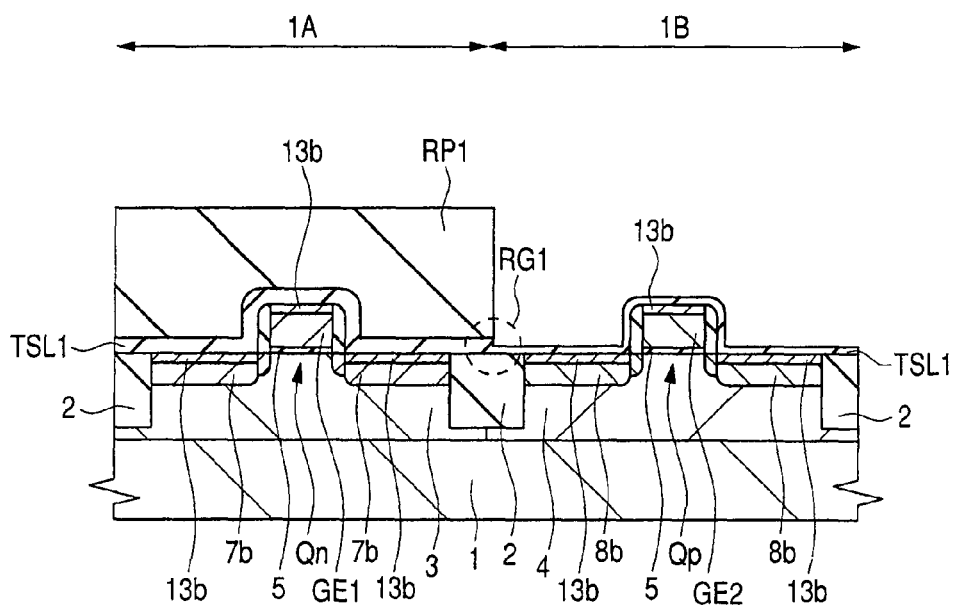
FIG. 67 is a cross-sectional view of the essential part in the manufacturing process of the semiconductor device subsequent to FIG. 66.

FIG. 65 is a manufacturing process flow chart showing a part of the manufacturing process of a semiconductor device of the present embodiment, which corresponds to FIG. 3 in Embodiment 1. FIGS. 66 and 67 are cross-sectional views of the essential part in a manufacturing process of a semiconductor device of the embodiment.

The manufacturing process of a semiconductor device of the embodiment can be performed in approximately the same way as that in Embodiment 1 up to the formation of the metal silicide layer 13b (that is, up to the obtainment of the structure in FIG. 7), and the description thereof is omitted here.

However, as described also in Embodiment 4, also in the embodiment, the process for forming the metal silicide layer 13b at Step S1 is not limited to the Step S1 described in Embodiment 1. That is, also in Embodiment 8, the material, concentration distribution and formation method of the metal silicide layer 13b are not limited to the material, concentration distribution and formation method of the metal silicide layer 13b as described in Embodiment 1, similar to the instance in Embodiments 4 to 7. For example, one or more elements selected from the group made of Ni (nickel), Co (cobalt), Pt (platinum), Pd (palladium), Hf (hafnium), V (vanadium), Er (erbium), Ir (iridium) and Yb (ytterbium) may be employed as the metal element constituting the metal silicide layer 13b in the embodiment.

After performing processes up to the process for forming the metal silicide layer 13b to give the structure in FIG. 7, in the embodiment, as shown in FIG. 66, the first stress film is formed over the whole main face of the semiconductor substrate 1, that is, over the main face of the semiconductor substrate 1 including the nMIS formation region 1A and pMIS formation region 1B (Step S11 in FIG. 65). At Step S11 in FIG. 65, the first stress film is formed over the semiconductor substrate 1 including the metal silicide layer 13b so as to cover the gate electrodes GE1 and GE2 and the sidewall 9. Hereinafter, an instance in which the tensile stress film TSL1 is set as the first stress film to be formed at Step S11 in FIG. 65 is illustrated and described, but, the compression stress film CSL1 instead of the tensile stress film TSL1 may be set as the first stress film to be formed at Step S11 in FIG. 65. Since the material, thickness and formation method of the tensile stress film TSL1 and compression stress film CSL1 in the embodiment are the same as those in Embodiment 1, the description thereof is omitted here.

Next, as shown in FIG. 67, after the formation of the photoresist film RP1 that covers the nMIS formation region 1A and exposes the pMIS formation region 1B using a photolithographic method, the tensile stress film TSL1 lying in the pMIS formation region 1B is dry-etched using the photoresist film RP1 as the etching mask (Step S12b in FIG. 65). On this occasion, since the photoresist film RP1 functions as the etching mask, the tensile stress film TSL1 of the nMIS formation region 1A is not etched but left. Further, in the embodiment, not all the tensile stress film TSL1 lying in the pMIS formation region 1B is removed in the dry etching process at Step S12b in FIG. 65, but only the upper layer portion of the tensile stress film TSL1 is dry-etched and removed in the pMIS formation region 1B and apart (the lower layer portion) of the tensile stress film TSL1 is not removed but left in laminate, so that the metal silicide layer 13b is not exposed. That is, in the dry etching process at Step S12b in FIG. 65, in the pMIS formation region 1B, the etching is ended before all the tensile stress film TSL1 is removed, although a part (the upper layer portion) of the tensile stress film TSL1 is removed. As the result, in the pMIS formation region 1B (particularly, over the metal silicide layer 13b of the pMIS formation region 1B) after the end of the dry etching at Step S12b in FIG. 65, a part (the lower layer portion) of the tensile stress film TSL1 is left and the metal silicide layer 13b is not exposed. After that, the photoresist film RP1 is removed by ashing or the like.

Figure 68:
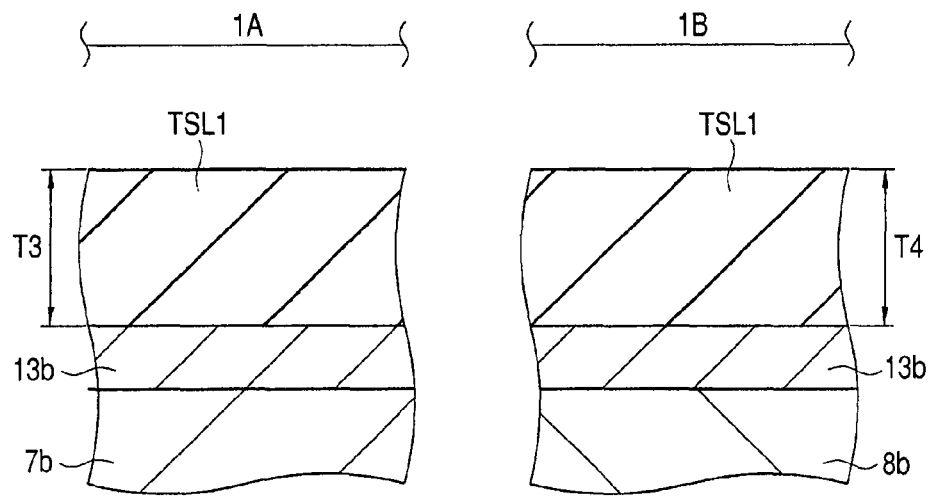
FIG. 68 is a cross-sectional view of the essential part in a manufacturing process of the same semiconductor device as in FIG. 66.
Figure 69:
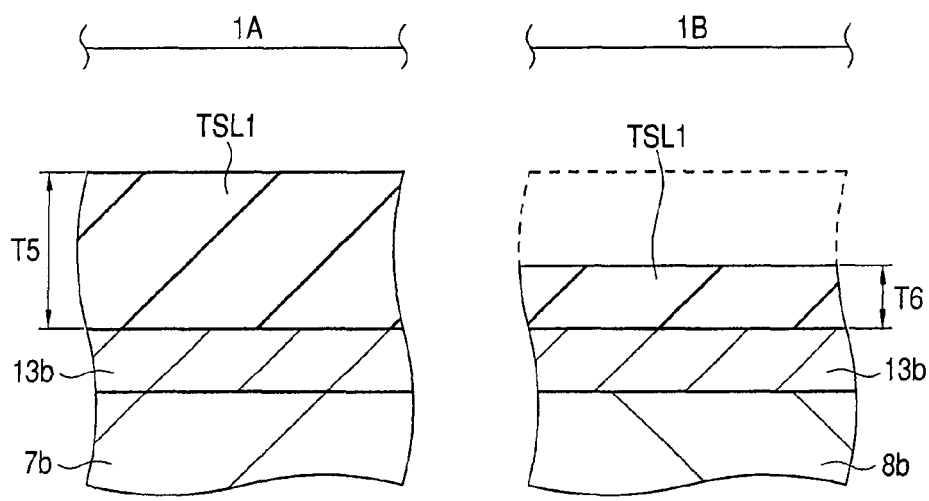
FIG. 69 is a cross-sectional view of another essential part in a manufacturing process of the same semiconductor device as in FIG. 67.

FIGS. 68 and 69 are cross-sectional views of the essential part (partially enlarged cross-sectional views) in a manufacturing process of a semiconductor device of the embodiment, wherein the neighborhood region of the metal silicide layer 13b formed at the upper portion of the n$^+$-type semiconductor region 7b of the nMIS formation region 1A, and the neighborhood region of the metal silicide layer 13b formed at the upper portion of the p$^+$-type semiconductor region 8b of the pMIS formation region 1B are enlarged and shown. Of these, FIG. 68 corresponds to a stage (the same process stage as that in FIG. 66) just after forming the first stress film (the tensile stress film TSL1 in the case of FIG. 68) at Step S11 in FIG. 65. FIG. 69 corresponds to a stage just after removing the photoresist film RP1 after dry-etching the first stress film (the tensile stress film TSL1 in the case of FIG. 69) at Step S12b in FIG. 65 (the process stage wherein the photoresist film RP1 is removed from the stage in FIG. 67). Meanwhile, in FIG. 69, a part of the tensile stress film TSL1 having been dry-etched (removed) at Step S12b in FIG. 65 is shown with a dotted line.

At the stage wherein the first stress film (the tensile stress film TSL1 in the case of FIG. 68) is formed at Step S11 in FIG. 65, as shown in FIG. 68, the thickness of the first stress film (the tensile stress film TSL1 in the case of FIG. 68) in the nMIS formation region 1A (film thickness, the deposited film thickness) T3 is approximately the same as the thickness of the first stress film (the tensile stress film TSL1 in the case of FIG. 68) in the pMIS formation region 1B (film thickness, the deposited film thickness) T4 (that is, T3=T4).

However, at the stage after dry-etching the first stress film (the tensile stress film TSL1 in the case of FIG. 69) at Step S12b in FIG. 65, as shown in FIG. 69, in the pMIS formation region 1B, a part (the upper layer portion) of the tensile stress film TSL1 has been removed by the dry etching but a part (the lower layer portion) of the tensile stress film TSL1 remains in laminate. That is, in the pMIS formation region 1B, a part of the tensile stress film TSL1 remains in laminate over the metal silicide layer 13b. Accordingly, at the stage after dry-etching the tensile stress film TSL1 at Step S12b in FIG. 65, the thickness (film thickness) T6 of the tensile stress film TSL1 remaining in the pMIS formation region 1B becomes thinner than the thickness T4 of the tensile stress film TSL1 at the stage of being formed at Step S11 in FIG. 65, but is greater than zero (that is, 0<T6<T4).

On the other hand, in the dry etching process of the tensile stress film TSL1 at Step S12b, the tensile stress film TSL1 of the pMIS formation region 1B is dry-etched, but the tensile stress film TSL1 of the nMIS formation region 1A is not dry-etched because it is covered with the photoresist film RP1. Accordingly, in the stage after dry-etching the tensile stress film TSL1 at Step S12b in FIG. 65, the thickness (film thickness) T5 of the tensile stress film TSL1 in the nMIS formation region 1A is the same as the thickness T3 of the tensile stress film TSL1 in the stage of the film deposition at Step S11 in FIG. 65 (that is, T3=T5).

Consequently, even when the tensile stress film TSL1 has the same thickness in the nMIS formation region 1A and in the pMIS formation region 1B (that is, T3=T4) at the film deposition, after the dry etching process of the tensile stress film TSL1 at Step S12b, the tensile stress film TSL1 has a smaller thickness in the pMIS formation region 1B than in the nMIS formation region 1A (that is, T5>T6). As the result, since the tensile stress film TSL1 having a greater thickness T5 can apply a strong tensile stress to the semiconductor substrate 1 of the nMIS formation region 1A, the mobility of the channel of the n-channel type MISFET Qn formed in the nMIS formation region 1A can be improved. On the other hand, in the pMIS formation region 1B, since the remaining tensile stress film TSL1 has a small thickness T6 and applies a comparatively small tensile stress, the compression stress film CSL1 to be formed at Step S13, which is described later, can apply a strong compression stress to the semiconductor substrate 1 of the pMIS formation region 1B, and the mobility of the channel of the p-channel type MISFET can be improved. As the result, the performance of both n-channel type MISFET Qn of the nMIS formation region 1A and p-channel type MISFET Qp of the pMIS formation region 1B can be improved.

Further, at the stage after dry-etching the tensile stress film TSL1 at Step S12b in FIG. 65, the tensile stress film TSL1 remaining in the pMIS formation region 1B preferably has a thickness T6 of 2 nm or more (that is, T6≧2 nm). As the result, even when the dry etching process at Step S12b in FIG. 65 somewhat varies every semiconductor wafer, since the tensile stress film TSL1 can surely remain in the pMIS formation region 1B, the exposure of the metal silicide layer 13b can surely be prevented.

Further, at the stage after dry-etching the tensile stress film TSL1 at Step S12b in FIG. 65, the tensile stress film TSL1 remaining in the pMIS formation region 1B preferably has a thickness T6 of 10 nm or less (that is, T6≦10 nm). As the result, the tensile stress applied to the channel region of the p-channel type MISFET Qp by the remaining tensile stress film TSL1 can appropriately be suppressed.

FIG. 70 is a partially enlarged cross-sectional view of the neighborhood of the border between the dry etching target region (the region in which the tensile stress film TSL1 is etched) and the non-target region (the tensile stress film TSL1 is not etched) upon dry-etching the tensile stress film TSL1 at Step S12b in FIG. 65, and shows an enlarged view of a region RG1 surrounded by the dotted line in FIG. 67, wherein the state in which the photoresist film RP1 has been removed is shown in order to make the drawing clearer.

Under the boundary line (the border) between the dry etching target region (the region where the tensile stress film TSL1 is etched) and the non-target region (the tensile stress film TSL1 is not etched) upon dry-etching the tensile stress film TSL1 at Step S12b in FIG. 65, the element isolation region 2 preferably lies in order to protect the metal silicide layer 13b. Specifically, in the region schematically shown by numeral 20 in FIG. 10, the boundary line between the target region and non-target region for the dry etching lies preferably. In the boundary line between the target region and the non-target region for the dry etching, as shown in FIG. 70, there is a step T7 of the surface of the tensile stress film TSL1.

Meanwhile, when the compression stress film CSL1 instead of the tensile stress film TSL1 is set as the first stress film to be formed at Step S11 in FIG. 65, at Step S12b in FIG. 65, the first stress film (the compression stress film CSL1) lying in the nMIS formation region 1A is dry-etched using the photoresist film RP2, which covers the pMIS formation region 1B and exposes the nMIS formation region 1A, as the etching mask. On this occasion, not all the first stress film (the compression stress film CSL1) lying in the nMIS formation region 1A is removed, but only the upper layer portion of the first stress film (the compression stress film CSL1) is dry-etched and removed in the nMIS formation region 1A, and a part (that is, the lower layer portion) of the first stress film (the compression stress film CSL1) is not removed but left so that the metal silicide layer 13b is not exposed. On this occasion, since the photoresist film RP2 functions as the etching mask, the first stress film (the compression stress film CSL1) of the pMIS formation region 1B is not etched but left.

FIGS. 71 to 74, which follow the FIG. 67, are cross-sectional views of the essential part in a manufacturing process of a semiconductor device of the embodiment.

Next, as shown in FIG. 71, the second stress film is formed over the whole main face of the semiconductor substrate 1, that is, over the main face of the semiconductor substrate 1 including the nMIS formation region 1A and pMIS formation region 1B (Step S13 in FIG. 65). The second stress film formed at Step S13 in FIG. 65 is a film that gives stress in the opposite direction as compared with the first stress film formed at Step S11 in FIG. 65, and, when the compression stress film CSL1 is set as the first stress film to be formed at Step S11 in FIG. 65, the second stress film formed at Step S13 in FIG. 65 is the compression stress film CSL1, as shown in FIG. 71.

At Step S13 in FIG. 65, the compression stress film CSL1 is formed over the tensile stress film TSL1, wherein, in the pMIS formation region 1B, it is formed over the tensile stress film TSL1 having a thickness T6, and, in the nMIS formation region 1A, it is formed over the tensile stress film TSL1 having a thickness T5.

Meanwhile, when the compression stress film CSL1 instead of the tensile stress film TSL1 is set as the first stress film to be formed at Step S11 in FIG. 65, at Step S13 in FIG. 65, the tensile stress film TSL1 instead of the compression stress film CSL1 is formed as the second stress film.

Figure 72:
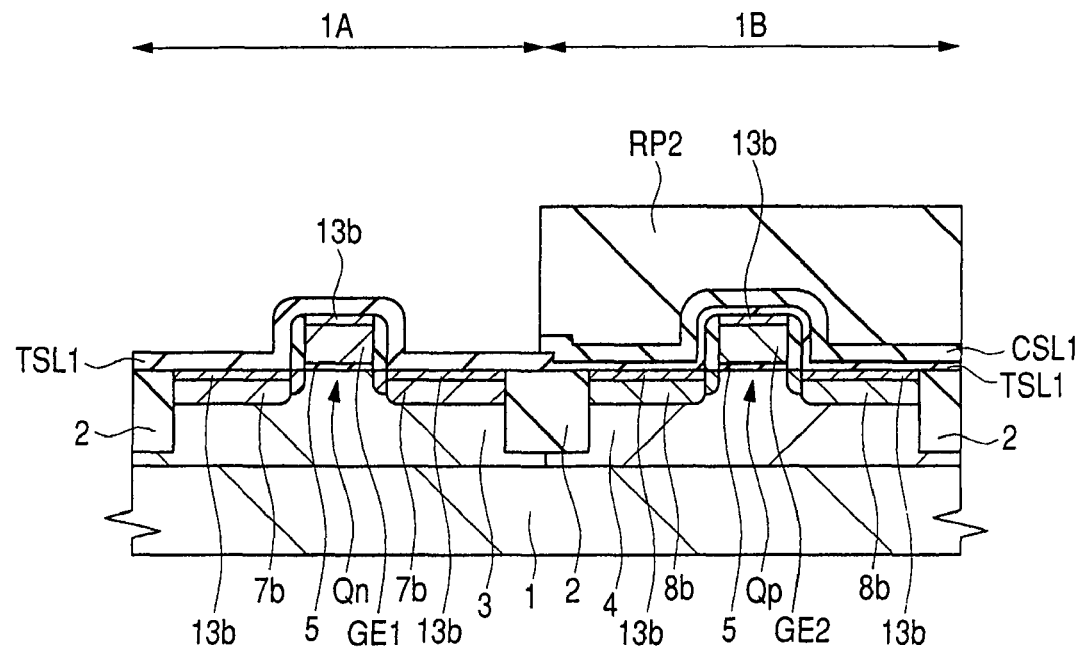
FIG. 72 is a cross-sectional view of the essential part in the manufacturing process of the semiconductor device subsequent to FIG. 71.

Next, as shown in FIG. 72, after the formation of the photoresist film RP2 that covers the pMIS formation region 1B and exposes the nMIS formation region 1A using a photolithographic method, the compression stress film CSL1 lying in the nMIS formation region 1A is dry-etched and removed using the photoresist film RP2 as the etching mask (Step S14 in FIG. 65). In the dry etching process at Step S14 in FIG. 65, it is designed so that the tensile stress film TSL1 (the tensile stress film TSL1 having a thickness T5) of the nMIS formation region 1A is not removed but left by controlling the over etching amount. Since the photoresist film RP2 functions as the etching mask, the compression stress film CSL1 (and the tensile stress film TSL1 having a thickness T6 under it) of the pMIS formation region 1B is not etched but left. After that, the photoresist film RP2 is removed by ashing or the like.

Meanwhile, when the compression stress film CSL1 instead of the tensile stress film TSL1 is set as the first stress film to be formed at Step S11 in FIG. 65 (that is, when the tensile stress film TSL1 is set as the second stress film), at Step S14 in FIG. 65, the tensile stress film TSL1 lying in the pMIS formation region 1B is dry-etched and removed using the photoresist film RP1 that covers the nMIS formation region 1A and exposes the pMIS formation region 1B as the etching mask. On this occasion, since the photoresist film RP1 functions as the etching mask, in the nMIS formation region 1A, the tensile stress film TSL1 (and the thin compression stress film CSL1 under it) is not etched but left, and, in the pMIS formation region 1B, the thick compression stress film CSL1 remains.

Figure 73:
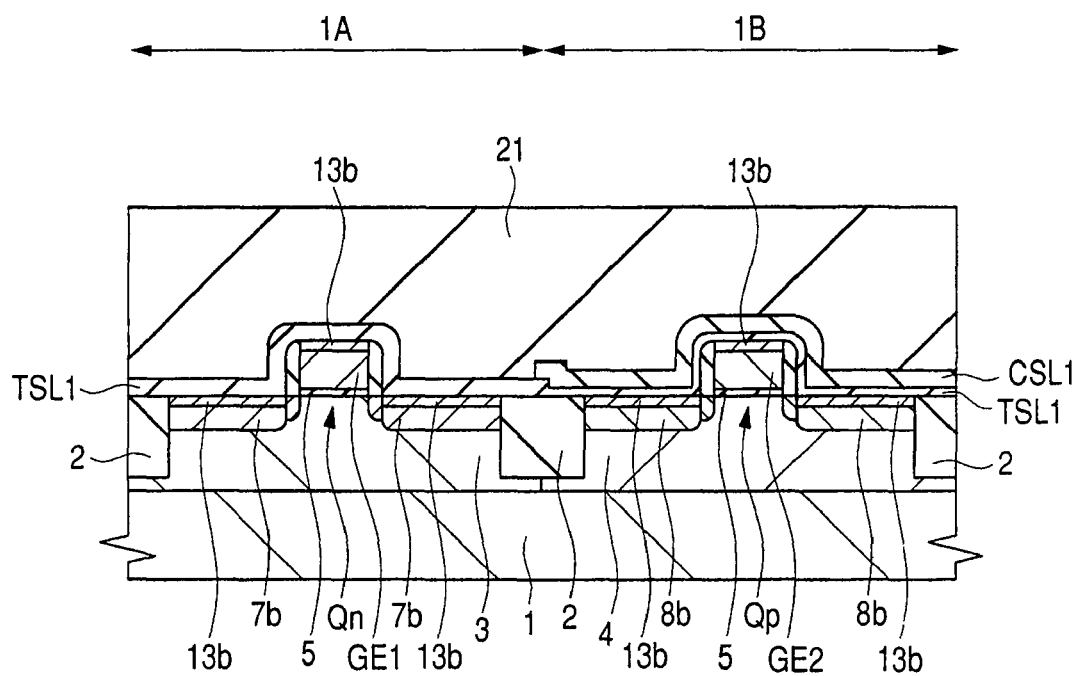
FIG. 73 is a cross-sectional view of the essential part in the manufacturing process of the semiconductor device subsequent to FIG. 72.

Subsequent processes are approximately the same as those in Embodiment 1. That is, as shown in FIG. 73, the interlayer insulating film 21 is formed over the whole main face of the semiconductor substrate 1, that is, over the main face of the semiconductor substrate 1 including the nMIS formation region 1A and pMIS formation region 1B (Step S15 in FIG. 65). The interlayer insulating film 21 is formed over the tensile stress film TSL1 and compression stress film CSL1, wherein the thickness of the interlayer insulating film 21 is greater than the thickness T5 of the tensile stress film TSL1 of the nMIS formation region 1A and the thickness T6 of the tensile stress film TSL1 of the pMIS formation region 1B. After the formation of the interlayer insulating film 21, the surface of the interlayer insulating film 21 is polished by a CMP method, or the like, and thereby the upper surface of the interlayer insulating film 21 is flattened.

Figure 74:
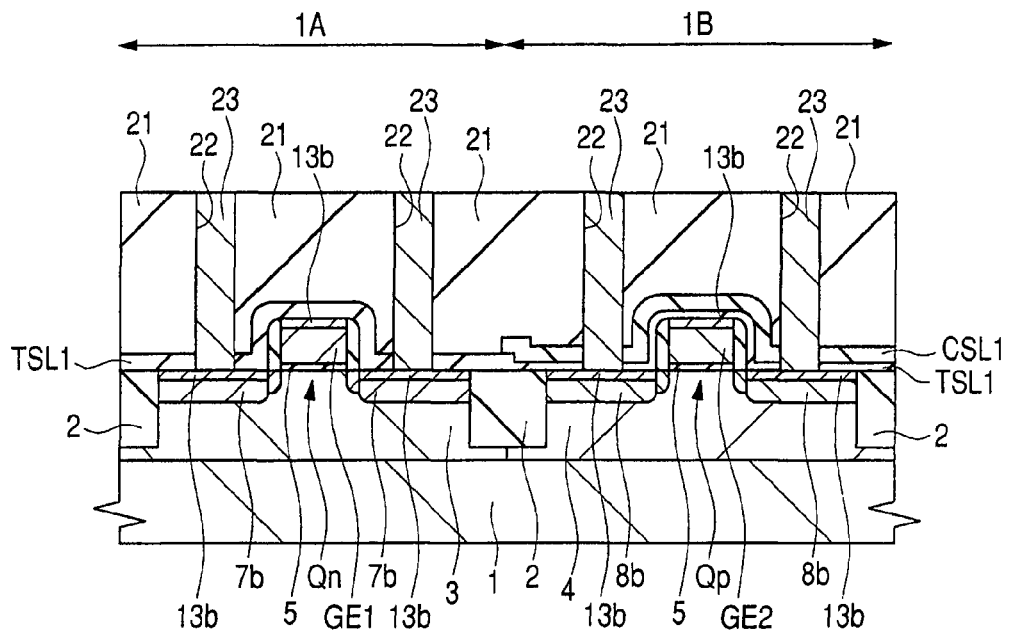
FIG. 74 is a cross-sectional view of the essential part in the manufacturing process of the semiconductor device subsequent to FIG. 73.

Next, as shown in FIG. 74, the contact hole 22 is formed by the dry etching using a photoresist pattern (not shown) formed on the interlayer insulating film 21 as the etching mask. On this occasion, in the nMIS formation region 1A, at a laminated film made of the interlayer insulating film 21 and tensile stress film TSL1, the contact hole 22 passing through the laminated film is formed, and, in the pMIS formation region 1B, at a laminated film made of the interlayer insulating film 21, compression stress film CSL1 and tensile stress film TSL1 (the tensile stress film TSL1 having the thickness T6), the contact hole 22 passing through the laminated film is formed.

Meanwhile, when the compression stress film CSL1 instead of the tensile stress film TSL1 is set as the first stress film to be formed at Step S11 in FIG. 65, in the nMIS formation region 1A, at a laminated film made of the interlayer insulating film 21, tensile stress film TSL1 and compression stress film CSL1 (the compression stress film CSL1 having the thickness T6), the contact hole 22 passing through the laminated film is formed. On this occasion, in the pMIS formation region 1B, at a laminated film made of the interlayer insulating film 21 and compression stress film CSL1, the contact hole 22 passing through the laminated film is formed.

Next, in the same way as that in Embodiment 1, the electroconductive plug 23 is formed inside the contact hole 22.

After that, in the same way as that in Embodiment 1, after the formation of the stopper insulating film 24 and the insulating film 25, the wiring groove 26 is formed, and the wiring M1 is formed inside the wiring groove 26. Here, the illustration and detailed description thereof are omitted.

In the semiconductor device of the embodiment thus manufactured, as shown in FIG. 74, the tensile stress film TSL1 has been formed so as to cover the n-channel type MISFET Qn and p-channel type MISFET Qp, that is, to cover the gate electrodes GE1 and GE2, the $n^+$-type semiconductor region 7b and $p^+$-type semiconductor region 8b over the semiconductor substrate 1. Further, over the tensile stress film TSL1, the compression stress film CSL1 is formed so as to cover the p-channel type MISFET Qp, that is, to cover the gate electrode GE2 and $p^+$-type semiconductor region 8b. Then, it is so designed that the thickness of the portion of the tensile stress film TSL1 (corresponding to the thickness T6) that covers the p-channel type MISFET Qp (the gate electrode GE2 and $p^+$-type semiconductor region 8b) is smaller than the thickness of the portion of the tensile stress film TSL1 (corresponding to the thickness T5) that covers the n-channel type MISFET Qn (the gate electrode GE1 and $n^+$-type semiconductor region 7b).

Upon dry-etching the first stress film, which was formed at Step S11 in FIG. 65, at Step S12b in FIG. 65, when the tensile stress film TSL1 is removed in the amount corresponding to the whole thickness thereof, differing from the present embodiment, there is a possibility that the metal silicide layer 13b is exposed and over-etched to cause the decrease in the thickness or etching damage of the metal silicide layer 13b, and that the resistance of the metal silicide layer 13b rises.

In contrast, in the embodiment, upon dry-etching the first stress film, which was formed at Step S11 in FIG. 65, at Step S12b in FIG. 65, it is so designed that not all the thickness of the first stress film is removed in the dry etching target region (the pMIS formation region 1B when the first stress film is the tensile stress film TSL1, and the nMIS formation region 1A when it is the compression stress film CSL1), but that the lower layer portion of the first stress film remains even after the dry etching. Consequently, since the metal silicide layer 13b is not exposed, it is possible to prevent the over etching of the metal silicide layer 13b and the decrease in the thickness and etching damage of the metal silicide layer 13b, and to prevent the rise in the resistance of the metal silicide layer 13b. Accordingly, the performance and reliability of semiconductor devices can be improved.

Figure 75:
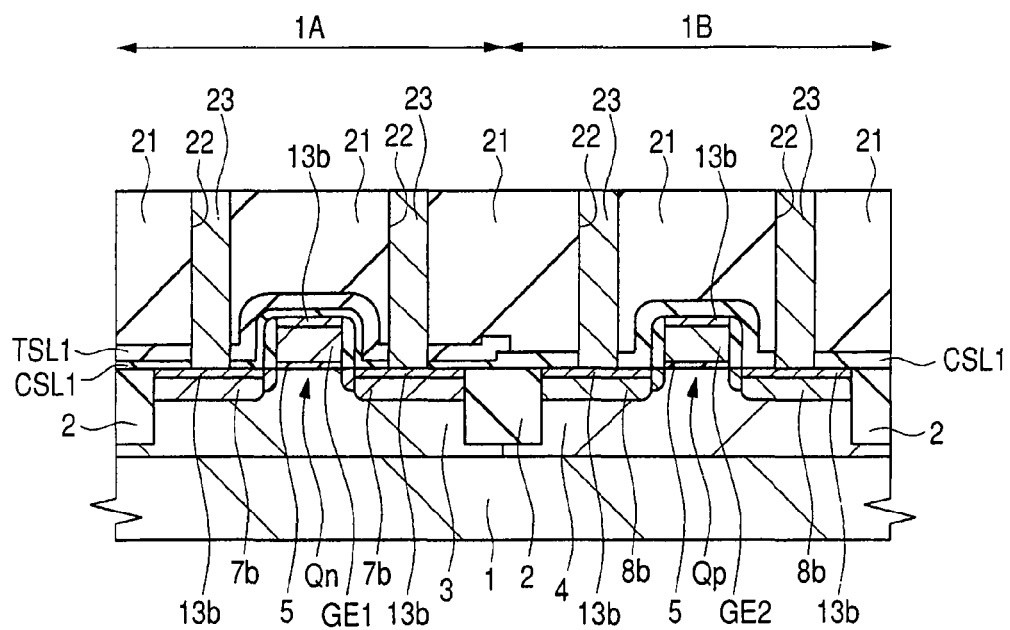
FIG. 75 is a cross-sectional view of the essential part in the manufacturing process of the semiconductor device being Embodiment 8 of the invention when the compression stress film is set as the first stress film.

In the embodiment, the instance, in which the tensile stress film TSL1 is set as the first stress film to be formed at Step S11 in FIG. 65, is mainly illustrated and described, and, the instance, in which the compression stress film CSL1 is set as the first stress film to be formed at Step S11 in FIG. 65, is also written down and explained. When the compression stress film CSL1 is set as the first stress film formed at Step S11 in FIG. 65, the shape becomes as that in FIG. 75. FIG. 75 is a cross-sectional view of the essential part in a manufacturing process of a semiconductor device of the embodiment when the compression stress film CSL1 is set as the first stress film formed at Step S11 in FIG. 65, which corresponds to FIG. 74 (the same process stage as that in FIG. 74) above.

As the first stress film to be formed at Step S11 in FIG. 65, either of the tensile stress film TSL1 and the compression stress film CSL1 may be set, but the tensile stress film TSL1 is more preferable (that is, the case in FIG. 74 is more preferable than the case in FIG. 75), the reason of which is as follows.

That is, when the compression stress film CSL1 instead of the tensile stress film TSL1 is formed at Step S11 in FIG. 65, in the nMIS formation region 1A of a manufactured semiconductor device (FIG. 75), the thin compression stress film CSL1 (having a thickness corresponding to the thickness T6) and a thick tensile stress film TSL1 thereon are formed as the stress film, wherein the thin compression stress film CSL1 (having a thickness corresponding to the thickness T6) cancels a part of the stress of the thick tensile stress film TSL1 thereon. On the other hand, when the tensile stress film TSL1 is formed at Step S11 in FIG. 65, in the pMIS formation region 1B of a manufactured semiconductor device (FIG. 74), a thin tensile stress film TSL1 (having the thickness T6) and a thick compression stress film CSL1 thereon are formed as the stress film, wherein the thin tensile stress film TSL1 (having the thickness T6) cancels a part of the stress of the thick compression stress film CSL1. Generally, formation of a stress film having greater absolute value of the stress is easier for a stress film that gives stress in the compression stress direction as compared with a stress film that gives stress in the tensile stress direction. Consequently, the instance, in which the tensile stress film TSL1 is set as the first stress film to be formed at Step S11 in FIG. 65, is advantageous in that the insufficiency of the tensile stress in the nMIS formation region 1A is easily prevented, because no compression stress film CSL1 lies under the tensile stress film TSL1.

Embodiment 9

Figure 76:
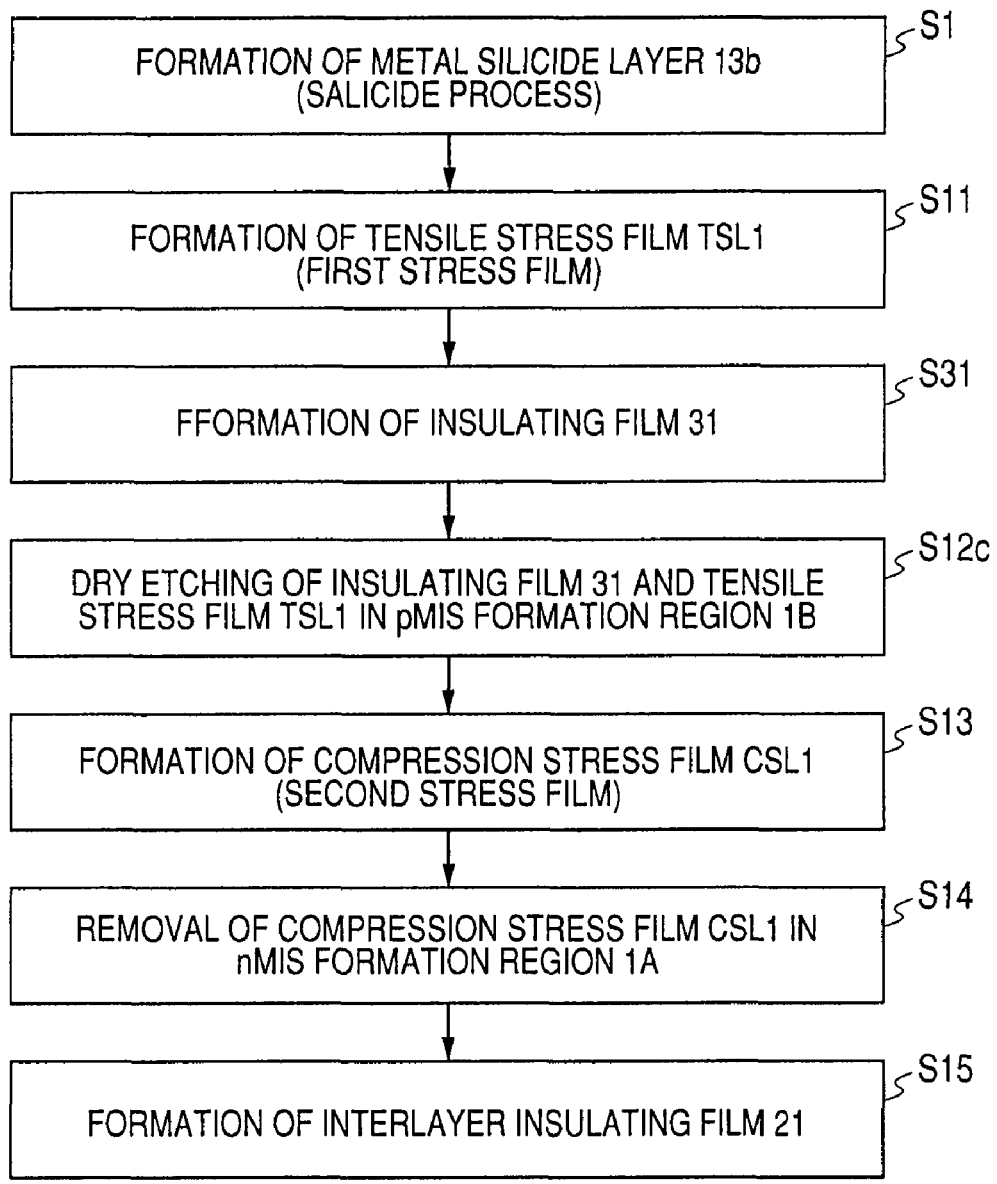
FIG. 76 is a manufacturing process flow chart showing a part of the manufacturing process of a semiconductor device being an Embodiment 9 of the invention.

FIG. 76 is a manufacturing process flow chart showing a part of the manufacturing process of a semiconductor device of the present embodiment, which corresponds to FIG. 65 in Embodiment 8. FIGS. 77 to 82 are cross-sectional views of the essential part in a manufacturing process of a semiconductor device of the embodiment.

Embodiment 9 corresponds to a modification of Embodiment 8 (a modification in which the insulating film 31 is provided over the first stress film in Embodiment 8). Up to the formation of the first stress film at Step S11 (that is, up to the obtainment of the structure in FIG. 66), the manufacturing process of a semiconductor device of the embodiment is the same as that in Embodiment 8, and, therefore, the description thereof is omitted here and processes subsequent to it will be described. Meanwhile, hereinafter, an instance, in which the tensile stress film TSL1 is set as the first stress film to be formed at Step S11 in FIG. 76, is illustrated and described, but the compression stress film CSL1 instead of the tensile stress film TSL1 can also set as the first stress film to be formed at Step S11 in FIG. 76.

Figure 77:
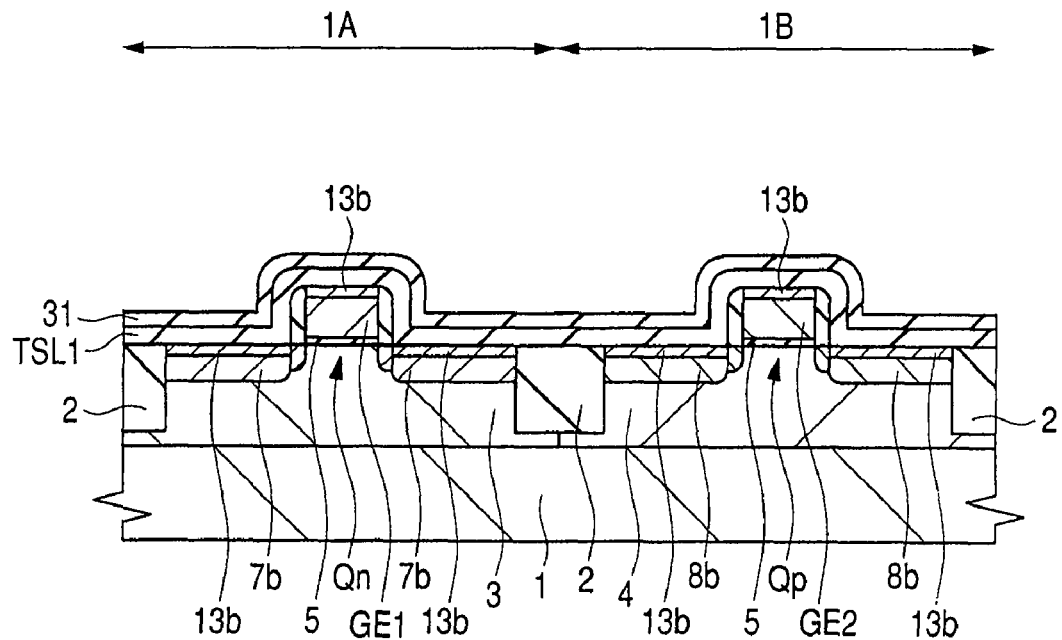
FIG. 77 is a cross-sectional view of the essential part in a manufacturing process of the semiconductor device being Embodiment 9 of the invention.

Next, as shown in FIG. 77, the insulating film 31 is formed over the whole main face of the semiconductor substrate 1 including the nMIS formation region 1A and pMIS formation region 1B, that is, over the tensile stress film TSL1 (Step S31 in FIG. 76).

The most suitable insulating film 31 is a film of silicon oxide represented by $SiO_2$, but is not limited to the film only when it exerts etching selectivity for the second stress film to be formed at Step S13 described later. For example, when the second stress film to be formed at Step S13 described later is a silicon nitride film, as the insulating film 31, a silicon carbide film (a SiC film), a silicon carbonitride film (a SiCN film) or a silicon oxynitride film (a SiON film) may also be employed in addition to the silicon oxide film. However, in order to give the etching selectivity for the second stress film to be formed at Step S13 described later, the insulating film 31 needs to be formed from a material different from that of the second stress film formed at Step S13 described later. The thickness of the insulating film 31 (formed film thickness) is preferably around 6 to 20 nm.

Meanwhile, when the compression stress film CSL1 instead of the tensile stress film TSL1 is set as the first stress film to be formed at Step S11 in FIG. 76, at Step S31 in FIG. 76, the insulating film 31 is formed over the compression stress film CSL1.

Figure 78:
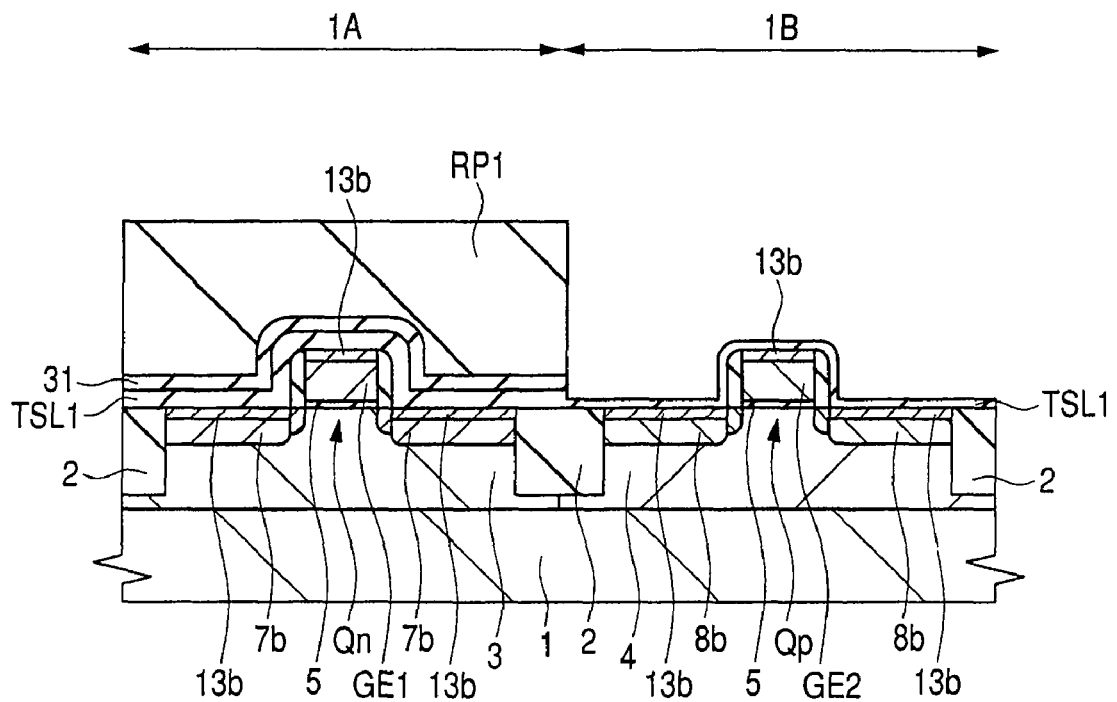
FIG. 78 is a cross-sectional view of the essential part in the manufacturing process of the semiconductor device subsequent to FIG. 77.

Next, as shown in FIG. 78, after the formation of the photoresist film RP1 that covers the nMIS formation region 1A and exposes the pMIS formation region 1B using a photolithographic method, the insulating film 31 and tensile stress film TSL1 under it lying in the pMIS formation region 1B are dry-etched using the photoresist film RP1 as the etching mask (Step S12c in FIG. 76). The dry etching process at Step S12c in FIG. 76 is similar to the dry etching process at Step S12b in FIG. 65, except that the insulating film 31 of the pMIS formation region 1B is dry-etched and removed and, after that, the tensile stress film TSL1 under it is dry-etched.

That is, in the dry etching process at Step S12c in FIG. 76, since the photoresist film RP1 functions as the etching mask, the insulating film 31 and tensile stress film TSL1 under it of the nMIS formation region 1A are not etched but are left. Further, in the dry etching process at Step S12c in FIG. 76, all the insulating film 31 of the pMIS formation region 1B is removed, but, for the tensile stress film TSL1 in the pMIS formation region 1B, not all of it is removed as is the case for Embodiment 8, that is, the upper layer portion of the tensile stress film TSL1 is dry-etched and removed, but a part (a lower layer portion) of the tensile stress film TSL1 is not removed but left in laminate, so as not to expose the metal silicide layer 13b. In other words, in the dry etching process at Step S12c in FIG. 76, in the pMIS formation region 1B, the etching is ended before the removal of all the tensile stress film TSL1, although all the insulating film 31 and a part (the upper layer portion) of the tensile stress film TSL1 are removed. As the result, in the pMIS formation region 1B (particularly, over the metal silicide layer 13b of the pMIS formation region 1B) after the end of the dry etching at Step S12c in FIG. 76, a part (the lower layer portion) of the tensile stress film TSL1 is left in laminate and the metal silicide layer 13b is not exposed. After that, the photoresist film RP1 is removed by ashing or the like. Meanwhile, regarding the thicknesses T3, T4, T5 and T6 and the step T7 of the tensile stress film TSL1 before and after the dry etching process at Step S12c in FIG. 76, also in the embodiment, the same can be said as those described in Embodiment 8 while referring to FIGS. 68 to 70, and the description thereof is omitted here.

Meanwhile, when the compression stress film CSL1 instead of the tensile stress film TSL1 is set as the first stress film to be formed at Step S11 in FIG. 76, at Step S12c in FIG. 76, the insulating film 31 and first stress film (the compression stress film CSL1) under it lying in the nMIS formation region 1A are dry-etched using the photoresist film RP2 that covers the pMIS formation region 1B and exposes the nMIS formation region 1A as the etching mask. On this occasion, although all the insulating film 31 in the nMIS formation region 1A is removed, not all the first stress film (the compression stress film CSL1) lying in the nMIS formation region 1A is removed, but the upper layer portion of the first stress film (the compression stress film CSL1) is dry-etched and removed in the nMIS formation region 1A, wherein a part (that is, the lower layer portion) of the first stress film (the compression stress film CSL1) is not removed but left in laminate, so as not to expose the metal silicide layer 13b. On this occasion, since the photoresist film RP2 functions as the etching mask, the insulating film 31 and first stress film (the compression stress film CSL1) under it of the pMIS formation region 1B are not etched but are left.

Figure 79:
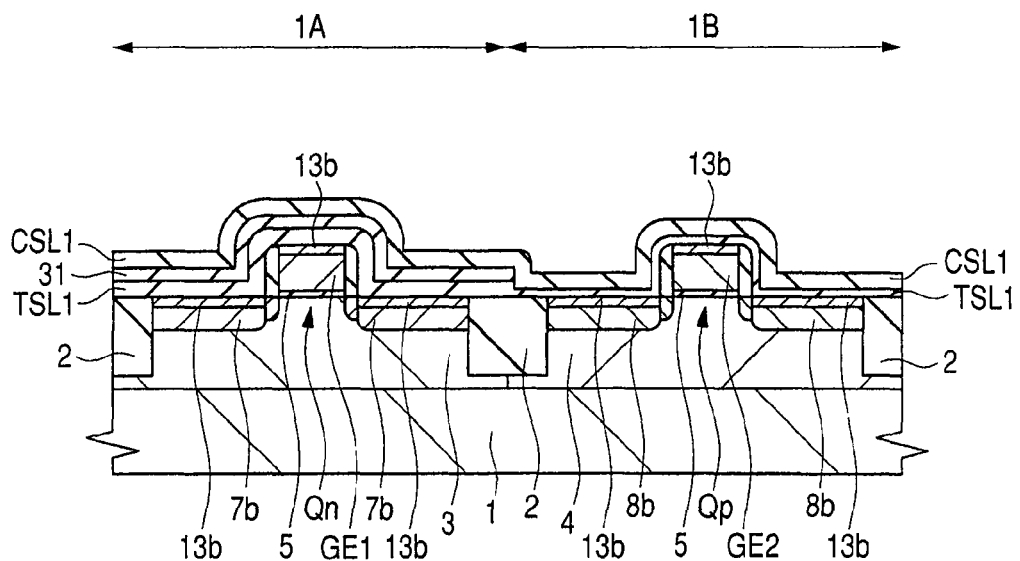
FIG. 79 is a cross-sectional view of the essential part in the manufacturing process of the semiconductor device subsequent to FIG. 78.

Next, as shown in FIG. 79, the second stress film is formed over the whole main face of the semiconductor substrate 1, that is, over the main face of the semiconductor substrate 1 including the nMIS formation region 1A and pMIS formation region 1B (Step S13 in FIG. 76). The second stress film formed at Step S13 in FIG. 76 is a film that gives stress in the opposite direction as compared with the first stress film formed at Step S11 in FIG. 76, and, when the tensile stress film TSL1 is set as the first stress film to be formed at Step S11 in FIG. 76, the second stress film formed at Step S13 in FIG. 76 is the compression stress film CSL1, as shown in FIG. 79.

At Step S13 in FIG. 76, the compression stress film CSL1 is formed, in the nMIS formation region 1A, over the insulating film 31 because the laminated film of the insulating film 31 and tensile stress film TSL1 exists, and, in the pMIS formation region 1B, the compression stress film CSL1 is formed over the thin tensile stress film TSL1 (having a thickness corresponding to the thickness T6).

Meanwhile, when the compression stress film CSL1 instead of the tensile stress film TSL1 is set as the first stress film to be formed at Step S11 in FIG. 76, at Step S13 in FIG. 76, the tensile stress film TSL1 instead of the compression stress film CSL1 is formed as the second stress film.

Figure 80:
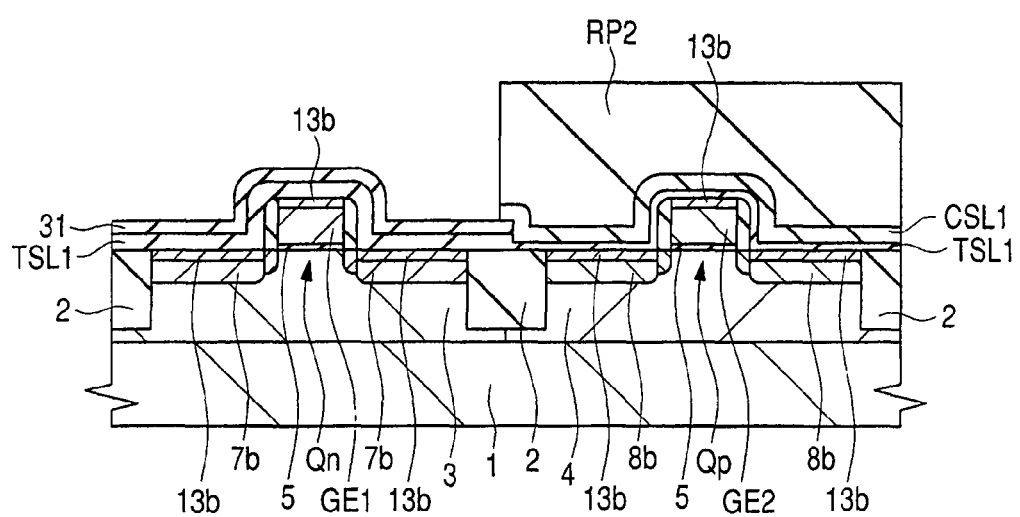
FIG. 80 is a cross-sectional view of the essential part in the manufacturing process of the semiconductor device subsequent to FIG. 79.

Next, as shown in FIG. 80, after the formation of the photoresist film RP2 that covers the pMIS formation region 1B and exposes the nMIS formation region 1A using a photolithographic method, the compression stress film CSL1 lying in the nMIS formation region 1A is dry-etched and removed using the photoresist film RP2 as the etching mask (Step S14 in FIG. 76).

The dry etching process (the process of removing the compression stress film CSL1) at Step S14 in FIG. 76 of the embodiment is similar to the dry etching process (the process of removing the compression stress film CSL1) at Step S14 in FIG. 65 of Embodiment 8, except for causing the insulating film 31 to function as the etching stopper.

That is, since the photoresist film RP2 functions as the etching mask in the dry etching process at Step S14 in FIG. 76 in the embodiment, the compression stress film CSL1 and thin tensile stress film TSL1 (having a thickness corresponding to T6) under it of the pMIS formation region 1B are not etched but are left. Further, in the dry etching process at Step S14 in FIG. 76, the dry etching of the compression stress film CSL1 is performed under conditions in which the compression stress film CSL1 is etched more easily as compared with the insulating film 31, to cause the insulating film 31 to function as the etching stopper film. Consequently, in the nMIS formation region 1A not covered with the photoresist film RP2, the insulating film 31 and tensile stress film TSL1 under it are left. Therefore, the metal silicide layer 13b is not exposed in both nMIS formation region 1A and pMIS formation region 1B. After the dry etching process at Step S14 in FIG. 76, the photoresist film RP2 is removed by ashing or the like.

In the embodiment, since the insulating film 31 functions as the etching stopper (the etching protective film for the tensile stress film TSL1) in the dry etching process at Step S14 in FIG. 76, it is possible to prevent the etching of the tensile stress film TSL1 (the first stress film formed at Step S11 in FIG. 76), and to prevent the decrease in the thickness of the tensile stress film TSL1 (the first stress film formed at Step S11 in FIG. 76).

Meanwhile, in the dry etching process at Step S14 in FIG. 76, possibly there is such case that a part of the insulating film 31 (an upper layer portion) is etched (removed) by over etching in the nMIS formation region 1A. However, it is preferable to design so that, at the stage after the end of the dry etching process at Step S14 in FIG. 76, at least a part of the insulating film 31 (a lower layer portion) remains in laminate on the tensile stress film TSL1 in the nMIS formation region 1A, so that the tensile stress film TSL1 is not exposed. This makes it possible to prevent appropriately the etching of the tensile stress film TSL1 in the dry etching process at Step S14 in FIG. 76.

When dry-etching the compression stress film CSL1 at Step S14 in FIG. 76, in order to prevent damages on the element isolation region 2 by the dry etching, as shown in FIG. 80, the formation of a portion in which a part of the compression stress film CSL1 covers the insulating film 31 is preferable. That is, the compression stress film CSL1 is set to overlap (cover) apart (an end portion neighborhood region) of the insulating film 31 above the element isolation region 2 between the nMIS formation region 1A and pMIS formation region 1B, at the end of the dry etching of the compression stress film CSL1 at Step S14.

Meanwhile, when the compression stress film CSL1 instead of the tensile stress film TSL1 is set as the first stress film to be formed at Step S11 in FIG. 76 (that is, when the tensile stress film TSL1 is set as the second stress film), at Step S14 in FIG. 76, the tensile stress film TSL1 lying in the pMIS formation region 1B is dry-etched and removed using the photoresist film RP1 that covers the nMIS formation region 1A and exposes the pMIS formation region 1B as the etching mask. On this occasion, since the photoresist film RP1 functions as the etching mask, the tensile stress film TSL1 (and the thin compression stress film CSL1 under it) of the nMIS formation region 1A is not etched but left, and, in the pMIS formation region 1B, the insulating film 31 and the thick compression stress film CSL1 are left by causing the insulating film 31 to function as the etching stopper film.

Figure 81:
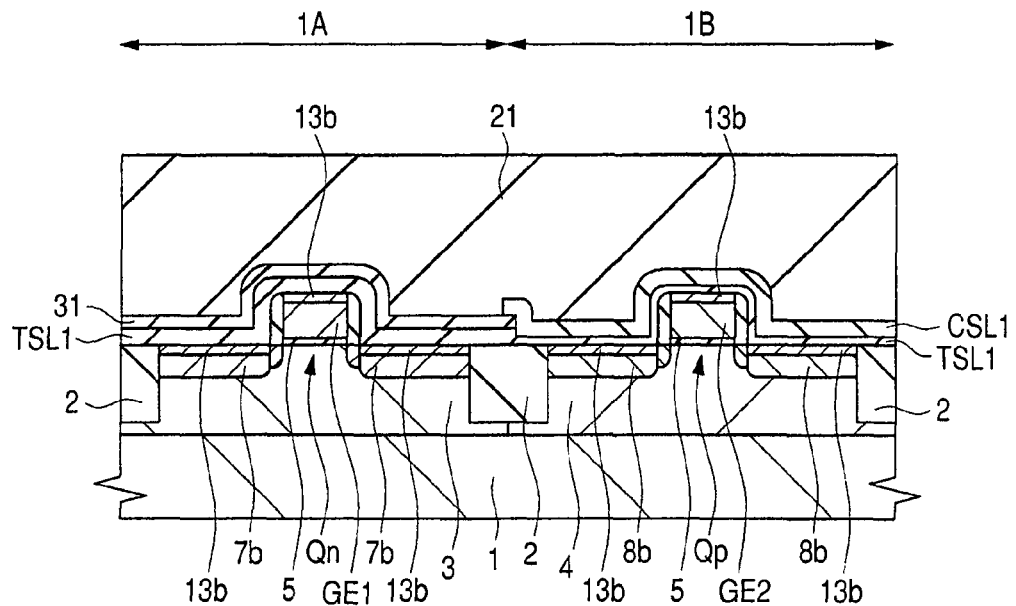
FIG. 81 is a cross-sectional view of the essential part in the manufacturing process of the semiconductor device subsequent to FIG. 80.

Subsequent processes are approximately the same as those in Embodiment 1. That is, as shown in FIG. 81, the interlayer insulating film 21 is formed over the whole main face of the semiconductor substrate 1, that is, over the main face of the semiconductor substrate 1 including the nMIS formation region 1A and pMIS formation region 1B (Step S15 in FIG. 76). The interlayer insulating film 21 is formed over the laminated film of the insulating film 31 and tensile stress film TSL1, and over the laminated film of the compression stress film CSL1 and tensile stress film TSL1, wherein the thickness of the interlayer insulating film 21 is greater than that of the tensile stress film TSL1 of the nMIS formation region 1A, insulating film 31, tensile stress film TSL1 of the pMIS formation region 1B, and compression stress film CSL1. After the formation of the interlayer insulating film 21, the surface of the interlayer insulating film 21 is polished by a CMP method, or the like, and thereby the upper surface of the interlayer insulating film 21 is flattened.

Figure 82:
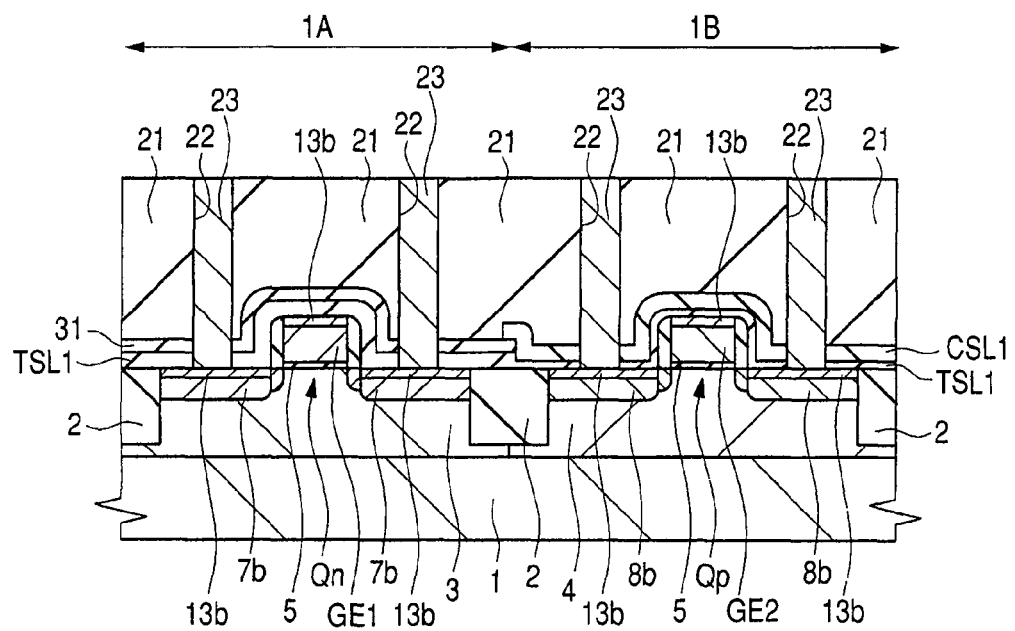
FIG. 82 is a cross-sectional view of the essential part in the manufacturing process of the semiconductor device subsequent to FIG. 81.

Next, as shown in FIG. 82, the contact hole 22 is formed by the dry etching using a photoresist pattern (not shown) formed on the interlayer insulating film 21 as the etching mask. On this occasion, in the nMIS formation region 1A, at a laminated film made of the interlayer insulating film 21, insulating film 31 and tensile stress film TSL1, the contact hole 22 passing through the laminated film is formed, and, in the pMIS formation region 1B, at a laminated film made of the interlayer insulating film 21, compression stress film CSL1 and tensile stress film TSL1 (the tensile stress film TSL1 having the thickness T6), the contact hole 22 passing through the laminated film is formed.

Meanwhile, when the compression stress film CSL1 instead of the tensile stress film TSL1 is set as the first stress film to be formed at Step S11 in FIG. 76, in the nMIS formation region 1A, at a laminated film made of the interlayer insulating film 21, tensile stress film TSL1 and compression stress film CSL1 (the compression stress film CSL1 having the thickness T6), the contact hole 22 passing through the laminated film is formed. Also, on this occasion, in the pMIS formation region 1B, at a laminated film made of the interlayer insulating film 21, insulating film 31 and compression stress film CSL1, the contact hole 22 passing through the laminated film is formed.

Next, in the same way as that in Embodiment 1, the electroconductive plug 23 is formed inside the contact hole 22.

After that, in the same way as that in Embodiment 1, after the formation of the stopper insulating film 24 and the insulating film 25, the wiring groove 26 is formed, and the wiring M1 is formed inside the wiring groove 26, but, here the illustration and detailed description thereof are omitted.

When comparing the semiconductor device of the embodiment thus manufactured (FIG. 82) with the semiconductor device in Embodiment 8 (FIG. 74), it differs in that the insulating film 31 exists over the tensile stress film TSL1 (between the tensile stress film TSL1 and interlayer insulating film 21) in the nMIS formation region 1A. Further, at least a part of the compression stress film CSL1 overlaps the insulating film 31.

In Embodiment 9, following effects can be further obtained in addition to that obtained in Embodiment 8. That is, in the embodiment, by causing the insulating film 31 formed at Step S31 in FIG. 76 to function as the etching stopper (the etching protective film for the first stress film) in the dry etching process (the process for removing the second stress film) at Step S14 in FIG. 76, it is possible to prevent the etching of the first stress film, and to prevent the decrease in film thickness of the first stress film. As the result, the deposited film thickness (the film thickness when deposited at Step S11 in FIG. 76) is maintained as the thickness of the first stress film (the first stress film formed at Step S11 in FIG. 76) in the manufactured semiconductor device. Since the deposited film thickness upon film deposition over the semiconductor wafer can be controlled with high accuracy, when the deposited film thickness can be maintained as the thickness of the first stress film, as the embodiment, the thickness of the first stress film in manufactured semiconductor devices can be set to an approximately designed value, which makes it possible to set the stress value acting on MISFETs approximately to a designed value itself. Further, in the embodiment, since the deposited film thickness can be maintained as the thickness of the first stress film, variation of the thickness of the first stress film can be suppressed for each wafer, and the spread of MISFET properties among wafers can be suppressed.

Figure 83:
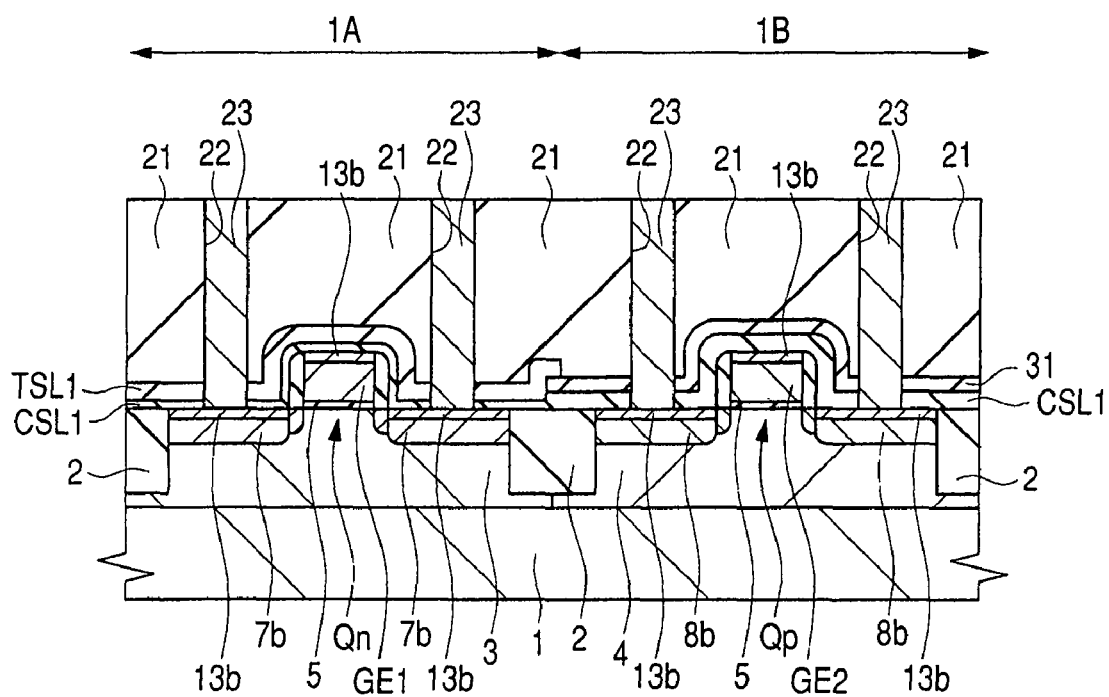
FIG. 83 is a cross-sectional view of the essential part in the manufacturing process of the semiconductor device being Embodiment 9 of the invention when a compression stress film is set as the first stress film.

In the embodiment, the instance, in which the tensile stress film TSL1 is set as the first stress film to be formed at Step S11 in FIG. 76, is mainly illustrated and described, and, the instance, in which the compression stress film CSL1 is set as the first stress film to be formed Step S11 in FIG. 76, is also written down and explained. When the compression stress film CSL1 is set as the first stress film formed at Step S11 in FIG. 76, the shape becomes as that in FIG. 83. FIG. 83 is a cross-sectional view of the essential part in a manufacturing process of a semiconductor device of the embodiment when the compression stress film CSL1 is set as the first stress film formed at Step S11 in FIG. 76, which corresponds to FIG. 82 (the same process stage as that in FIG. 82) above.

As the first stress film to be formed at Step S11 in FIG. 76, either of the tensile stress film TSL1 and the compression stress film CSL1 may be set, but the tensile stress film TSL1 is more preferable (that is, the instance in FIG. 82 is more preferable than the instance in FIG. 83), the reason of which is the same as that described in Embodiment 8.

Embodiment 10

Figure 84:
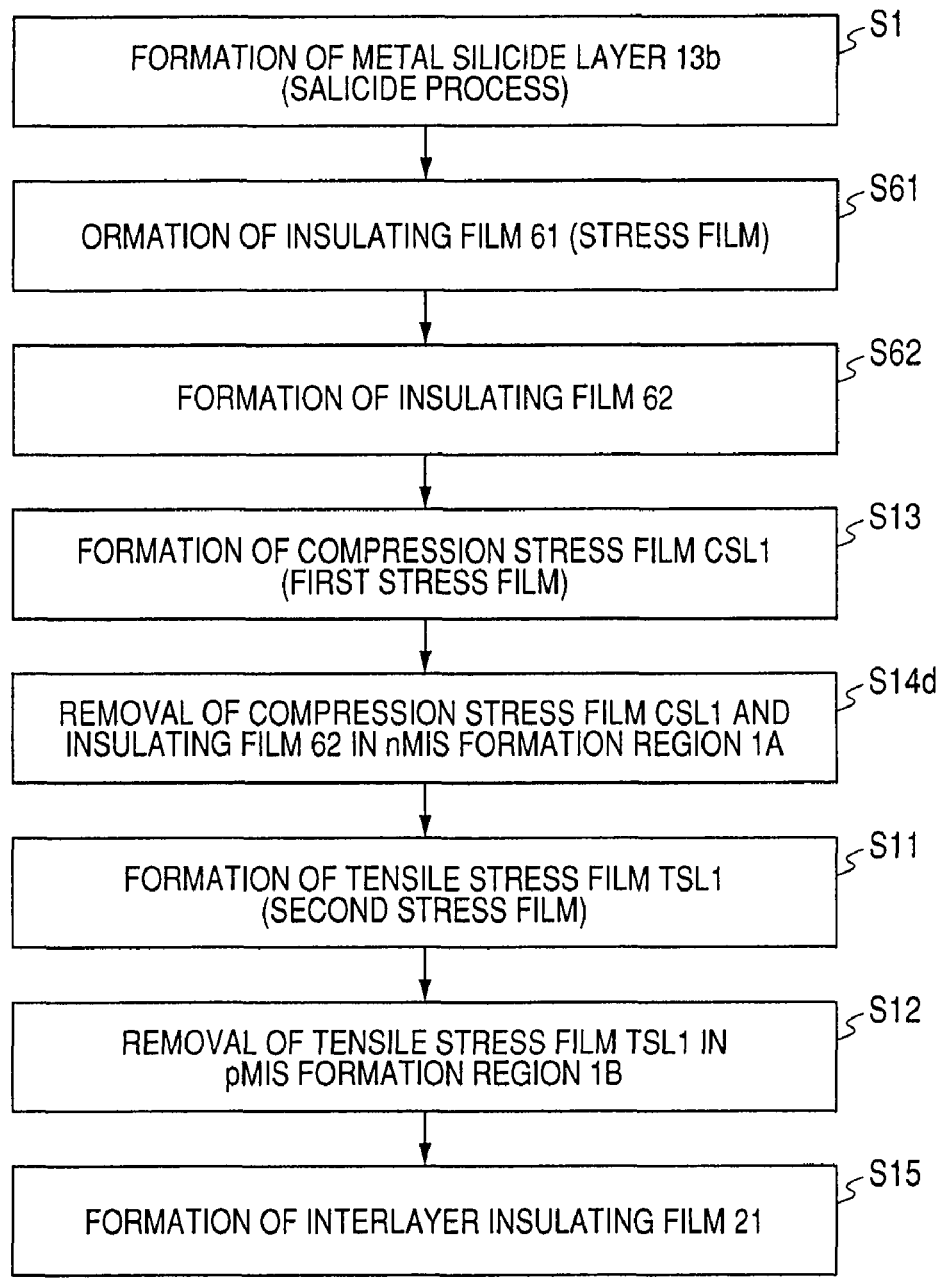
FIG. 84 is a manufacturing process flow chart showing a part of the manufacturing process of a semiconductor device being an Embodiment 10 of the invention.

FIG. 84 is a manufacturing process flow chart showing a part of the manufacturing process of a semiconductor device of the present embodiment, which corresponds to FIG. 3 in Embodiment 1. FIGS. 85 to 90 are cross-sectional views of the essential part in a manufacturing process of a semiconductor device of the embodiment.

The manufacturing process of a semiconductor device of the embodiment is approximately the same as that in Embodiment 1 up to the formation of the metal silicide layer 13b (that is, up to the obtainment of the structure in FIG. 7), and the description thereof is omitted here.

However, as was described in Embodiment 4, also in the embodiment, the method of forming the metal silicide layer 13b at Step S1 is not limited to the Step S1 described in Embodiment 1. That is, also in the embodiment, as are the cases for Embodiments 4 to 9, the material, concentration distribution and formation method of the metal silicide layer 13b are not limited to the material, concentration distribution and formation method of the metal silicide layer 13b as described in Embodiment 1. For example, one or more elements selected from the group made of Ni (nickel), Co (cobalt), Pt (platinum), Pd (palladium), Hf (hafnium), V (vanadium), Er (erbium), Ir (iridium) and Yb (ytterbium) may be employed as a metal element constituting the metal silicide layer 13b in the embodiment.

Figure 85:
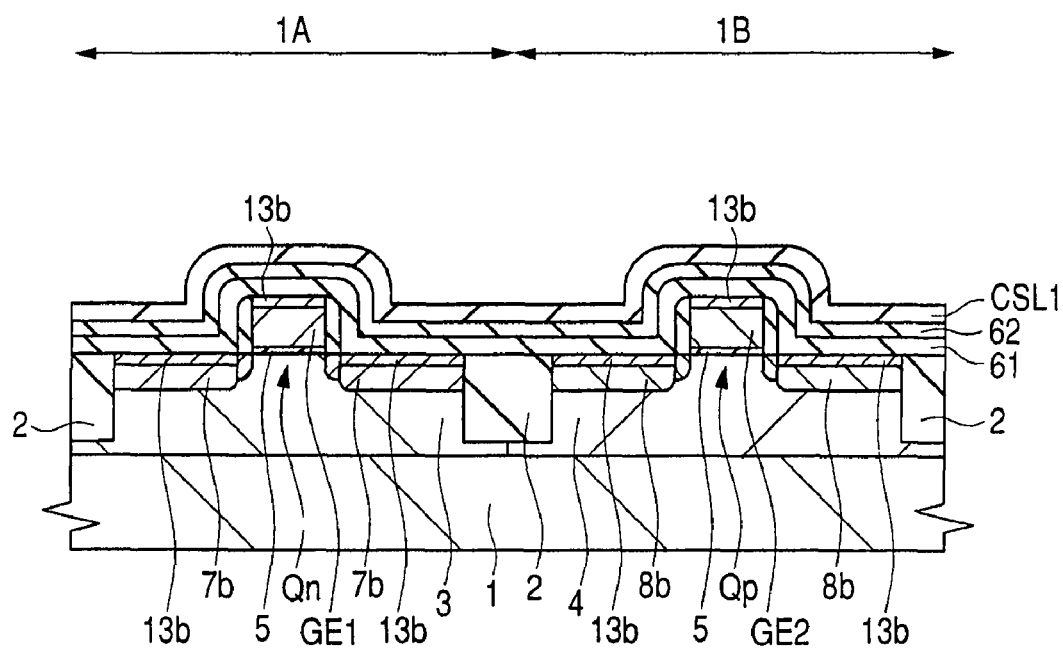
FIG. 85 is a cross-sectional view of the essential part in a manufacturing process of the semiconductor device being Embodiment 10 of the invention.

After performing processes up to the formation of the metal silicide layer 13b to obtain the structure in FIG. 7, in the embodiment, as shown in FIG. 85, an insulating film 61 is formed over the whole main face of the semiconductor substrate 1, that is, over the main face of the semiconductor substrate 1 including the nMIS formation region 1A and pMIS formation region 1B (Step S61 in FIG. 84). At Step S61 in FIG. 84, the insulating film 61 is formed over the semiconductor substrate 1 including the metal silicide layer 13b so as to cover gate electrodes GE1 and GE2 and the sidewall 9. The insulating film 61 is formed as a stress film of either tension or compression (that is, either the tensile stress film or the compression stress film). The insulating film 61 preferably has a thickness (formed film thickness) of around 2 to 10 nm.

Next, the insulating film 62 is formed over the main face of the semiconductor substrate 1 including the nMIS formation region 1A and pMIS formation region 1B, that is, over the insulating film 61 (Step S62 in FIG. 84). Since the insulating film 62 formed at Step S62 in FIG. 84 needs to give etching selectivity for the insulating film 61, the insulating film 61 formed at Step S61 in FIG. 84 and the insulating film 62 formed at Step S62 in FIG. 84 are constituted of materials different from each other. Further, since the insulating film 62 formed at Step S62 in FIG. 84 needs to give etching selectivity for the first stress film to be formed at Step S13 described later, the insulating film 62 formed at Step S62 in FIG. 84 and the first stress film formed at Step S13 described later are constituted of materials different from each other. The insulating film 62 preferably has a thickness (formed film thickness) of around 2 to 10 nm.

Next, the first stress film is formed over the whole main face of the semiconductor substrate 1 including the nMIS formation region 1A and pMIS formation region 1B, that is, over the insulating film 62 (Step S13 in FIG. 84). Hereinafter, instances, in which the first stress film formed at Step S13 in FIG. 84 is the compression stress film CSL1, are illustrated and described, but, the tensile stress film TSL1 instead of the compression stress film CSL1 may be set as the first stress film formed at Step S13 in FIG. 84. Since the material and formation method of the compression stress film CSL1 and tensile stress film in the embodiment are the same as those in Embodiment 1, the description thereof is omitted here. The first stress film formed at Step S13 in FIG. 84 preferably has a thickness (formed film thickness) of around 20 to 60 nm.

The first stress film formed at Step S13 in FIG. 84 and the insulating film 61 formed at Step S61 in FIG. 84 may be constituted of the same material, or may be constituted of different materials. However, when both are formed from silicon nitride, the absolute value of the stress is easily increased, preferably. When both the first stress film formed at Step S13 in FIG. 84 and the insulating film 61 formed at Step S61 in FIG. 84 are formed from silicon nitride, the insulating film 62 to be formed at Step S62 in FIG. 84 may be made of a silicon oxide film, silicon carbide film (a SiC film), silicon oxynitride (SiON) film or a silicon carbonitride (SiCN) film.

When the insulating film 62 is a silicon oxide film, as the formation method thereof, a thermal CVD method using TEOS and $O_3$ gas may be employed, and, additionally, for example, it is possible to form the insulating film 62 at the surface of the insulating film 61 by plasma-treating the surface of the insulating film 61 with plasma of oxygen-containing gas, and to form the insulating film 62 at the surface of the insulating film 61 by a heat treatment or ion implantation.

Figure 86:
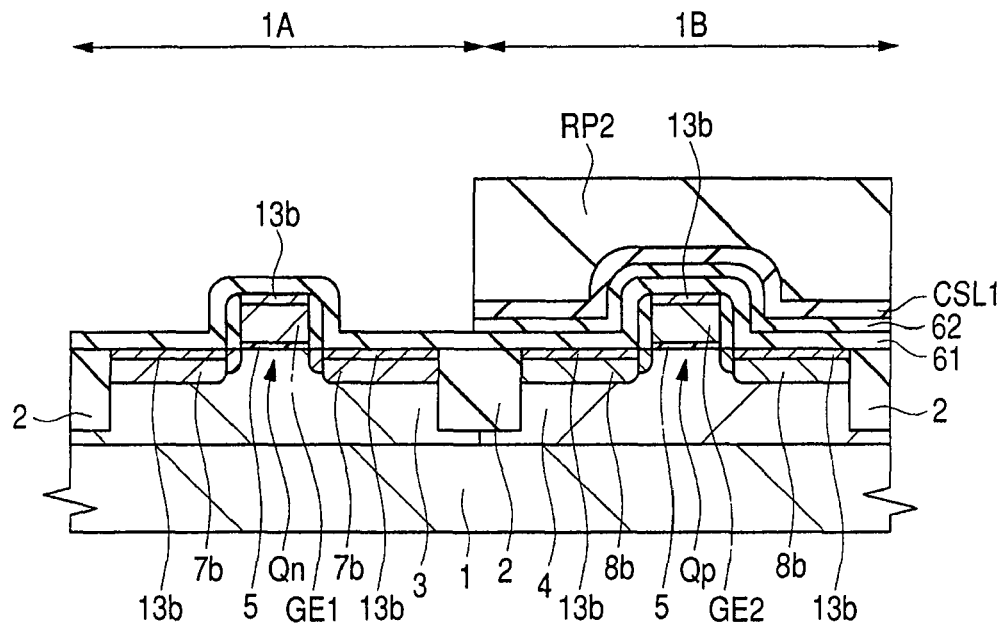
FIG. 86 is a cross-sectional view of the essential part in the manufacturing process of the semiconductor device subsequent to FIG. 85.

Next, as shown in FIG. 86, after the formation of the photoresist film RP2 that covers the pMIS formation region 1B and exposes the nMIS formation region 1A by a photolithographic method, using the photoresist film RP2 as the etching mask, the compression stress film CSL1 lying in the nMIS formation region 1A and insulating film 62 under it are dry-etched and removed (Step S14d in FIG. 84). On this occasion, firstly, the compression stress film CSL1 is dry-etched under conditions in which compression stress film CSL1 is etched more easily as compared with the insulating film 62 to cause the insulating film 62 to function as the etching stopper film, and, after that, the insulating film 62 is dry-etched under conditions in which the insulating film 62 is etched more easily as compared with the insulating film 61 to cause the insulating film 61 to function as the etching stopper film. That is, by designing so that the insulating film 61 remains on the metal silicide layer 13b in the nMIS formation region 1A at the end of the dry etching, the insulating film 61 is caused to function as the etching protective film (the barrier of the etching) of the metal silicide layer 13b. Further, on this occasion, since the photoresist film RP2 functions as the etching mask, in the pMIS formation region 1B, the laminated film of the insulating film 61, insulating film 62 and compression stress film CSL1 is not etched but left. After that, the photoresist film RP2 is removed by ashing or the like.

In the dry etching process at Step S14d in FIG. 84, all the insulating film 61 of the nMIS formation region 1A is preferably removed, but, only when the stress of the second stress film to be formed at Step S11 described later sufficiently acts on the channel of MISFETs, in the nMIS formation region 1A, not all the insulating film 62 may be removed, but a part (a lower layer portion) of the insulating film 62 may be left on the insulating film 61.

Under a boundary line (a border) between the dry etching target region (the region where the compression stress film CSL1 is etched and removed) and the non-target region (the region where the compression stress film CSL1 is not etched but left) in the dry etching process at Step S14d in FIG. 84, the element isolation region 2 preferably lies in order to protect the metal silicide layer 13b. Specifically, in the region schematically shown by numeral 20 in FIG. 10, the boundary line between the target region and the non-target region for dry etching lies preferably.

Meanwhile, when the tensile stress film TSL1 is set as the first stress film to be formed at Step S13 in FIG. 84, at Step S14d in FIG. 84, the first stress film (the tensile stress film TSL1) and the insulating film 62 under it lying in the pMIS formation region 1B are dry-etched and removed using the photoresist film RP1 that covers the nMIS formation region 1A and exposes the pMIS formation region 1B as the etching mask, to cause the insulating film 61 to function as the etching stopper film.

Figure 87:
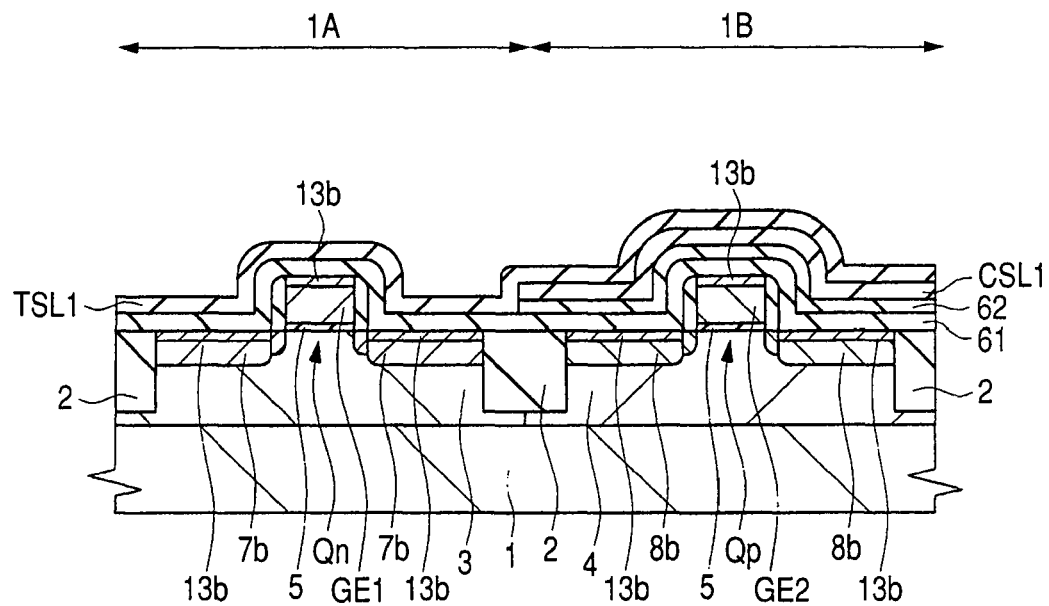
FIG. 87 is a cross-sectional view of the essential part in the manufacturing process of the semiconductor device subsequent to FIG. 86.

Next, as shown in FIG. 87, the second stress film is formed over the whole main face surface of the semiconductor substrate 1, that is, the main face of the semiconductor substrate 1 including the nMIS formation region 1A and pMIS formation region 1B (Step S11 in FIG. 84). The second stress film formed at Step S11 in FIG. 84 is a film that gives stress in the opposite direction as compared with the first stress film to be formed at Step S13 in FIG. 84, and, when the compression stress film CSL1 is set as the first stress film to be formed at Step S13 in FIG. 84, the second stress film formed at Step S11 in FIG. 84 is the tensile stress film TSL1, as shown in FIG. 87. The second stress film formed at Step S11 in FIG. 84 preferably has a thickness (formed film thickness) of around 20 to 60 nm.

At Step S11 in FIG. 84, the tensile stress film TSL1 is formed over the remaining insulating film 61 in the nMIS formation region 1A, and is formed over the compression stress film CSL1 in the pMIS formation region 1B, because the laminated film of the insulating film 61, insulating film 62 and compression stress film CSL1 exists.

Meanwhile, when the tensile stress film TSL1 instead of the compression stress film CSL1 is set as the first stress film to be formed at Step S13 in FIG. 84, the compression stress film CSL1 instead of the tensile stress film TSL1 is formed as the second stress film at Step S11 in FIG. 84.

Figure 88:
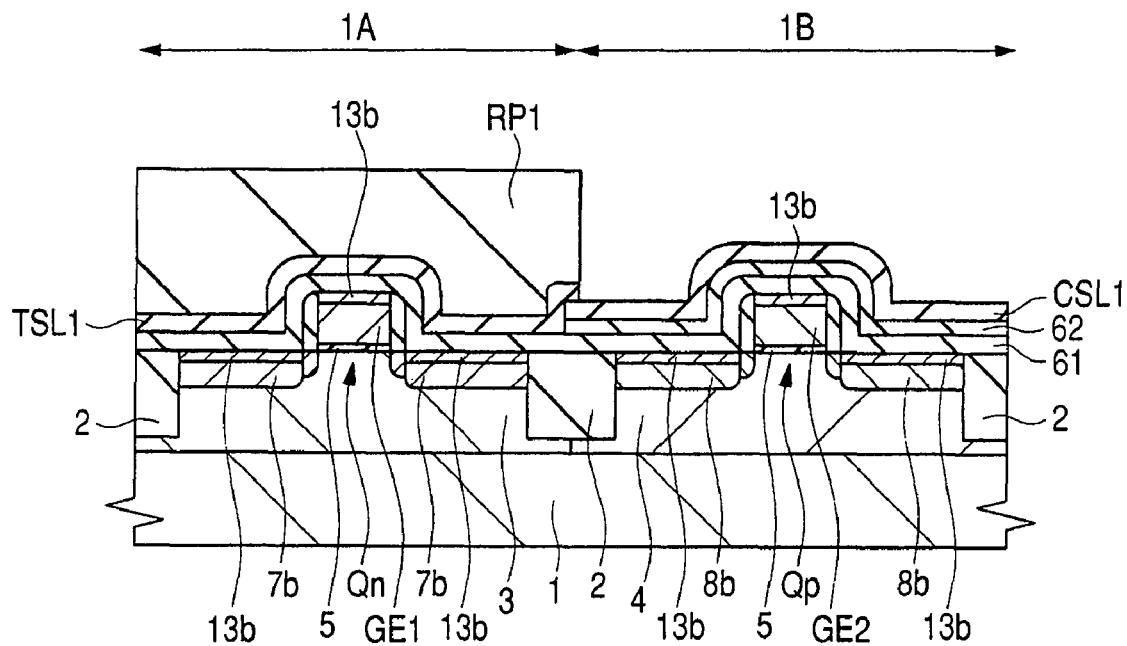
FIG. 88 is a cross-sectional view of the essential part in the manufacturing process of the semiconductor device subsequent to FIG. 87.

Next, as shown in FIG. 88, after the formation of the photoresist film RP1 that covers the nMIS formation region 1A and exposes the pMIS formation region 1B using a photolithographic method, the tensile stress film TSL1 lying in the pMIS formation region 1B is dry-etched and removed using the photoresist film RP1 as the etching mask (Step S12 in FIG. 84). In the dry etching process at Step S12 in FIG. 84, it is designed so that the compression stress film CSL1 (and insulating films 62, 61 under it) of the pMIS formation region 1B is not removed but left by controlling the over etching amount. Further, since the photoresist film RP1 functions as the etching mask, the tensile stress film TSL1 (and the insulating film 61 under it) in the nMIS formation region 1A is not etched but left. After that, the photoresist film RP2 is removed by ashing or the like.

Upon dry-etching the tensile stress film TSL1 at Step S12 in FIG. 84, it is preferable to design so that a part of the tensile stress film TSL1 covers the compression stress film CSL1 in order to prevent damage given to the element isolation region 2 by the dry etching, as shown in FIG. 88. That is, at the end of the dry etching of the tensile stress film TSL1 at Step S14, the tensile stress film TSL1 is set to overlap (cover) a part (an end portion neighborhood region) of the compression stress film CSL1 over the element isolation region 2 between the nMIS formation region 1A and the pMIS formation region 1B.

Meanwhile, when the tensile stress film TSL1 instead of the compression stress film CSL1 is set as the first stress film to be formed at Step S13 in FIG. 84 (that is, when the compression stress film CSL1 is set as the second stress film), at Step S12 in FIG. 84, the compression stress film CSL1 lying in the nMIS formation region 1A is removed by the dry etching, using the photoresist film RP2, which covers the pMIS formation region 1B and exposes the nMIS formation region 1A, as the etching mask. On this occasion, since the photoresist film RP2 functions as the etching mask, in the pMIS formation region 1B, the compression stress film CSL1 (and the insulating film 61 under it) is not etched but left, and, in the nMIS formation region 1A, the tensile stress film TSL1, and the insulating film 62 and insulating film 61 under it are left.

Figure 89:
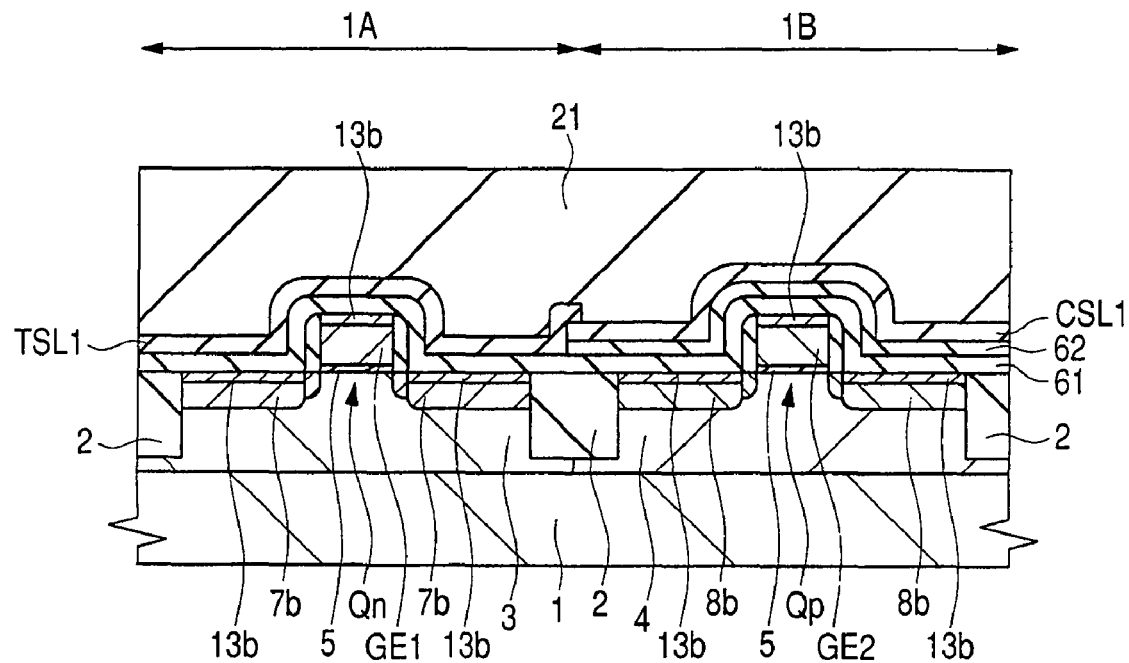
FIG. 89 is a cross-sectional view of the essential part in the manufacturing process of the semiconductor device subsequent to FIG. 88.

Subsequent processes are approximately the same as those in Embodiment 1. That is, as shown in FIG. 89, the interlayer insulating film 21 is formed over the whole main face of the semiconductor substrate 1, that is, over the main face of the semiconductor substrate 1 including the nMIS formation region 1A and pMIS formation region 1B (Step S15 in FIG. 84). The interlayer insulating film 21 is formed over the laminated film of the insulating film 61 and tensile stress film TSL1, and over the laminated film of the insulating film 61, insulating film 62 and compression stress film CSL1, wherein the thickness of the interlayer insulating film 21 is greater than that of the tensile stress film TSL1, compression stress film CSL1, insulating film 61 and insulating film 62. After the formation of the interlayer insulating film 21, the surface of the interlayer insulating film 21 is polished by a CMP method, or the like, and thereby the upper surface of the interlayer insulating film 21 is flattened.

Figure 90:
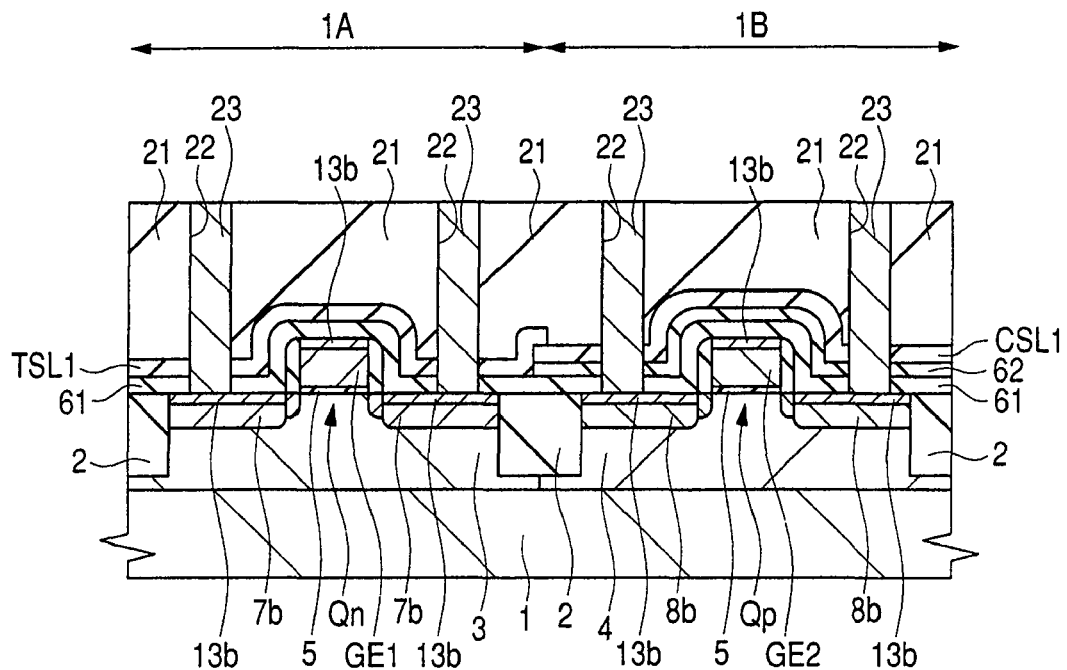
FIG. 90 is a cross-sectional view of the essential part in the manufacturing process of the semiconductor device subsequent to FIG. 89.

Next, as shown in FIG. 90, the contact hole 22 is formed by the dry etching using a photoresist pattern (not shown) formed on the interlayer insulating film 21 as the etching mask. On this occasion, in the nMIS formation region 1A, at a laminated film made of the interlayer insulating film 21, tensile stress film TSL1 and insulating film 61, the contact hole 22 passing through the laminated film is formed, and, in the pMIS formation region 1B, at a laminated film made of the interlayer insulating film 21, compression stress film CSL1, insulating film 62 and insulating film 61, the contact hole 22 passing through the laminated film is formed.

Meanwhile, when the tensile stress film TSL1 instead of the compression stress film CSL1 is set as the first stress film to be formed at Step S13 in FIG. 84, in the nMIS formation region 1A, at a laminated film made of the interlayer insulating film 21, tensile stress film TSL1, insulating film 62 and insulating film 61, the contact hole 22 passing through the laminated film is formed. On this occasion, in the pMIS formation region 1B, at a laminated film made of the interlayer insulating film 21, compression stress film CSL1 and insulating film 61, the contact hole 22 passing through the laminated film is formed.

Next, in the same way as that in Embodiment 1, the electroconductive plug 23 is formed inside the contact hole 22.

After that, in the same way as that in the embodiment 1, the stopper insulating film 24 and the insulating film 25 are formed, and then the wiring groove 26 is formed, and the wiring M1 is formed inside the wiring groove 26. The illustration and detailed description thereof are omitted here.

In the semiconductor device of the embodiment thus manufactured, as shown in FIG. 90, the insulating film 61 is formed over the semiconductor substrate 1 so as to cover the n-channel type MISFET Qn and p-channel type MISFET Qp, that is, to cover gate electrodes GE1 and GE2, the $n^+$-type semiconductor region 7b and $p^+$-type semiconductor region 8b. Then, over the insulating film 61, the tensile stress film TSL1 is formed so as to cover the n-channel type MISFET Qn, that is, to cover the gate electrode GE1 and $n^+$-type semiconductor region 7b. Further, over the insulating film 61, a laminated film of the insulating film 62 and compression stress film CSL1 above it is formed so as to cover the p-channel type MISFET Qp, that is, to cover the gate electrode GE2 and $p^+$-type semiconductor region 8b. Further, at least a part of the tensile stress film TSL1 overlaps the laminated film of the compression stress film CSL1 and insulating film 62.

When the insulating films 61, 62 are not formed, differing from the embodiment, the metal silicide layer 13b may be over-etched upon dry-etching the first stress film, which was formed at Step S13 in FIG. 84, at Step S14d in FIG. 84 to cause the decrease in the thickness or etching damage of the metal silicide layer 13b, and to raise the resistance of the metal silicide layer 13b.

In contrast, in the embodiment, at Steps S61, S62 and S13 in FIG. 84, the insulating film 61, insulating film 62 and first stress film are formed in this order, and, upon dry-etching the first stress film at Step S14d in FIG. 84, the insulating film 61 is caused to function as the etching stopper. As the result, it is possible to prevent the decrease in film thickness and etching damage of the metal silicide layer 13b caused by over etching of the metal silicide layer 13b, and to prevent the rise in the resistance of the metal silicide layer 13b. Consequently, the performance and reliability of semiconductor devices can be improved.

Further, in the embodiment, by forming the insulating film 61, which is caused to function as the etching stopper, with either a tensile stress film or a compression stress film, not only the stress of the tensile stress film TSL1 and the stress of the compression stress film CSL1, but also the stress of the insulating film 61 can be acted on the semiconductor substrate (the channel region of a MISFET). Consequently, it is possible to improve more appropriately the mobility of the channel of a MISFET, and to improve more the performance of a MISFET formed at the semiconductor substrate 1. Since the insulating film 61 is formed closer to the semiconductor substrate 1 than the tensile stress film TSL1 and compression stress film CSL1, the effect of improving the mobility of the channel region caused by setting the insulating film 61 as a stress film is very great.

Further, when the insulating film 62 is not formed, differing from the embodiment, in order to cause the insulating film 61 to function as the etching stopper film, the insulating film 61 formed at Step S61 in FIG. 84 and the first stress film formed at Step S13 in FIG. 84 need to be formed from materials different from each other in order to give the etching selectivity between the insulating film 61 and the first stress film, which corresponds to Embodiment 8 above.

In contrast, in the embodiment, the insulating film 62 lies between the insulating film 61 formed at Step S61 in FIG. 84 and the first stress film formed at Step S13 in FIG. 84. Consequently, in order to cause the insulating film 61 to function as the etching stopper, it is sufficient to form the insulating film 62 and the insulating film 61 from materials different from each other in order to give the etching selectivity between the insulating film 62 and the insulating film 61. Accordingly, in the embodiment, the insulating film 61 formed at Step S61 in FIG. 84 and the first stress film formed at Step S13 in FIG. 84 can be formed from the same material. Consequently, both the insulating film 61 formed at Step S61 in FIG. 84 and the first stress film formed at Step S13 in FIG. 84 can be formed of a film of a material that is most appropriate for the stress film such as a silicon nitride film. Consequently, since it is possible to increase the stress of not only the first stress film, but also the insulating film 61, the mobility of the channel of a MISFET can further be improved, and the performance of a MISFET formed at the semiconductor substrate 1 can further be improved. Accordingly, the embodiment gives great effect when applied to the case where both the insulating film 61 formed at Step S61 in FIG. 84 and the first stress film formed at Step S13 in FIG. 84 are formed from the same material, particularly preferably from silicon nitride.

The insulating film 61 may be formed into either of a tensile stress film and compression stress film, but, when comparing the tensile stress film TSL1 with the compression stress film CSL1, it is more difficult for the tensile stress film TSL1 to give stress of a greater absolute value. Therefore, the insulating film 61 is more preferably a tensile stress film so that the insulating film 61 can reinforce the tensile stress of the tensile stress film TSL1.

Figure 91:
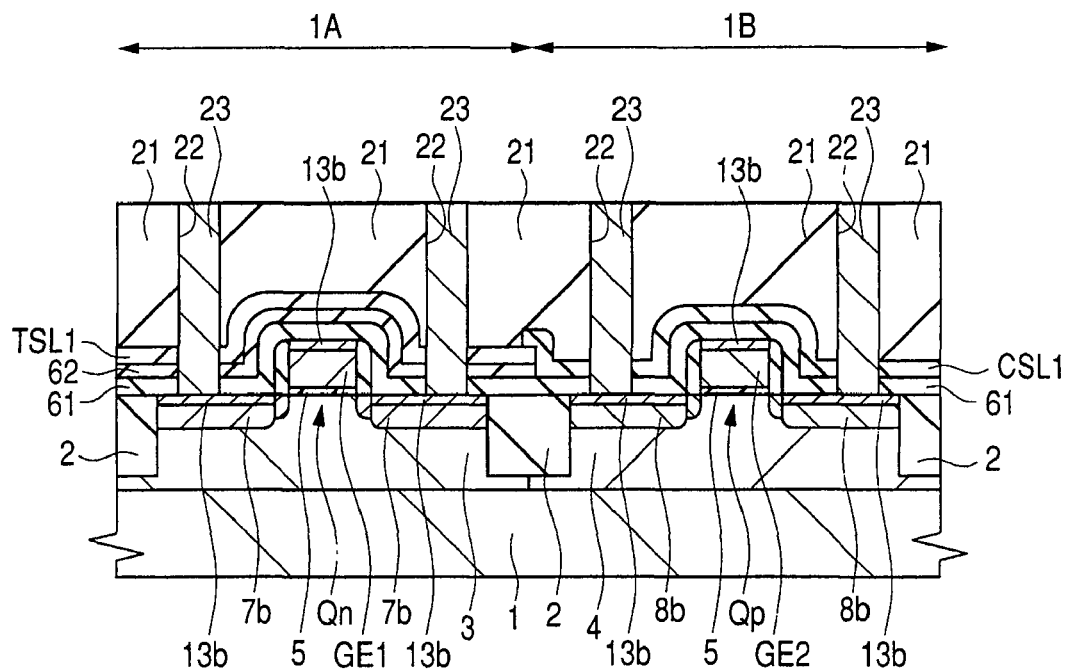
FIG. 91 is a cross-sectional view of the essential part in the manufacturing process of the semiconductor device being Embodiment 10 of the invention when a tensile stress film is set as the first stress film.

In the embodiment, the instance, in which the compression stress film CSL1 is set as the first stress film to be formed at Step S13 in FIG. 84, is mainly illustrated and described, and, the instance, in which the tensile stress film TSL1 is set as the first stress film to be formed at Step S13 in FIG. 84, is also written down and explained. When the tensile stress film TSL1 is set as the first stress film formed at Step S13 in FIG. 84, the shape becomes as that in FIG. 91. FIG. 91 is a cross-sectional view of the essential part in a manufacturing process of a semiconductor device of the embodiment when the tensile stress film TSL1 is set as the first stress film formed at Step S13 in FIG. 84, which corresponds to FIG. 90 (the same process stage as that in FIG. 90) above.

As the first stress film formed at Step S13 in FIG. 84, either of the compression stress film CSL1 and the tensile stress film TSL1 may be set, but the compression stress film CSL1 is more preferable (that is, the instance in FIG. 90 is more preferred to the instance in FIG. 91), the reason of which is as follows.

That is, in a manufactured semiconductor device, the second stress film formed at Step S11 in FIG. 84 has a smaller number of insulating films lying between it and the semiconductor substrate 1 as compared with the first stress film formed at Step S13 in FIG. 84, and is disposed more closely to the semiconductor substrate 1. Generally, formation of a stress film having a greater absolute value of the stress is easier for a stress film that gives stress in the compression stress direction as compared with a stress film that gives stress in the tensile stress direction. Therefore, by setting the compression stress film CSL1, for which the formation of a film having a great absolute value of the stress is easy, as the first stress film that is disposed apart from the semiconductor substrate 1, and setting the tensile stress film TSL1, for which the formation of a film having a great absolute value of the stress is difficult, as the second stress film that is disposed close to the semiconductor substrate 1, the stress is allowed to act more effectively in both nMIS formation region 1A and pMIS formation region 1B. Further, it is advantageous also in that the shortage of the tensile stress in the nMIS formation region 1A is easily prevented.

Embodiment 11

Figure 92:
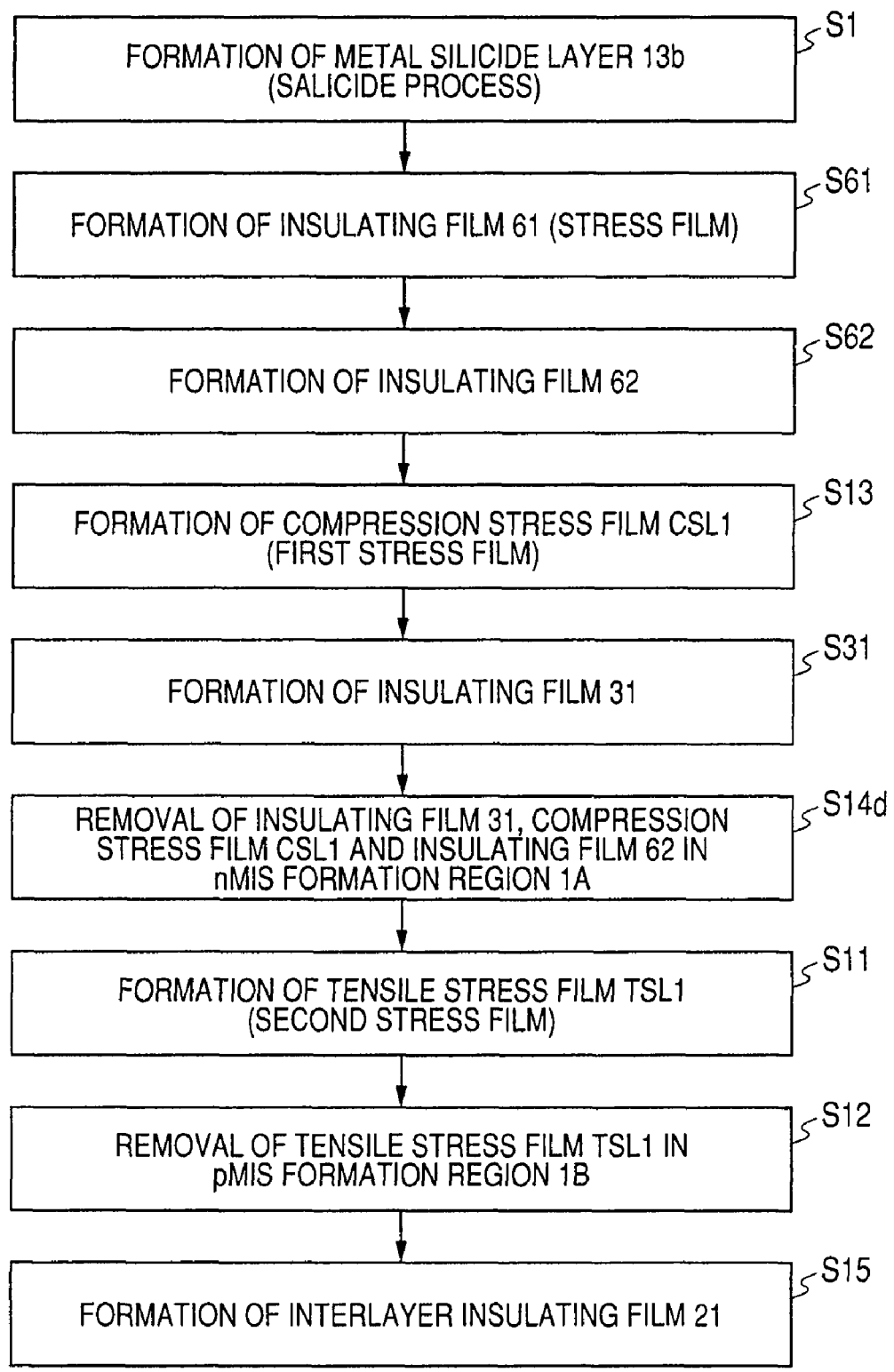
FIG. 92 is a manufacturing process flow chart showing a part of the manufacturing process of a semiconductor device being an Embodiment 11 of the invention.

FIG. 92 is a manufacturing process flow chart showing a part of the manufacturing process of a semiconductor device of the present embodiment, which corresponds to FIG. 84 in Embodiment 10. FIGS. 93 to 98 are cross-sectional views of the essential part in a manufacturing process of a semiconductor device of the embodiment.

The embodiment corresponds to the modification of Embodiment 10 (the modification of Embodiment 10, in which the insulating film 31 is provided over the first stress film). In the embodiment, since manufacturing processes of a semiconductor device are the same as those in Embodiment 10 up to the formation of the first stress film at Step S13 (that is, up to the obtainment of the structure in FIG. 85), the description thereof is omitted here, and subsequent processes will be described. Meanwhile, hereinafter, an instance, in which the first stress film to be formed at Step S13 in FIG. 92 is the compression stress film CSL1, is illustrated and described, but, the first stress film to be formed at Step S13 in FIG. 92 may also be the tensile stress film TSL1 instead of the compression stress film CSL1.

Figure 93:
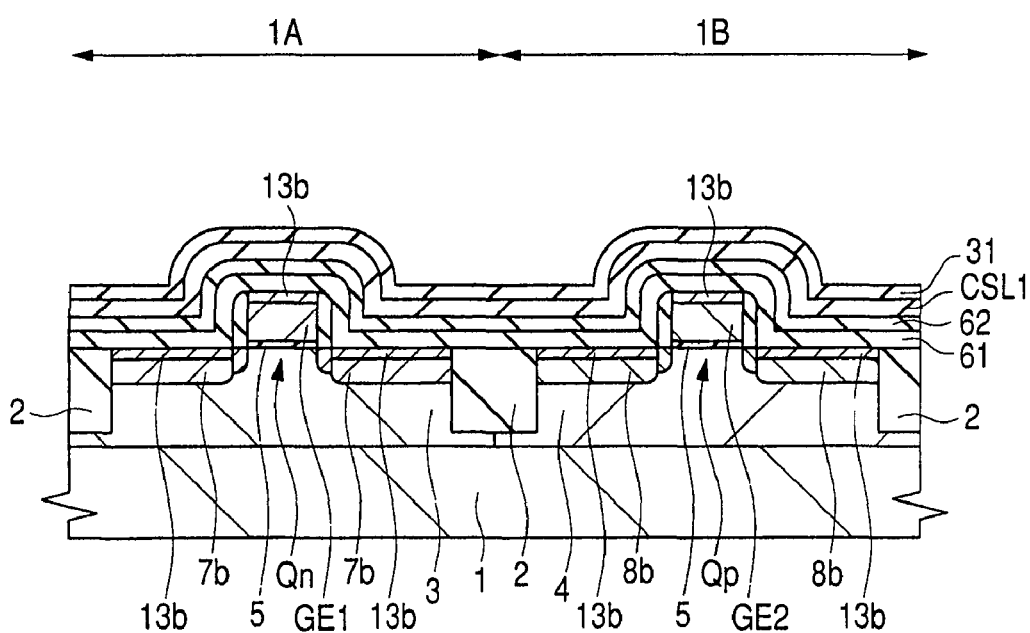
FIG. 93 is a cross-sectional view of the essential part in a manufacturing process of the semiconductor device being Embodiment 11 of the invention.

Next, as shown in FIG. 93, the insulating film 31 is formed over the whole main face of the semiconductor substrate 1 including the nMIS formation region 1A and pMIS formation region 1B, that is, over the compression stress film CSL1 (Step S31 in FIG. 92).

Although a film of silicon oxide represented by $SiO_2$ is most suitable for the insulating film 31, the film is not limited to it only when the film can give etching selectivity for the second stress film to be formed at Step S11, which will be described later. For example, when the second stress film to be formed at Step S11 described later is a silicon nitride film, as the insulating film 31, a silicon carbide film (a SiC film), a silicon carbonitride film (a SiCN film) or a silicon oxynitride film (a SiON film) may also be employed, in addition to the silicon oxide film. However, in order to give the etching selectivity for the second stress film to be formed at Step S11 described later, the insulating film 31 needs to be formed from a material different from that of the second stress film formed at Step S11 described later. The insulating film 31 preferably has a thickness (formed film thickness) of around 6 to 20 nm.

When the insulating film 31 is a silicon oxide film, as the formation method thereof, a thermal CVD method using TEOS and $O_3$ gas may be employed, and, additionally, for example, it is possible to form the insulating film 31 at the surface of the compression stress film CSL1 by plasma-treating the surface of the compression stress film CSL1 with plasma of oxygen-containing gas, and to form the insulating film 31 at the surface of the compression stress film CSL1 by a heat treatment or ion implantation. This is the same in Embodiments 3, 5, 7 and 9 above.

Meanwhile, when the tensile stress film TSL1 instead of the compression stress film CSL1 is set as the first stress film to be formed at Step S13 in FIG. 92, at Step S31 in FIG. 92, the insulating film 31 is formed over the tensile stress film TSL1.

Figure 94:
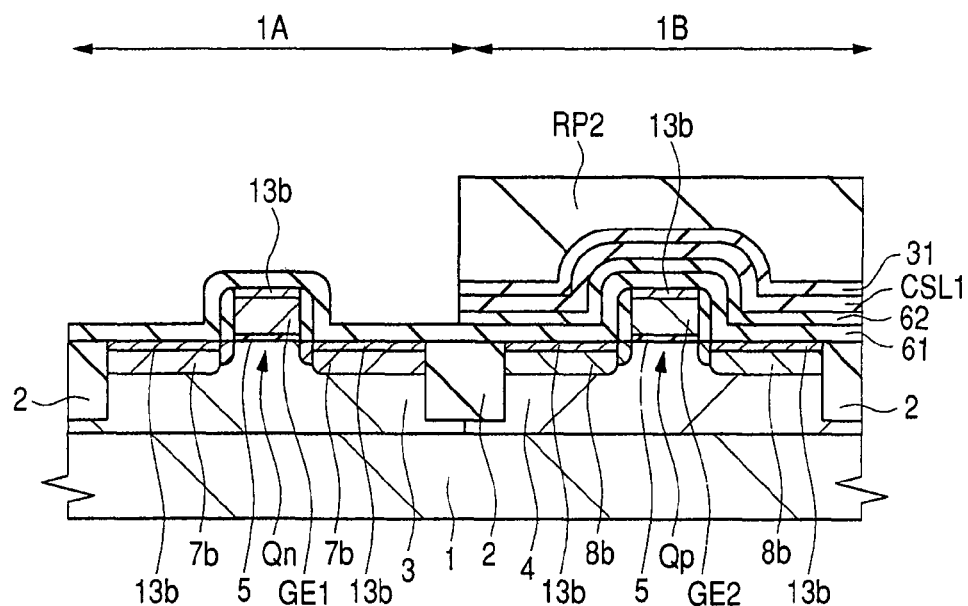
FIG. 94 is a cross-sectional view of the essential part in the manufacturing process of the semiconductor device subsequent to FIG. 93.

Next, as shown in FIG. 94, after the formation of the photoresist film RP2 that covers the pMIS formation region 1B and exposes the nMIS formation region 1A using a photolithographic method, the insulating film 31, compression stress film CSL1 and insulating film 62 lying in the nMIS formation region 1A are dry-etched and removed using the photoresist film RP2 as the etching mask (Step S14d in FIG. 92). On this occasion, firstly, the insulating film 31 is dry-etched under conditions in which the insulating film 31 is etched more easily as compared with the compression stress film CSL1, and then the compression stress film CSL1 is dry-etched under conditions in which the compression stress film CSL1 is etched more easily as compared with the insulating film 62, and the insulating film 62 is dry-etched under conditions in which the insulating film 62 is etched more easily as compared with the insulating film 61. Then, the insulating film 61 is caused to function as the etching stopper film and is left. That is, by allowing the insulating film 61 to remain on the metal silicide layer 13b of the nMIS formation region 1A at the end of the dry etching, the insulating film 61 is caused to function as the etching protective film (the barrier against the etching) of the metal silicide layer 13b. Further, on this occasion, since the photoresist film RP2 functions as the etching mask, in the pMIS formation region 1B, the laminated film of the insulating film 61, insulating film 62, compression stress film CSL1 and insulating film 31 is not etched but left. After that, the photoresist film RP2 is removed by ashing or the like.

Further, in the dry etching process at Step S14d in FIG. 92, all the insulating film 61 of the nMIS formation region 1A is preferably removed, but, only when the stress of the second stress film to be formed at Step S11 described later sufficiently acts on the channel of a MISFET, not all the insulating film 62 may be removed in the nMIS formation region 1A, but a part (a lower layer portion) of the insulating film 62 may remain on the insulating film 61.

Under the boundary line (the border) between the dry etching target region (the region where the compression stress film CSL1 is etched and removed) and the non-target region (the region where the compression stress film CSL1 is not etched but left) in the dry etching process at Step S14d in FIG. 92, the element isolation region 2 preferably lies in order to protect the metal silicide layer 13b. Specifically, in the region schematically shown by numeral 20 in FIG. 10, the boundary line between the target region and the non-target region for dry etching lies preferably.

Meanwhile, when the tensile stress film TSL1 is set as the first stress film to be formed at Step S13 in FIG. 92, at Step S14d in FIG. 92, the insulating film 31, first stress film (tensile stress film TSL1) and insulating film 62 lying in the pMIS formation region 1B are dry-etched and removed using the photoresist film RP1 that covers the nMIS formation region 1A and exposes the pMIS formation region 1B as the etching mask, to cause the insulating film 61 to function as the etching stopper film.

Figure 95:
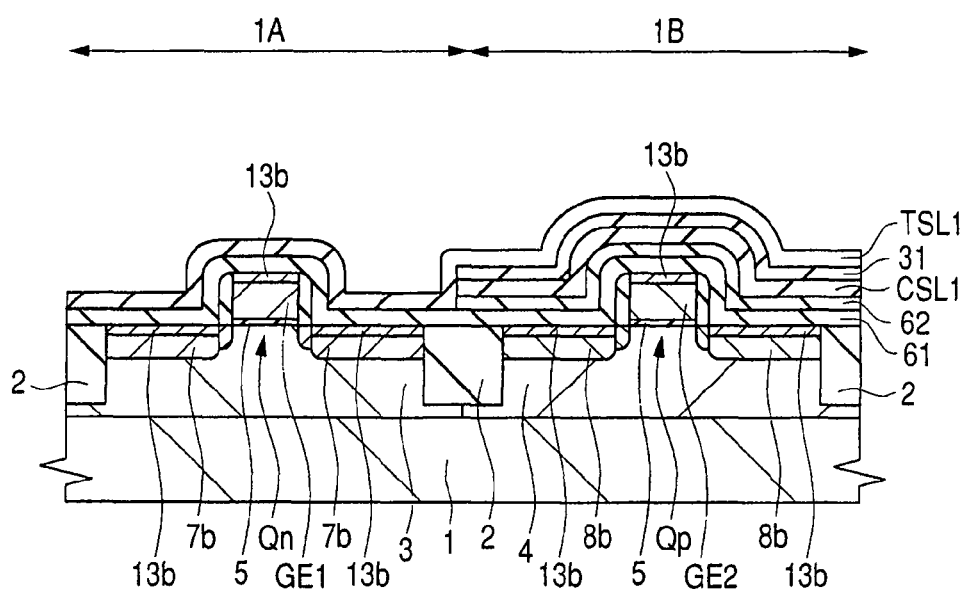
FIG. 95 is a cross-sectional view of the essential part in the manufacturing process of the semiconductor device subsequent to FIG. 94.

Next, as shown in FIG. 95, the second stress film is formed over the whole main face surface of the semiconductor substrate 1, that is, the main face of the semiconductor substrate 1 including the nMIS formation region 1A and pMIS formation region 1B (Step S11 in FIG. 92). The second stress film formed at Step S11 in FIG. 92 is a film that gives stress in the opposite direction as compared with the first stress film to be formed at Step S13 in FIG. 92, and, when the compression stress film CSL1 is set as the first stress film to be formed at Step S13 in FIG. 92, the second stress film formed at Step S11 in FIG. 92 is the tensile stress film TSL1, as shown in FIG. 95. The second stress film formed at Step S11 in FIG. 92 preferably has a thickness (formed film thickness) of around 20 to 60 nm.

At Step S11 in FIG. 92, the tensile stress film TSL1 is formed, in the nMIS formation region 1A, over the remaining insulating film 61, and is formed in the pMIS formation region 1B, over the insulating film 31 because the laminated film of the insulating film 61, insulating film 62, compression stress film CSL1 and insulating film 31 exists.

Meanwhile, when the tensile stress film TSL1 instead of the compression stress film CSL1 is set as the first stress film to be formed at Step S13 in FIG. 92, at Step S11 in FIG. 92, the compression stress film CSL1 instead of the tensile stress film TSL1 is formed as the second stress film.

Figure 96:
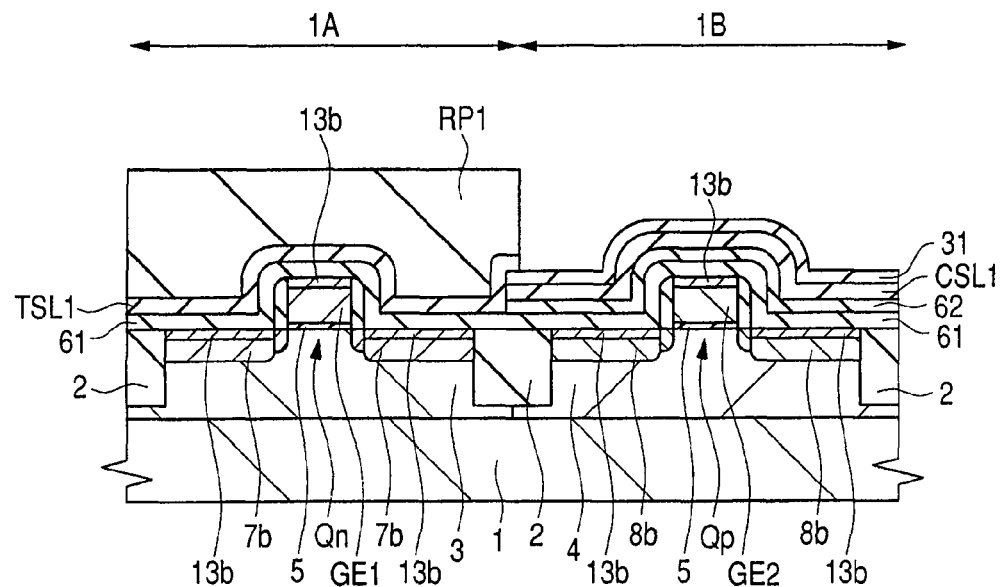
FIG. 96 is a cross-sectional view of the essential part in the manufacturing process of the semiconductor device subsequent to FIG. 95.

Next, as shown in FIG. 96, after the formation of the photoresist film RP1 that covers the nMIS formation region 1A and exposes the pMIS formation region 1B using a photolithographic method, the tensile stress film TSL1 lying in the pMIS formation region 1B is dry-etched and removed, using the photoresist film RP1 as an etching mask (Step S12 in FIG. 92).

In the embodiment, the dry etching process (the process for removing the tensile stress film TSL1) at Step S12 in FIG. 92 is similar to the dry etching process (the process for removing the tensile stress film TSL1) at Step S12 in FIG. 84 in Embodiment 10, except for causing the insulating film 31 to function as the etching stopper.

That is, in the dry etching process at Step S12 in FIG. 92 in the embodiment, since the photoresist film RP1 functions as the etching mask, the tensile stress film TSL1 and insulating film 61 under it of the pMIS formation region 1B are not etched but are left. Also, in the dry etching process at Step S12 in FIG. 92, the tensile stress film TSL1 is dry-etched under conditions in which the tensile stress film TSL1 is etched more easily as compared with the insulating film 31, to cause the insulating film 31 to function as the etching stopper film. Consequently, the insulating film 31, and the compression stress film CSL1, insulating film 62 and insulating film 61 under it are left in the pMIS formation region 1B not covered with the photoresist film RP1. Consequently, the metal silicide layer 13b is not exposed in both the nMIS formation region 1A and pMIS formation region 1B. After the dry etching process at Step S12 in FIG. 92, the photoresist film RP1 is removed by ashing or the like.

In the embodiment, in the dry etching process at Step S12 in FIG. 92, since the insulating film 31 functions as the etching stopper (the etching protective film for the tensile stress film TSL1), it is possible to prevent the etching of the tensile stress film TSL1 (the first stress film formed at Step S13 in FIG. 92), and to prevent the decrease in the thickness of the tensile stress film TSL1.

Meanwhile, in the dry etching process at Step S12 in FIG. 92, possibly there is such case that a part of the insulating film 31 (an upper layer portion) is etched (removed) by over etching in the pMIS formation region 1B. However, it is preferable to design so that, at the stage after the end of the dry etching process at Step S12 in FIG. 92, at least a part of the insulating film 31 (a lower layer portion) remains in laminate over the compression stress film CSL1 in the pMIS formation region 1B, and the compression stress film CSL1 is not exposed. This makes it possible to prevent appropriately the etching of the compression stress film CSL1 in the dry etching process at Step S12 in FIG. 92.

When dry-etching the tensile stress film TSL1 at Step S12 in FIG. 92, in order to prevent damages on the element isolation region 2 by the dry etching, as shown in FIG. 96, it is preferable to form a portion, in which a part of the tensile stress film TSL1 covers the laminated film of the insulating film 31, compression stress film CSL1 and insulating film 62. That is, the tensile stress film TSL1 is set to overlap (cover) apart (an end portion neighborhood region) of the laminated film of the insulating film 31, compression stress film CSL1 and insulating film 62 above the element isolation region 2 between the nMIS formation region 1A and pMIS formation region 1B, at the end of the dry etching of the tensile stress film TSL1 at Step S12.

Meanwhile, when the tensile stress film TSL1 instead of the compression stress film CSL1 is set as the first stress film to be formed at Step S13 in FIG. 92 (that is, the compression stress CSL1 is set as the second stress film), at Step S12 in FIG. 92, the compression stress film CSL1 lying in the nMIS formation region 1A is dry-etched and removed, using the photoresist film RP2 that covers the pMIS formation region 1B and exposes the nMIS formation region 1A as the etching mask. On this occasion, since the photoresist film RP2 functions as the etching mask, the compression stress film CSL1 (and the insulating film 61 under it) in the pMIS formation region 1B is not etched but left, and, by causing the insulating film 31 to function as the etching stopper film, the insulating film 31, and the tensile stress film TSL1, insulating film 62 and insulating film 61 under it are left in the nMIS formation region 1A.

Figure 97:
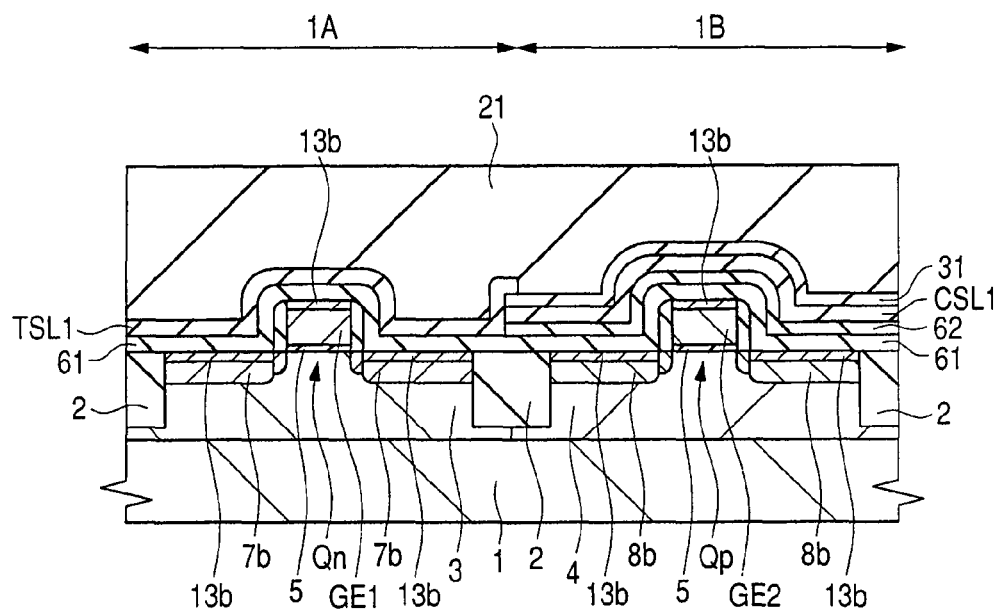
FIG. 97 is a cross-sectional view of the essential part in the manufacturing process of the semiconductor device subsequent to FIG. 96.

Subsequent processes are approximately the same as those in Embodiment 1. That is, as shown in FIG. 97, the interlayer insulating film 21 is formed over the whole main face of the semiconductor substrate 1, that is, over the main face of the semiconductor substrate 1 including the nMIS formation region 1A and pMIS formation region 1B (Step S15 in FIG. 92). The interlayer insulating film 21 is formed over the laminated film of the insulating film 61 and tensile stress film TSL1, and over the laminated film of the insulating film 61, insulating film 62, compression stress film CSL1 and insulating film 31, wherein the thickness of the interlayer insulating film 21 is greater than that of the tensile stress film TSL1, compression stress film CSL1, insulating film 31, insulating film 61 and insulating film 62. After the formation of the interlayer insulating film 21, the surface of the interlayer insulating film 21 is polished by a CMP method, or the like, and thereby the upper surface of the interlayer insulating film 21 is flattened.

Figure 98:
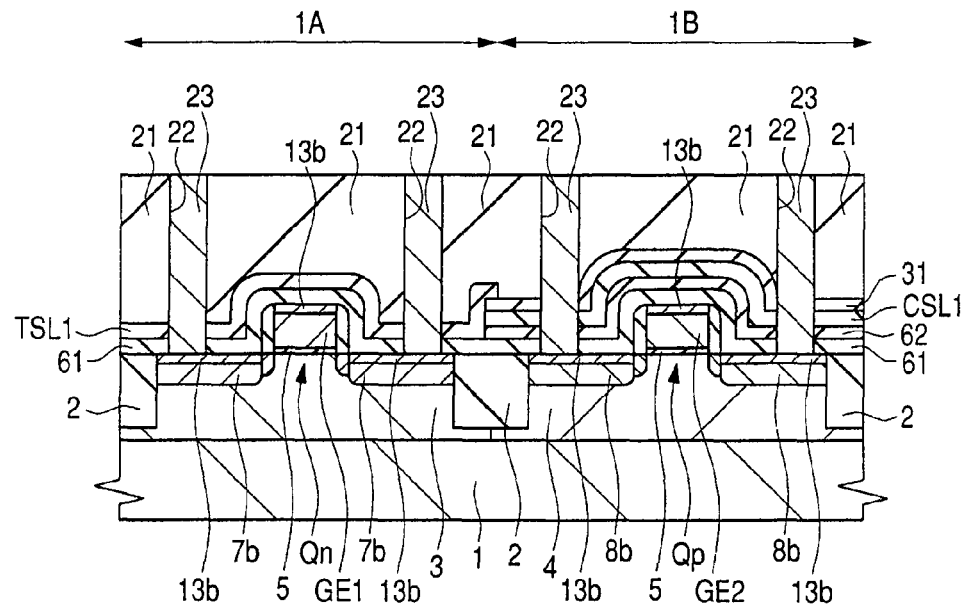
FIG. 98 is a cross-sectional view of the essential part in the manufacturing process of the semiconductor device subsequent to FIG. 97.

Next, as shown in FIG. 98, the contact hole 22 is formed by the dry etching using a photoresist pattern (not shown) formed on the interlayer insulating film 21 as the etching mask. On this occasion, in the nMIS formation region 1A, at a laminated film made of the interlayer insulating film 21, tensile stress film TSL1 and insulating film 61, the contact hole 22 passing through the laminated film is formed, and, in the pMIS formation region 1B, at a laminated film made of the interlayer insulating film 21, insulating film 31, compression stress film CSL1, insulating film 62 and insulating film 61, the contact hole 22 passing through the laminated film is formed.

Meanwhile, when the tensile stress film TSL1 instead of the compression stress film CSL1 is set as the first stress film to be formed at Step S13 in FIG. 92, in the nMIS formation region 1A, at a laminated film made of the interlayer insulating film 21, insulating film 31, tensile stress film TSL1, insulating film 62 and insulating film 61, the contact hole 22 passing through the laminated film is formed. Further, on this occasion, in the pMIS formation region 1B, at the laminated film made of the interlayer insulating film 21, compression stress film CSL1 and insulating film 61, the contact hole 22 passing through the laminated film is formed.

Next, in the same way as that in Embodiment 1, the electroconductive plug 23 is formed inside the contact hole 22.

After that, in the same way as that in Embodiment 1, after the formation of the stopper insulating film 24 and the insulating film 25, the wiring groove 26 is formed, and the wiring M1 is formed inside the wiring groove 26. Here, the illustration and the detailed description thereof are omitted.

When compared with the semiconductor device in Embodiment 10 (FIG. 90), the semiconductor device of the embodiment thus manufactured (FIG. 98) is different in that the insulating film 31 lies over the compression stress film CSL1 (between the compression stress film CSL1 and the interlayer insulating film 21) in the pMIS formation region 1B. The insulating film 31, the compression stress film CSL1 and the insulating film 62 have the same planar shape. Further, at least a part of the tensile stress film TSL1 overlaps the laminated film of the insulating film 31, compression stress film CSL1 and insulating film 62.

In Embodiment 11, following effects can further be obtained in addition to that obtained in Embodiment 10. That is, in the embodiment, by causing the insulating film 31 formed at Step S31 to function as the etching stopper (the etching protective film for the first stress film) in the dry etching process at Step S12 (the process for removing the second stress film), it is possible to prevent the etching of the first stress film, and to prevent decrease in the thickness of the first stress film. As the result, the deposited film thickness (the film thickness when deposited at Step S13 in FIG. 92) is maintained as the thickness of the first stress film (the first stress film formed at Step S13 in FIG. 92) in the manufactured semiconductor device. Since the deposited film thickness upon deposition over the semiconductor wafer can be controlled with high accuracy, when the deposited film thickness can be maintained as the thickness of the first stress film, as in the embodiment, the thickness of the first stress film in manufactured semiconductor devices can be set to an approximately designed value, which makes it possible to set the stress value acting on MISFETs approximately to the designed value itself. Further, in the embodiment, since the deposited film thickness can be maintained as the thickness of the first stress film, variation of the thickness of the first stress film can be suppressed for each wafer, and the spread of MISFET properties among wafers can be suppressed.

Figure 99:
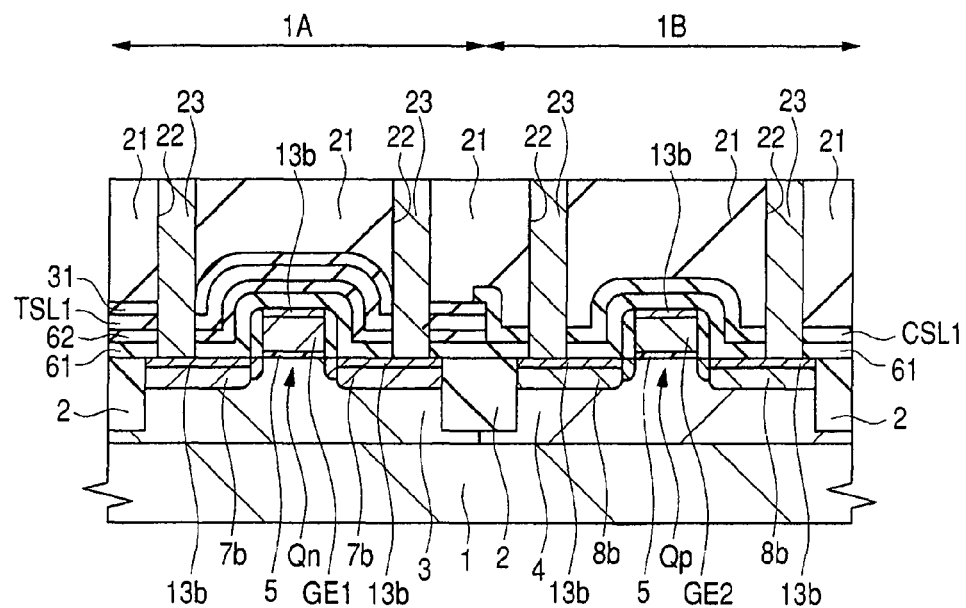
FIG. 99 is a cross-sectional view of the essential part in the manufacturing process of the semiconductor device being Embodiment 11 of the invention when the tensile stress film is set as the first stress film.

In the embodiment, the instance, in which the compression stress film CSL1 is set as the first stress film to be formed at Step S13 in FIG. 92, is mainly illustrated and described, and, the instance, in which the tensile stress film TSL1 is set as the first stress film to be formed at Step S13 in FIG. 92, is also written down and explained. When the tensile stress film TSL1 is set as the first stress film formed at Step S13 in FIG. 92, the shape becomes as that in FIG. 99. FIG. 99 is a cross-sectional view of the essential part in a manufacturing process of a semiconductor device of the embodiment when the tensile stress film TSL1 is set as the first stress film formed at Step S13 in FIG. 92, which corresponds to FIG. 98 (the same process stage as that in FIG. 98) above.

Embodiment 12

Figure 100:
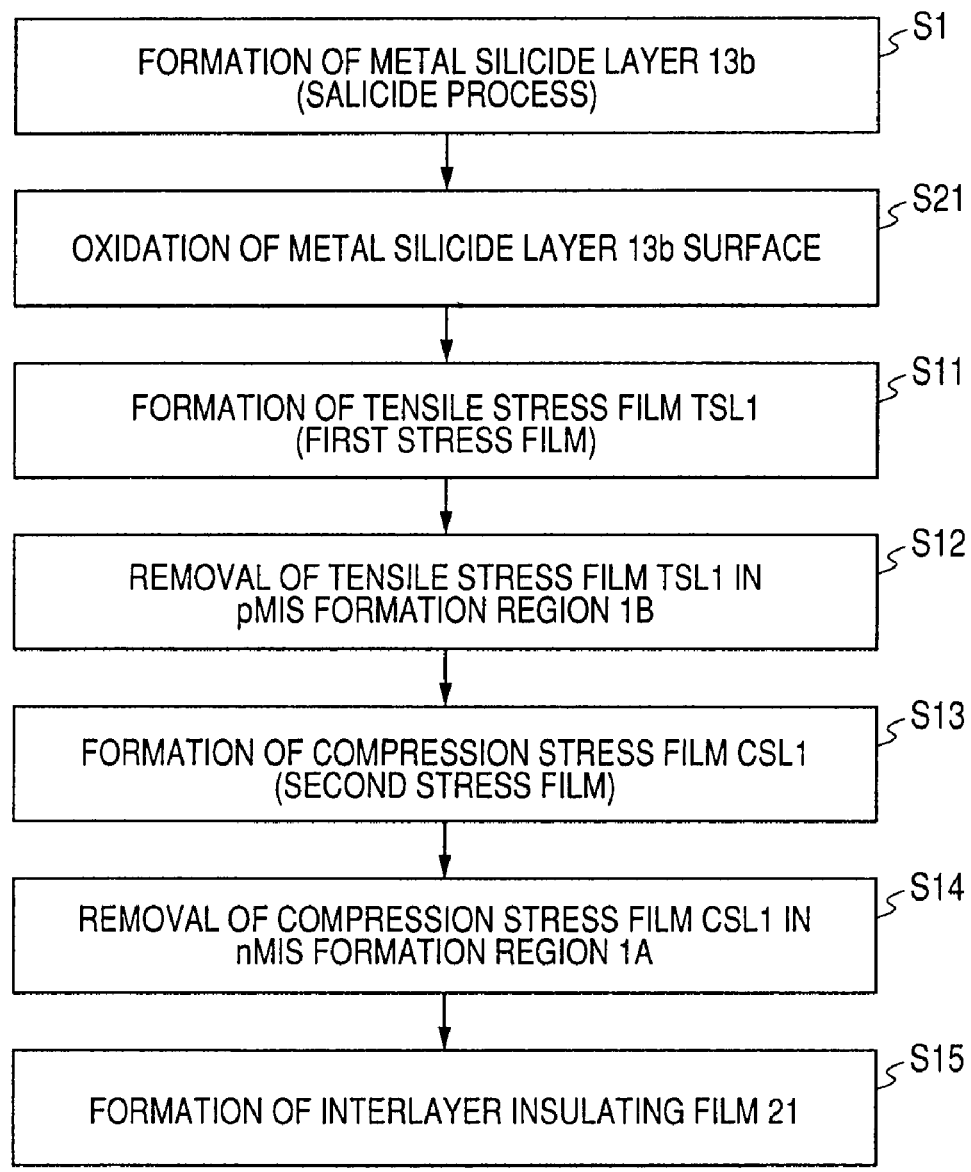
FIG. 100 is a manufacturing process flow chart showing a part of the manufacturing process of a semiconductor device being an Embodiment 12 of the invention.
Figure 101:
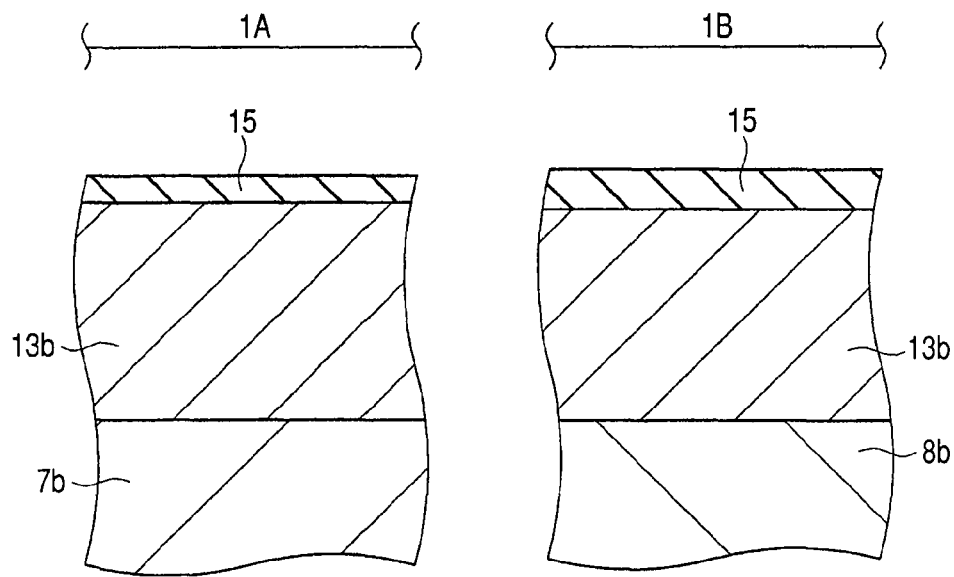
FIG. 101 is a cross-sectional view of the essential part in the manufacturing process of the semiconductor device being Embodiment 12 of the invention.

FIG. 100 is a manufacturing process flow chart showing a part of the manufacturing process of a semiconductor device of the embodiment, which corresponds to FIG. 3 in Embodiment 1. FIG. 101 is a cross-sectional view of the essential part in a manufacturing process of a semiconductor device of the embodiment, which shows the neighborhood of the metal silicide layer 13b of the nMIS formation region 1A and pMIS formation region 1B, and corresponds to FIG. 22 in Embodiment 2 above.

Manufacturing processes of a semiconductor device in the embodiment can be performed in the approximately same way as that in Embodiment 1 up to the formation of the metal silicide layer 13b (that is, up to the obtainment of the structure in FIG. 7), and the description thereof is omitted here.

However, as described in Embodiment 4, also in the embodiment, the process for forming the metal silicide layer 13b at Step Si is not limited to Step S1 described in Embodiment 1. That is, as in Embodiments 4 to 11, also in the embodiment, the material, concentration distribution and formation method of the metal silicide layer 13b are not limited to the material, concentration distribution and formation method of the metal silicide layer 13b as described in Embodiment 1. For example, one or more elements selected from the group made of Ni (nickel), Co (cobalt), Pt (platinum), Pd (palladium), Hf (hafnium), V (vanadium), Er (erbium), Ir (iridium) and Yb (ytterbium) may be employed as the metal element constituting the metal silicide layer 13b in the embodiment.

In the embodiment, after the formation of the metal silicide layer 13b at Step S1, the surface of the metal silicide layer 13b is oxidized (Step S21 in FIG. 100). The oxidizing process at Step S21 in FIG. 100 is the same as that at Step S21 in FIG. 21 in Embodiment 2, and the detailed description thereof is omitted here. By the oxidizing process at Step S21 in FIG. 100, as shown in FIG. 101, an oxidized film (an oxidized film of the metal silicide) 15 is formed at the surface of the metal silicide layer 13b. The oxide film 15 is an oxidized film including elements constituting the metal silicide layer 13b and oxygen (O) as constitutional elements.

Subsequent processes are basically the same as those in Embodiment 1, but, although the tensile stress film TSL1 is formed prior to the formation of the compression stress film CSL1 in Embodiment 1, either the tensile stress film TSL1 or the compression stress film CSL1 may be formed primarily in Embodiment 12. Hereinafter, specific description will be given.

Figure 102:
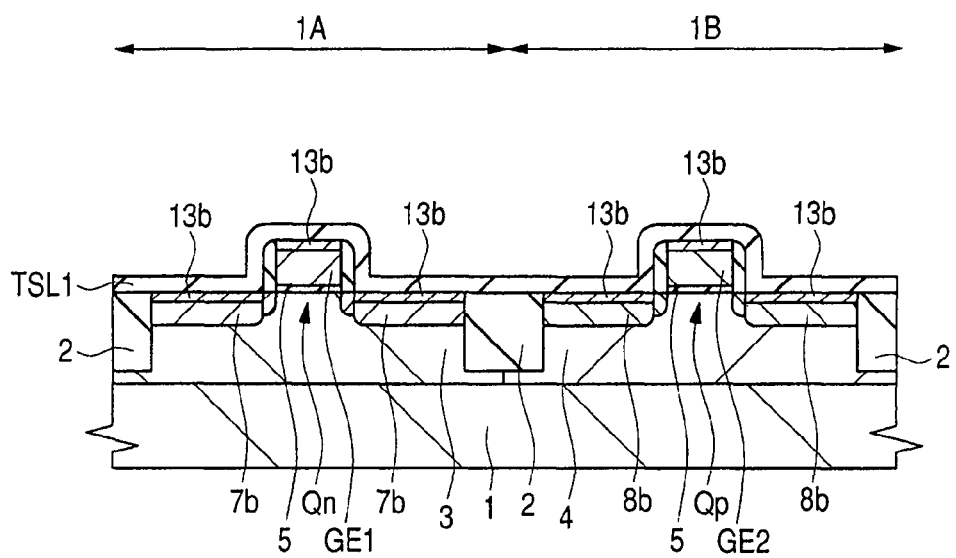
FIG. 102 is a cross-sectional view of the essential part in the manufacturing process of the semiconductor device being Embodiment 12 of the invention.

That is, in the embodiment, after the surface of the metal silicide layer 13b is oxidized at Step S21 in FIG. 100, as shown in FIG. 102, the first stress film is formed over the whole main face of the semiconductor substrate 1, that is, over the main face of the semiconductor substrate 1 including the nMIS formation region 1A and pMIS formation region 1B (Step S11 in FIG. 100). At Step S11 in FIG. 100, the first stress film is formed over the semiconductor substrate 1 including the metal silicide layer 13b so as to cover gate electrodes GE1 and GE2, and the sidewall 9. Hereinafter, an instance, in which the tensile stress film TSL1 is set as the first stress film to be formed at Step S11 in FIG. 100, is illustrated and described, but, the compression stress film CSL1 instead of the tensile stress film TSL1 may also be set as the first stress film to be formed at Step S11 in FIG. 100. Since the material and formation method of the tensile stress film TSL1 and compression stress film CSL1 in the embodiment are the same as those in Embodiment 1, the description thereof is omitted here.

Figure 103:
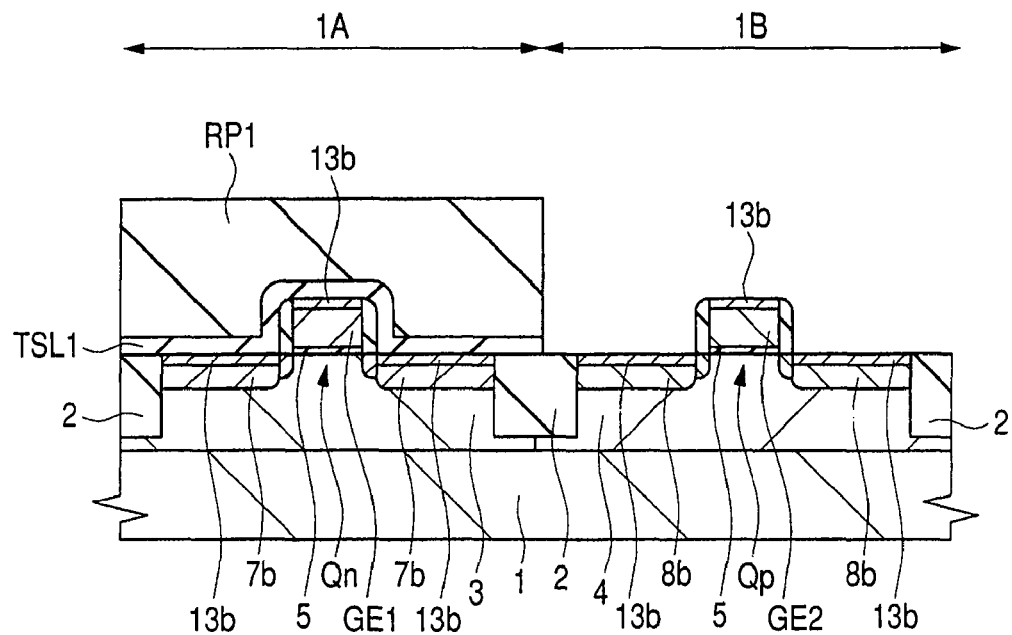
FIG. 103 is a cross-sectional view of the essential part in the manufacturing process of the semiconductor device subsequent to FIG. 102.

Next, as shown in FIG. 103, after the formation of the photoresist film RP1 that covers the nMIS formation region 1A and exposes the pMIS formation region 1B using a photolithographic method, the tensile stress film TSL1 lying in the pMIS formation region 1B is dry-etched and removed using the photoresist film RP1 as the etching mask (Step S12 in FIG. 100). On this occasion, since the photoresist film RP1 functions as the etching mask, the tensile stress film TSL1 in the nMIS formation region 1A is not etched but left. After that, the photoresist film RP1 is removed by ashing or the like.

Meanwhile, when the compression stress film CSL1 instead of the tensile stress film TSL1 is set as the first stress film to be formed at Step S11 in FIG. 100, at Step S12 in FIG. 100, the compression stress film CSL1 lying in the nMIS formation region 1A is dry-etched and removed using the photoresist film RP2 that covers the pMIS formation region 1B and exposes the nMIS formation region 1A as the etching mask. On this occasion, since the photoresist film RP2 functions as the etching mask, the compression stress film CSL1 of the pMIS formation region 1B is not etched but left.

Figure 104:
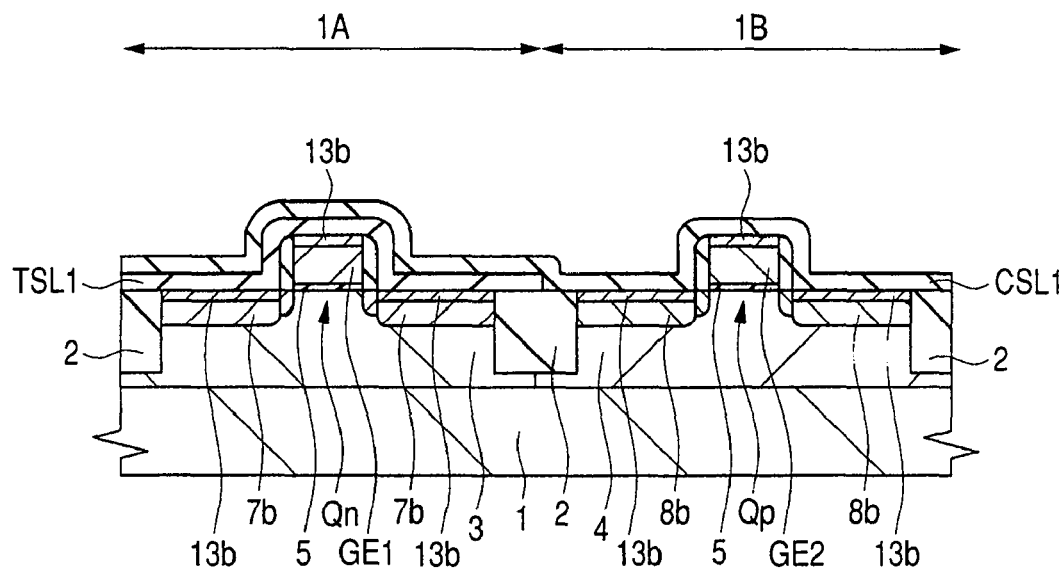
FIG. 104 is a cross-sectional view of the essential part in the manufacturing process of the semiconductor device subsequent to FIG. 103.

Next, as shown in FIG. 104, the second stress film is formed over the whole main face of the semiconductor substrate 1, that is, over the main face of the semiconductor substrate 1 including the nMIS formation region 1A and pMIS formation region 1B (Step S13 in FIG. 100). The second stress film formed at Step S13 in FIG. 100 is a film that gives stress in the opposite direction as compared with the first stress film formed at Step S11 in FIG. 100, and, when the tensile stress film TSL1 is set as the first stress film to be formed at Step S11 in FIG. 100, the second stress film formed at Step S13 in FIG. 100 is the compression stress film CSL1, as shown in FIG. 104.

Meanwhile, when the compression stress film CSL1 instead of the tensile stress film TSL1 is set as the first stress film to be formed at Step S11 in FIG. 100, at Step S13 in FIG. 100, the tensile stress film TSL1 instead of the compression stress film CSL1 is formed as the second stress film.

Figure 105:
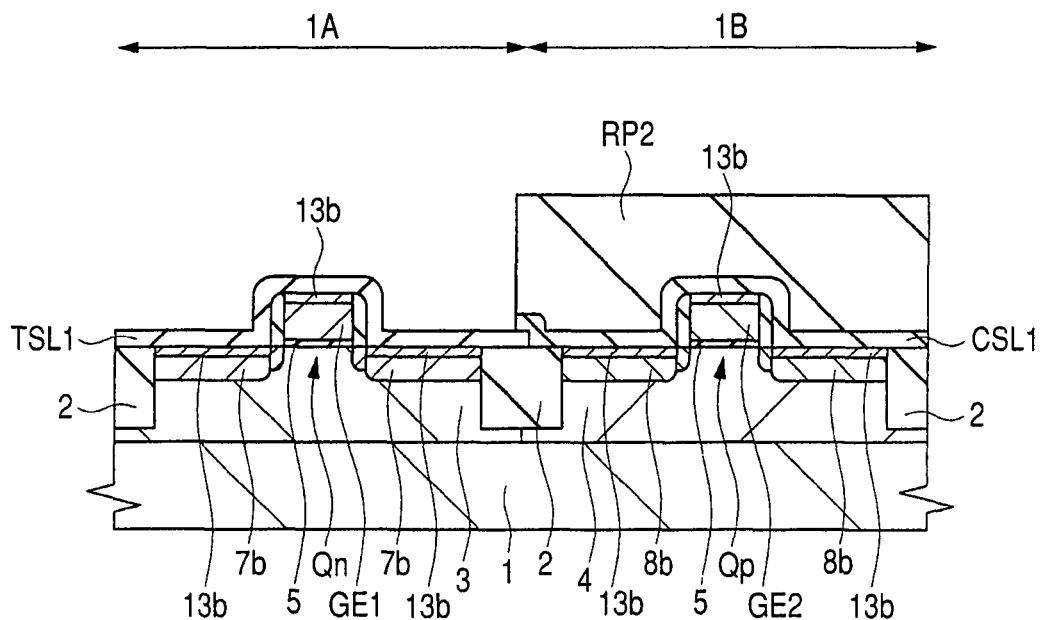
FIG. 105 is a cross-sectional view of the essential part in the manufacturing process of the semiconductor device subsequent to FIG. 104.

Next, as shown in FIG. 105, after the formation of the photoresist film RP2 that covers the pMIS formation region 1B and exposes the nMIS formation region 1A using a photolithographic method, the compression stress film CSL1 lying in the nMIS formation region 1A is dry-etched and removed using the photoresist film RP2 as the etching mask (Step S14 in FIG. 100). On this occasion, by controlling the over etching amount, the tensile stress film TSL1 of the nMIS formation region 1A is not removed but left. Also, on this occasion, since the photoresist film PR2 functions as the etching mask, the compression stress film CSL1 of the pMIS formation region 1B is not etched but left. After that, the photoresist film RP2 is removed by ashing or the like.

Meanwhile, when the compression stress film CSL1 instead of the tensile stress film TSL1 is set as the first stress film to be formed at Step S11 in FIG. 100 (that is, when the tensile stress film TSL1 is set as the second stress film), at Step S14 in FIG. 100, the tensile stress film TSL1 lying in the pMIS formation region 1B is dry-etched and removed using the photoresist film RP1 that covers the nMIS formation region 1A and exposes the pMIS formation region 1B as the etching mask. On this occasion, since the photoresist film RP1 functions as the etching mask, the tensile stress film TSL1 of the nMIS formation region 1A is not etched but left, and, by controlling the over etching amount, the compression stress film CSL1 of the pMIS formation region 1B is not removed but left.

Figure 106:
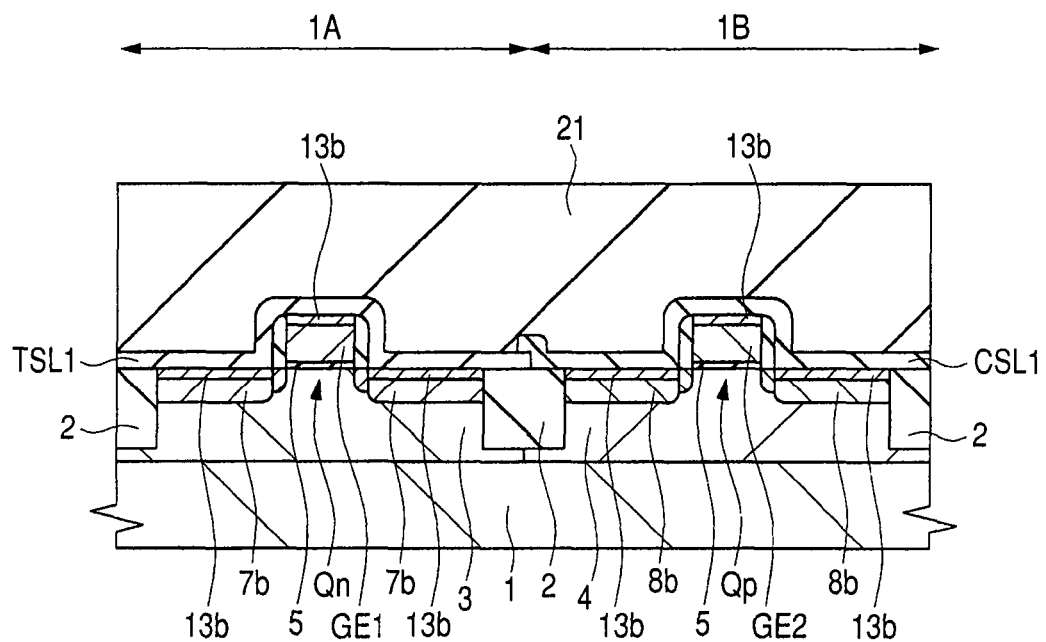
FIG. 106 is a cross-sectional view of the essential part in the manufacturing process of the semiconductor device subsequent to FIG. 105.

Subsequent processes are approximately the same as those in Embodiment 1. That is, as shown in FIG. 106, the interlayer insulating film 21 is formed over the whole main face of the semiconductor substrate 1, that is, over the main face of the semiconductor substrate 1 including the nMIS formation region 1A and pMIS formation region 1B (Step S15 in FIG. 100). After the formation of the interlayer insulating film 21, the surface of the interlayer insulating film 21 is polished by a CMP method, or the like, and thereby the upper surface of the interlayer insulating film 21 is flattened.

Figure 107:
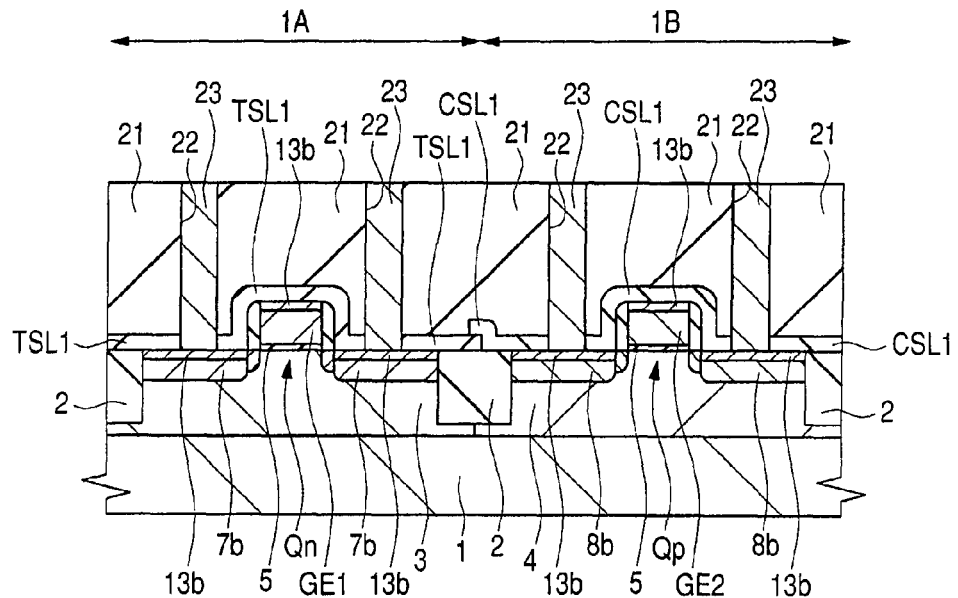
FIG. 107 is a cross-sectional view of the essential part in the manufacturing process of the semiconductor device subsequent to FIG. 106.

Next, as shown in FIG. 107, the contact hole 22 is formed, and the plug 23 is formed inside the contact hole 22.

After that, in the same was as that in Embodiment 1, after the formation of the stopper insulating film 24 and the insulating film 25, the wiring groove 26 is formed, and the wiring M1 is formed inside the wiring groove 26, but the illustration and detailed description thereof are omitted here.

In the embodiment, after the surface of the metal silicide layer 13b is oxidized at Step S21 in FIG. 100, the first stress film is formed at Step S11 in FIG. 100. Consequently, the oxide film 15 formed at Step S21 in FIG. 100 can function as the barrier (the protective film of the metal silicide layer 13b) against over etching upon removing the first stress film by the dry etching at Step S12 in FIG. 100. Consequently, when compared with a case where no operation at Step S21 in FIG. 100 is performed, the decrease in film thickness and etching damage of the metal silicide layer 13b caused by over etching can be suppressed, the rise in the resistance of the metal silicide layer 13b can be suppressed, and the performance and reliability of semiconductor devices can be improved.

Figure 108:
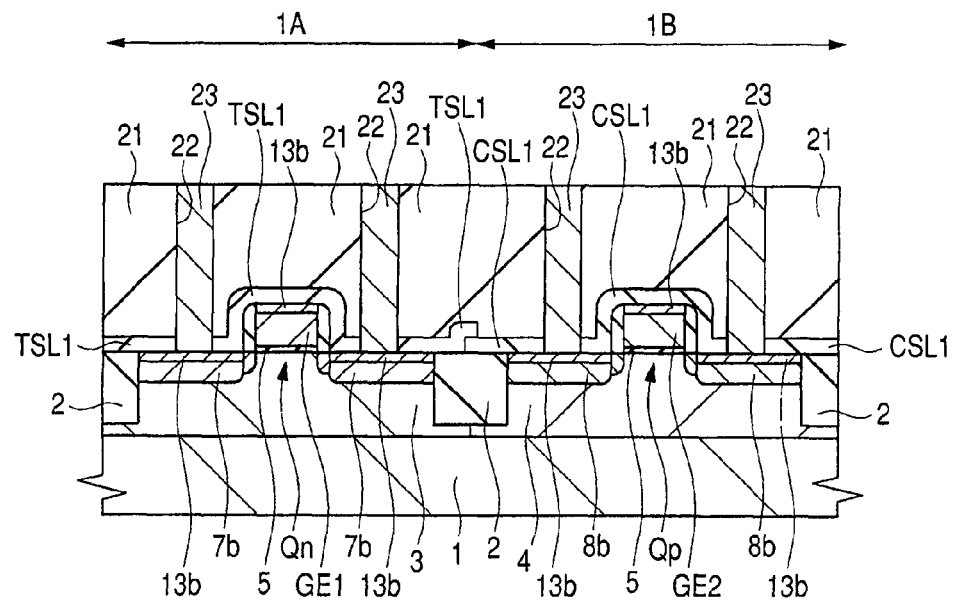
FIG. 108 is a cross-sectional view of the essential part in the manufacturing process of the semiconductor device being Embodiment 12 of the invention when the compression stress film is set as the first stress film.
Figure 109:
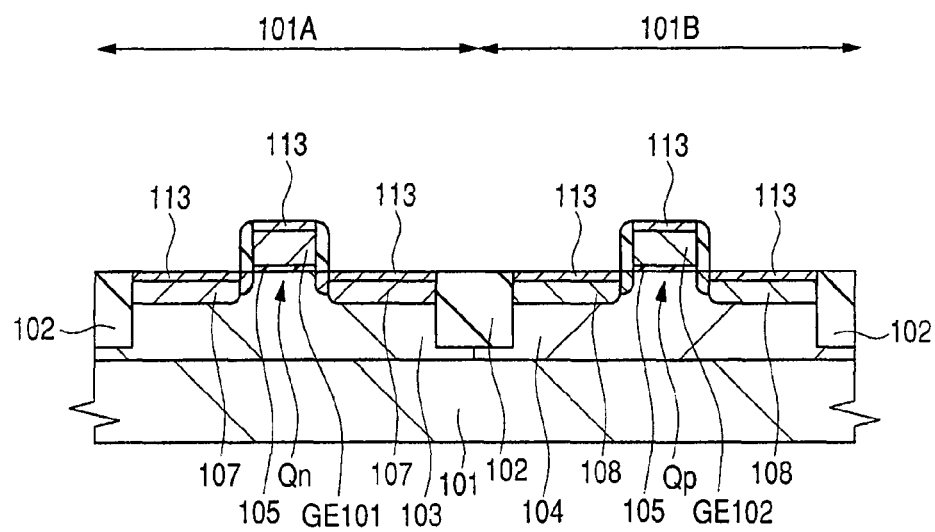
FIG. 109 is a cross-sectional view of the essential part in a manufacturing process of a semiconductor device examined by the inventor.
Figure 110:
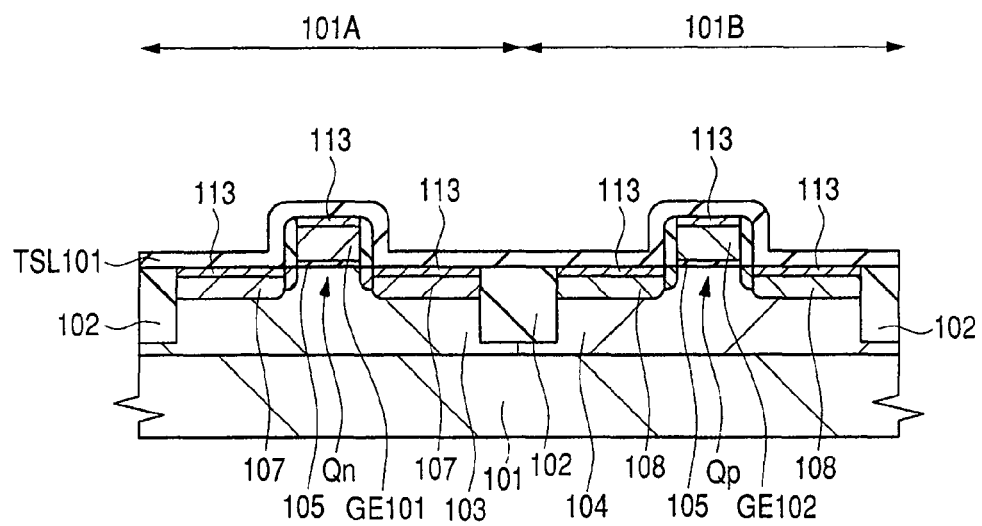
FIG. 110 is a cross-sectional view of the essential part in the manufacturing process of the semiconductor device subsequent to FIG. 109.
Figure 111:
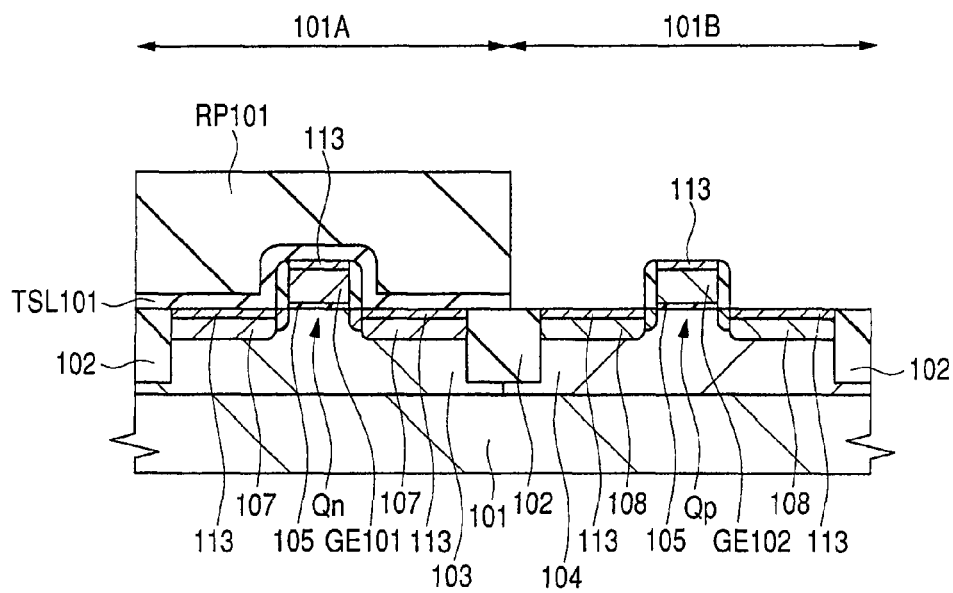
FIG. 111 is a cross-sectional view of the essential part in the manufacturing process of the semiconductor device subsequent to FIG. 110.
Figure 112:
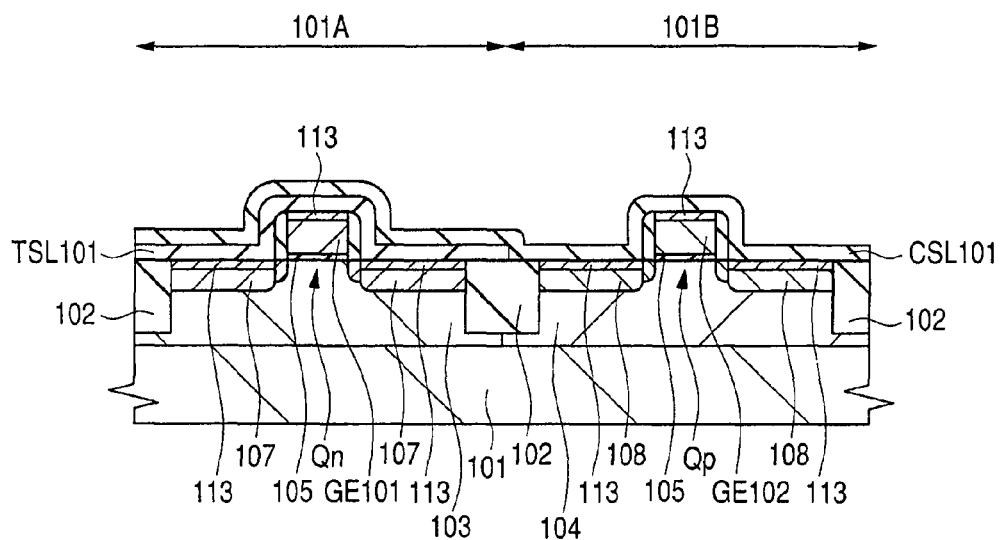
FIG. 112 is a cross-sectional view of the essential part in the manufacturing process of the semiconductor device subsequent to FIG. 111.
Figure 113:
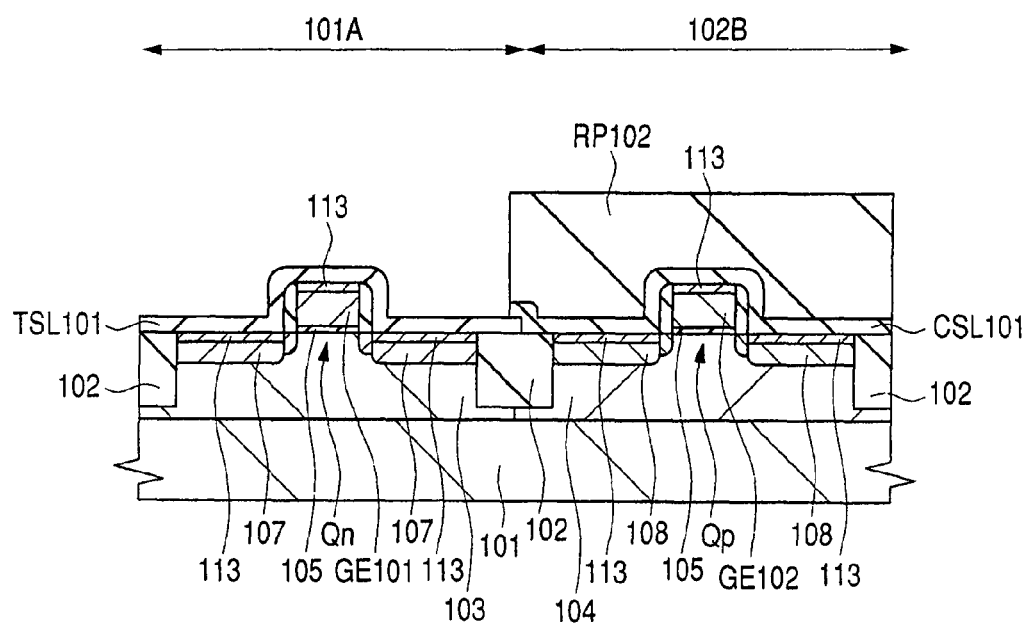
FIG. 113 is a cross-sectional view of the essential part in the manufacturing process of the semiconductor device subsequent to FIG. 112.
Figure 114:
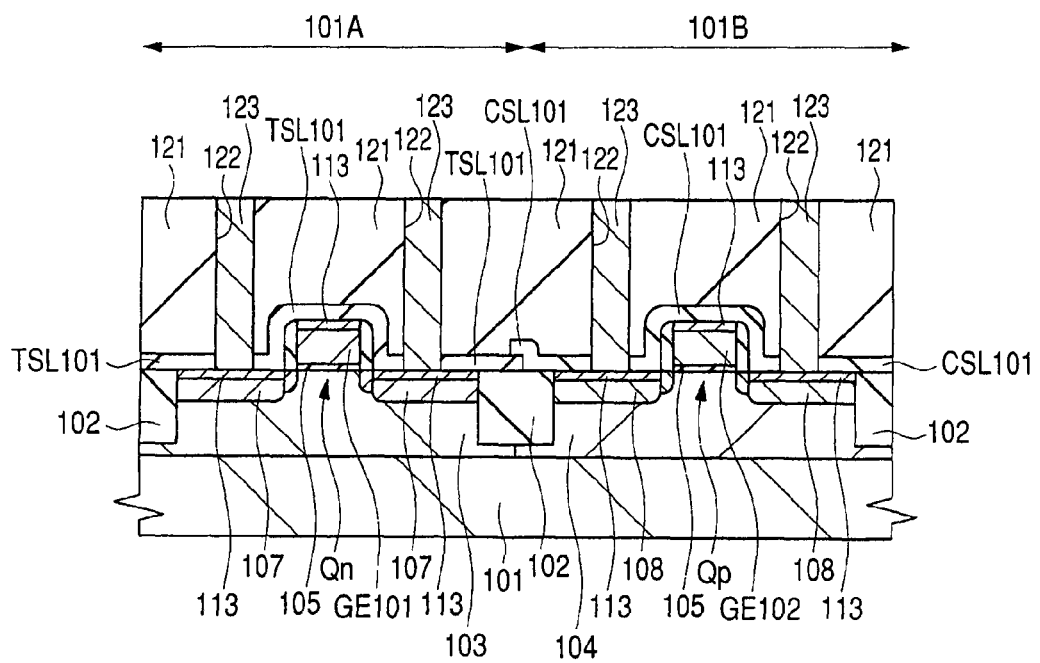
FIG. 114 is a cross-sectional view of the essential part in the manufacturing process of the semiconductor device subsequent to FIG. 113.

In the embodiment, the instance, in which the tensile stress film TSL1 is set as the first stress film to be formed at Step S11 in FIG. 100, is mainly illustrated and described, and, the instance, in which the compression stress film CSL1 is set as the first stress film to be formed at Step S11 in FIG. 100, is also written down and explained. When the compression stress film CSL1 is set as the first stress film formed at Step S11 in FIG. 100, the shape becomes as that in FIG. 108. FIG. 108 is a cross-sectional view of the essential part in a manufacturing process of a semiconductor device of the embodiment when the compression stress film CSL1 is set as the first stress film formed at Step S11 in FIG. 100, which corresponds to FIG. 107 (the same process stage as that in FIG. 107) above.

Heretofore, the invention achieved by the present inventor has specifically been explained on the basis of embodiments thereof, but, needless to say, the invention is not limited to the embodiments but may be variously changed without departing form the range of the gist thereof.

The present invention is effective when applied to semiconductor devices and manufacturing techniques thereof.

What is claimed is:

1. A method of manufacturing a semiconductor device including an n-channel type field effect transistor and a p-channel type field effect transistor, the method comprising the steps of:
   (a) preparing a semiconductor substrate;
   (b) forming a first gate electrode of the n-channel type field effect transistor and a second gate electrode of the p-channel type field effect transistor over the semiconductor substrate each via a gate insulating film;
   (c) forming an n-type first semiconductor region that functions as a source or drain of the n-channel type field effect transistor and a p-type second semiconductor region that functions as a source or drain of the p-channel type field effect transistor at the semiconductor substrate;
   (d) forming metal silicide layers over the first semiconductor region and over the second semiconductor region;
   (e) after the step (d), forming a tensile stress film over the semiconductor substrate so as to cover the first and second gate electrodes and the first and second semiconductor regions;
   (f) after the step (e), removing a part of the tensile stress film that covers the second gate electrode and the second semiconductor region while leaving a part of the tensile stress film that covers the first gate electrode and the first semiconductor region; and
   (g) after the step (f), forming a compression stress film over the semiconductor substrate so as to cover the tensile stress film, the second gate electrode and the second semiconductor region,
   wherein each of the metal silicide layers formed at the step (d) contains Pt, and a Pt concentration of the surface of the each of the metal silicide layers is higher than that of the inside of the each of the metal silicide layers, and
   wherein the Pt concentration of the surface of the metal silicide layer of the p-channel type field effect transistor is higher than the Pt concentration of the surface of the metal silicide layer of the n-channel type field effect transistor.

2. The method of manufacturing a semiconductor device according to claim 1,
   wherein the step (d) includes the steps of:
   (d1) forming a metal film containing Pt over the semiconductor substrate including the first and second semiconductor regions;
   (d2) after the step (d1), performing a first heat treatment to react the metal film with the first and second semiconductor regions, and thereby forming the metal silicide layer;
   (d3) after the step (d2), removing the metal film having not reacted at the step (d2); and
   (d4) after the step (d3), performing a second heat treatment at a heat treatment temperature higher than that of the first heat treatment to further react the metal silicide layer with the first and second semiconductor regions.

3. The method of manufacturing a semiconductor device according to claim 2,
   wherein, in the first heat treatment at the step (d2), the heat treatment temperature is 290° C. or less and the heat treatment time is 30 seconds or less.

4. The method of manufacturing a semiconductor device according to claim 3,
   wherein, in the second heat treatment at the step (d4), the heat treatment temperature is 525° C. or less and the heat treatment time is 30 seconds or less.

5. The method of manufacturing a semiconductor device according to claim 4,
   wherein the metal film formed at the step (d1) is an alloy film of nickel and platinum; and the metal silicide layer includes nickel platinum silicide.

6. The method of manufacturing a semiconductor device according to claim 5,
   wherein, at the step (d2), the metal silicide layer of a $(Ni_{1-y}Pt_y)_2Si$ phase is formed; and at the step (d4), the metal silicide layer of a $Ni_{1-y}Pt_ySi$ phase is formed by the second heat treatment.

7. The method of manufacturing a semiconductor device according to claim 1 further comprising the step of, after the step (d) and before the step (e), (d5) oxidizing the surface of the metal silicide layer.

* * * * *